US012021516B2

(12) United States Patent
Okuda et al.

(10) Patent No.: US 12,021,516 B2
(45) Date of Patent: Jun. 25, 2024

(54) SEMICONDUCTOR DEVICE

(71) Applicant: ROHM CO., LTD., Kyoto (JP)

(72) Inventors: Hajime Okuda, Kyoto (JP); Yoshinori Fukuda, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 174 days.

(21) Appl. No.: 17/245,635

(22) Filed: Apr. 30, 2021

(65) Prior Publication Data

US 2021/0344341 A1 Nov. 4, 2021

(30) Foreign Application Priority Data

May 1, 2020 (JP) ................................ 2020-081199

(51) Int. Cl.
*H03K 17/687* (2006.01)
*H01L 29/06* (2006.01)
*H01L 29/78* (2006.01)

(52) U.S. Cl.
CPC ..... *H03K 17/6871* (2013.01); *H01L 29/0696* (2013.01); *H01L 29/7813* (2013.01)

(58) Field of Classification Search
CPC ........... H03K 17/6871; H01L 29/0696; H01L 29/7813
See application file for complete search history.

(56) References Cited

U.S. PATENT DOCUMENTS

| | | | | |
|---|---|---|---|---|
| 6,181,186 B1 * | 1/2001 | Itoh | H03K 17/0822 327/309 |
| 8,633,723 B2 * | 1/2014 | Takeuchi | H01L 29/7813 327/540 |
| 2016/0133742 A1 * | 5/2016 | Okuda | H01L 23/49562 438/270 |
| 2019/0260371 A1 | 8/2019 | Wada et al. | |

FOREIGN PATENT DOCUMENTS

| | | | |
|---|---|---|---|
| JP | H05175444 A | | 7/1993 |
| JP | H07030386 A | | 1/1995 |
| JP | 2000101076 A | | 4/2000 |
| JP | 2001257348 A | | 9/2001 |
| JP | 2003282947 A | * | 10/2003 |
| JP | 2018129378 A | | 8/2018 |
| WO | 2014038064 A1 | | 3/2014 |

OTHER PUBLICATIONS

Notice of Reasons for Refusal dated Jan. 18, 2024, in the counterpart Japanese patent application No. 2020-081199.

* cited by examiner

*Primary Examiner* — Metasebia T Retebo
(74) *Attorney, Agent, or Firm* — Rabin & Berdo, P.C.

(57) ABSTRACT

A semiconductor device includes a semiconductor chip, and an n-system gate divided transistor, where the "n" is not less than 2, that includes n-number of system transistors formed in the semiconductor chip such as to be individually controlled and that is configured such as to generate a single output signal by selective controls of the n-number of system transistors.

17 Claims, 72 Drawing Sheets

1

SEMICONDUCTOR DEVICE

CROSS REFERENCE TO RELATED APPLICATIONS

This application claims the benefit of priority to Japanese Patent Application No. 2020-081199 filed on May 1, 2020. The entire contents of the application are hereby incorporated herein by reference.

BACKGROUND OF THE INVENTION

Field of the Invention

The present invention relates to a semiconductor device.

Description of the Related Art

US2019-0260371A1 discloses a semiconductor device including a first power transistor, a second power transistor, an active clamp circuit and an active clamp cutoff circuit. A drain of the second power transistor is electrically connected to a drain of the first power transistor. A source of the second power transistor is electrically connected to a source of the first power transistor. The active clamp circuit is electrically connected to the drain and agate of the second power transistor. The active clamp cutoff circuit is connected to a gate of the first power transistor and the gate of the second power transistor.

SUMMARY OF THE INVENTION

One embodiment of the present invention provides a semiconductor chip, and an n-system gate divided transistor, where the “n” is not less than 2, that includes n-number of system transistors formed in the semiconductor chip such as to be individually controlled and that is configured such as to generate a single output signal by selective controls of the n-number of system transistors.

The aforementioned or other objects, features, and effects of the present invention will be clarified by the following description of preferred embodiments given below with reference to the accompanying drawings.

DETAILED DESCRIPTION OF THE PREFERRED EMBODIMENTS

One embodiment of the present invention provides a semiconductor chip, and an n-system gate divided transistor, where the "n" is not less than 2, that includes n-number of system transistors formed in the semiconductor chip such as to be individually controlled and that is configured such as to generate a single output signal by selective controls of the n-number of system transistors. According to this structure, it is possible to provide a semiconductor device that has a transistor with a variable ON-resistance.

Hereinafter, preferred embodiments of the present invention will be described in detail with reference to the attached drawings.

Figure 1:
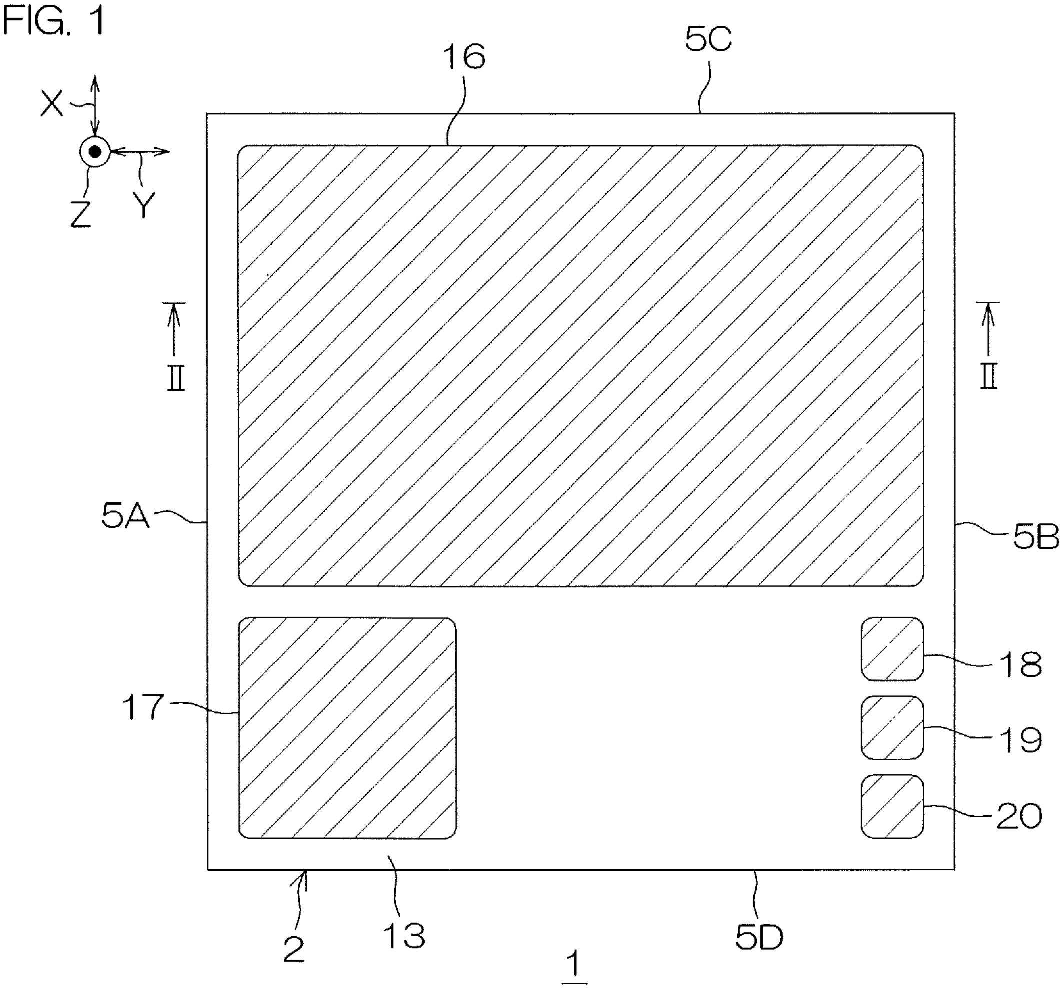
FIG. 1 is a plan view showing a semiconductor device according to a first preferred embodiment of the present invention.
Figure 2:
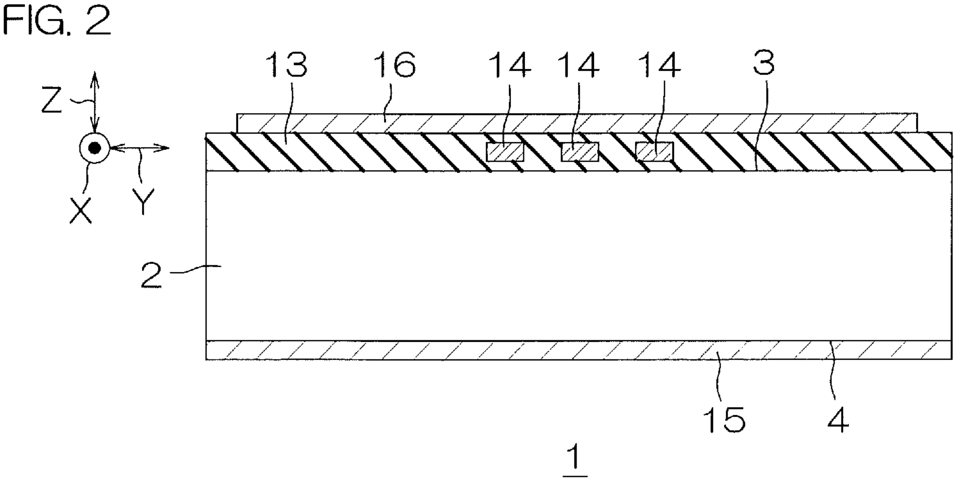
FIG. 2 is a sectional view taken along line II-II shown in FIG. 1.
Figure 3:
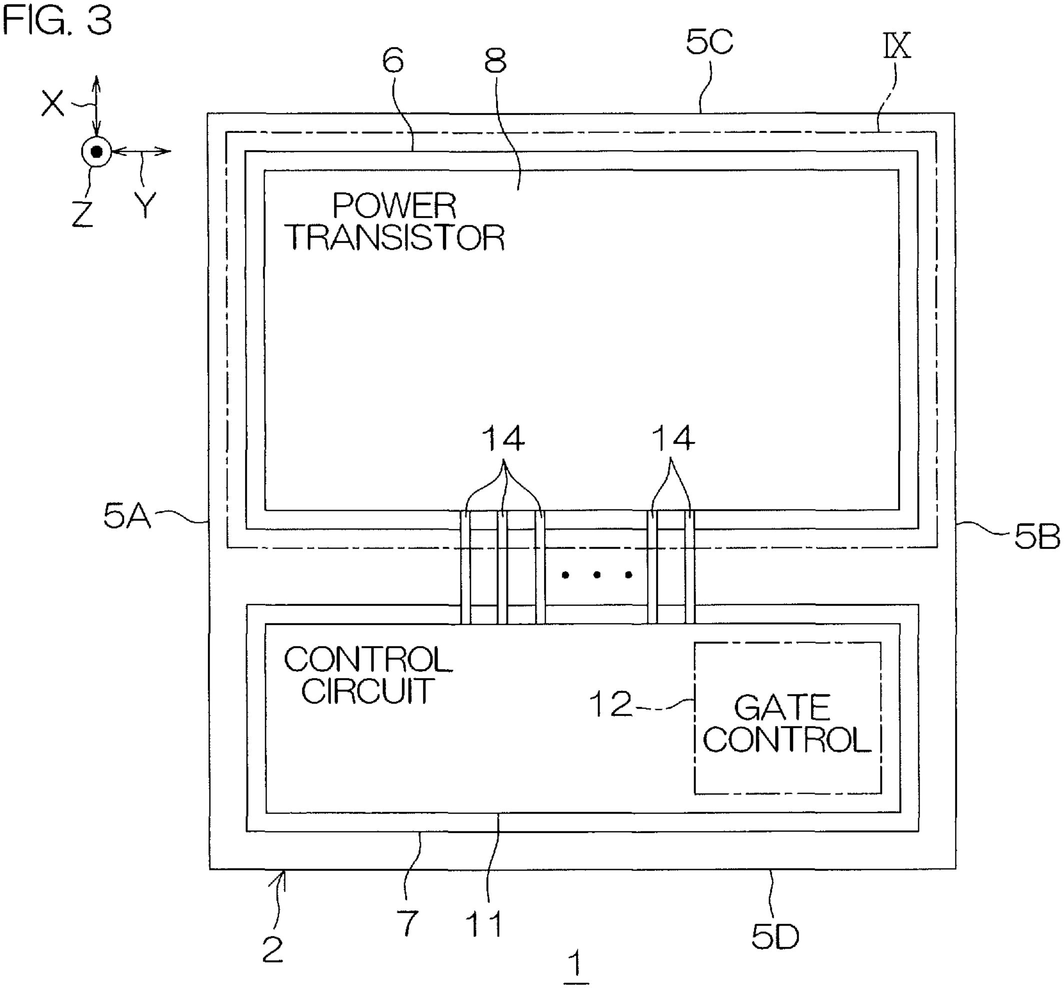
FIG. 3 is a plan view showing a structure of a semiconductor chip shown in FIG. 1.
Figure 4:
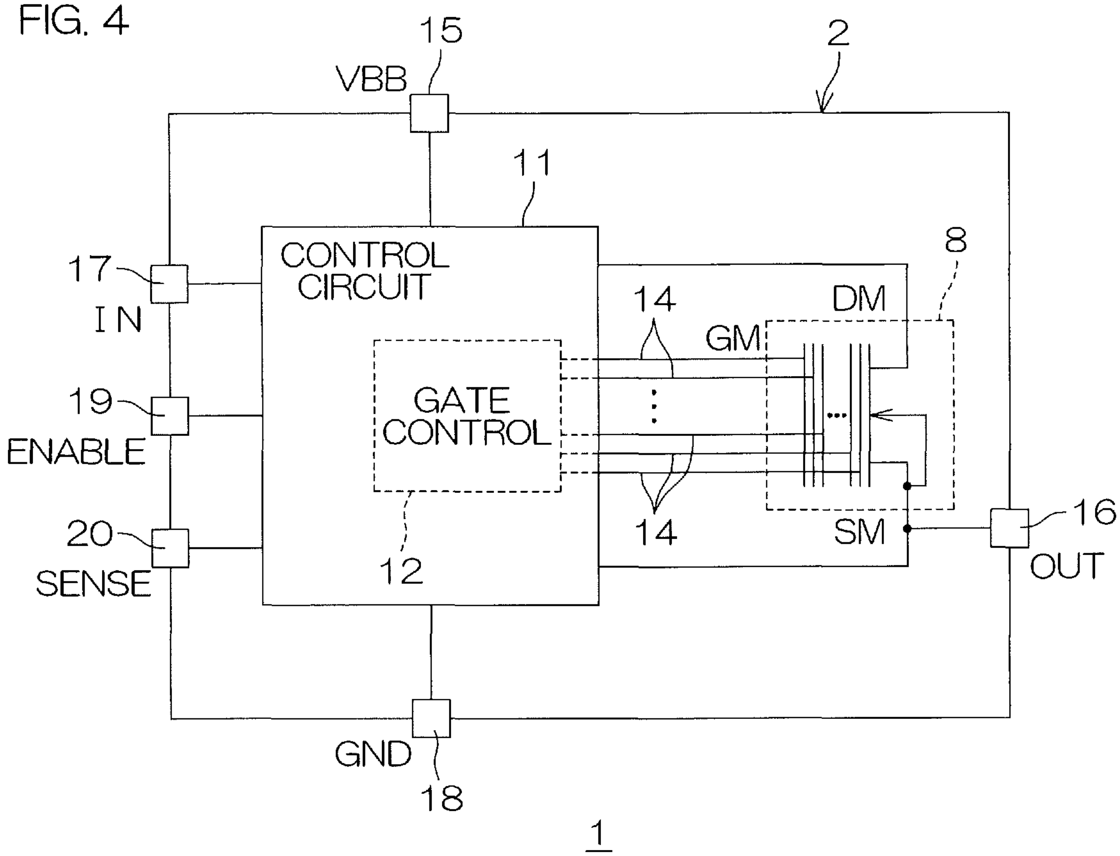
FIG. 4 is a block circuit diagram showing an electrical structure of the semiconductor device shown in FIG. 1.
Figure 5:
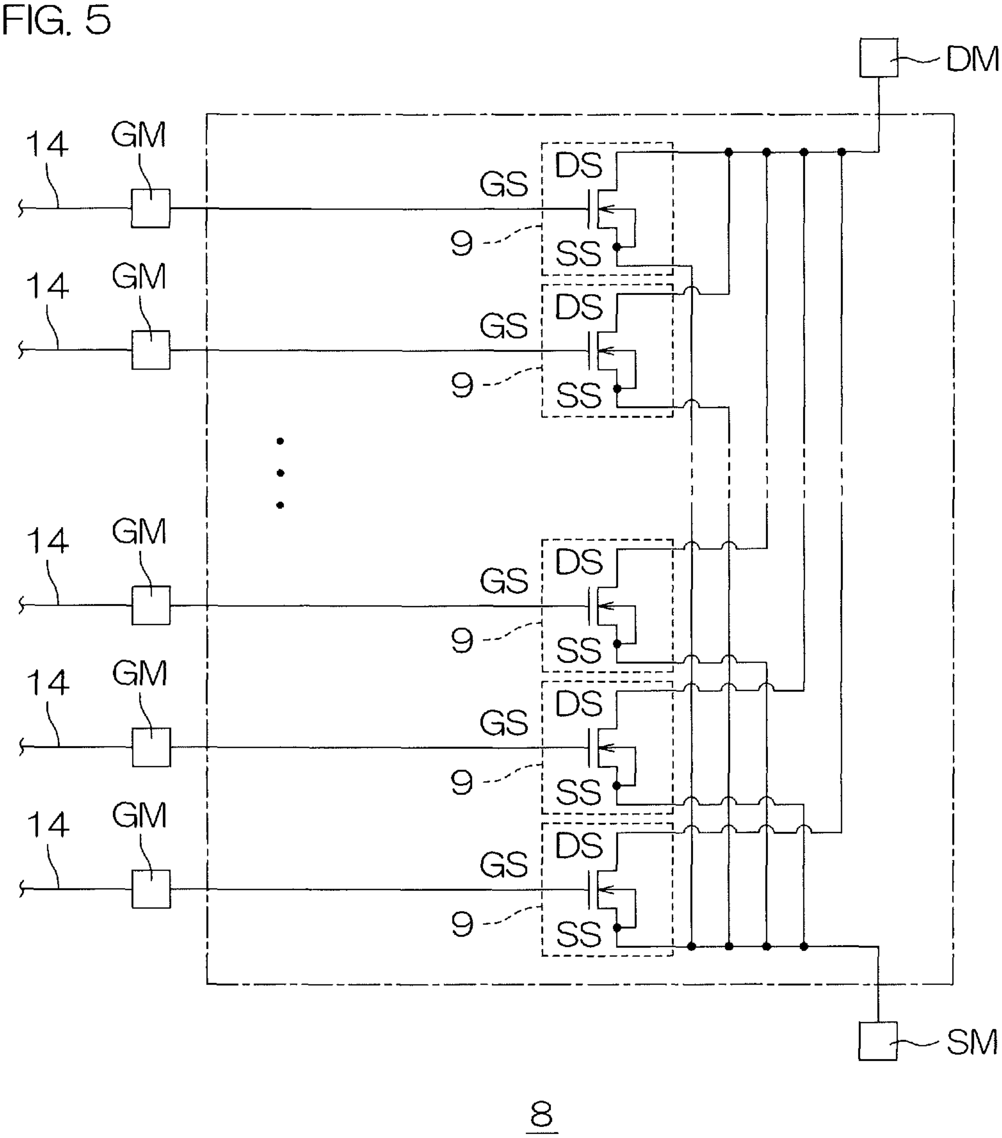
FIG. 5 is an equivalent circuit diagram of a power transistor shown in FIG. 4.
Figure 6:
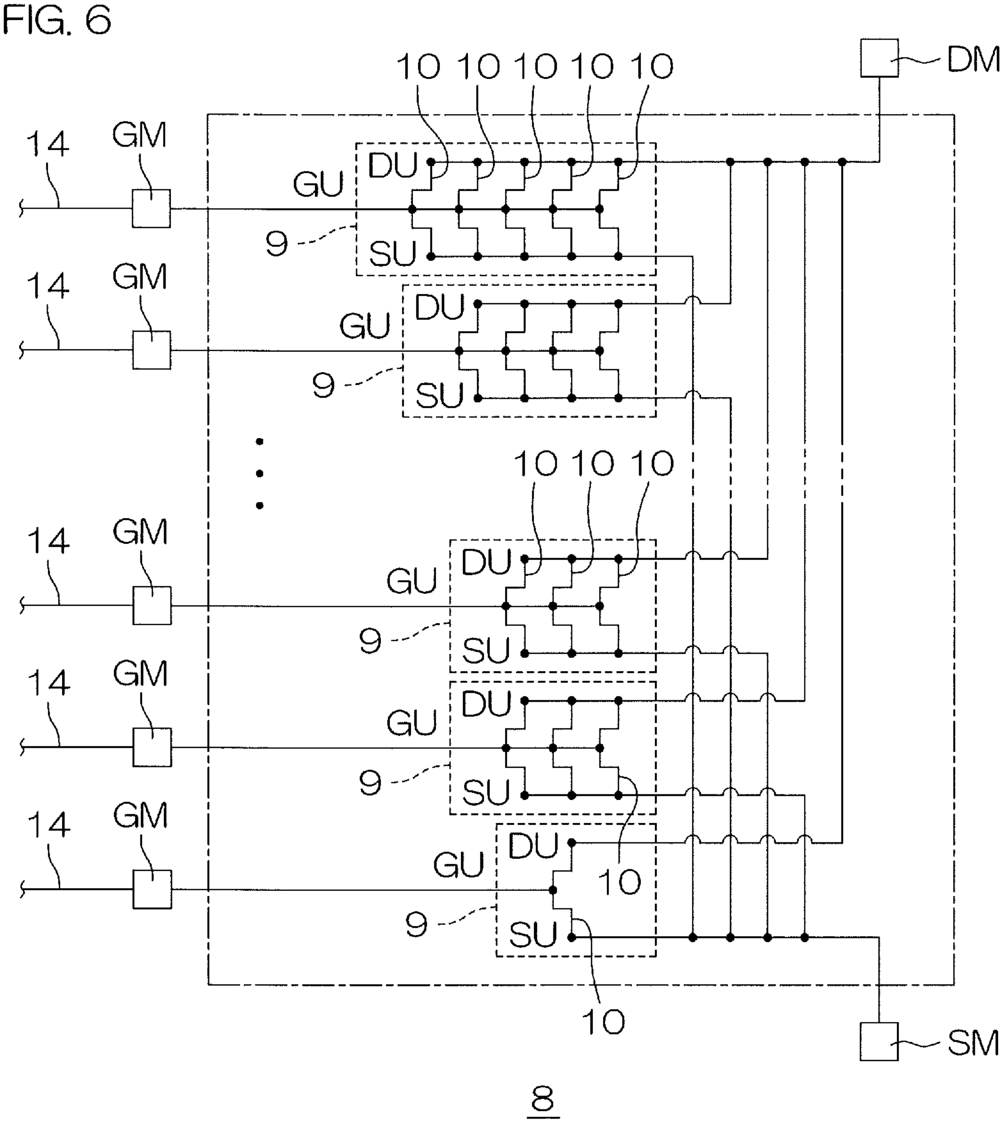
FIG. 6 is a further equivalent circuit diagram of the power transistor shown in FIG. 5.

FIG. 1 is a plan view showing a semiconductor device 1 according to a first preferred embodiment of the present invention. FIG. 2 is a sectional view taken along line II-II shown in FIG. 1. FIG. 3 is a plan view showing a structure of a semiconductor chip 2 shown in FIG. 1. FIG. 4 is a block circuit diagram showing an electrical structure of the semiconductor device 1 shown in FIG. 1. FIG. 5 is an equivalent circuit diagram of a power transistor 8 shown in FIG. 4. FIG. 6 is a further equivalent circuit diagram of the power transistor 8 shown in FIG. 5.

Hereinafter, a configuration example in which the semiconductor device 1 consists of a high side switching device will be described, but the semiconductor device 1 can be provided as a low side switching device by adjusting electrical connection forms and functions of various structures.

With reference to FIG. 1 and FIG. 2, the semiconductor device 1 includes a semiconductor chip 2 formed in a rectangular parallelepiped shape in this embodiment. Specifically, the semiconductor chip 2 consists of an Si (silicon) chip. The semiconductor chip 2 includes a first main surface 3 on one side, a second main surface 4 on the other side, and first to fourth side surfaces 5A to 5D connecting the first main surface 3 and the second main surface 4. The first main surface 3 and the second main surface 4 are each formed in a quadrilateral shape in plan view when viewed from a normal direction Z thereof (hereinafter, simply referred to as "plan view")

The first main surface 3 is a device surface in which a functional device is formed. The second main surface 4 is amounting surface and consists of a grinding surface having grinding marks. The first to fourth side surfaces 5A to 5D include the first side surface 5A, the second side surface 5B, the third side surface 5C and the fourth side surface 5D. The first side surface 5A and the second side surface 5B extend in a first direction X along the first main surface 3, and oppose a second direction Y intersecting (specifically, orthogonal to) the first direction X. The third side surface 5C and the fourth side surface 5D extend in the second direction Y, and oppose the first direction X.

With reference to FIG. 3, the semiconductor device 1 includes a first device region 6 that is demarcated in the first main surface 3. The first device region 6 is an output region in which an output signal to be output to an outside is generated. The first device region 6 is demarcated in a region at a side of the third side surface 5C in the first main surface 3, in this embodiment. An arrangement and a planar shape of the first device region 6 are arbitrary, and are not restricted to specific configurations. However, it is preferred that the first device region 6 occupies not less than a half area of an area of the first main surface 3 to achieve satisfactory output characteristics.

The semiconductor device 1 includes a second device region 7 that is demarcated in a region different from the first device region 6 in the first main surface 3. The second device region 7 is an input region to which electrical signals from an outside are input. The second device region 7 is demarcated in a region at a side of the fourth side surface 5D with respect to the first device region 6, in this embodiment. An arrangement and a planar shape of the second device region 7 are arbitrary, and are not restricted to specific configurations.

It is preferred that the second device region 7 has a planar area not less than a planar area of the first device region 6. It is preferred that the second device region 7 is formed with an area ratio of not less than 0.1 and not more than 1 with respect to the first device region 6. The area ratio is a ratio of the planar area of the second device region 7 with respect to the planar area of the first device region 6. The area ratio may be not less than 0.1 and not more than 0.25, not less than 0.25 and not more than 0.5, not less than 0.5 and not more than 0.75, or, not less than 0.75 and not more than 1. It is preferred that the area ratio is less than 1.

With reference to FIG. 3 to FIG. 6, the semiconductor device 1 includes an n-system (n≥2) power transistor 8 formed in the first device region 6 as one example of a gate divided transistor of an insulated-gate-type. The power transistor 8 may be referred to as a power MISFET (Metal Insulator Semiconductor Field Effect Transistor). The power transistor 8 includes a single main drain DM, a single main source SM and n-number (n≥2) of main gates GM.

The n-number of main gates GM are configured such that n-number of gate signals G which are equal to or different from each other are input at arbitrary timings. Each of the gate signals G includes an ON-signal by which the power transistor 8 is controlled to an ON-state and an OFF-signal by which the power transistor 8 is controlled to an OFF-state. The power transistor 8 outputs a single output current IOUT (an output signal) from the main drain DM and the main source SM in response to the n-number of gate signals G input to the n-number of main gates GM. That is, the power transistor 8 consists of a switching device of a multiple-input-single-output-type. Specifically, the output current IOUT is a drain-source current flowing between the main drain DM and the main source SM.

With reference to FIG. 5, the power transistor 8, specifically, includes n-number (n≥2) of system transistors 9 as individual control targets. More specifically, the power transistor 8 is composed of a parallel circuit including the n-number of system transistors 9 which are parallelly connected such that the n-number of gate signals G are individually input. The n-number of system transistors 9 are collectively formed in the single first device region 6, in this embodiment. The n-number of system transistors 9 are configured such as to be electrically independently controlled to an ON-state and OFF-state each other. That is, the n-system power transistor 8 is configured such that the system transistor 9 in an ON-state and the system transistor 9 in an OFF-state coexist at an arbitrary timing.

The n-number of system transistors 9 each includes a system drain DS, a system source SS and a system gate GS. The system drains DS of the n-number of system transistors 9 are connected to the main drain DM, respectively. The system sources SS of the n-number of system transistors 9 are connected to the main source SM, respectively. The system gates GS of the n-number of system transistors 9 are connected to the main gates GM with a one-to-one correspondence, respectively.

That is, the main drain DM, the main source SM and the n-number of main gates GM of the power transistor 8 are respectively configured with the system drain DS, the system source SS and the n-number of system gates GS of the n-number of system transistors 9. The n-number of main gates GM substantially consist of the n-number of system gates GS.

The n-number of system transistors 9 each generates an electrical signal for respective systems in response to the gate signal G, and each outputs the electrical signal to the main drain DM and the main source SM. Specifically, the electrical signal for each system is a drain-source current flowing between the system drain DS and the system source SS of each of system transistors 9. The electrical signals for the respective systems are to be added between the main drain DM and the main source SM. The single output current IOUT is thereby generated.

It is preferred that the n-number of system transistors 9 each has a gate threshold voltage equal to each other. The n-number of system transistors 9 may each have a channel area equal to each other or may each have a channel area different from each other. That is, the n-number of system transistors 9 may each have ON-resistance characteristics equal to each other or may each have ON-resistance characteristics different from each other.

With reference to FIG. 6, the n-number of system transistors 9 each includes a single or plurality of unit transistors 10 that are systematized (grouped) as an individual control target. The n-number of system transistors 9 are each configured with a parallel circuit including the single or plurality of unit transistors 10. The "parallel circuit" here includes a case in which the system transistor 9 is configured with the single unit transistors 10.

A number of the unit transistors 10 included in each of the system transistors 9 is arbitrary, but it is preferred that at least one of the system transistors 9 includes the plurality of unit transistors 10. The n-number of system transistors 9 may be configured with the same number of the unit transistors 10, or may be configured with the different number of the unit transistors 10.

Each of the unit transistors 10 includes a unit drain DU, a unit source SU and a unit gate GU. The unit drains DU of the single or plurality of unit transistors 10 in each of the system transistors 9 are electrically connected to the system drain DS. The unit sources SU of the single or plurality of unit transistors 10 in each of the system transistors 9 are electrically connected to the system source SS. The unit gates GU of the single or plurality of unit transistors 10 in each of the system transistors 9 are electrically connected to the system gate GS.

That is, the system drain DS, the system source SS and the system gate GS of each of the system transistors 9 are configured with the unit drains DU, the unit sources SU and the unit gates GU of the single or plurality of unit transistors 10.

The plurality of unit transistors 10 may consist of a trench-gate-type or consist of a planer-gate-type. It is preferred that the plurality of unit transistors 10 each has a gate threshold voltage equal to each other. The plurality of unit transistors 10 may each have a channel area equal to each other or may each have a channel area different from each other. That is, the plurality of unit transistors 10 may each have ON-resistance characteristics equal to each other or may have ON-resistance characteristics different from each other.

The gate threshold voltage, the ON-resistance characteristics (the channel area), etc. of each of the system transistors 9 can be precisely adjusted by adjusting the number, the gate threshold voltages and the channel areas of the plurality of unit transistors 10. Electrical characteristics of each of the system transistors 9 may be adjusted depending on electrical specifications of the power transistor 8 to be achieved. A channel utilization, an ON-resistance Ron, a switching waveform, etc. are exemplified as the electrical specifications of the power transistor 8.

With reference to FIG. 3 and FIG. 4, the semiconductor device 1 includes a control IC 11 (Control Integrated Circuit) formed in the second device region 7 as an example of a control circuit. The control IC 11 includes a plural types of functional circuits that realize various functions in response to the electrical signals input from the outside. The plural types of the functional circuits includes a gate control circuit 12 configured such as to drive and control the power transistor 8 in response to the electrical signals from the outside. Specifically, the gate control circuit 12 is configured such as to generate the n-number of gate signals G by which the n-number of system transistors 9 are to be individually controlled. The control IC 11 forms as a so-called IPD (Intelligent Power Device) together with the power transistor 8. The IPD is also referred to as an IPM (Intelligent Power Module).

With reference to FIG. 2, the semiconductor device 1 includes an interlayer insulation layer 13 that covers the first main surface 3. The interlayer insulation layer 13 collectively covers the first device region 6 and the second device region 7. The interlayer insulation layer 13 consists of a multilayer wiring structure having a laminated structure in which a plurality of insulation layers and a plurality of wiring layers are alternately laminated, in this embodiment. Each of the insulation layers includes at least one of an $SiO_2$ film and an SiN film. Each of the wiring layers may include at least one of an Al layer, a Cu layer, an AlCu-alloy layer, an AlSiCu-alloy layer and an AlSi-alloy layer.

With reference to FIG. 3, the semiconductor device 1 includes n-number of gate wirings 14 formed anywhere above the first main surface 3 as an example of control wirings. The n-number of gate wirings 14 consist of the n-number of wiring layers formed inside the interlayer insulation layer 13. The n-number of gate wirings 14 are selectively routed around in the interlayer insulation layer 13, and electrically connected to the n-number of main gates GM of the power transistor 8 and the control IC 11 (the gate control circuit 12), respectively.

The n-number of gate wirings 14 are electrically connected to the n-number of main gates GM (the n-number of system gates GS) of the power transistor 8 with a one-to-one correspondence in states of being electrically independent of each other. The n-number of gate wirings 14 thereby individually transmit the n-number of gate signals G generated by the control IC 11 (the gate control circuit 12) to the n-number of main gates GM of the power transistor 8.

That is, the n-number of gate wirings 14 are electrically connected to the unit gates GU of the single or plurality of unit transistors 10 to be systematized as the individual control target from an aggregate consisting of the plurality of unit transistors 10. The n-number of gate wirings 14 may include the single or plurality of gate wirings 14 electrically connected to the single unit transistors 10 as the individual control target. The n-number of gate wirings 14 may include a single or plurality of gate wirings 14 parallelly connecting the plurality of unit transistors 10 as the individual control target.

The semiconductor device 1 includes a plurality (6, in this embodiment) of terminal electrodes 15 to 20. In FIG. 1, the plurality of terminal electrodes 15 to 20 are shown by hatching. A number, arrangements and planar shapes of the plurality of terminal electrodes 15 to 20 are to be adjusted depending on specifications of the power transistor 8 and specifications of the control IC 11, and are not therefore restricted to configurations as shown in FIG. 1. The plurality of terminal electrodes 15 to 20 include a drain terminal 15 (a power terminal VBB), a source terminal 16 (an output terminal OUT), an input terminal 17, a reference terminal 18, an enable terminal 19 and a sense terminal 20, in this embodiment.

The drain terminal 15 directly covers the second main surface 4 of the semiconductor chip 2 and electrically connected to the second main surface 4. The drain terminal 15 transmits a power supply voltage VB to the main drain DM of the power transistor 8 and the various circuits of the control IC 11. The drain terminal 15 may include at least one of a Ti layer, an Ni layer, an Au layer, an Ag layer and an Al layer. The drain terminal 15 may have a laminated structure in which at least two of the Ti layer, the Ni layer, the Au layer, the Ag layer and the Al layer are laminated in arbitrary order.

The source terminal 16, the input terminal 17, the reference terminal 18, the enable terminal 19 and the sense terminal 20 are formed on the interlayer insulation layer 13. The source terminal 16 is formed above the first device region 6 at the first main surface 3. The source terminal 16 is electrically connected to the main source SM of the power transistor 8 and the control IC 11. The source terminal 16 transmits the output current IOUT generated by the power transistor 8 to the outside.

The input terminal 17, the reference terminal 18, the enable terminal 19 and the sense terminal 20 are formed above a region (specifically, the second device region 7) outside the first device region 6, respectively. The input terminal 17 transmits an input voltage by which the control IC 11 is to be driven. The reference terminal 18 transmits a reference voltage (e.g. a ground voltage GND) to the power transistor 8 and the control IC 11. The enable terminal 19 transmits an electrical signal by which apart of or all of functions of the control IC 11 are to be enabled or disabled. The sense terminal 20 transmits an electrical signal by which a malfunction in the control IC 11 is to be detected.

The terminal electrodes 16 to 20 excluding the drain terminal 15 may include at least one of a pure-Al layer, a pure-Cu layer, an AlCu-alloy layer, an AlSiCu-alloy layer and an AlSi-alloy layer. Plating layers may be formed on outer surfaces of the terminal electrodes 16 to 20, respectively. The plating layers may include at least one of an Ni layer, a Pd layer and an Au layer.

Figure 7:
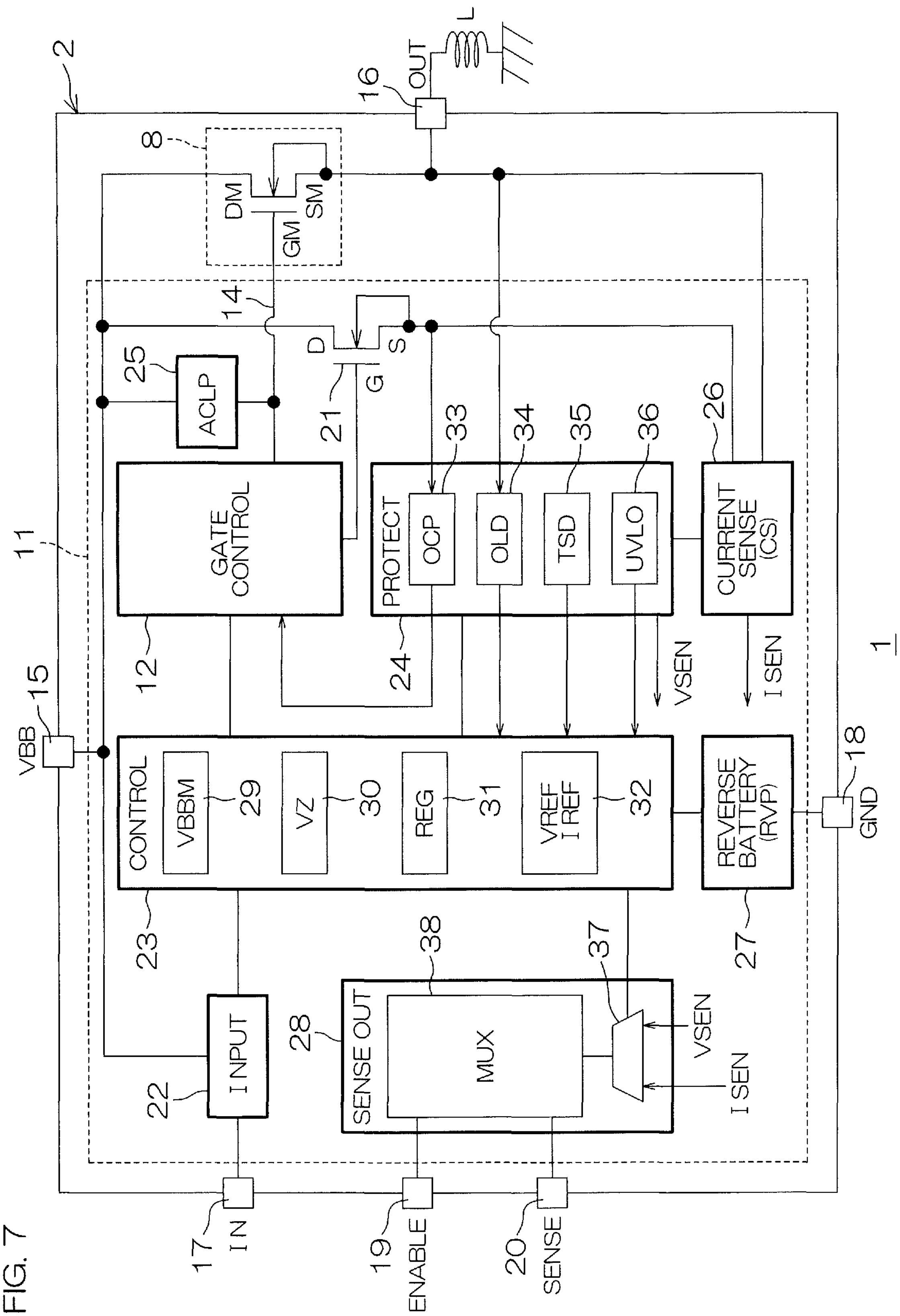
FIG. 7 is a block circuit diagram of one configuration example of the semiconductor device shown in FIG. 1.

FIG. 7 is a block circuit diagram of one configuration example of the semiconductor device 1 shown in FIG. 1.

Hereinafter, an example in which the semiconductor device 1 is to be installed into a car will be described. The semiconductor device 1 include the drain terminal 15, the source terminal 16, the input terminal 17, the reference terminal 18, the enable terminal 19, the sense terminal 20, the power transistor 8 and the control IC 11.

The drain terminal 15 is connected to a power supply. A power supply voltage VB may be not less than 10V and not more than 20V. The source terminal 16 is connected to an inductive load L. The inductive load L may be an inductance component of a coil, a solenoid, a harness, etc. The input terminal 17 is externally connected to an MCU (Micro Controller Unit), a DC/DC converter or an LDO (Low Drop Out). An input voltage may be not less than 1V and not more than 10V. The reference terminal 18 is to be grounded. The enable terminal 19 may be connected to an MCU. The electrical signal by which a part of or all of functions of the control IC 11 are to be enabled or disabled is input to the enable terminal 19. The sense terminal 20 may be connected to a resistor.

The main drain DM of the power transistor 8 is electrically connected to the drain terminal 15. The main source SM of the power transistor 8 is electrically connected to the control IC 11 (a current detection circuit 26 described later) and the source terminal 16. The n-number of main gates GM of the power transistor 8 is electrically connected to the control IC 11 (specifically, the gate control circuit 12) via the n-number of gate wirings 14. In FIG. 7, the n-number of gate wirings 14 are shown simplified by one line.

The control IC 11 includes the gate control circuit 12, a sense transistor 21, an input circuit 22, a current-voltage control circuit 23, a protection circuit 24, an active clamp circuit 25, a current detection circuit 26, a power-supply reverse connection protection circuit 27 and a malfunction detection circuit 28. The sense transistor 21 includes a drain, a source and a gate. The gate of the sense transistor 21 is electrically connected to the gate control circuit 12. The drain of the sense transistor 21 is electrically connected to the drain terminal 15. The source of the sense transistor 21 is electrically connected to the current detection circuit 26.

The input circuit 22 is electrically connected to the input terminal 17 and the current-voltage control circuit 23. The input circuit 22 may include a Schmitt trigger circuit. The input circuit 22 is configured such as to shape a waveform of an electrical signal applied to the input terminal 17. A signal generated by the input circuit 22 is input to the current-voltage control circuit 23.

The current-voltage control circuit 23 is electrically connected to the protection circuit 24, the gate control circuit 12, the power-supply reverse connection protection circuit 27 and the malfunction detection circuit 28. The current-voltage control circuit 23 may include a logic circuit. The current-voltage control circuit 23 is configured such as to generate various voltages and currents in response to an electrical signal from the input circuit 22 and an electrical signal from the protection circuit 24. The current-voltage control circuit 23 includes a driving voltage generation circuit 29, a first constant voltage generation circuit 30, a second constant voltage generation circuit 31 and a reference voltage-reference current generation circuit 32, in this embodiment.

The driving voltage generation circuit 29 is configured such as to generate a driving voltage by which the gate control circuit 12 is driven. The driving voltage may be set to a value obtained by subtracting a predetermined value from the power supply voltage VB. The driving voltage generation circuit 29 may generate the driving voltage of not less than 5V and not more than 15V obtained by subtracting 5V from the power supply voltage VB. The driving voltage is input to the gate control circuit 12.

The first constant voltage generation circuit 30 is configured such as to generate a first constant voltage by which the protection circuit 24 is driven. The first constant voltage generation circuit 30 may include a Zener diode, a regulator circuit or the like (here Zener diode). The first constant voltage may be not less than 1V and not more than 5V. The first constant voltage is input to the protection circuit 24 (specifically a load open detection circuit 34, etc. described later).

The second constant voltage generation circuit 31 is configured such as to generate a second constant voltage by which the protection circuit 24 is driven. The second constant voltage generation circuit 31 may include a Zener diode, a regulator circuit or the like (here Zener diode). The second constant voltage may be not less than 1V and not more than 5V. The second constant voltage is input to the protection circuit 24 (specifically an overheat protection circuit 35, a low-voltage malfunction suppression circuit 36, etc. described later).

The reference voltage-reference current generation circuit 32 is configured such as to generate reference voltages and reference currents for various circuits. The reference voltages may be not less than 1V and not more than 5V. The reference currents may be not less than 1 mA and not more than 1A. The reference voltages and the reference currents are input to the various circuits. If the various circuits include a comparator, the reference voltage or the reference current may be input to the comparator.

The protection circuit 24 is electrically connected to the current-voltage control circuit 23, the gate control circuit 12, the malfunction detection circuit 28, the source of the power transistor 8 and the source of the sense transistor 21. The protection circuit 24 include an overcurrent protection circuit 33, a load open detection circuit 34, a overheat protection circuit 35 and a low-voltage malfunction suppression circuit 36.

The overcurrent protection circuit 33 is electrically connected to the gate control circuit 12 and the source of the sense transistor 21. The overcurrent protection circuit 33 is configured such as to protect the power transistor 8 from an overcurrent by detecting the output current flowing through the power transistor 8 and limiting the output current to a value less than a constant value. The overcurrent protection circuit 33 may include a current monitor circuit. A signal generated by the overcurrent protection circuit 33 is input to the gate control circuit 12.

The load open detection circuit 34 is electrically connected to the current-voltage control circuit 23 and the main source SM of the power transistor 8. The load open detection circuit 34 is configured such as to detect an open state of a load. A signal generated by the load open detection circuit 34 is input to the current-voltage control circuit 23.

The overheat protection circuit 35 is electrically connected to the current-voltage control circuit 23. The overheat protection circuit 35 is configured such as to monitor a temperature of the power transistor 8 and protect the power transistor 8 from an excessive temperature rise. The overheat protection circuit 35 is configured such as to forcibly control the power transistor 8 to the OFF-state when the temperature of the power transistor 8 reaches a predetermined threshold value, or when a temperature difference between the power transistor 8 and another circuit reaches a predetermined threshold value. The overheat protection circuit 35 may include a temperature sensitive device such as a temperature sensitive diode and a thermistor. A signal generated by the overheat protection circuit 35 is input to the current-voltage control circuit 23.

The low-voltage malfunction suppression circuit 36 is electrically connected to the current-voltage control circuit 23. The low-voltage malfunction suppression circuit 36 is configured such as to suppress a malfunction of the power transistor 8 in a case in which the power supply voltage VB is less than a predetermined value. A signal generated by the low-voltage malfunction suppression circuit 36 is input to the current-voltage control circuit 23.

The gate control circuit 12 is electrically connected to the current-voltage control circuit 23, the protection circuit 24, the n-number of main gates GM of the power transistor 8 and the gate of the sense transistor 21. The gate control circuit 12 may include an oscillation circuit, a charge pump circuit, etc. The gate control circuit 12 is configured such as to control an ON/OFF of the power transistor 8 in response to the electrical signal from the current-voltage control circuit 23 and the electrical signal from the protection circuit 24.

The gate control circuit 12 is configured such as to generate the n-number of gate signals G to be output to the n-number of gate wirings 14. The n-number of gate signals G is input to the power transistor 8 via the n-number of gate wirings 14. The ON/OFF of the power transistor 8 is thereby controlled. The gate control circuit 12 is also configured such as to control an ON/OFF of the sense transistor 21. The gate control circuit 12 is configured such as to generate a gate signal to be output to the gate of the sense transistor 21 in response to the electrical signal from the current-voltage control circuit 23 and the electrical signal from the protection circuit 24. The ON/OFF of the sense transistor 21 is thereby controlled. It is preferred that the sense transistor 21 is controlled at the same timing as the power transistor 8.

The active clamp circuit 25 is electrically connected to the drain terminal 15, the main gate GM of the power transistor 8 and the gate of the sense transistor 21. The active clamp circuit 25 is configured such as to protect the power transistor 8 from a counter electromotive force. The active clamp circuit 25 may include a plurality of diodes. The active clamp circuit 25 may have a diode pair including a first diode array and a second diode array that are connected in a reverse biased manner.

The first diode array includes a single or plurality of diodes that are connected in a series in a forward direction. The second diode array includes a single or plurality of diodes that are connected in a series in a forward direction and is connected to the first diode array in a reverse biased manner. The single or plurality of diodes that compose of the first diode array may include at least one of a pn-junction diode and a Zener diode. The single or plurality of diodes that compose of the second diode array may include at least one of a pn-junction diode and a Zener diode.

The current detection circuit 26 is electrically connected to the protection circuit 24, the malfunction detection circuit 28, the source of the power transistor 8 and the source of the sense transistor 21. The current detection circuit 26 is configured such as to detect the current flowing through the power transistor 8 and the sense transistor 21 and generate a current detection signal accordingly.

The power-supply reverse connection protection circuit 27 is electrically connected to the reference terminal 18 and the current-voltage control circuit 23. The power-supply reverse connection protection circuit 27 is configured such as to protect the current-voltage control circuit 23, the power transistor 8, etc. from a reverse voltage when the power supply is connected in reverse.

The malfunction detection circuit 28 is electrically connected to the current-voltage control circuit 23, the protection circuit 24 and the current detection circuit 26. The malfunction detection circuit 28 is configured such as to monitor a voltage of the protection circuit 24. The malfunction detection circuit 28 is configured such as to generate a malfunction detecting signal according to the voltage of the protection circuit 24, in a case in which a malfunction (voltage fluctuation, etc.) occurs in any of the overcurrent protection circuit 33, the load open detection circuit 34, the overheat protection circuit 35 and the low-voltage malfunction suppression circuit 36.

Specifically, the malfunction detection circuit 28 includes a first multiplexer circuit 37 and a second multiplexer circuit 38. The first multiplexer circuit 37 includes two input portions, a single output portion and a single selection input portion. The protection circuit 24 and the current detection circuit 26 are respectively connected to the input portions of the first multiplexer circuit 37. The second multiplexer circuit 38 is connected to the output portion of the first multiplexer circuit 37. The current-voltage control circuit 23 is connected to the selection input portion of the first multiplexer circuit 37.

The first multiplexer circuit 37 is configured such as to generate the malfunction detecting signal in response to the electrical signal from the current-voltage control circuit 23, the voltage detection signal from the protection circuit 24 and the current detection signal from the current detection circuit 26. The malfunction detecting signal generated by the first multiplexer circuit 37 is input to the second multiplexer circuit 38. The second multiplexer circuit 38 include two input portions and a single output portion. The output portion of the second multiplexer circuit 38 and the enable terminal 19 are respectively connected to the input of the second multiplexer circuit 38. The sense terminal 20 is connected to the output portion of the second multiplexer circuit 38.

In a case in which the MCU is connected to the enable terminal 19 and the resistor is connected to the sense terminal 20, an ON-signal is input to the enable terminal 19 from the MCU and the malfunction detecting signal is output from the sense terminal 20. The malfunction detecting is to be converted into a voltage signal by the resistor that is electrically connected to the sense terminal 20. The malfunction of the semiconductor device 1 is detected by that voltage signal.

Figure 8A:
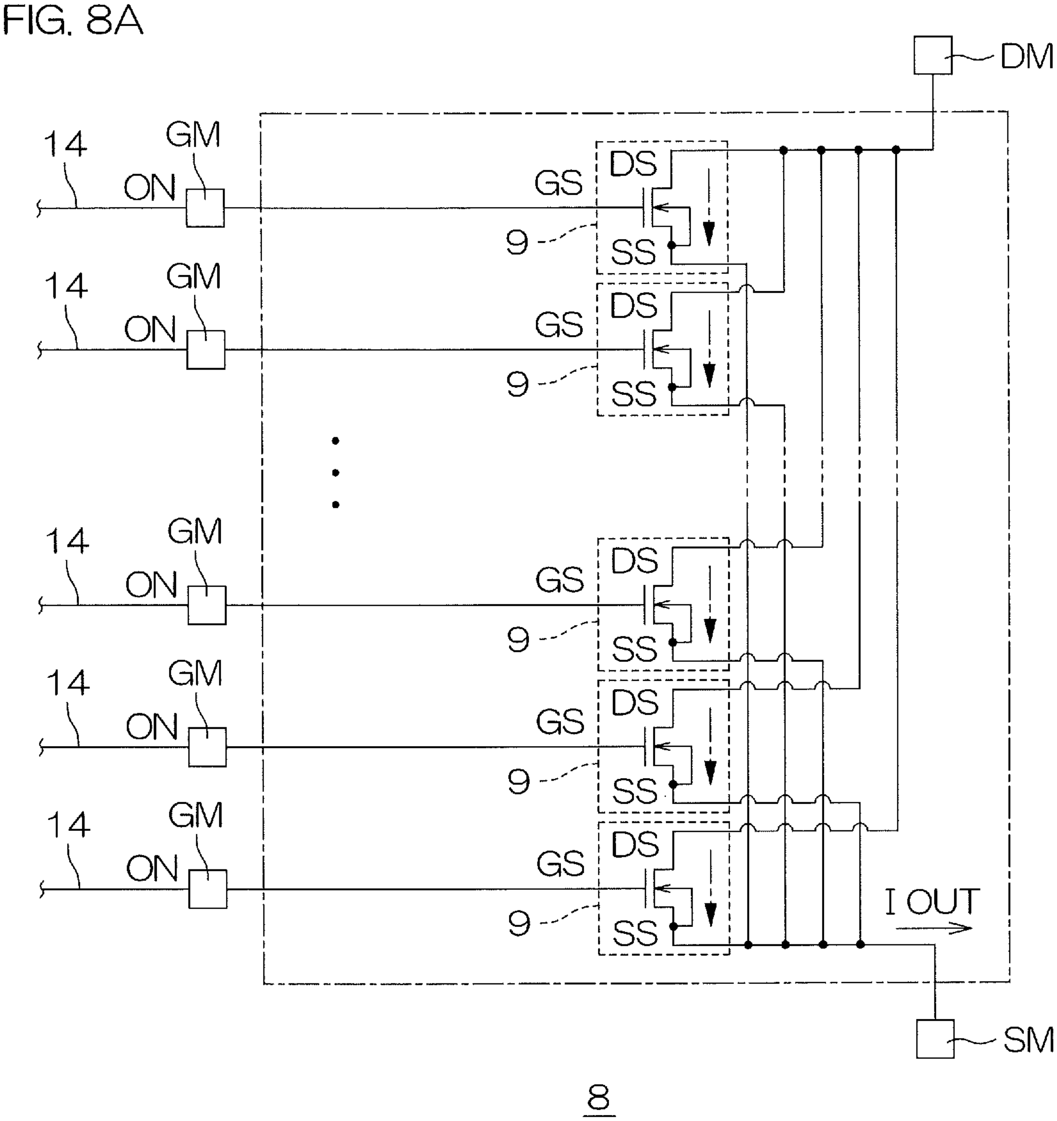
FIGS. 8A to 8C are circuit diagrams for describing operation examples to the power transistor.
Figure 8B:
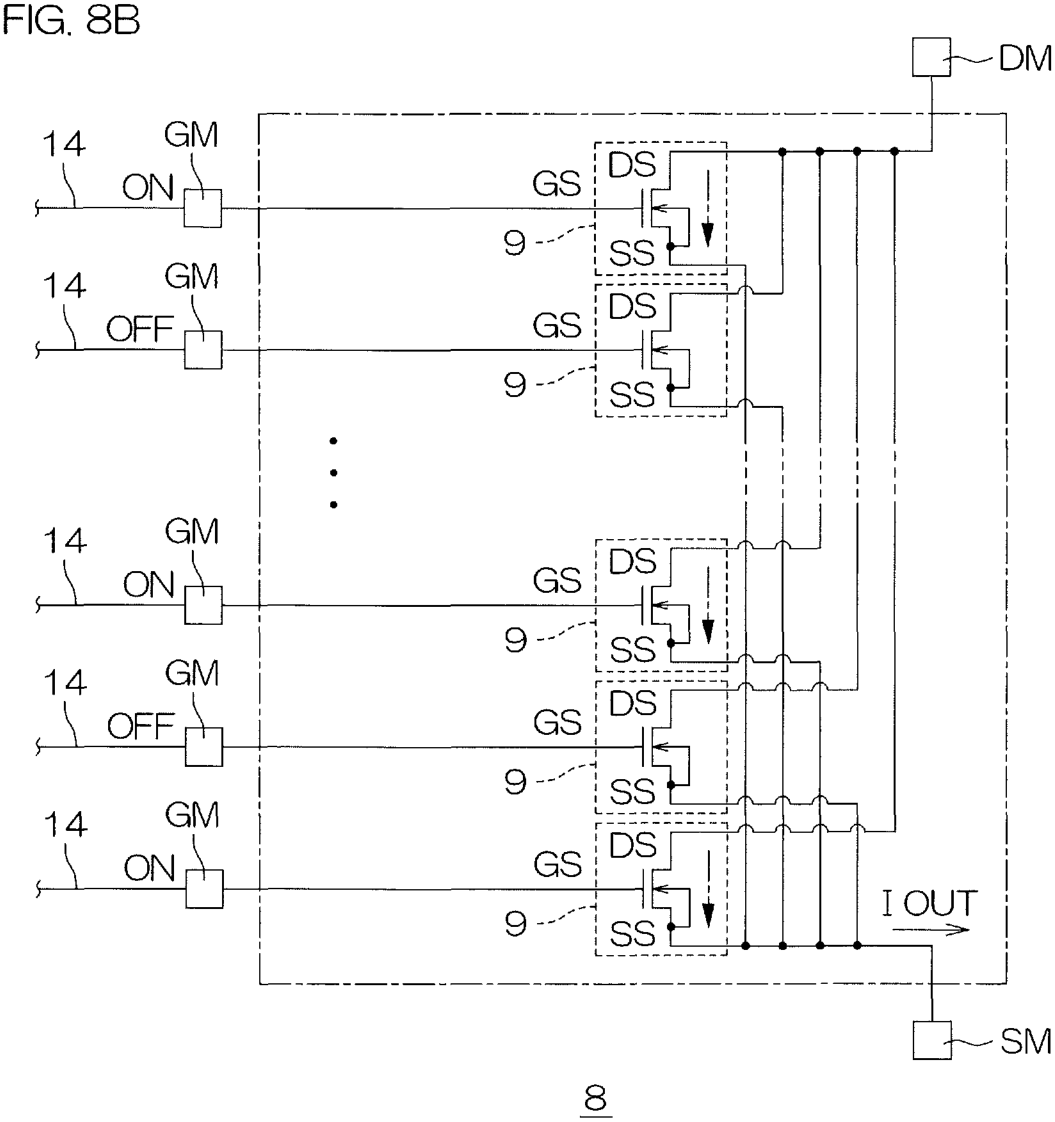
Figure 8C:
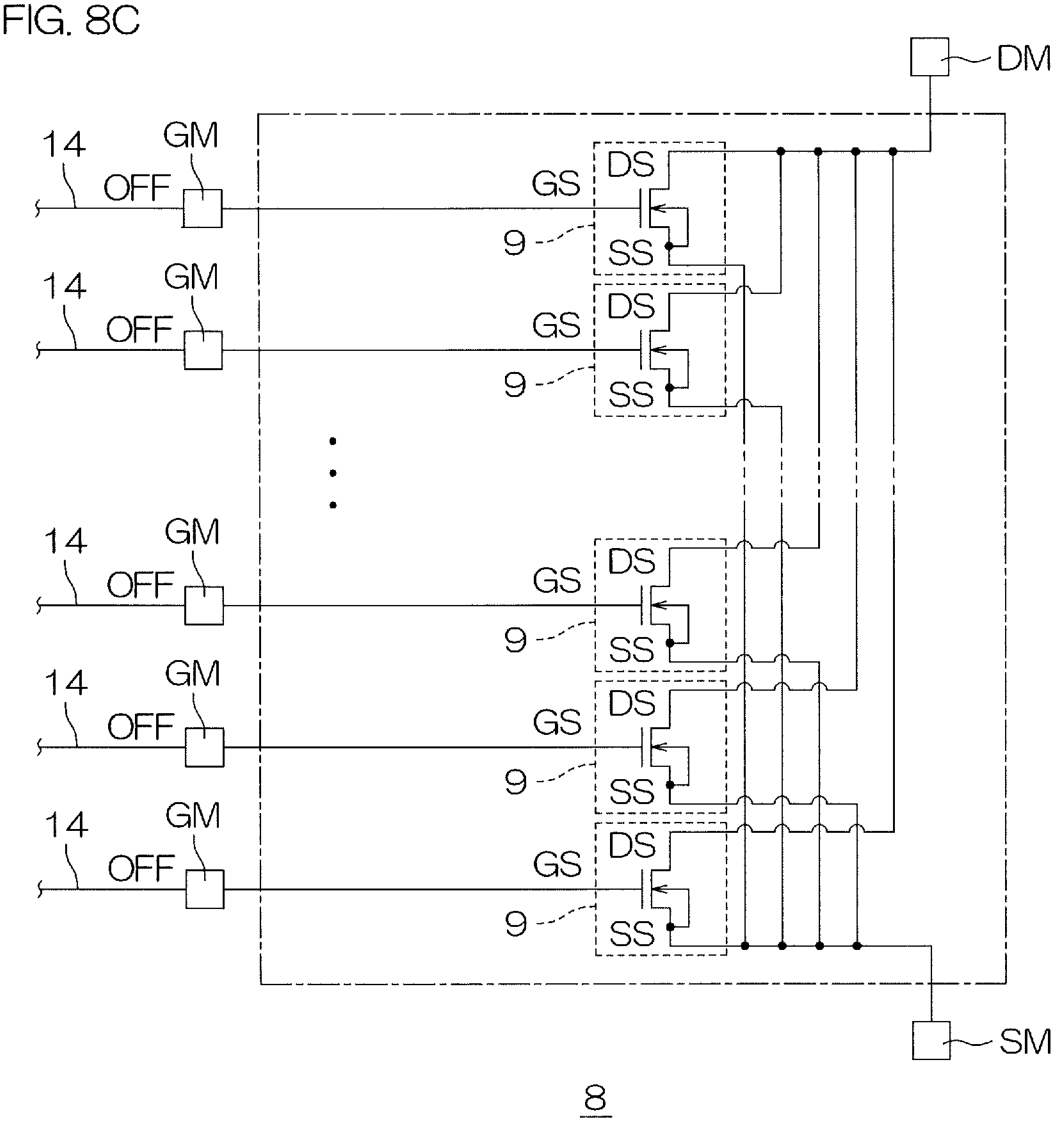

FIGS. 8A to 8C are circuit diagrams for describing operation examples to the power transistor 8. With reference to FIG. 8A, when the gate signals G exceeding the gate threshold voltages (that is, the ON-signals) are input to all of the n-number of gate wirings 14, all of the system transistors 9 are to be in the ON-states. In this case, the power transistor 8 is to be in the ON-state in a state in which all of current paths are conducted. The channel utilization of the power transistor 8 is therefore relatively increased and the ON-resistance Ron of the power transistor 8 is relatively decreased accordingly.

With reference to FIG. 8B, when the gate signals G exceeding the gate threshold voltages (that is, the ON-signals) are input to the x-number ($1 \leq x < n$) of gate wirings 14, and the gate signals G less than the gate threshold voltages (that is, the OFF-signals) are input to the ($n-x$)-number of gate wirings 14, the x-number of system transistors 9 are to be in the ON-states whereas the ($n-x$)-number of system transistors 9 are to be in the OFF-states. In this case, the power transistor 8 is to be in the ON-state in a state in which parts of the current paths are cutoff. The channel utilization of the power transistor 8 is therefore relatively decreased and the ON-resistance Ron of the power transistor 8 is relatively increased accordingly.

With reference to FIG. 8C, when the gate signals G less than the gate threshold voltages (that is, the OFF-signals) are input to all of the n-number of gate wirings 14, all of the current paths are cutoff. All of the system transistors 9 are therefore to be in the OFF-states and the power transistor 8 is to be in the OFF-state.

Figure 9:
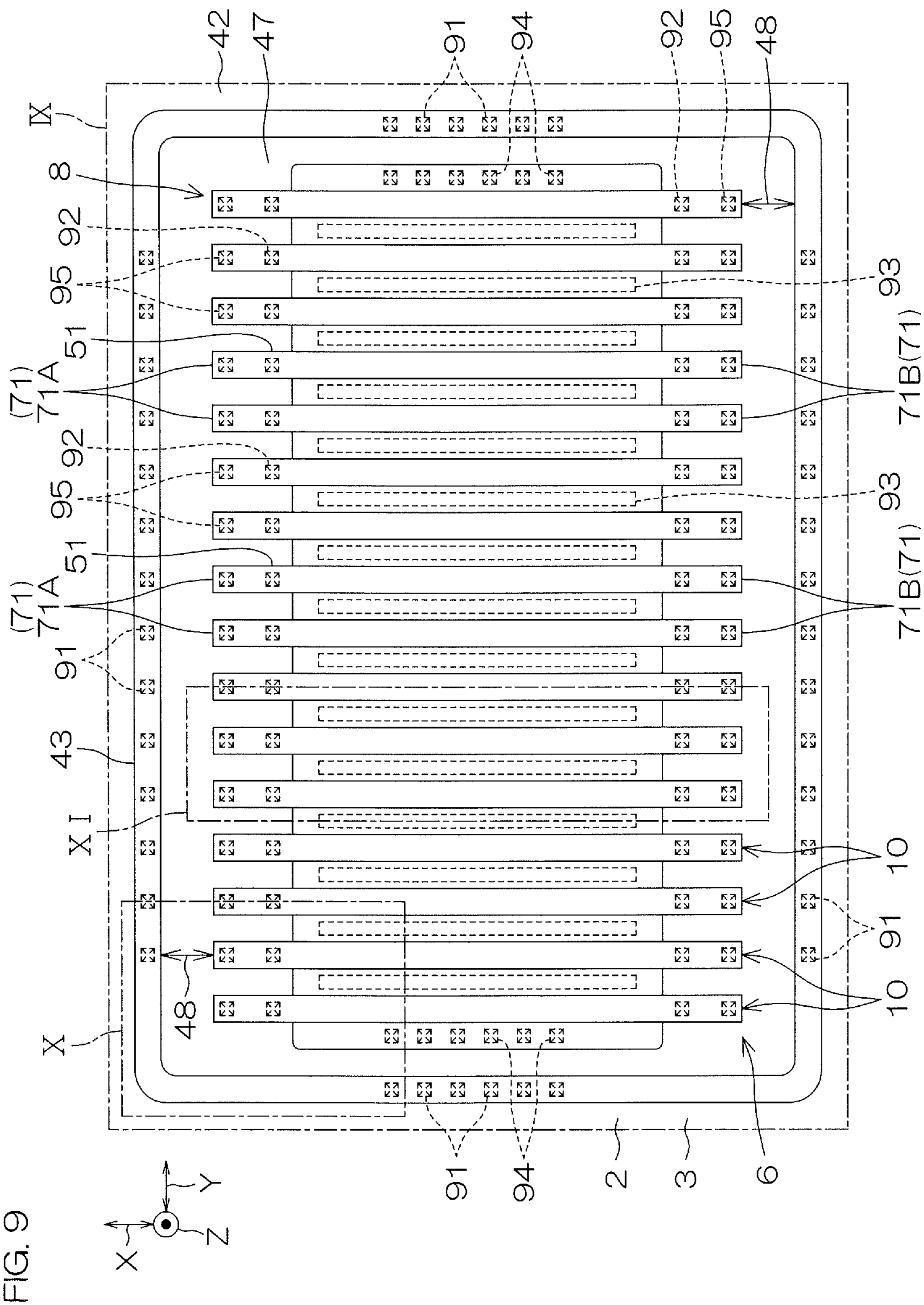
FIG. 9 is an enlarged view of a region IX shown in FIG. 3.
Figure 10:
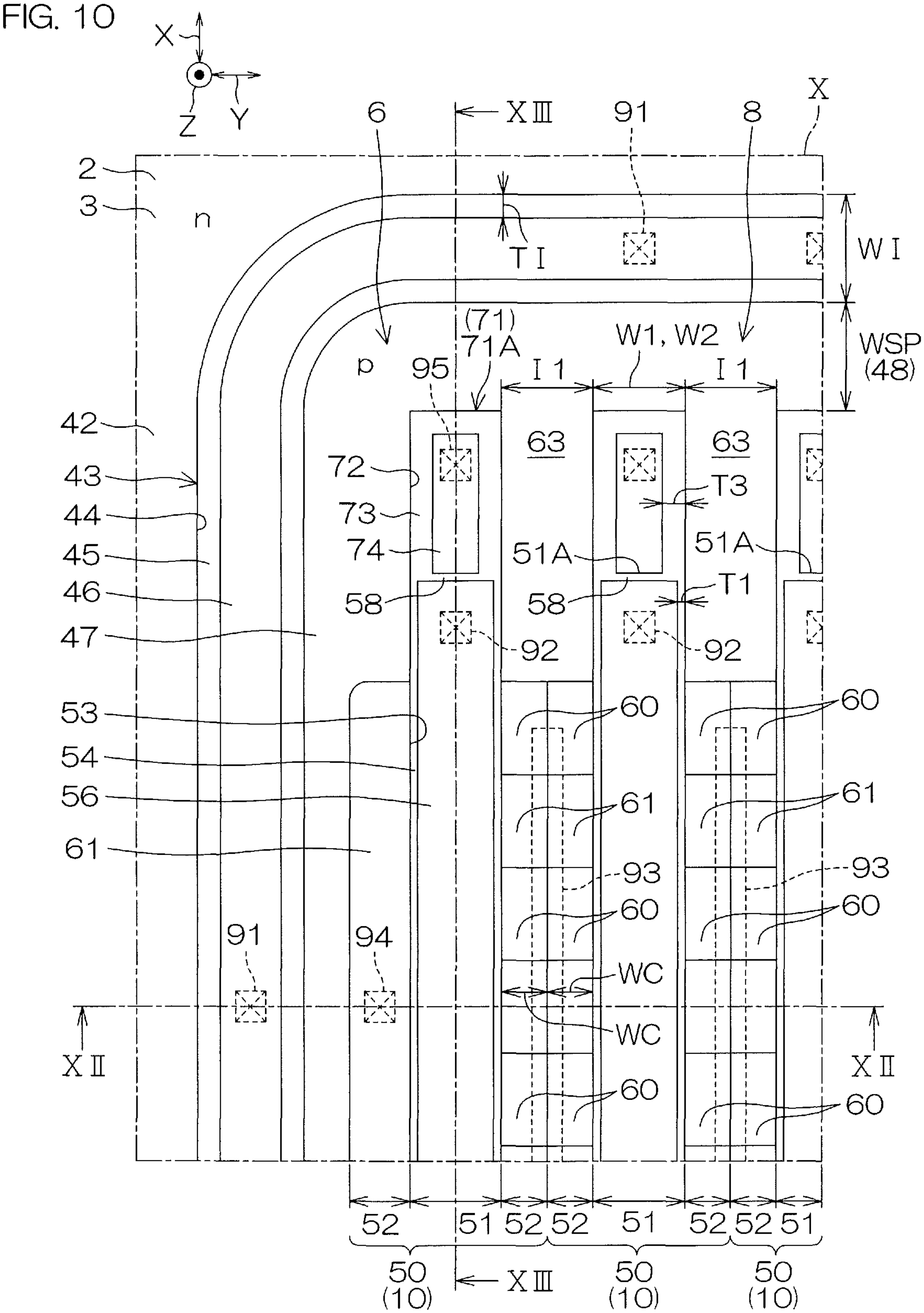
FIG. 10 is an enlarged view of a region X shown in FIG. 9.
Figure 11:
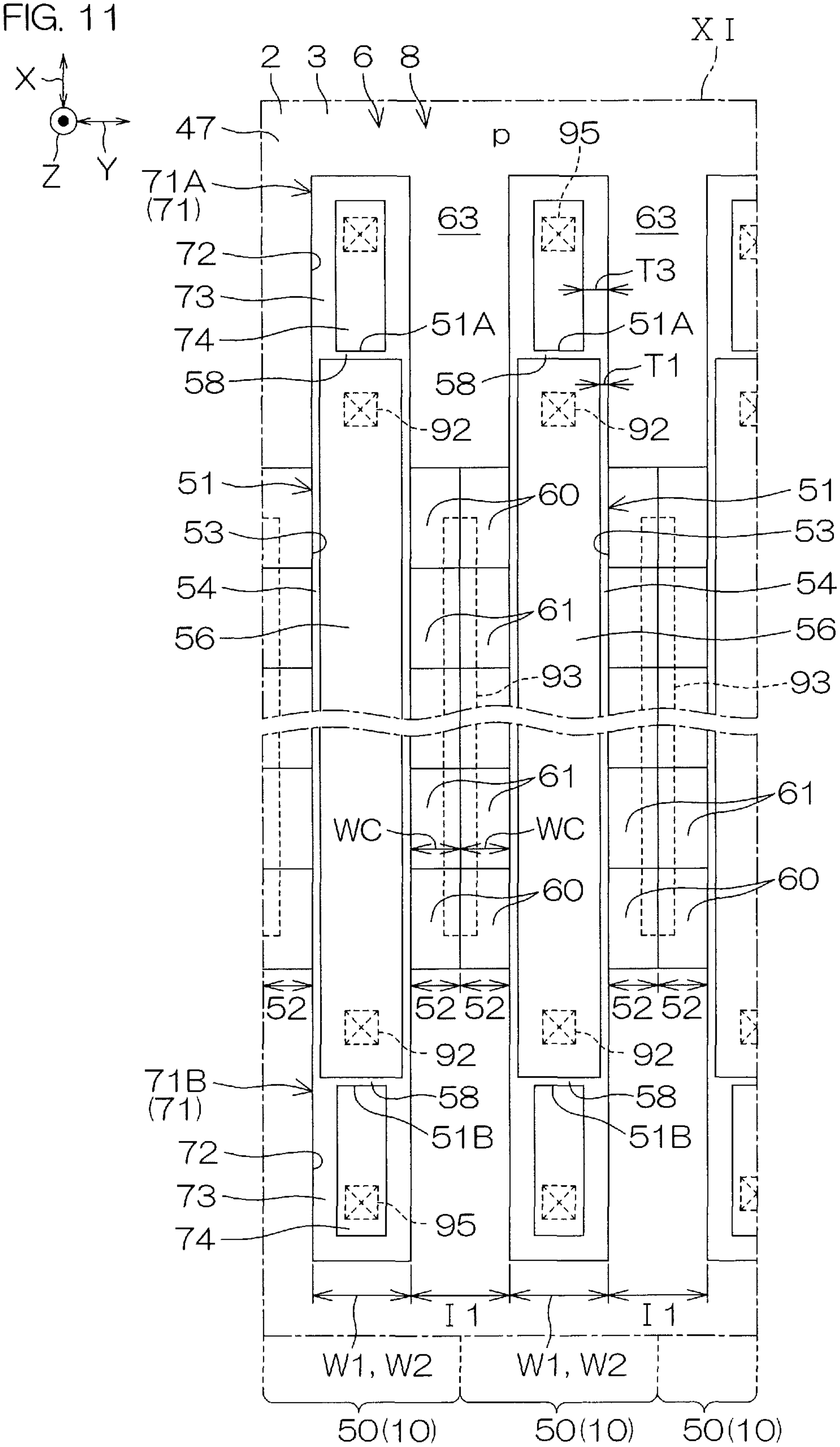
FIG. 11 is an enlarged view of a region XI with some parts omitted.
Figure 12:
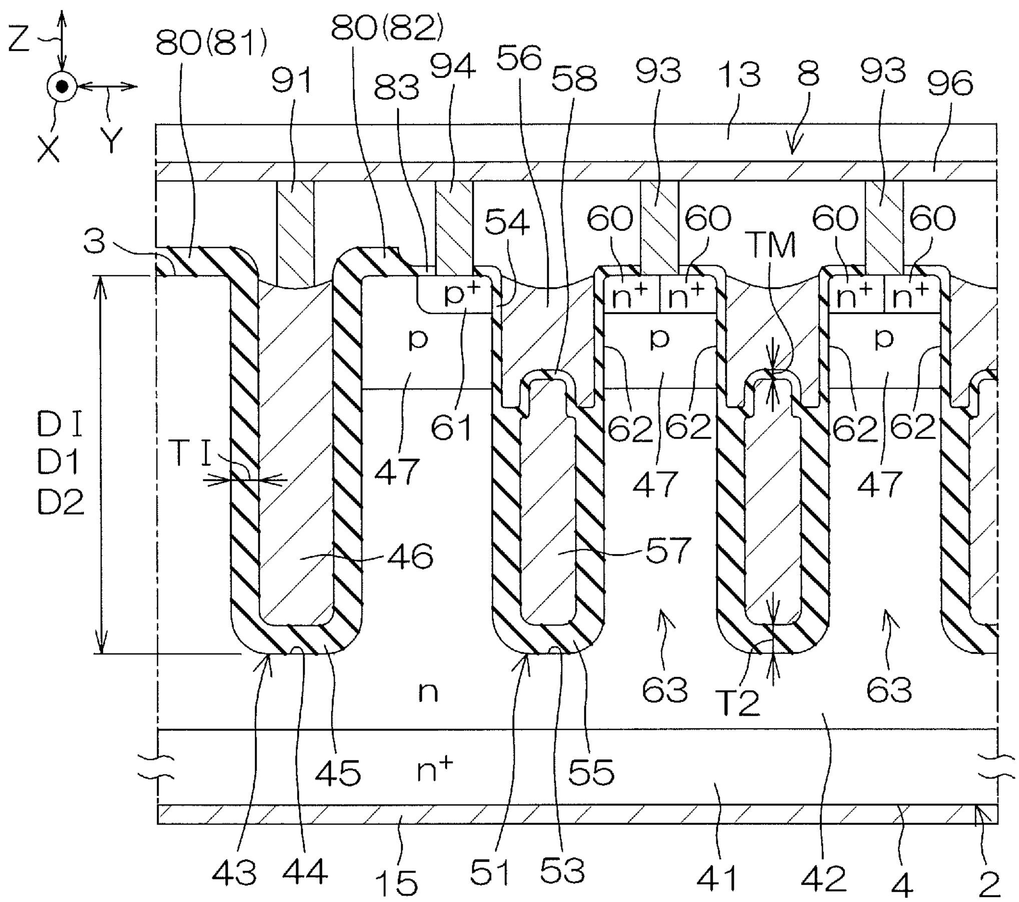
FIG. 12 is a sectional view taken along line XII-XII shown in FIG. 10.
Figure 13:
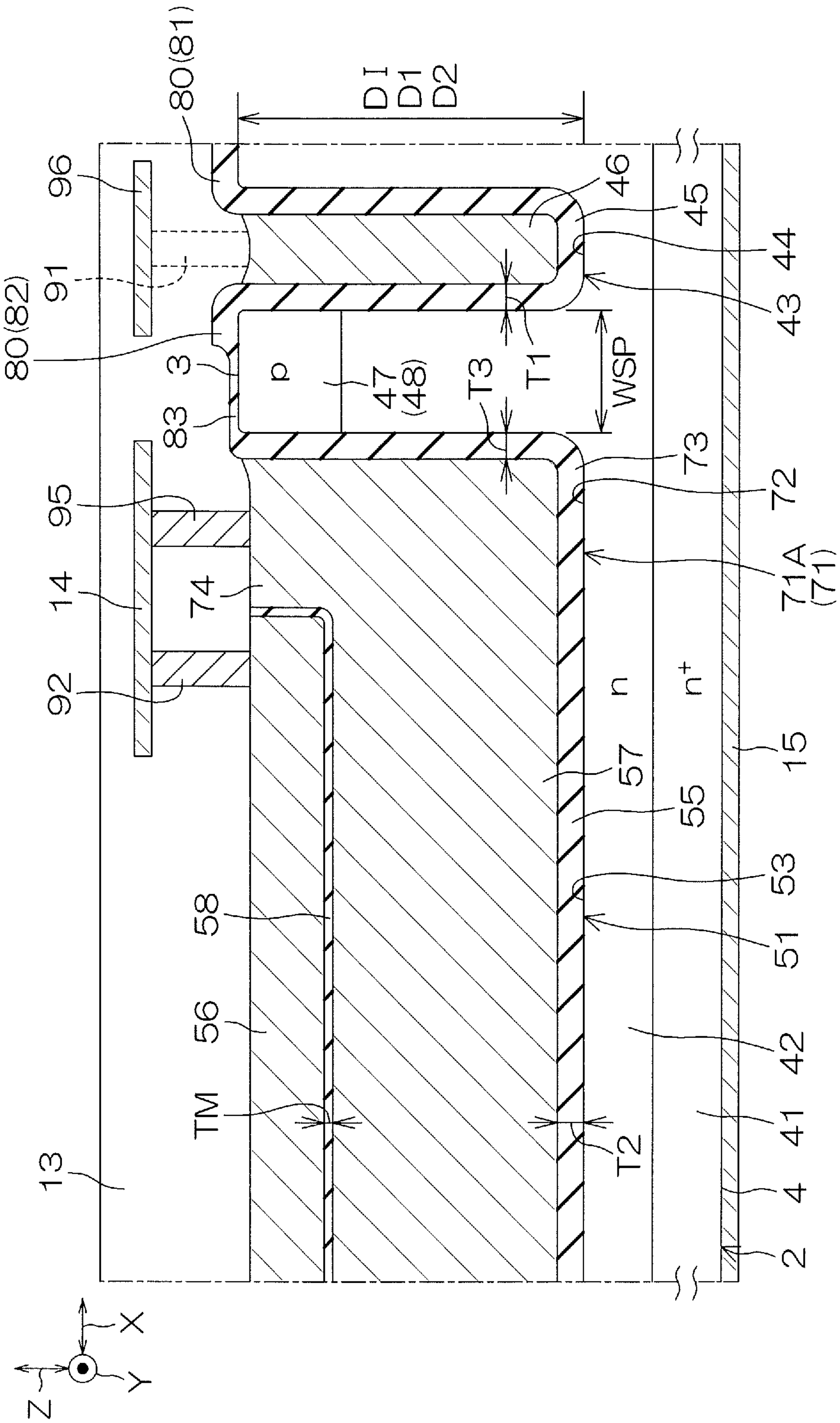
FIG. 13 is a sectional view taken along line XIII-XIII shown in FIG. 10.
Figure 14:
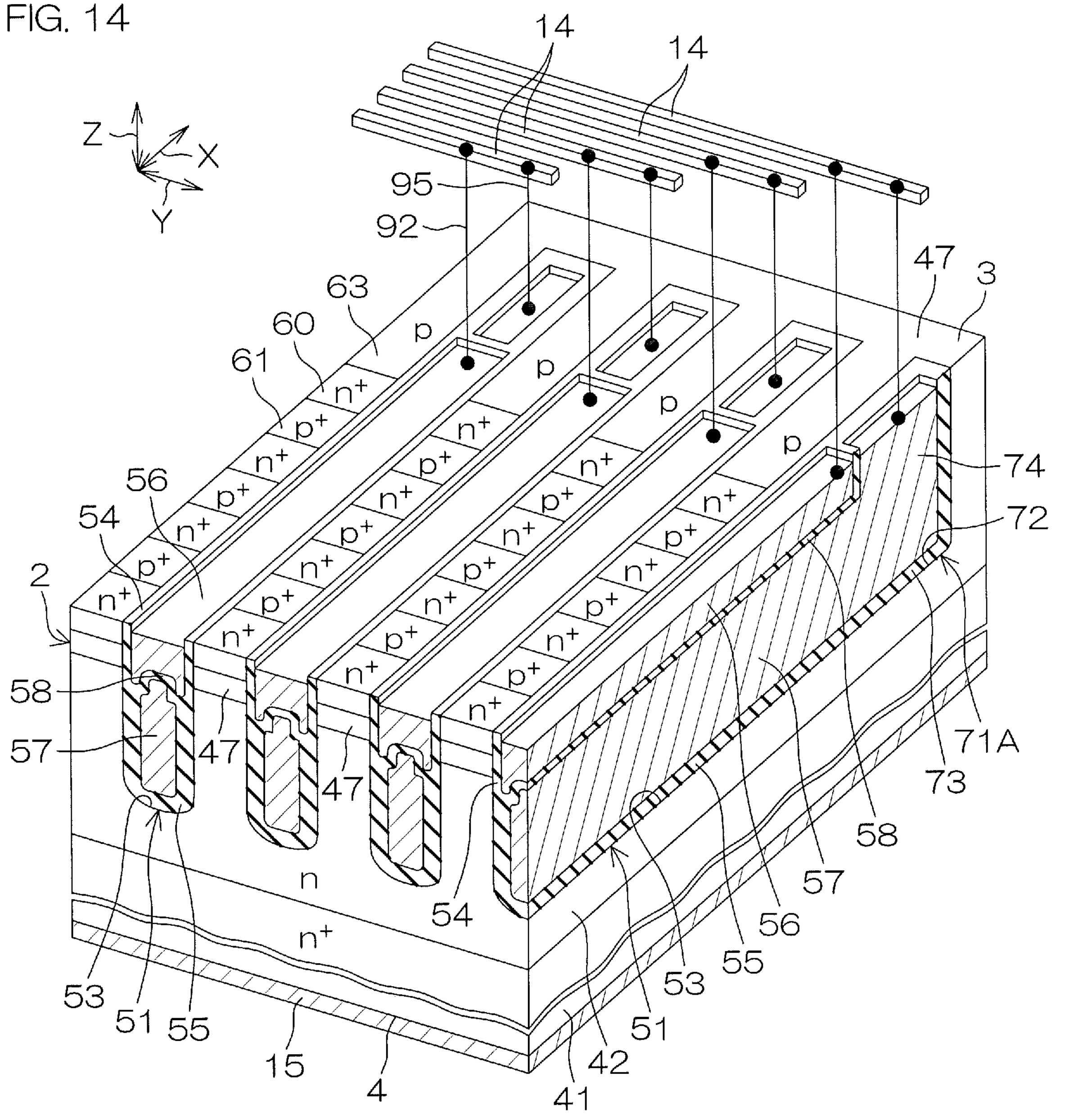
FIG. 14 is a sectional perspective view showing a principal portion of a first device region shown in FIG. 9.

Hereinafter, with reference to FIG. 9 to FIG. 14, a specific structure of the first device region 6 (the power transistor 8) shall be described. FIG. 9 is an enlarged view of a region IX shown in FIG. 3. FIG. 10 is an enlarged view of a region X shown in FIG. 9. FIG. 11 is an enlarged view of a region XI with some parts omitted. FIG. 12 is a sectional view taken along line XII-XII shown in FIG. 10. FIG. 13 is a sectional view taken along line XIII-XIII shown in FIG. 10. FIG. 14 is a sectional perspective view showing a principal portion of the first device region 6 shown in FIG. 9. In FIG. 14, for clarification, the structures on the first main surface 3 are omitted, and the gate wirings 14, etc. are shown by simplified.

With reference to FIG. 9 to FIG. 14 (FIG. 12 and FIG. 13 especially), the semiconductor device 1 includes an n-type (a first conductivity type) drain region 41 (a first impurity region) formed in a surface layer portion of the second main surface 4 of the semiconductor chip 2. The drain region 41 forms the main drain DM of the power transistor 8. The drain region 41 is formed in a whole region of the surface layer portion of the second main surface 4 and is exposed from the second main surface 4 and first to fourth side surfaces 5A to 5D. An n-type impurity concentration of the drain region 41 may be not less than $1\times10^{18}$ cm$^{-3}$ and not more than $1\times10^{21}$ cm$^{-3}$. The drain region 41 is formed by a semiconductor substrate (Si substrate), in this embodiment.

A thickness of the drain region 41 may be not less than 10 μm and not more than 450 μm. The thickness of the drain region 41 may be not less than 10 μm and not more than 50 μm, not less than 50 μm and not more than 150 μm, not less than 150 μm and not more than 250 μm, not less than 250 μm and not more than 350 μm, or, not less than 350 μm and not more than 450 μm. It is preferred that the thickness of the drain region 41 is not less than 50 μm and not more than 150 μm.

The semiconductor device 1 includes an n-type drift region 42 (a second impurity region) formed in the surface layer portion of the first main surface 3 of the semiconductor chip 2. The drift region 42 forms the main drain DM of the power transistor 8 together with the drain region 41. The drift region 42 is formed in a whole region of the surface layer portion of the first main surface 3 such as to be electrically connected to the drain region 41, and is exposed from the first main surface 3 and the first to fourth side surfaces 5A to 5D.

The drift region 42 has an n-type impurity concentration less than the n-type impurity concentration of the drain region 41. The n-type impurity concentration may be not less than $1\times10^{15}$ cm$^{-3}$ and not more than $1\times10^{18}$ cm$^{-3}$. The drift region 42 is formed by an epitaxial layer (Si epitaxial layer), in this embodiment.

The drift region 42 has a thickness less than the thickness of the drain region 41. The thickness of the drift region 42 may be not less than 5 μm and not more than 20 μm. The thickness of the drift region 42 may be not less than 5 μm and not more than 10 μm, not less than 10 μm and not more than 15 μm, or, not less than 15 μm and not more than 20 μm. It is preferred that the thickness of the drift region 42 is not less than 5 μm and not more than 15 μm.

The semiconductor device 1 includes a trench separation structure 43 that demarcates the first device region 6 at the first main surface 3, as an example of a region separation structure. The trench separation structure 43 may be referred to as a DTI (Deep Trench Isolation) structure or an STI (Shallow Trench Isolation) structure.

The trench separation structure 43 is formed in an annular shape enclosing a part of a region of the first main surface 3 and demarcates the first device region 6 having a predetermined shape in plan view. The trench separation structure 43 is formed in a quadrilateral annular shape having four sides parallel to the first to fourth side surfaces 5A to 5D in plan view, and demarcates the first device region 6 of a quadrilateral shape, in this embodiment. A planar shape of the trench separation structure 43 is arbitrary, and the trench separation structure 43 may be formed in a polygonal annular shape. The first device region 6 may be demarcated in a polygonal shape depending on the planar shape of the trench separation structure 43.

The trench separation structure 43 has a separation width WI. The separation width WI is a width in a direction orthogonal to a direction in which the trench separation structure 43 extends. The separation width WI may be not less than 0.5 μm and not more than 2.5 μm. The separation width WI may be not less than 0.5 μm and not more than 1 μm, not less than 1 μm and not more than 1.5 μm, not less than 1.5 μm and not more than 2 μm, or, not less than 2 μm and not more than 2.5 μm. It is preferred that the separation width WI is not less than 1.2 μm and not more than 2 μm.

The trench separation structure 43 has a separation depth DI. The separation depth DI may be not less than 1 μm and not more than 10 μm. The separation depth DI may be not less than 1 μm and not more than 2.5 μm, not less than 2.5 μm and not more than 5 μm, not less than 5 μm and not more than 7.5 μm, or, not less than 7.5 μm and not more than 10 μm. It is preferred that the separation depth DI is not less than 2 μm and not more than 6 μm.

An aspect ratio DI/WI of the trench separation structure 43 may exceed 1 and not more than 5. The aspect ratio DI/WI is a ratio of the separation depth DI with respect to the separation width WI. It is preferred that the aspect ratio DI/WI is not less than 2. It is preferred that a bottom wall of the trench separation structure 43 is formed at an interval of not less than 1 μm and not more than 10 μm from a bottom portion of the drift region 42. It is particularly preferred that the bottom wall of the trench separation structure 43 is formed at the interval of not less than 1 μm and not more than 5 μm from the bottom portion of the drift region 42.

The trench separation structure 43 has a corner portion connecting a portion extending in the first direction X and a portion extending in the second direction Y in an arc shape. The four corner portions of the trench separation structure 43 are each formed in the arc shape, in this embodiment. That is, the first device region 6 is demarcated in a quadrilateral shape having four corners each extending in an arc shape. It is preferred that the corner portions of the trench separation structure 43 each has the constant separation width WI along an arc direction.

The trench separation structure 43 has a single electrode structure including a separation trench 44, a separation insulating film 45 (a separation insulator) and a separation electrode 46. The separation trench 44 is digged down from the first main surface 3 toward the second main surface 4.

The separation trench 44 is formed at an interval form a bottom portion of the drift region 42 toward the first main surface 3.

The separation trench 44 includes a side wall and a bottom wall. An angle that the side wall of the separation trench 44 forms with the first main surface 3 inside the semiconductor chip 2 may be not less than 90° and not more than 92°. The separation trench 44 may be formed in a tapered shape that an opening width is gradually narrowed from an opening to the bottom wall. It is preferred that a corner of the bottom wall of the separation trench 44 is formed in a curved shape. A whole of the bottom wall of the separation trench 44 may be formed in a curved shape toward the second main surface 4.

The separation insulating film 45 is formed on a wall surface of the separation trench 44. Specifically, the separation insulating film 45 is formed in a film shape on a whole region of the wall surface of the separation trench 44, and demarcates a recessed space of a U-shape inside the separation trench 44. The separation insulating film 45 includes a silicon oxide film in this embodiment.

The separation insulating film 45 has a separation thickness TI. The separation thickness TI is a thickness of the separation insulating film 45 along a normal direction to the wall surface of the separation trench 44. The separation thickness TI may be not less than 0.1 μm and not more than 1 μm. The separation thickness TI may be not less than 0.1 μm and not more than 0.25 μm, not less than 0.25 μm and not more than 0.5 μm, not less than 0.5 μm and not more than 0.75 μm, or, not less than 0.75 μm and not more than 1 μm. It is preferred that the separation thickness TI is not less than 0.15 μm and not more than 0.65 μm.

The separation electrode 46 is embedded in the separation trench 44 across the separation insulating film 45 as an integrated member. The separation electrode 46 includes a conductive polysilicon, in this embodiment. The source voltage (e.g. the ground voltage) as the reference voltage may be applied to the separation electrode 46.

The semiconductor device 1 includes a p-type (second conductivity type) body region 47 that is formed in the surface layer portion of the first main surface 3 at the first device region 6. A p-type impurity concentration of the body region 47 may be not less than $1\times10^{18}$ $cm^{-3}$ and not more than $1\times10^{18}$ $cm^{-3}$. The body region 47 is formed in a whole region of the surface layer portion of the first main surface 3 at the first device region 6, and is in contact with the trench separation structure 43. The body region 47 is formed in a region at a side of the first main surface 3 with respect to the bottom wall of the trench separation structure 43. Specifically, the body region 47 is formed in a region at the side of the first main surface 3 with respect to an intermediate portion of the trench separation structure 43.

The semiconductor device 1 includes a body space 48 formed along an inner peripheral wall of the trench separation structure 43, in the first device region 6. The body space 48 consists of a part of the body region 47. The body space 48 is formed in an annular shape along the inner peripheral wall of the trench separation structure 43 and encloses an interior of the first device region 6 in plan view.

The body space 48 has a space width WSP. The space width WSP may be not less than the separation width WI (WI≤WSP), or may be not more than the separation width WI (WSP<WI). It is preferred that the body space 48 has a constant space width WSP along the inner peripheral wall of the trench separation structure 43. The space width WSP may be not less than 1 μm and not more than 2.5 μm. The space width WSP may be not less than 1 μm and not more than 1.5 μm, not less than 1.5 μm and not more than 2 μm, or, not less than 2 μm and not more than 2.5 μm. It is preferred that the space width WSP is not less than 1.2 μm and not more than 2 μm.

The semiconductor device 1 includes the power transistor 8 formed in the first main surface 3 at the first device region 6. The power transistor 8 is formed in the first main surface 3 at an interval of the space width WSP from the trench separation structure 43. The power transistor 8 thus opposes the trench separation structure 43 with the body space 48 therebetween.

Specifically, the power transistor 8 includes the plurality of unit transistors 10 collectively formed in the first main surface 3 at the first device region 6. In FIG. 9, an example in which 16-number of the unit transistors 10 are formed, but the number of the unit transistor 10 is arbitrary. The plurality of unit transistors 10 are each formed in a band shape (a rectangular shape) extending in the first direction X and arrayed in a row along the second direction Y in plan view. The plurality of unit transistors 10 are thus formed in a stripe shape extending in the first direction X in plan view.

With reference to FIG. 10 and FIG. 11, specifically, the plurality of unit transistors 10 are each configured with a unit cell 50. Each of the unit cell 50 includes a trench gate structure 51 and a channel cell 52 to be controlled by the trench gate structure 51. The channel cell 52 is a region in which an opening and a closing of a current path are controlled by the trench gate structure 51. The unit cell 50 includes a pair of the channel cell 52 formed at both sides of the single trench gate structure 51, in this embodiment.

A cell width of the unit cell 50 may be not less than 1 μm and not more than 5 μm. The cell width is a width in a direction orthogonal to a direction extending the unit cell 50 (that is, the second direction Y). A length of the unit cell 50 in the first direction X is arbitrary and is adjusted according to a length of the trench gate structure 51. Hereinafter, a structure of the single unit transistor 10 (the unit cell 50) will be described and thereafter arrangements of the plurality of unit transistors 10 (the unit cell 50) will be described.

The trench gate structure 51 is formed in a band shape (a rectangular shape) extending in the first direction X in plan view. The trench gate structure 51 has a first end portion 51A at one side and a second end portion 51B at the other side, regarding the first direction X (a longitudinal direction).

The trench gate structure 51 has a first width W1. The first width W1 is a width in a short direction (the second direction Y) of the trench gate structure 51. The first width W1 may be substantially equal to the separation width WI of the trench separation structure 43 (W1≈WI). It is preferred that the first width W1 is less than the separation width WI (W1<WI). It is preferred that the first width W1 is less than the space width WSP (W1<WSP). The first width W1 may be not less than 0.5 μm and not more than 2 μm. The first width W1 may be not less than 0.5 μm and not more than 1 μm, not less than 1 μm and not more than 1.5 μm, or, not less than 1.5 μm and not more than 2 μm. It is preferred that the first width W1 is not less than 0.5 μm and not more than 1.5 μm.

The trench gate structure 51 has a first depth D1. The first depth D1 may be substantially equal to the separation depth DI of the trench separation structure 43 (D1≈DI). It is preferred that the first depth D1 is less than the separation depth DI (D1<DI). The first depth D1 may be not less than 1 μm and not more than 10 μm. The first depth D1 may be not less than 1 μm and not more than 2.5 μm, not less than 2.5 μm and not more than 5 μm, not less than 5 μm and not more than 7.5 μm, or, not less than 7.5 μm and not more than 10 μm. It is preferred that the first depth D1 may be not less than 2 μm and not more than 6 μm.

An aspect ratio D1/W1 of the trench gate structure 51 may exceed 1 and not more than 5. The aspect ratio D1/W1 is a ratio of the first depth D1 with respect to the first width W1. It is particularly preferred that the aspect ratio D1/W1 is not less than 2. It is preferred that a bottom wall of the trench gate structure 51 is formed at an interval of not less than 1 μm and not more than 10 μm from the bottom portion of the drift region 42. It is particularly preferred that the bottom wall of the trench gate structure 51 is formed at the interval of not less than 1 μm and not more than 5 μm from the bottom portion of the drift region 42.

The trench gate structure 51 has a multiple electrode structure including a gate trench 53, an upper insulating film 54, a lower insulating film 55, an upper electrode 56, a lower electrode 57 and a middle insulating film 58. The upper insulating film 54, the lower insulating film 55 and the middle insulating film 58 configure a first insulator. The upper electrode 56 and the lower electrode 57 are therefore embedded in the gate trench 53 such as to be vertically insulated and separated by the first insulator.

The gate trench 53 is digged down form the first main surface 3 toward the second main surface 4. The gate trench 53 penetrates the body region 47, and is formed at an interval from the bottom portion of the drift region 42 toward the first main surface 3.

The gate trench 53 includes a side wall and a bottom wall. An angle that the side wall of the gate trench 53 forms with the first main surface 3 inside the semiconductor chip 2 may be not less than 90° and not more than 92°. The gate trench 53 may be formed in a tapered shape that an opening width is gradually narrowed from an opening to the bottom wall. It is preferred that a corner of the bottom wall of the gate trench 53 is formed in a curved shape. A whole of the bottom wall of the gate trench 53 may be formed in a curved shape toward the second main surface 4.

The upper insulating film 54 covers an upper wall surface of the gate trench 53. Specifically, the upper insulating film 54 covers the upper wall surface located at an opening side of the gate trench 53 with respect to the bottom portion of the body region 47. A lower portion of the upper insulating film 54 crosses a boundary of the drift region 42 and the body region 47. The upper insulating film 54 has a portion that covers the body region 47 and a portion that covers the drift region 42. A covering area of the upper insulating film 54 with respect to the body region 47 is greater than a covering area of the upper insulating film 54 with respect to the drift region 42. The upper insulating film 54 includes a silicon oxide in this embodiment. The upper insulating film 54 is formed as a gate insulating film.

The upper insulating film 54 has a first thickness T1 less than the separation thickness TI of the separation insulating film (T1<TI). The first thickness T1 is a thickness of the upper insulating film 54 along a normal direction to the wall surface of the gate trench 53. The first thickness T1 may be not less than 0.01 μm and not more than 0.05 μm. The first thickness T1 may be not less than 0.01 μm and not more than 0.02 μm, not less than 0.02 μm and not more than 0.03 μm, not less than 0.03 μm and not more than 0.04 μm, or, not less than 0.04 μm and not more than 0.05 μm. It is preferred that the first thickness T1 is not less than 0.02 μm and not more than 0.04 μm.

The lower insulating film 55 covers a lower wall surface of the gate trench 53. Specifically, the lower insulating film 55 covers the lower wall surface located at a bottom wall side region of the gate trench 53 with respect to the bottom portion of the body region 47. The lower insulating film 55 demarcates a recessed space of a U-shape at the bottom wall side region of the gate trench 53. The lower insulating film 55 is in contact with the drift region 42. The lower insulating film 55 includes a silicon oxide in this embodiment. The lower insulating film 55 is formed as a field insulating film.

The lower insulating film 55 has a second thickness T2 exceeding the first thickness T1 of the upper insulating film 54 (T1<T2). The second thickness T2 may be substantially equal to the separation thickness TI of the separation insulating film 45 (T2≈TI). The second thickness T2 is a thickness of the lower insulating film 55 along the normal direction to the wall surface of the gate trench 53. The second thickness T2 may be not less than 0.1 μm and not more than 1 μm. The second thickness T2 may be not less than 0.1 μm and not more than 0.25 μm, not less than 0.25 μm and not more than 0.5 μm, not less than 0.5 μm and not more than 0.75 μm, or, not less than 0.75 μm and not more than 1 μm. It is preferred that the second thickness T2 is not less than 0.15 μm and not more than 0.65 μm.

The upper electrode 56 is embedded in an upper side (an opening side) inside the gate trench 53 across the upper insulating film 54. The upper electrode 56 is formed in a band shape (a rectangular shape) extending in the first direction X in plan view. The upper electrode 56 opposes the body region 47 and the drift region 42 across the upper insulating film 54. An opposing area of the upper electrode 56 with respect to the body region 47 is greater than an opposing area of the upper electrode 56 with respect to the drift region 42. The upper electrode 56 includes a conductive polysilicon in this embodiment. The upper electrode 56 is formed as a gate electrode. The gate signal G is applied to the upper electrode 56.

The lower electrode 57 is embedded in a lower side (the bottom wall side) inside the gate trench 53 across the lower insulating film 55. The lower electrode 57 opposes the drift region 42 across the lower insulating film 55. The lower electrode 57 has an upper end portion that protrudes toward the side of the first main surface 3 from the lower insulating film 55. The upper end portion of the lower electrode 57 is extending toward the upper electrode 56 such as to be engaged into a bottom portion of the upper electrode 56. The upper end portion of the lower electrode 57 thus opposes the upper insulating film 54 across the bottom portion of the upper electrode 56, regarding the second direction Y.

The lower electrode 57 includes a conductive polysilicon in this embodiment. The lower electrode 57 is formed as a gate electrode in this embodiment. The gate signal G is thereby input to the lower electrode 57 at the same timing as the upper electrode 56. That is, the upper electrode 56 and the lower electrode 57 arranged in the common gate trench 53 are controlled simultaneously. A voltage drop between the upper electrode 56 and the lower electrode 57 can thus be suppressed, and therefore an electric field concentration between the upper electrode 56 and the lower electrode 57 can be suppressed. Also, the ON-resistance Ron of the semiconductor chip 2 (particularly the drift region 42) can be reduced. This structure is particularly effective when the semiconductor device 1 is provided as an in-vehicle device.

The middle insulating film 58 is interposed between the upper electrode 56 and the lower electrode 57 and electrically isolates the upper electrode 56 and the lower electrode 57. Specifically, the middle insulating film 58 covers the lower electrode 57 (the upper end portion) exposed from the lower insulating film 55 in a region between the upper electrode 56 and the lower electrode 57. The middle insulating film 58 is continued to the upper insulating film 54 and the lower insulating film 55. The middle insulating film 58 includes a silicon oxide in this embodiment.

The middle insulating film 58 has the middle thickness TM less than the second thickness T2 of the lower insulating film 55 (TM<T2), regarding the normal direction Z. The middle thickness TM may be not less than 0.01 μm and not more than 0.05 μm. The middle thickness TM may be not less than 0.01 μm and not more than 0.02 μm, not less than 0.02 μm and not more than 0.03 μm, not less than 0.03 μm and not more than 0.04 μm, not less than 0.04 μm and not more than 0.05 μm. It is preferred that the middle thickness TM is not less than 0.02 μm and not more than 0.04 μm.

The pair of channel cells 52 are each formed in a band shape extending in the first direction X at the both sides of the trench gate structure 51. The pair of channel cells 52 each has a channel width WC. The channel width WC may be not less than 0.1 μm and not more than 1 μm.

The pair of channel cells 52 each includes an n-type source region 60 formed in a surface layer portion of the body region 47. A number of the source region 60 included in the pair of channel cells 52 is arbitrary. The pair of channel cells 52 each includes a plurality of the source regions 60 in this embodiment. The single or plurality of source regions 60 included in the unit cell 50 forms the unit source SU of the unit transistor 10 (a part of the main source SM of the power transistor 8).

An n-type impurity concentration of the source region 60 exceeds the n-type impurity concentration of the drift region 42. The n-type impurity concentration of the source region 60 may be not less than $1\times10^{18}$ $cm^{-3}$ and not more than $1\times10^{21}$ $cm^{-3}$. The plurality of source regions 60 are formed at intervals in the first direction X in each of the channel cells 52. Bottom portions of the plurality of source regions 60 are located in a region at the side of the first main surface 3 with respect to the bottom portion of the body region 47.

The pair of channel cells 52 each includes a p-type contact region 61 formed in a region different from the source region 60 in the surface layer portion of the body region 47. A number of the contact region 61 included in the pair of channel cells 52 is arbitrary. The pair of channel cells 52 each includes a plurality of the contact regions 61 in this embodiment. A p-type impurity concentration of the contact region 61 exceeds the p-type impurity concentration of the body region. The p-type impurity concentration of the contact region 61 may be not less than $1\times10^{18}$ $cm^{-3}$ and not more than $1\times10^{21}$ $cm^{-3}$.

The plurality of contact regions 61 are formed at intervals in the first direction X in each of the channel cells 52. Specifically, the plurality of contact regions 61 are alternately formed with the plurality of source regions 60 in the first direction X such as to sandwich one of the source regions 60. Bottom portions of the plurality of contact regions 61 are located in a region at the side of the first main surface 3 with respect to the bottom portion of the body region 47.

The pair of channel cells 52 include a plurality of channel regions 62 defined between the plurality of source regions 60 and the drift region 42 inside the body region 47. ONs/OFFs of the plurality of channel regions 62 are simultaneously controlled by the trench gate structure 51. The plurality of channel regions 62 therefore form a single channel of the unit transistor 10.

A plurality of the unit cells 50 are formed such that a plurality of the trench gate structures 51 are arranged in a row in the second direction Y at intervals of the first intervals I1. That is, the plurality of trench gate structures 51 are each formed in a band shape extending in the first direction X and are formed at intervals of the first intervals I1 in the second direction Y in the first device region 6 in plan view. That is, the plurality of unit cells 50 (the plurality of trench gate structures 51) are formed in a stripe shape extending in the first direction X in plan view.

Mesa portions 63 of mesa shapes extending in the first direction X are respectively demarcated in regions between the pairs of the adjacent trench gate structures 51. That is, the plurality of trench gate structures 51 are alternately formed with the plurality of mesa portions 63 in the second direction Y such as to sandwich one of the mesa portions 63.

The plurality of unit cells 50 are formed such that the channel cells 52 are integrated with each other in the mesa portions 63 located between the pairs of the adjacent unit cells 50 in this embodiment. The plurality of source regions 60 and the plurality of contact regions 61 are alternately formed along the first direction X in the surface layer portion of the body region 47 at each of the mesa portions 63. The plurality of unit cells 50 are each formed by regions between central portions of the pairs of the adjacent mesa portions 63, respectively, in this embodiment.

Even with such a structure, the ONs/OFFs of the channel regions 62 of the respective unit cells 50 are controlled in the respective unit cells 50. When focusing on a pair of the adjacent unit cells 50, in a case in which one unit cell 50 (one trench gate structure 51) is controlled to the ON-state, the channel regions 62 of the one unit cell 50 is to be the ON-state whereas the channel regions 62 of the other unit cell 50 is not to be the ON-state. The plurality of unit cells 50 (the trench gate structures 51) are therefore electrically independent of each other unless an electrical connection from the outside is provided. Each of the unit cells 50 therefore functions as the single unit transistor 10.

The trench gate structures 51 of the two unit cells 50 that are arranged at both sides regarding the second direction Y are each formed at an interval of the space width WSP from the trench separation structure 43 toward the first direction X. The two unit cells 50 arranged at the both sides are free from the source region 60 in the channel cells 52 at sides of the trench separation structure 43 in this embodiment. According to this structure, main current paths can be limited to the mesa portions 63, and at the same time, a leakage current between the trench gate structures 51 and the trench separation structure 43 can be suppressed.

The two unit cells 50 arranged at the both sides each includes only the contact region 61 (hereinafter, referred to as "the outermost contact region 61") in the channel cell 52 at the side of the trench separation structure 43 in this embodiment. It is preferred that the outermost contact regions 61 are spaced from the trench separation structure 43 toward the trench gate structures 51. The outermost contact regions 61 are each connected to the side wall of the corresponding trench gate structure 51. The outermost contact region 61 may be formed in a band shape extending along the side wall of the corresponding trench gate structure 51.

With reference to FIG. 10 and FIG. 11, the first interval I1 is equivalent to a value obtained by doubling the channel width WC in this embodiment. It is preferred that the first interval I1 is set such that depletion layers extending from the plurality of trench gate structures 51 are integrated at regions below the bottom walls of the plurality of trench gate structures 51. The first interval I1 may be not less than 0.25 times of the first width W1 and not more than 1.5 times of the first width W1. It is preferred that the first interval I1 is not more than the first width W1 (I1≤W1). It is preferred that the first interval I1 is less than the space width WSP (I1≤WSP).

The first interval I1 may be not less than 0.5 μm and not more than 2 μm. The first interval I1 may be not less than 0.5 μm and not more than 1 μm, not less than 1 μm and not more than 1.5 μm, or, not less than 1.5 μm and not more than 2 μm. It is preferred that the first interval I1 is not less than 0.4 μm and not more than 1.6 μm.

With reference to FIG. 9 to FIG. 11, the semiconductor device 1 includes a plurality (32, in this embodiment) of trench contact structures 71 that are formed in the first main surface 3 at the first device region 6. The plurality of trench contact structures 71 are also components of the power transistor 8. Specifically, the plurality of trench contact structures 71 include a plurality (16, in this embodiment) of first trench contact structures 71A and a plurality (16, in this embodiment) of second trench contact structures 71B.

The plurality of first trench contact structures 71A are formed in regions between the first end portions 51A of the plurality of trench gate structures 51 and the trench separation structure 43, respectively. The plurality of trench gate structures 51 are connected to the first end portions 51A of the plurality of trench gate structures 51, respectively, and are each formed in a band shape (a rectangular shape) extending in the first direction X. The plurality of first trench contact structures 71A are formed at intervals of the space width WSP from the trench separation structures 43 regarding the first direction X. Lengths of the plurality of first trench contact structures 71A in the first direction X are arbitrary.

The plurality of second trench contact structures 71B are formed in regions between the second end portions 51B of the plurality of trench gate structures 51 and the trench separation structure 43, respectively. The plurality of second trench contact structures 71B are connected to the second end portions 51B of the plurality of the trench gate structures 51, respectively, and are each formed in a band shape (a rectangular shape) extending in the first direction X. The plurality of second trench contact structures 71B are formed at intervals of the space width WSP from the trench separation structure 43 regarding the first direction X. Lengths of the plurality of second trench contact structures 71B in the first direction X are arbitrary.

The plurality of trench contact structures 71 each has a second width W2 and a second depth D2. The second width W2 is a width in a direction (the second direction Y) orthogonal to a direction (the first direction X) in which the trench contact structure 71 extends. The second width W2 is substantially equal to the first width W1 of the trench gate structure 51 in this embodiment (W2≈W1). Also, the second depth D2 is substantially equal to the first depth D1 of the trench gate structure 51 in this embodiment (D2≈D1). An aspect ratio D2/W2 of the trench contact structure 71 is therefore substantially equal to the aspect ratio D1/W1 of the trench gate structure 51 (D2/W2≈D1/W1).

Specifically, the plurality of trench contact structures 71 each has a single electrode structure including a contact trench 72, a contact insulating film 73 (a second insulator) and the contact electrode 74. The contact trench 72 is digged down from the first main surface 3 toward the second main surface 4 such as to communicate with the gate trench 53. The contact trench 72 is formed at interval from the bottom portion of the drift region 42 toward the first main surface 3.

The contact trench 72 includes a side wall and a bottom wall. An angle that the side wall of the contact trench 72 forms with the first main surface 3 inside the semiconductor chip 2 may be not less than 90° and not more than 92°. The contact trench 72 may be formed in a tapered shape that an opening width is gradually narrowed from an opening to the bottom wall. It is preferred that a corner of the bottom wall of the contact trench 72 is formed in a curved shape. A whole of the bottom wall of the contact trench 72 may be formed in a curved shape toward the second main surface 4. The bottom wall of the contact trench 72 is smoothly connected to the bottom wall of the gate trench 53.

The contact insulating film 73 is formed on a wall surface of the contact trench 72. Specifically, the contact insulating film 73 is formed in a film shape on a whole region of the wall surface of the contact trench 72, and demarcates a recessed space of a U-shape inside the contact trench 72. The contact insulating film 73 includes a silicon oxide film in this embodiment.

The contact insulating film 73 has a third thickness T3 exceeding the first thickness T1 of the upper insulating film 54 (T1<T3). The third thickness T3 is a thickness of the contact insulating film 73 along a normal direction of the wall surface of the contact trench 72. The third thickness T3 may be substantially equal to the separation thickness TI of the separation insulating film 45 (T3≈TI). The third thickness T3 may be substantially equal to the second thickness T2 of the lower insulating film 55 (T3≈T2).

The third thickness T3 may be not less than 0.1 μm and not more than 1 μm. The third thickness T3 may be not less than 0.1 μm and not more than 0.25 μm, not less than 0.25 μm and not more than 0.5 μm, not less than 0.5 μm and not more than 0.75 μm, or, not less than 0.75 μm and not more than 1 μm. It is preferred that the third thickness T3 is not less than 0.15 μm and not more than 0.65 μm.

The contact electrode 74 is embedded in the contact trench 72 across the contact insulating film 73 as an integrated member. The contact electrode 74 includes a conductive polysilicon in this embodiment. The contact electrode 74 is fixed to a same potential as a potential of the lower electrode 57 of the trench gate structure 51. That is, the contact electrode 74 is formed as a gate electrode, and the gate signal G is to be input to the contact electrode 74.

Specifically, the contact electrode 74 is connected to the lower electrode 57 of the trench gate structure 51 at a communication portion between the contact trench 72 and the gate trench 53. On the other hand, the contact electrode 74 is electrically insulated from the upper electrode 56 of the trench gate structure 51 across the middle insulating film 58. That is, the contact electrode 74 consists of a lead-out portion of the lower electrode 57 that is led out into the contact trench 72 from the gate trench 53 across the contact insulating film 73 and the middle insulating film 58.

The plurality of trench contact structures 71 is controlled at the same timing as the connected trench gate structures 51 because of structurally including the contact electrodes 74 fixed to the same potential as the lower electrodes 57. Therefore, a total number of the trench gate structures 51 which can be systematized as the system transistor 9 (that is, a maximum system number of the power transistor 8) is determined by the plurality of trench contact structures 71.

The plurality of trench contact structures 71 are connected one by one to the both end portions (the first end portion 51A and the second end portion 51B) each of the trench gate structures 51 in this embodiment. Therefore, each of the trench gate structures 51 is to be controlled at the same timing with the two trench contact structures 71 arranged at the both ends. That is, 16-number of the trench gate structures 51 are configured such as to be electrically independently controlled in this embodiment.

The total number of the unit transistors 10 which can be systematized as the system transistor 9 is therefore "16", and the maximum system number of the power transistor 8 is "16". The 16-number of gate signals G at maximum can be individually input to 16-number of the trench gate structures 51 in a one-to-one correspondence by adjusting the number of the gate wirings 14 that are to be connected to the plurality of trench gate structures 51. Combination patterns of the gate signals G to be input to the n-number of system transistors 9 can be increased by increasing the system number.

With reference to FIG. 12 and FIG. 13, the semiconductor device 1 includes a field insulating film 80 selectively covering a periphery of the trench separation structure 43 at the first main surface 3. The field insulating film 80 includes a silicon oxide film in this embodiment. The field insulating film 80 has a thickness exceeding the first thickness T1 of the upper insulating film 54. The thickness of the field insulating film 80 may be not more than the second thickness T2 of the lower insulating film 55.

The field insulating film 80 includes an outer field insulating film 81 located outside the first device region 6 and an inner field insulating film 82 located inside the first device region 6. The outer field insulating film 81 covers a region outside the first device region 6 on the first main surface 3 and is connected to the separation insulating film 45 exposed from an outer peripheral wall of the trench separation structure 43. The inner field insulating film 82 covers a periphery of the first device region 6 on the first main surface 3 and is connected to the separation insulating film 45 exposed from an inner peripheral wall of the trench separation structure 43. Specifically, the inner field insulating film 82 covers the body space 48 at the periphery of the first device region 6 of the first device region 6.

The semiconductor device 1 includes a main surface insulating film 83 selectively covering the first main surface 3 at the first device region 6. The main surface insulating film 83 includes a silicon oxide film in this embodiment. The main surface insulating film 83 covers regions outside the separation trench 44, the gate trench 53 and the contact trench 72, and is connected to the upper insulating film 54, the contact insulating film 73 and the inner field insulating film 82. The main surface insulating film 83 has a thickness less than the thickness of the inner field insulating film 82 (the field insulating film 80). The thickness of the main surface insulating film 83 may be substantially equal to the first thickness T1 of the upper insulating film 54.

The semiconductor device 1 includes the aforementioned interlayer insulation layer 13 covering the first main surface 3. The semiconductor device 1 includes a plurality of plug electrodes 91 to 95 each embedded in the interlayer insulation layer 13. The plurality of plug electrodes 91 to 95 includes a plurality of first plug electrodes 91, a plurality of second plug electrodes 92, a plurality of third plug electrodes 93, a plurality of fourth plug electrodes 94 and a plurality of fifth plug electrodes 95. The plurality of plug electrodes 91 to 95 may consist of a tungsten plug electrode, respectively. In FIG. 9 to FIG. 11, the plurality of plug electrodes 91 to 95 are shown by X marks. Also, in FIG. 14, the first plug electrodes 91 and the fifth plug electrodes 95 are shown simplified by lines.

The plurality of first plug electrodes 91 each consists of a source plug electrode for the separation electrode 46. The plurality of first plug electrodes 91 are embedded in portions covering the trench separation structure 43 in the interlayer insulation layer 13, respectively. The plurality of first plug electrodes 91 are embedded at intervals along the separation electrode and electrically connected to the separation electrode 46, respectively. Arrangements and shapes of the plurality of first plug electrodes 91 are arbitrary. The single or plurality of first plug electrodes 91 that extend in a band shape or an annular shape in plan view may be formed on the separation electrode 46.

The plurality of second plug electrodes 92 each consists of a gate plug electrode for the upper electrodes 56. The plurality of second plug electrodes 92 are embedded in portions covering the plurality of trench gate structures 51 in the interlayer insulation layer 13, respectively. The plurality of second plug electrodes 92 are embedded at intervals along the respective upper electrodes 56 and electrically connected to the respective upper electrodes 56. The plurality of second plug electrodes 92 are electrically connected to the end portions of the respective upper electrodes 56 in this embodiment. Arrangements and shapes of the plurality of second plug electrodes 92 are arbitrary. The single or plurality of second plug electrodes 92 that extend in a band shape along the upper electrode 56 in plan view may be formed on the respective upper electrodes 56.

The plurality of third plug electrodes 93 each consists of a source plug electrode for the source regions 60 (the contact regions 61). The plurality of third plug electrodes 93 are embedded in portions covering the plurality of mesa portions 63 in the interlayer insulation layer 13. The plurality of third plug electrodes 93 are each embedded in a band shape extending along the plurality of mesa portion 63 in plan view. Each of third plug electrodes 93 is electrically connected to the plurality of source regions 60 and the plurality of contact regions 61 in the respective mesa portions 63. Arrangements and shapes of the plurality of third plug electrodes 93 are arbitrary. The plurality of third plug electrodes 93 may be formed on the respective mesa portions 63.

The plurality of fourth plug electrodes 94 each consists of a source plug electrode for the outermost contact regions 61. The plurality of fourth plug electrodes 94 are embedded in portions covering the outermost contact regions 61 in the interlayer insulation layer 13, respectively. The plurality of fourth plug electrodes 94 embedded at intervals along the respective outermost contact regions 61 and electrically connected to the respective outermost contact regions 61. Arrangements and shapes of the plurality of fourth plug electrodes 94 are arbitrary. The single or plurality of fourth plug electrodes 94 that extend in a band shape in plan view may be formed on the respective outermost contact regions 61.

The plurality of fifth plug electrodes 95 each consist of a gate plug electrode for the contact electrodes 74. The plurality of fifth plug electrodes 95 are embedded in portions covering the plurality of contact electrodes 74 in the interlayer insulation layer 13, respectively. The plurality of fifth plug electrodes 95 are electrically connected to the respective contact electrodes 74. Arrangements and shapes of the plurality of fifth plug electrodes 95 are arbitrary. The single or plurality of fifth plug electrodes 95 that extend in a band shape along the contact electrode 74 in plan view may be formed on the respective contact electrode 74.

The semiconductor device 1 includes a single or plurality of source wirings 96 formed in the interlayer insulation layer 13. The single or plurality of source wirings 96 consist of the single or plurality of the wiring layers formed in the interlayer insulation layer 13. The single or plurality of source wirings 96 are selectively routed around in the interlayer insulation layer 13 and electrically connected to the separation electrode 46, the source regions 60 and the contact regions 61 via the plurality of first plug electrodes 91, the plurality of third plug electrodes 93 and the plurality of fourth plug electrodes 94. The single or plurality of source wirings 96 are electrically connected to the source terminal 16.

The semiconductor device 1 includes the aforementioned n-number of gate wirings 14 formed in the interlayer insulation layer 13. The n-number of gate wirings 14 are selectively routed around in the interlayer insulation layer 13 and electrically connected to the upper electrodes 56, the lower electrodes 57 and the contact electrodes 74, respectively, via the plurality of second plug electrodes 92 and the plurality of fifth plug electrodes 95. The n-number of gate wirings 14 are electrically connected to the control IC 11 (the gate control circuit 12).

Specifically, the n-number of gate wirings 14 are electrically connected to the single or plurality of trench gate structures 51 (the unit transistors 10) to be systematized as the individual control target, respectively. The n-number of gate wirings 14 may include the single or plurality of gate wirings 14 electrically connected to the single trench gate structure 51 to be systematized as the individual control target. The n-number of gate wirings 14 may include the single or plurality of gate wirings 14 that parallelly connect the plurality of trench gate structures 51 as the individual control target.

The n-number of gate wirings 14 are electrically connected to the upper electrodes 56 and the lower electrodes 57 of the trench gate structures 51, respectively. That is, the n-number of gate wirings 14 are electrically connected to the single or plurality of trench gate structures 51 and the single or plurality of trench contact structures 71 that are connected to said single or plurality of trench gate structures 51. The n-number of system transistors 9 are configured with the parallel circuits of the single or plurality of trench gate structures 51 (the unit transistors 10) which are electrically connected to the n-number of gate wirings 14.

The plurality of unit transistors 10 (the unit cells 50) each has a predetermined channel ratio RC. The channel ratio RC is, when a planar area of the pair of channel cells 52 in each of the unit transistors 10 is supposed to be 100%, defined by a ratio of the channel areas of the channel regions 62 occupying said planar area. The channel areas are defined by a total sum of the planar areas of the single or plurality of source regions 60 included in each of the unit transistors 10.

The plurality of unit transistors 10 each has 50% of the channel ratio RC, in this embodiment. A total channel ratio RT (an average channel ratio) of the plurality of unit transistors 10 is therefore 50%. The total channel ratio RT is a ratio obtained by dividing a total sum of the channel ratio RC of all of the unit transistors 10 by a total number of all of the unit transistors 10. In the n-system power transistor 8, the total channel ratio RT is divided into n-number of system channel ratios RS consisting of same or different values by the n-number of system transistors 9. A total sum of the n-number of system channel ratios RS become the total channel ratio RT.

The channel ratio RC of the unit transistor 10 is adjustable in a range of not less than 0% and not more than 100%. In a case in which the channel ratio RC is set to 0%, the source region 60 is not formed in the pair of channel cells 52. In this case, one or both of the body region 47 and the contact regions 61 are to be formed in the pair of channel cells 52. In a case in which the channel ratio RC is set to 100%, only the source regions 60 is formed in the pair of channel cells 52 whereas the contact regions 61 and the body region 47 is not formed. In view of the electrical characteristics of the unit transistor 10, it is preferred that the channel ratio RC is adjusted in a range of more than 0% and less than 100%.

The channel ratios RC may be adjusted for the respective unit transistors 10. That is, the plurality of unit transistors 10 may have the channel ratios RC different from each other or may have the channel ratios RC equal to each other. In this case, the n-number of system transistors 9 may include the single or plurality of unit transistors 10 which are systematized as the individual control target from an aggregation of the plurality of unit transistors 10 having the same or different channel ratios RC. The n-number of system transistors 9 may have the same or different system channel ratios RS, respectively.

The channel ratio RC is related to a temperature rise at the first device region 6 (the semiconductor chip 2). For example, an increasing in the channel ratio RC causes the temperature rise of the first device region 6. On the other hand, a reduction in the channel ratio RC suppresses the temperature rise of the first device region 6. The channel ratios RC thus may be adjusted for the respective unit transistors 10 based on a temperature distribution of the first device region 6.

The single or plurality of unit transistors 10 that have relatively small values in the channel ratio RC are arranged in a region where the temperature tends to rise, and the single or plurality of unit transistors 10 that have relatively large values in the channel ratio RC are arranged in a region where the temperature is unlikely to rise. A central portion of the first device region 6 is exemplified as the region where the temperature tends to rise. A peripheral portion of the first device region 6 is exemplified as the region where the temperature is unlikely to rise.

The single or plurality of unit transistors 10 that have the channel ratios RC of not less than 20% and not more than 40% (e.g. 25%) may be arranged at the region where the temperature tends to rise (e.g. the central portion). The single or plurality of unit transistors 10 that have the channel ratios RC of not less than 60% and not more than 80% (e.g. 75%) may be arranged at the region where the temperature is unlikely to rise (e.g. the peripheral portion).

The single or plurality of unit transistors 10 that have the channel ratios RC of more than 40% and less than 60% (e.g. 50%) may be arranged at a region between the region where the temperature tends to rise and the region where the temperature is unlikely to rise. In those case, the total channel ratio RT may be adjusted to 50%. That is, the total channel ratio RT may be adjusted while adjusting the channel ratios RC for the respective unit transistors 10 based on the temperature distribution of the first device region 6.

The unit transistor 10 that has the channel ratio RC of not less than 20% and not more than 40% (e.g. 25%), the unit transistor 10 that has the channel ratio RC of not less than 40% and not more than 60% (e.g. 50%), and the unit transistor 10 that has the channel ratio RC of not less than 60% and not more than 80% (e.g. 75%) may be iteratively arranged in a regular order. Those three types of the unit transistors 10 may be iteratively arranged in the second direction Y in that order. In this case, the total channel ratio RT may be adjusted to 50%. According to this structure, it is possible to suppress the formation of a deviation in the temperature distribution of the first device region 6 with a relatively simple design.

Figure 15A:
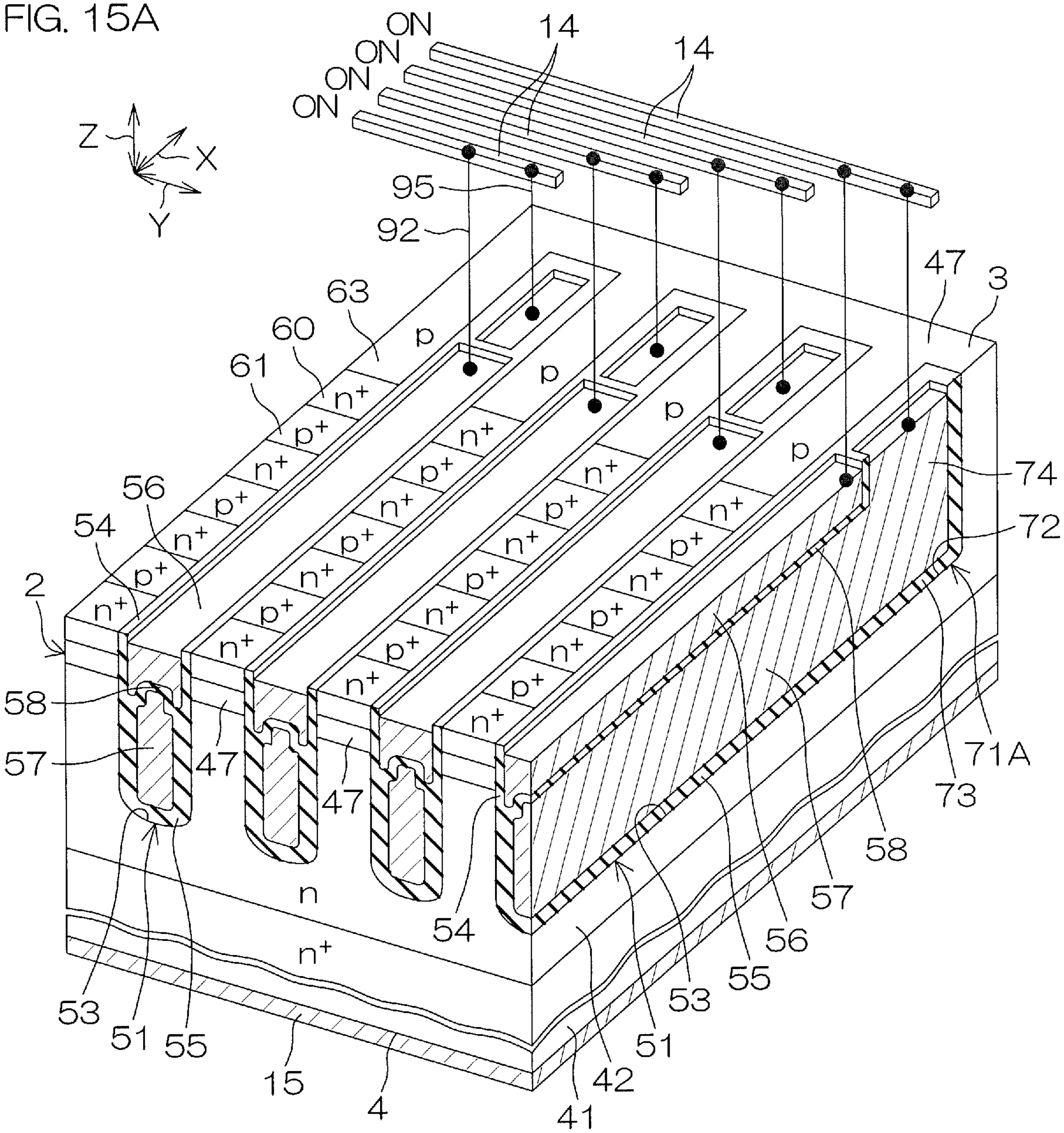
FIGS. 15A to 15C are sectional perspective views showing control examples to the power transistor.
Figure 15B:
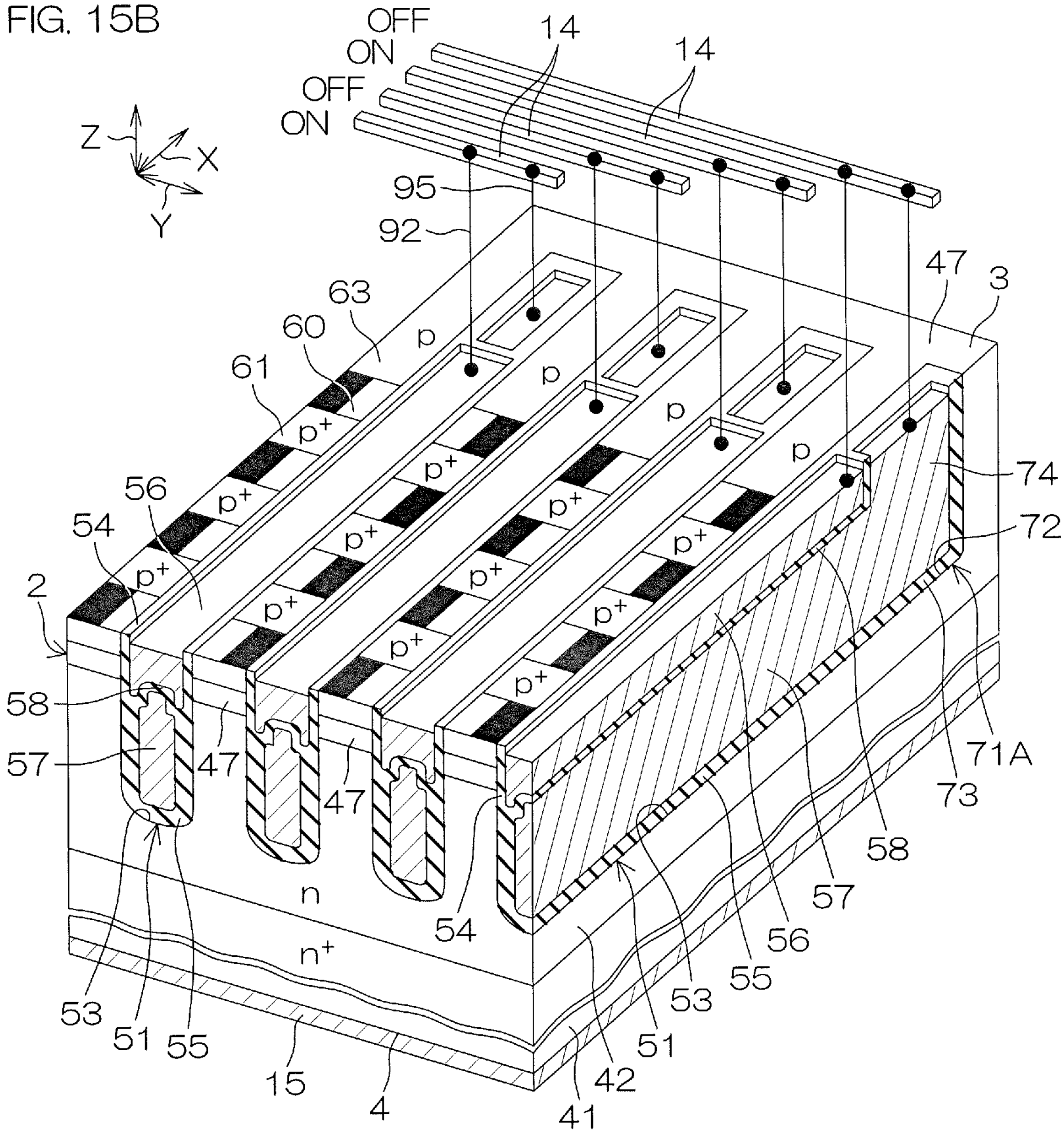
Figure 15C:
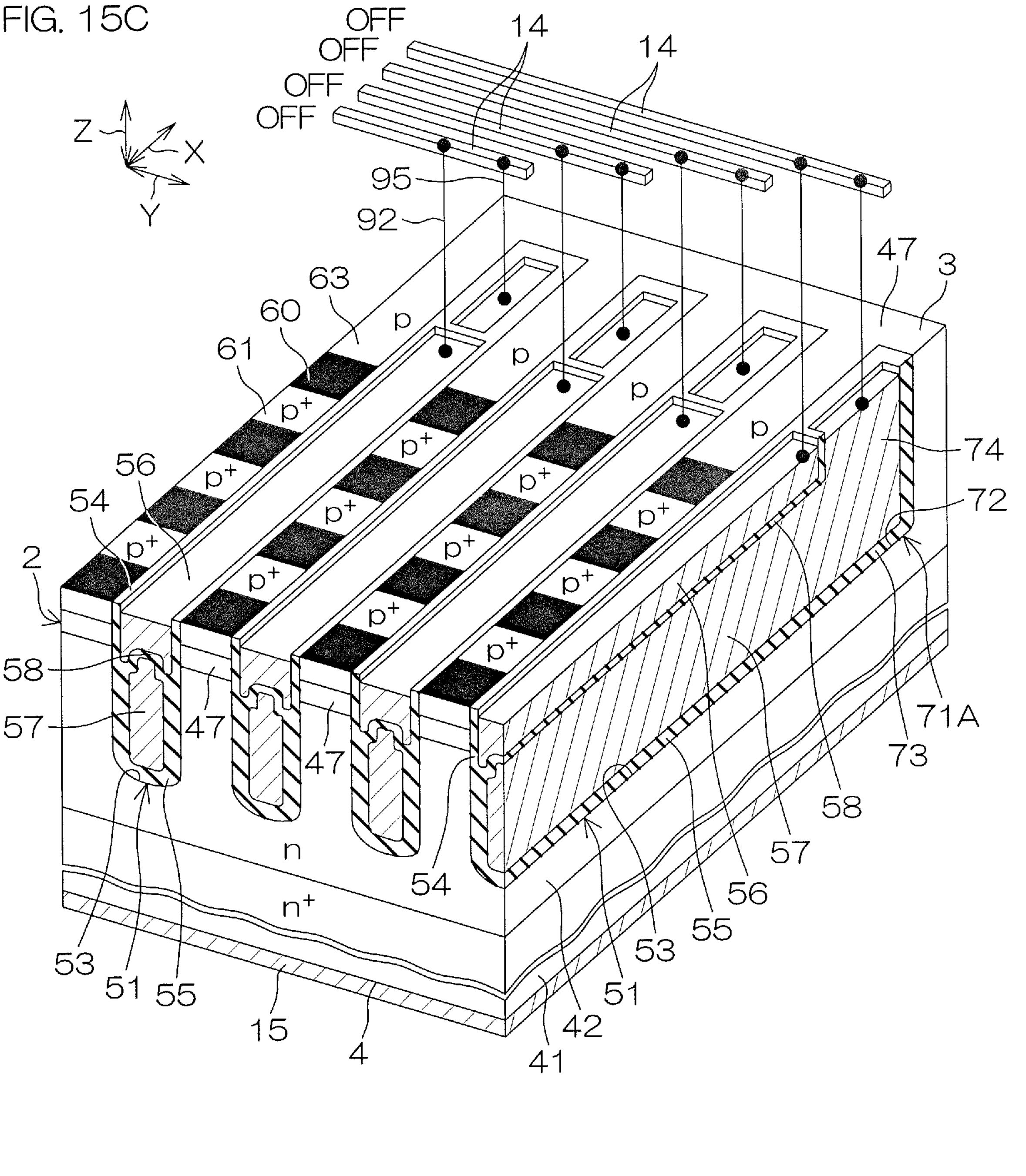

FIGS. 15A to 15C are sectional perspective views showing control examples to the power transistor 8. In FIG. 15A to FIG. 15C, channels (the source regions 60) in the OFF-states are shown by filled hatchings.

With reference to FIG. 15A, when the gate signals G exceeding the gate threshold voltages (that is, the ON-signals) are input to all of the n-number of gate wirings 14, all of the unit transistors 10 (the n-number of system transistors 9) are controlled to the ON-states at the same timing. The power transistor 8 is thereby driven with the total channel ratio RT (that is, the n-number of system channel ratios RS). The channel utilization of the power transistor 8 is therefore relatively increased, and the ON-resistance Ron is relatively decreased. The total channel ratio RT determines a minimum value of the ON-resistance Ron.

With reference to FIG. 15B, when the gate signals G exceeding the gate threshold voltages (that is, the ON-signals) are input to x-number ($1 \leq x < n$) of the gate wirings 14, and the gate signals G less than the gate threshold voltages (that is, the OFF-signals) are input to (n−x)-number of the gate wirings 14, x-number of the system transistors 9 are to be in the ON-states whereas (n−x)-number of the system transistors 9 are to be in the OFF-states. In this case, the power transistor 8 is driven by x-number of the system channel ratios RS (that is, less than the total channel ratio RT). The channel utilization of the power transistor 8 is therefore relatively decreased, and the ON-resistance Ron is relatively increased.

With reference to FIG. 15C, when the gate signals G less than the gate threshold voltages (that is, the OFF-signals) are input to all of the n-number of gate wirings 14, all of the unit transistors 10 (the n-number of system transistors 9) are to be in the OFF-states at the same timing. The power transistor 8 is therefore suspended.

The power transistor 8 may consist of at least 2-system (that is, n≥2), and may include at least two system transistors 9. At least two system transistors 9 each includes the single or plurality of unit transistors 10. At least two system transistors 9 are electrically connected to at least two gate wirings 14, respectively, and are controlled by at least two gate signals G. According to the power transistor 8 of not less than 2-system, at least two operational modes each consisting of the different ON-resistance Ron can thereby be achieved.

The power transistor 8 may consist of at least 3-system (that is, n≥3), and may include at least three system transistors 9. At least three system transistors 9 each includes the single or plurality of unit transistors 10. At least three system transistors 9 are electrically connected to at least three gate wirings 14, respectively, and are controlled by at least three gate signals G. According to the power transistor 8 of not less than 3-system, at least three operational modes each consisting of the different ON-resistance Ron can thereby be achieved.

As described above, the semiconductor device 1 includes the semiconductor chip 2, and the n-system (n≥2) power transistor 8. The n-system power transistor 8 includes the n-number (n≥2) of system transistors 9 each formed in the semiconductor chip 2 such as to be individually controlled, and is configured such as to generate the single output current IOUT (the output signal) by selective controls of the n-number of system transistors 9.

The n-system power transistor 8 is configured with the parallel circuit in which the n-number of system transistors 9 are parallelly connected such that the n-number of gate signals G are individually input. The n-number of system transistors 9 generate the electrical signals for the respective systems in response to the gate signals G. The n-system power transistor 8 generates the single output current IOUT consisting of the addition value of the n-number of electrical signals generated by the n-number of system transistors 9.

The n-system power transistor 8 is configured such that the channel utilization and the ON-resistance Ron are to be changed by the selective controls of the n-number of system transistors 9. The power transistor 8 can therefore be controlled with the plural operational modes each consisting of the different ON-resistances Ron. It is thus possible to provide the semiconductor device 1 of a variable ON-resistance type. With the semiconductor device 1, it is possible to drive and control the power transistor 8 with the appropriate ON-resistance Ron according to operation situations.

The power transistor 8 may be controlled with at least two operational modes by at least two system transistors 9. It is preferred that the power transistor 8 is controlled with at least three operational modes by at least three system transistors 9.

The semiconductor device 1 includes the first device region 6 demarcated in the semiconductor chip 2. The power transistor 8 has the n-number of system transistors 9 collectively formed in the first device region 6. According to this structure, it is not necessary to distributively arrange the n-number of system transistors 9 in the semiconductor chip 2, and thereby a wiring resistance can be reduced by shortening a wiring distance. A variation in switching speeds of the n-number of system transistors 9 can thus be suppressed, and the power transistor 8 accordingly can be appropriately driven and controlled.

It is preferred that the n-number of system transistors 9 includes the single or plurality of unit transistors 10 systematized as the individual control target, respectively. According to this structure, the channel utilization and the ON-resistance characteristics can be adjusted for the respective system transistors 9 by adjusting the number and the channel ratios RC of the unit transistors 10. It is thus possible to appropriately adjust the ON-resistance characteristics of the power transistor 8.

Each of the unit transistors 10 may have the trench gate structure 51. The trench gate structure 51 may have the multiple electrode structure including the upper electrode 56 and the lower electrode 57 each embedded in the gate trench 53 such as to be vertically insulated and separated by the insulator (the upper insulating film 54, the lower insulating film 55 and the middle insulating film cally 58). In this structure, it is preferred that the lower electrode 57 is fixed to the same potential as the upper electrode 56.

According to this structure, the voltage drop between the upper electrode 56 and the lower electrode 57 can be suppressed, and therefore the electric field concentration between the upper electrode 56 and the lower electrode 57 can be suppressed. Also, the ON-resistance Ron of the semiconductor chip 2 (particularly the drift region 42) can be reduced. This structure is effective when the semiconductor device 1 is to be provided as an in-vehicle device.

The semiconductor device 1 includes the second device region 7 demarcated in the region different from the first device region 6 in the semiconductor chip 2, and the control IC 11 formed in the second device region 7. Also, the semiconductor device 1 includes the n-number of gate wirings 14 formed anywhere above the semiconductor chip 2 such as to be electrically connected to the power transistor 8 and the control IC 11.

The control IC 11 generates the n-number of gate signals G by which the n-number of system transistors 9 are to be individually controlled and outputs the n-number of gate signals G to the n-number of gate wirings 14. The n-number of gate wirings 14 individually transmits the n-number of gate signals G generated by the control IC 11 to the n-number of system transistors 9. According to this structure, it is possible to provide the IPD integrally including the power transistor 8 and the control IC 11.

Figure 16:
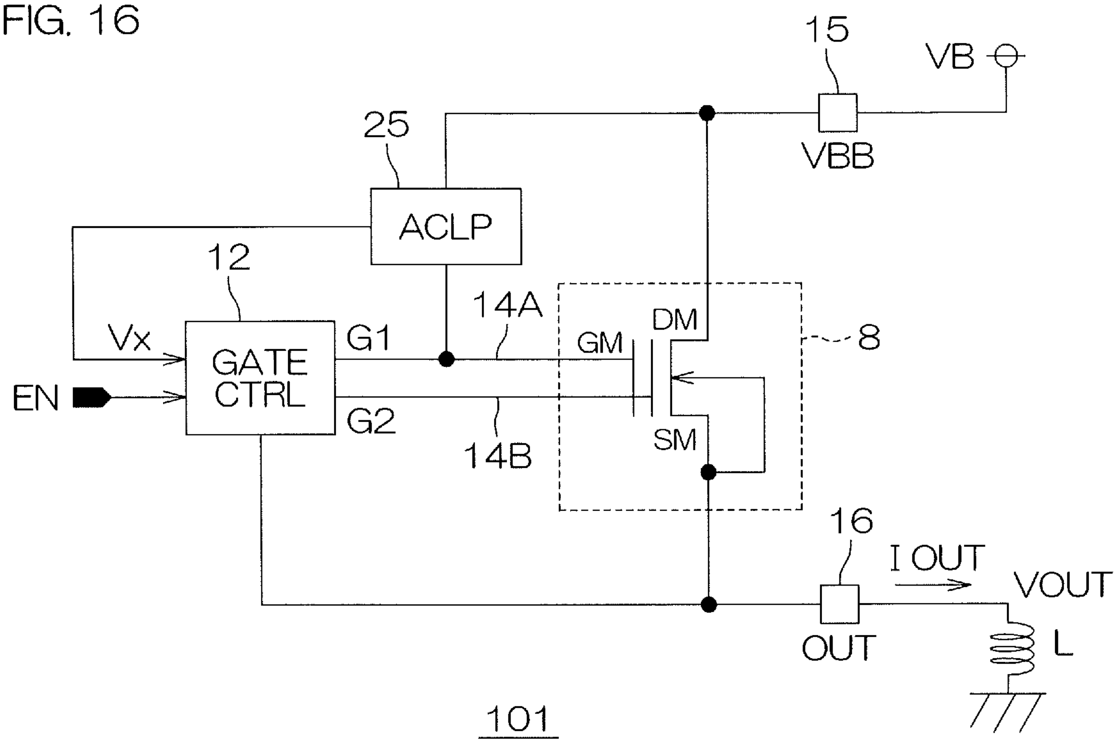
FIG. 16 is a block circuit diagram of a semiconductor device according to a second preferred embodiment of the present invention (which is an embodiment for performing a 2-system-control in a case in which a 2-system power transistor is adopted into the semiconductor device according to the first preferred embodiment).
Figure 17:
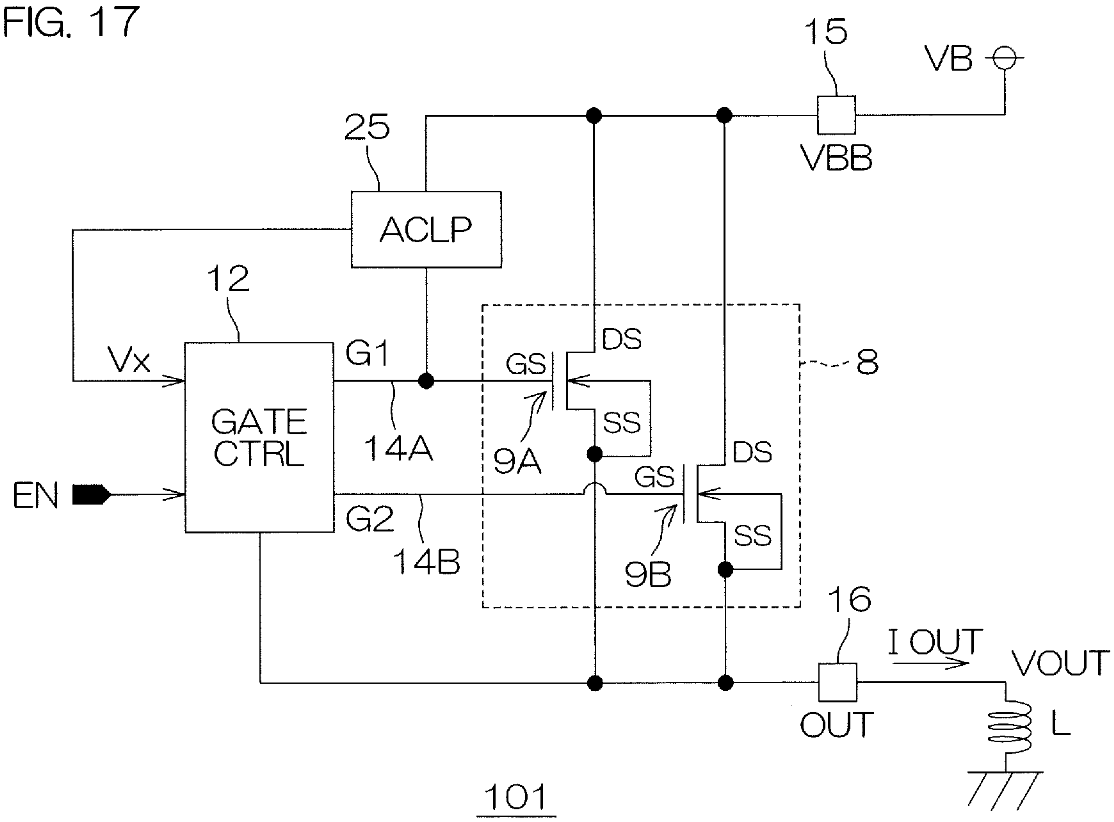
FIG. 17 is an equivalent circuit diagram of the power transistor shown in FIG. 16.
Figure 18:
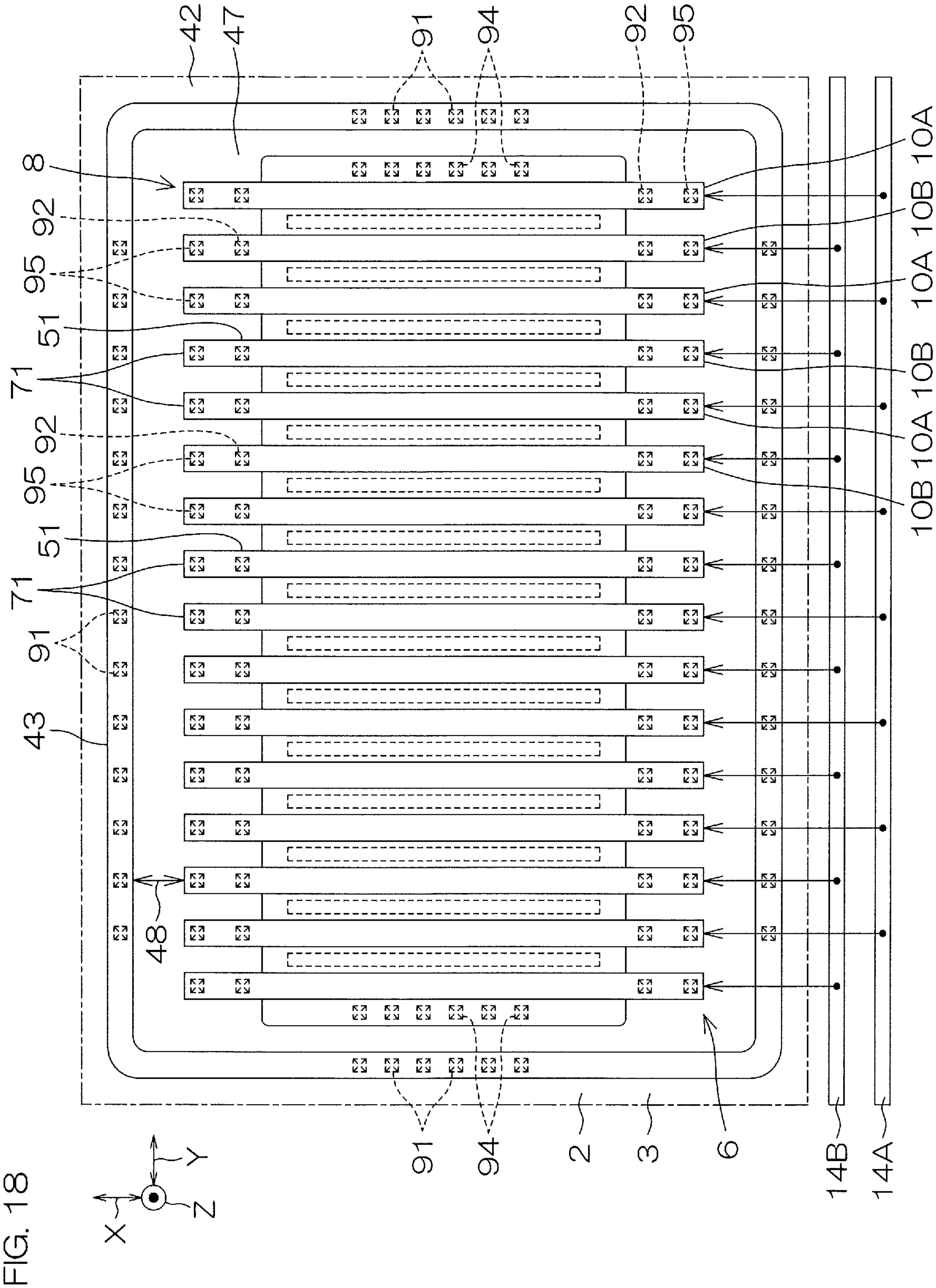
FIG. 18 is a plan view of one configuration example of the 2-system power transistor.
Figure 19:
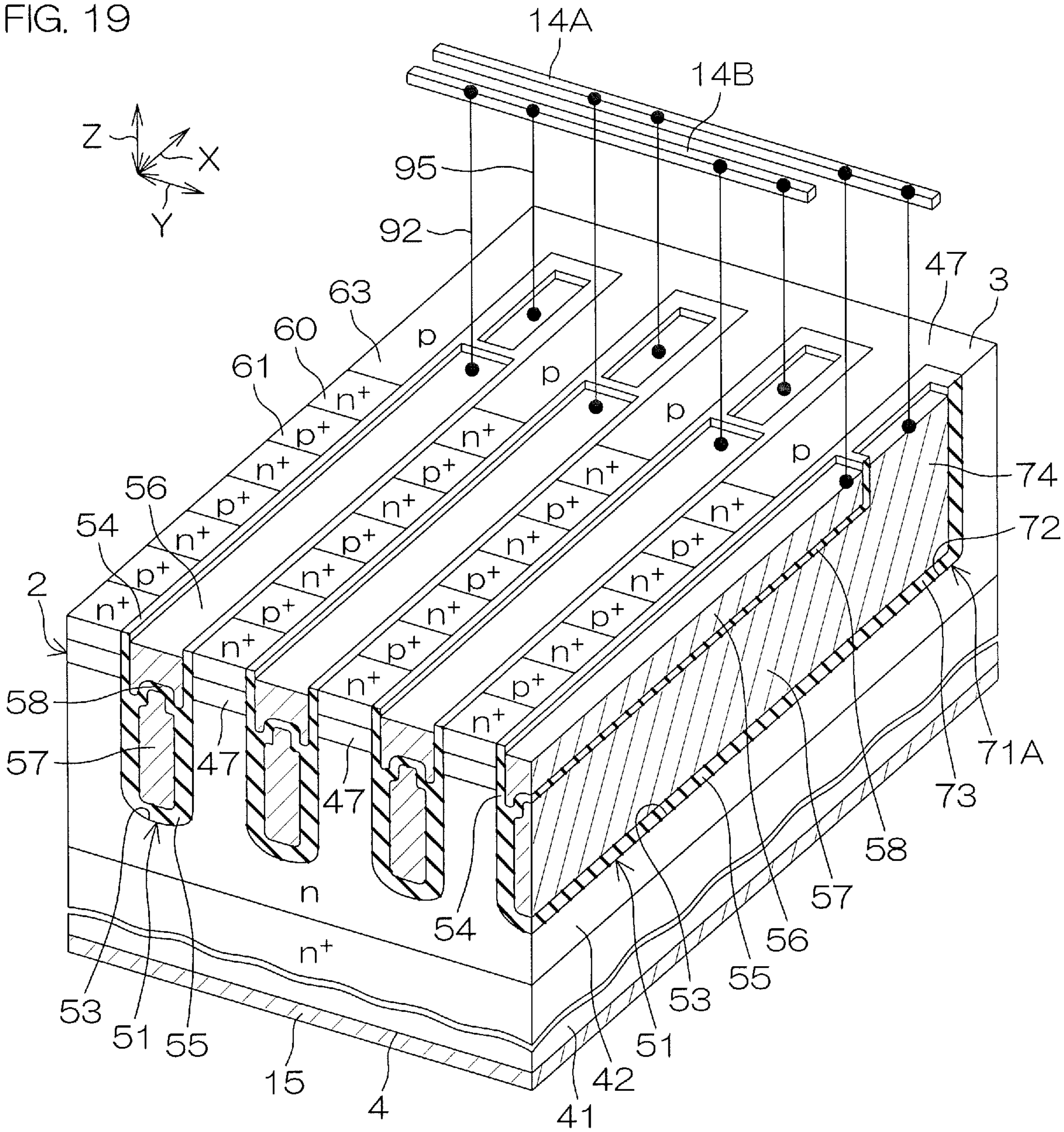
FIG. 19 is a sectional perspective view showing one configuration example of the 2-system power transistor.

FIG. 16 is a block circuit diagram of a semiconductor device 101 according to a second preferred embodiment of the present invention (which is an embodiment for performing a 2-system-control in a case in which the 2-system power transistor 8 is adopted into the semiconductor device 1 according to the first preferred embodiment). FIG. 17 is an equivalent circuit diagram of the power transistor 8 shown in FIG. 16. FIG. 18 is a plan view of one configuration example of the 2-system power transistor 8. FIG. 19 is a sectional perspective view showing one configuration example of the 2-system power transistor 8. Hereinafter, the structures corresponding to the structures described for the semiconductor device 1 will be described with the same reference numerals.

With reference to FIG. 16 to FIG. 19, the semiconductor device 101 has the drain terminal 15 (the power terminal VBB), the source terminal 16 (the output terminal OUT), the 2-system power transistor 8, 2-number of the gate wirings 14, the active clamp circuit 25 and the gate control circuit 12. The active clamp circuit 25 and the gate control circuit 12 each forms the part of the control IC 11. In FIG. 16 and FIG. 17, an example in which the inductive load L is connected to the source terminal 16.

The 2-system power transistor 8 includes the 2-number of system transistors 9. The 2-number of system transistors 9 include a first system transistor 9A and a second system transistor 9B. The 2-number of system gates GS of the first and second system transistors 9A and 9B configure the 2-number of main gates GM (a first gate and a second gate) of the power transistor 8.

The first system transistor 9A includes a single or plurality of first unit transistors 10A systematized as the individual control target from the plurality of unit transistors 10. The first system transistor 9A is composed of the plurality (8, in this embodiment) of the first unit transistors 10A in this embodiment. It is preferred that the plurality of first unit transistors 10A are systematized at intervals such as to sandwich at least one of the unit transistors 10.

The second system transistor 9B includes a single or plurality of second unit transistors 10B systematized as the individual control target from the plurality of unit transistors 10 excluding the first unit transistors 10A. The second system transistor 9B is composed of the plurality (8, in this embodiment) of the second unit transistors 10B in this embodiment. It is preferred that the plurality of second unit transistors 10B are systematized alternately with the plurality of first unit transistors 10A such as to sandwich at least one of the plurality of first unit transistors 10A.

According to this structure, a pair of the first unit transistors 10A adjacent to each other can be separated by the second unit transistors 10B. Also, a pair of the second unit transistors 10B adjacent to each other can be separated by the first unit transistors 10A. That is, the unit transistors 10 belonging the same system are not continuously systematized along the second direction Y. This makes it possible to disperse temperature-rising regions in the first device region 6 when the first and second unit transistors 10A and 10B are individually controlled. A local temperature rise in the first device region 6 can thereby be suppressed.

The numbers of the first and second unit transistors 10A and 10B are arbitrary. The number of the second unit transistor 10B may be equal to the number of the first unit transistor 10A. The number of the second unit transistor 10B may be more than the number of the first unit transistor 10A, or may be less than the first unit transistor 10A.

The total channel ratio RT of the 2-system power transistor 8 is divided into the two system channel ratios RS each consisting of a same or different value by the first system transistor 9A and the second system transistor 9B. The first system transistor 9A has a first system channel ratio RS1, and the second system transistor 9B has a second system channel ratio RS2. The first and second system channel ratios RS1 and RS2 each has various values as long as a relational expression (RT=RS1+RS2) in which a total sum of the first and second system channel ratios RS1 and RS2 becomes the total channel ratio RT (0%<RT≤100%) is satisfied.

The second system channel ratio RS2 may be equal to the first system channel ratio RS1 (RS1≈RS2). The second system channel ratio RS2 may be more than the first system channel ratio RS1 (RS1<RS2), or less than the first system channel ratio RS1 (RS2<RS1). Hereinafter, for convenience, an example in which the total channel ratio RT is set to 50%, the first system channel ratio RS1 is set to 25%, and the second system channel ratio RS2 is set to 25% will be described.

The 2-system power transistor 8 is to be controlled with a first operational mode, a second operational mode and a third operational mode. In the first operational mode, the first and second system transistors 9A and 9B are controlled to the OFF-states at a same timing. In the second operational mode, the first and second system transistors 9A and 9B are controlled to the ON-states at a same timing. In the third operational mode, only one of the first and second system transistors 9A and 9B is to be controlled to the ON-state.

In the first operational mode, the power transistor 8 is to be a suspended state. In the second operational mode, the power transistor 8 is to be driven with the total channel ratio RT. In the third operational mode, the power transistor 8 is driven with the first system channel ratio RS1 or the second system channel ratio RS2 each less than the total channel ratio RT. In the third operational mode, in this embodiment, the power transistor 8 is driven with the first system transistor 9A in a state in which the second system transistor 9B is suspended. The power transistor 8 is therefore driven with the first system channel ratio RS1 (RS1<RT) in the third operational mode.

The 2-number of gate wirings 14 include a first gate wiring 14A and a second gate wiring 14B. The first gate wiring 14A is electrically connected to the first system transistor 9A (the plurality of first unit transistors 10A). The second gate wiring 14B is electrically connected to the second system transistor 9B (the plurality of second unit transistors 10B) different from the first system transistor 9A.

The active clamp circuit 25 is connected to the drain and the gate of the first system transistor 9A. The active clamp circuit 25 forcibly controls the first system transistor 9A to be in the ON-state when the source terminal 16 becomes a negative voltage. The active clamp circuit 25 thereby limits a drain-source voltage (=VBB−VOUT) of the power transistor 8 to a value not more than a clamp voltage Vclp. The second system transistor 9B does not contribute to an active clamp operation. The active clamp circuit 25 is therefore not connected to the second system transistor 9B.

The gate control circuit 12 is connected to the first and second system transistors 9A and 9B via the first and second gate wirings 14A and 14B. Also, the gate control circuit 12 is electrically connected to an apply end of an interior node voltage Vx of the active clamp circuit 25. The gate control circuit 12 generates first and second gate signals G1 and G2 by which the first and second system transistors 9A and 9B are to be controlled in response to an enable signal EN and the interior node voltage Vx, and individually output the first and second gate signals G1 and G2 to the first and second gate wirings 14A and 14B.

Specifically, in an enable state in which the enable signal EN is to be a high level (EN=H), the gate control circuit 12 generates the first and second gate signals G1 and G2 by which both of the first and second system transistors 9A and 9B are controlled to the ON-state. On the other hand, in an disable state in which the enable signal EN is to be a low level (EN=L), the gate control circuit 12 generates the first and second gate signals G1 and G2 by which both of the first and second system transistors 9A and 9B are controlled to the OFF-state.

Also, in response to the interior node voltage Vx, the gate control circuit 12 generates the first and second gate signals G1 and G2 by which the first system transistor 9A is controlled to the ON-state whereas the second system transistor 9B is controlled to the OFF-state. Specifically, the gate control circuit 12 controls the second system transistor 9B to the OFF-state in response to the interior node voltage Vx after a transition from the enable state (EN=H) to the disable state (EN=L) and before an operation of the active clamp circuit 25.

Before the operation of the active clamp circuit 25 means before the output voltage VOUT is clamped. In a case in which the second system transistor 9B is in the OFF-state, the gate and the drain of the second system transistor 9B are short-circuited, and accordingly the second system transistor 9B is to be completely suspended. The gate and the drain of the second system transistor 9B are to be short-circuited by the second gate signals G2 fixed to the output voltage VOUT.

Figure 20:
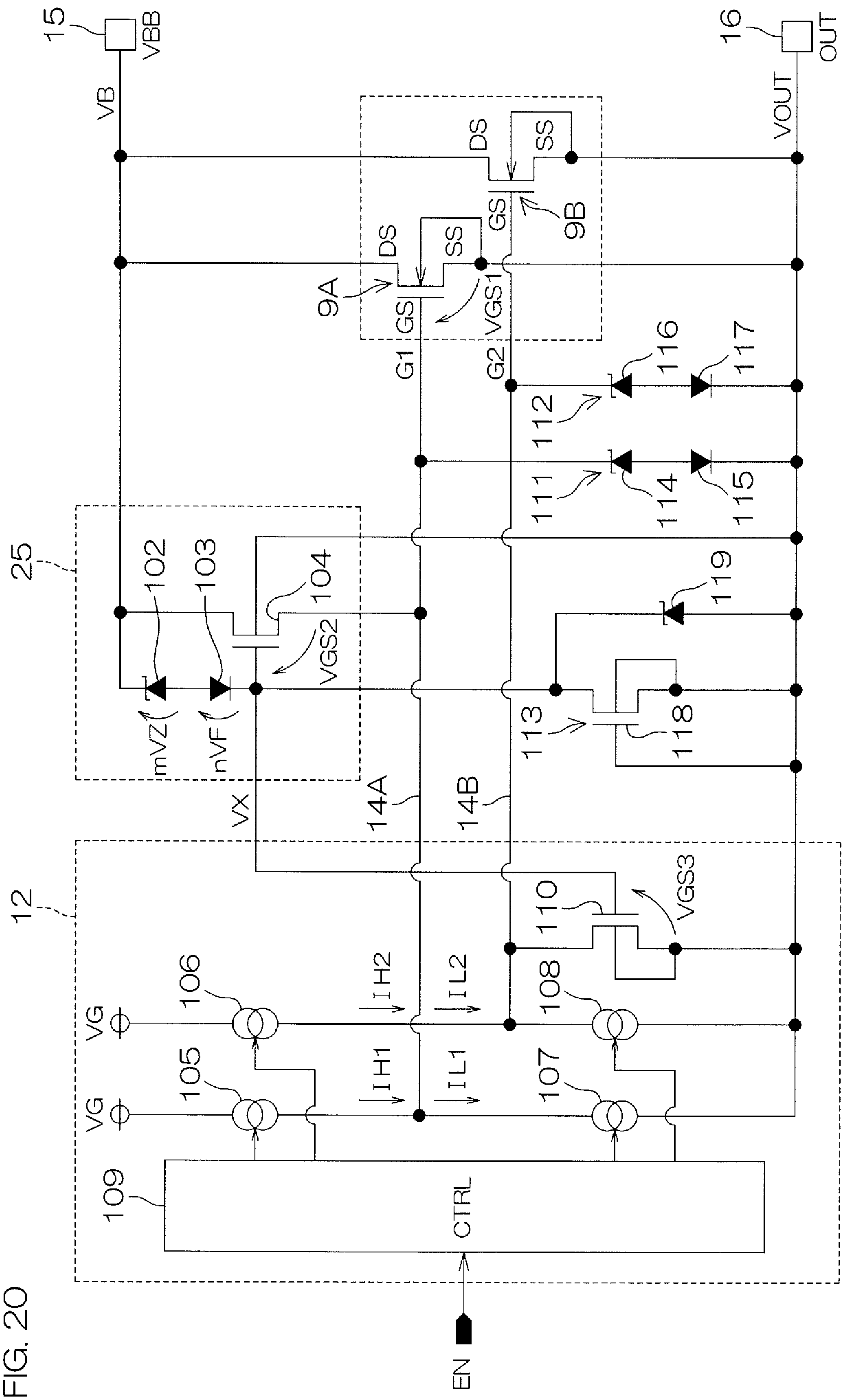
FIG. 20 is a circuit diagram showing one configuration example of a gate control circuit and an active clamp circuit shown in FIG. 16.

FIG. 20 is a circuit diagram showing one configuration example of the gate control circuit 12 and the active clamp circuit 25 shown in FIG. 16. FIG. 20 is also a circuit diagram showing a principal portion of the control IC 11.

The first and second system transistors 9A and 9B each includes the system drain DS, the system source SS and the system gate GS. The system drains DS of the first and second system transistors 9A and 9B are electrically connected to the drain terminal 15, respectively. The system sources SS of the first and second system transistors 9A and 9B are electrically connected to the source terminal 16, respectively.

The first gate wiring 14A is electrically connected to the system gate GS of the first system transistor 9A. The second gate wiring 14B is electrically connected to the system gate GS of the second system transistor 9B. In the description hereinafter, "a state of being electrically connected to the system gate GS of the first system transistor 9A" is included in "a state of being electrically connected to the first gate wiring 14A". Also, "a state of being electrically connected to the system gate GS of the second system transistor 9B" is included in "a state of being electrically connected to the second gate wiring 14B".

The active clamp circuit 25 includes a Zener diode array 102, a diode array 103, and an n-channel-type clamp MISFET 104. The Zener diode array 102 consists of a series circuit including an m-stage (e.g. m=8) of Zener diodes connected in series in a forward direction. The number of the Zener diode is arbitrary, and it may be "m=1". The Zener diode array 102 includes a cathode and an anode. The cathode of the Zener diode array 102 is electrically connected to the drain terminal 15 and the system drains DS of the first and second system transistors 9A and 9B.

The diode array 103 consists of a series circuit including an n-stage (e.g. n=3) of pn-junction diodes connected in series in a forward direction. The number of the pn-junction diode is arbitrary, and it may be "n=1". The diode array 103 includes a cathode and an anode. The anode of the diode array 103 is reverse biased to the anode of the Zener diode array 102.

The clamp MISFET 104 includes a drain, a source, a gate and a back gate. The drain of the clamp MISFET 104 is electrically connected to the drain terminal 15 and the system drains DS of the first and second system transistors 9A and 9B. The source of the clamp MISFET 104 is electrically connected to the first gate wiring 14A. The gate of the clamp MISFET 104 is electrically connected to the cathode of the diode array 103. The back gate of the clamp MISFET 104 is electrically connected to the system sources SS of the first and second system transistors 9A and 9B and the source terminal 16.

The gate control circuit 12 includes first to fourth current sources 105 to 108, a controller 109, and an n-channel-type drive MISFET 110.

The first current source 105 is configured such as to generate a first source current IH1. The first current source 105 is electrically connected to an apply end of a boosted voltage VG (=a charge pump output) and the first gate wiring 14A. The second current source 106 is configured such as to generate a second source current IH2. The second current source 106 is electrically connected to an apply end of a boosted voltage VG and the second gate wiring 14B.

The third current source 107 is configured such as to generate a first sink current IL1. The third current source 107 is electrically connected to the first gate wiring 14A and the source terminal 16 (the output voltage VOUT). The fourth current source 108 is configured such as to generate a second sink current IL2. The fourth current source 108 is electrically connected to the second gate wiring 14B and the source terminal 16.

The controller 109 is connected to the first to fourth current sources 105 to 108. In the enable state (EN=H), the controller 109 controls the first and second current sources 105 and 106 to be in ON-states whereas controls the third and fourth current sources 107 and 108 to be in OFF-states. Thereby, the first source current IH1 is output to the first gate wiring 14A, and the second source current IH2 is output to the second gate wiring 14B.

In the disable state (EN=L), the controller 109 controls the third and fourth current sources 107 and 108 to be in ON-states whereas controls the first and second current sources 105 and 106 to be in OFF-states. Thereby, the first sink current IL1 is pulled from the first gate wiring 14A, and the second sink current IL2 is pulled from the second gate wiring 14B.

The drive MISFET 110 is connected between the second gate wiring 14B and the source terminal 16. The drive MISFET 110 includes a drain, a source, a gate and a back gate. The drain of the drive MISFET 110 is electrically connected to the second gate wiring 14B. The source of the drive MISFET 110 is electrically connected to the source terminal 16 (the output voltage VOUT). The gate of the drive MISFET 110 is electrically connected to the apply end of the interior node voltage Vx. The back gate of the drive MISFET 110 is electrically connected to the source terminal 16 (the output voltage VOUT).

The drive MISFET 110 is configured such as to be controlled to an ON-state or an OFF-state in response to the interior node voltage Vx. The interior node voltage Vx may be an arbitrary voltage in the active clamp circuit 25. The interior node voltage Vx may be a gate voltage of the clamp MISFET 104, or may be an anode voltage of any one of the pn-junction diodes of the diode array 103.

The semiconductor device 101 includes a first protection circuit 111, a second protection circuit 112 and a third protection circuit 113 in the control IC 11, as examples of an electrostatic destruction protection circuit that protects various circuits from a static electricity, in this embodiment.

The first protection circuit 111 protects the first system transistor 9A from the static electricity. The first protection circuit 111 is electrically connected to the first gate wiring 14A and the source terminal 16. The first protection circuit 111 includes a first diode pair including a first Zener diode 114 and a first diode 115 that are reverse biased each other, in this embodiment.

The first Zener diode 114 includes a cathode and an anode. The cathode of the first Zener diode 114 is electrically connected to the first gate wiring 14A. The first diode 115 includes a cathode and an anode. The anode of the first diode 115 is reverse biased to the anode of the first Zener diode 114. The cathode of the first diode 115 is electrically connected to the source terminal 16.

The second protection circuit 112 protects the second system transistor 9B from the static electricity. The second protection circuit 112 is electrically connected to the second gate wiring 14B and the source terminal 16. The second protection circuit 112 includes a second diode pair including a second Zener diode 116 and a second diode 117 that are reverse biased each other, in this embodiment.

The second Zener diode 116 includes a cathode and an anode. The cathode of second Zener diode 116 is electrically connected to the second gate wiring 14B. The second diode 117 includes a cathode and an anode. The anode of the second diode 117 is reverse biased to the anode of the second Zener diode 116. The cathode of the second diode 117 is electrically connected to the source terminal 16.

The third protection circuit 113 protects the active clamp circuit 25 from the static electricity. The third protection circuit 113 is electrically connected to the active clamp circuit 25 and the source terminal 16. The third protection circuit 113 includes a parallel circuit including a depression-type and n-channel-type protection MISFET 118 and a third Zener diode 119.

The protection MISFET 118 includes a drain, a source, a gate, and a back gate. The drain of the protection MISFET 118 is electrically connected to the gate of the clamp MISFET 104. The source, the gate and the back gate of the protection MISFET 118 are electrically connected to the source terminal 16. The third Zener diode 119 includes a cathode and an anode. The cathode of the third Zener diode 119 is electrically connected to the drain of the protection MISFET 118 (the gate of the clamp MISFET 104). The anode of the third Zener diode 119 is electrically connected to the source terminal 16.

Figure 21:
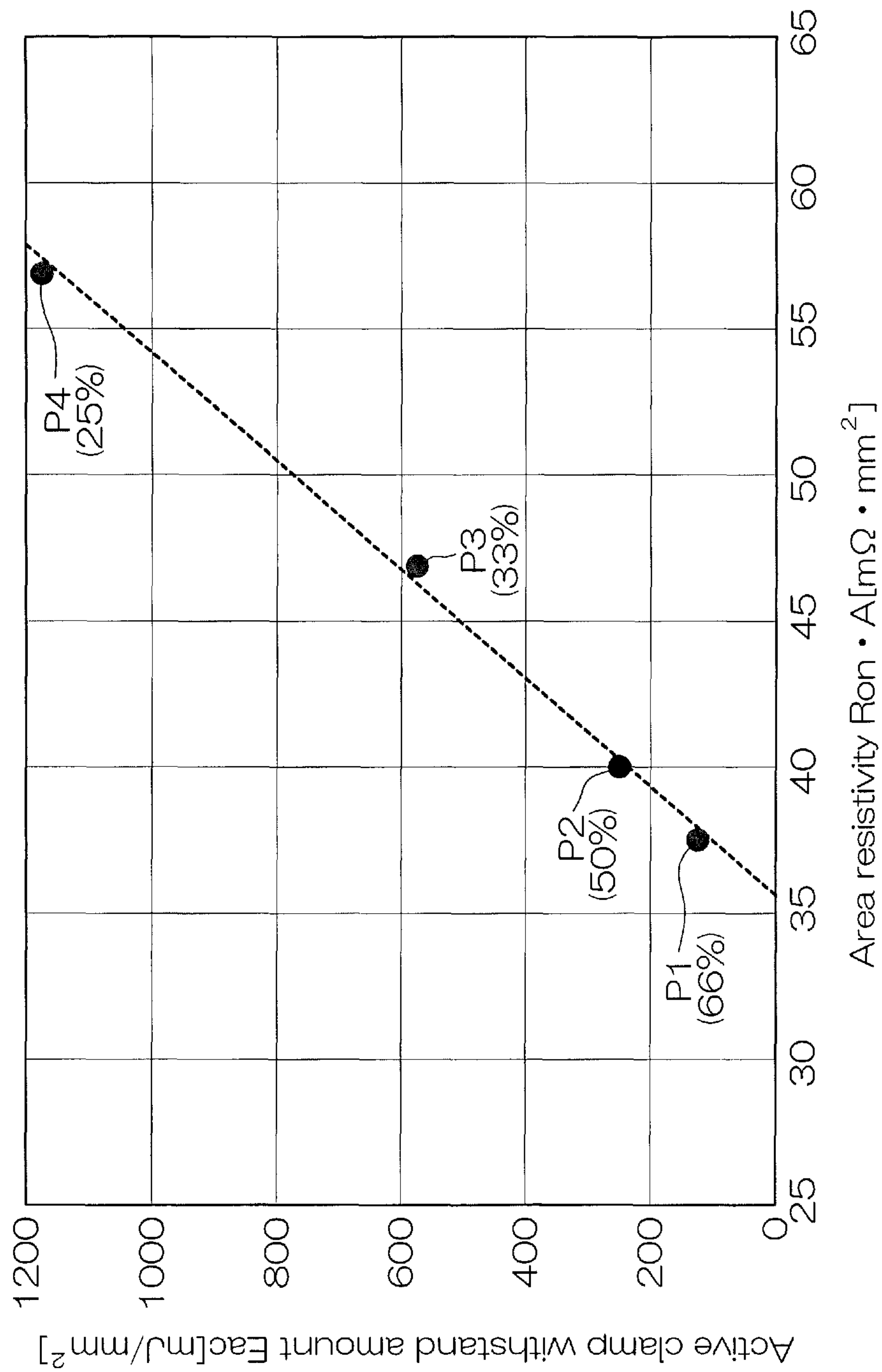
FIG. 21 is an actual measurement graph showing a relationship between an active clamp withstand amount and an area resistivity.

FIG. 21 is an actual measurement graph showing a relationship between an active clamp withstand amount Eac and an area resistivity Ron·A. An ordinate axis of FIG. 21 shows the active clamp withstand amount Eac [$MJ/mm^2$]. An abscissa axis of FIG. 21 shows the area resistivity Ron·A [$m\Omega \cdot mm^2$]. The graph of FIG. 21 shows the characteristics when the first and second system transistors 9A and 9B were controlled to the ON-states and the OFF-states at the same timings.

The active clamp withstand amount Eac is defined by a withstand amount of the power transistor 8 with respect to a counter electromotive force caused by an inductive energy of the inductive load L during a transition operation of the power transistor 8 from the ON-state to the OFF-state (That is, during the active clamp operation). The area resistivity Ron·A represents the ON-resistance Ron of the power transistor 8 during a normal operation.

A first plot point P1, a second plot point P2, a third plot point P3 and a fourth plot point P4 are shown in FIG. 21. The first plot point P1, the second plot point P2, the third plot point P3 and the fourth plot point P4 each represents characteristics in a case in which the total channel ratio RT in the first device region 6 is adjusted to 66%, 50%, 33% and 25%.

In a case in which the total channel ratio RT was increased, the area resistivity Ron·A was reduced in the normal operation, and the active clamp withstand amount Eac was reduced in the active clamp operation. In contrast thereto, in a case in which the total channel ratio RT was reduced, the area resistivity Ron·A was increased in the normal operation, and the active clamp withstand amount Eac was improved in the active clamp operation.

In view of the area resistivity Ron·A, the total channel ratio RT is preferably not less than 33% (specifically, not less than 33% and less than 100%). In view of the active clamp withstand amount Eac, the total channel ratio RT is preferably less than 33% (specifically, more than 0% and less than 33%). The area resistivity Ron·A was reduced due to an increase in total channel ratio RT, and this is because of an increase in the current path. The active clamp withstand amount Eac was reduced due to an increase in the total channel ratio RT, and this is because of a sharp temperature rise due to the counter electromotive force.

In particular, in a case in which the total channel ratio RT is relatively large, it is more likely that a local and sharp temperature rise may occur in a region between the unit transistors 10 (specifically, the trench gate structures 51) which are adjacent to each other. It is considered that the active clamp withstand amount Ea was reduced due to this type of temperature rise.

On the other hand, the area resistivity Ron·A was increased due to a reduction in the total channel ratio RT, and this is because of shrinkage of the current path. The active clamp withstand amount Eac was improved due to a reduction in the total channel ratio RT, and this is considered to be because the total channel ratio RT was made relatively small and the local and sharp temperature rise was suppressed.

From the results of the graph of FIG. 21, it is found that an adjustment method based on the total channel ratio RT has a trade-off relationship and therefore there is a difficulty in realizing an excellent area resistivity Ron·A and an excellent active clamp withstand amount Eac at the same time independently of the trade-off relationship.

On the other hand, from the results of the graph of FIG. 21, it is found that, by making the power transistor 8 operate such as to approach the first plot point P1 (the total channel ratio RT=66%) in the normal operation and operate such as to approach the fourth plot point P4 (the total channel ratio RT=25%) in the active clamp operation, it is possible to realize an excellent area resistivity Ron·A and an excellent active clamp withstand amount Eac at the same time. Therefore, in the semiconductor device 101, controls described using FIG. 22 and FIG. 23A to FIG. 23C are implemented for the power transistor 8.

Figure 22:
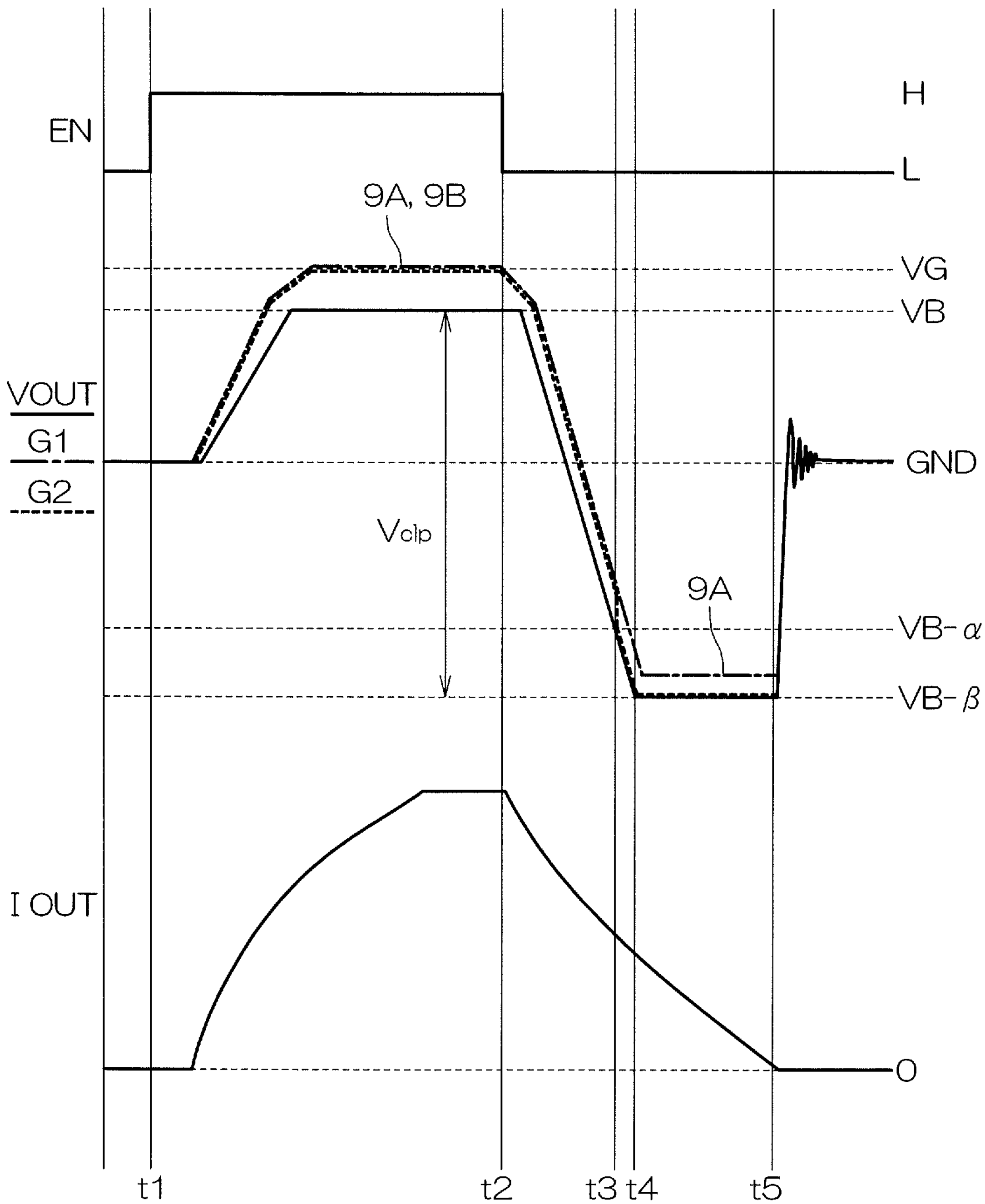
FIG. 22 is a timing chart showing a control example to the power transistor.
Figure 23A:
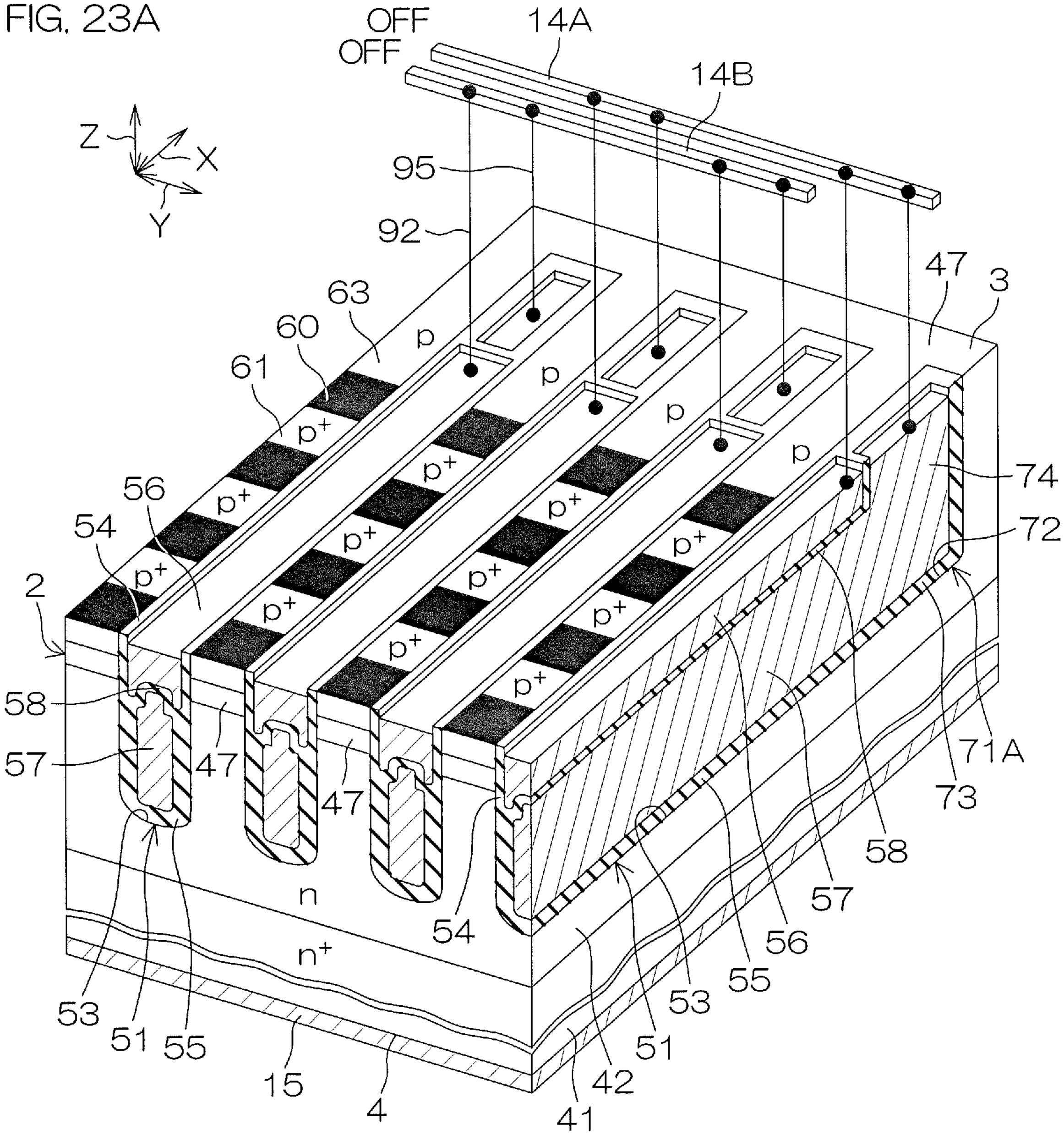
FIGS. 23A to 23C are sectional perspective views showing control examples to the power transistor.
Figure 23B:
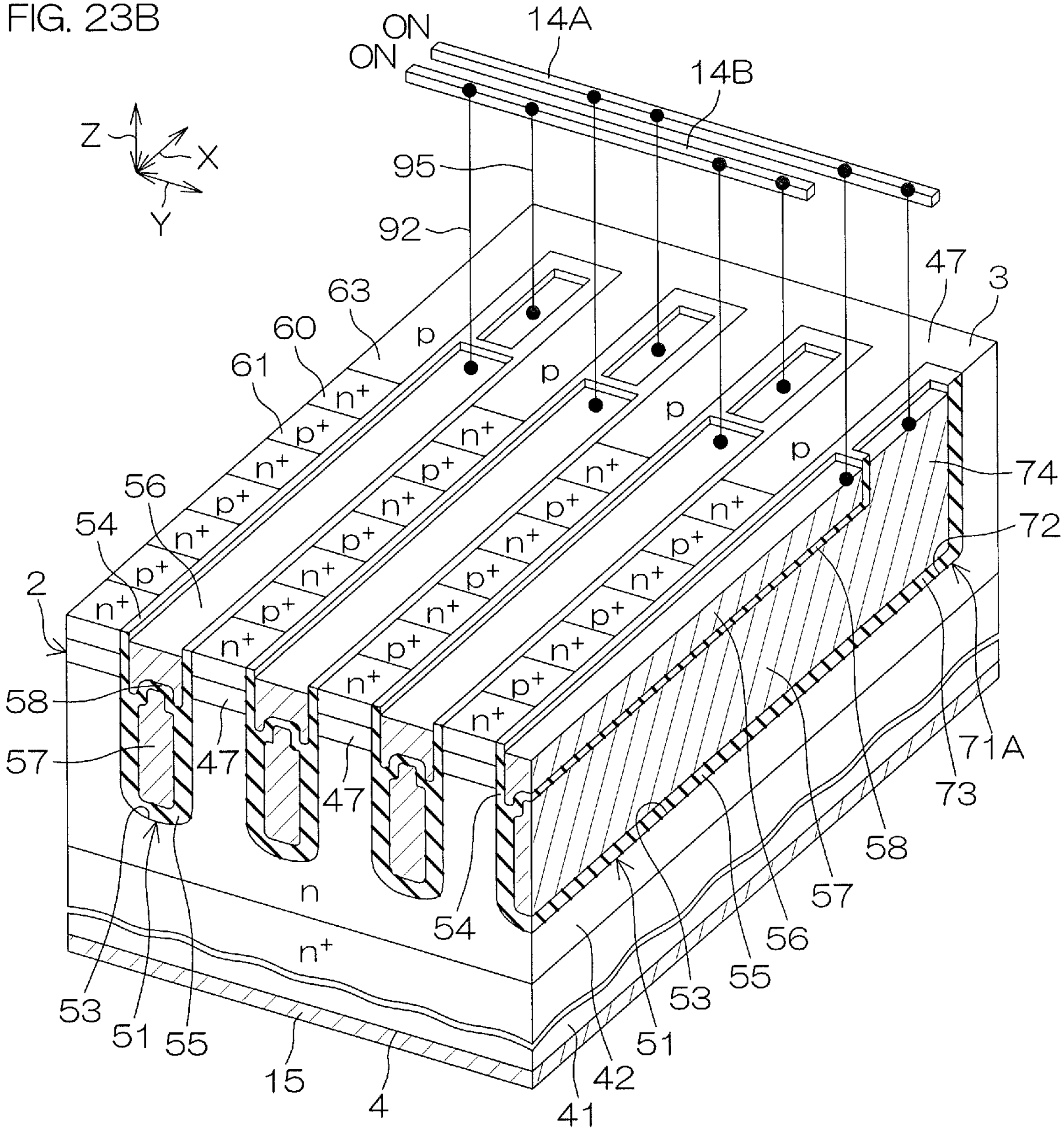
Figure 23C:
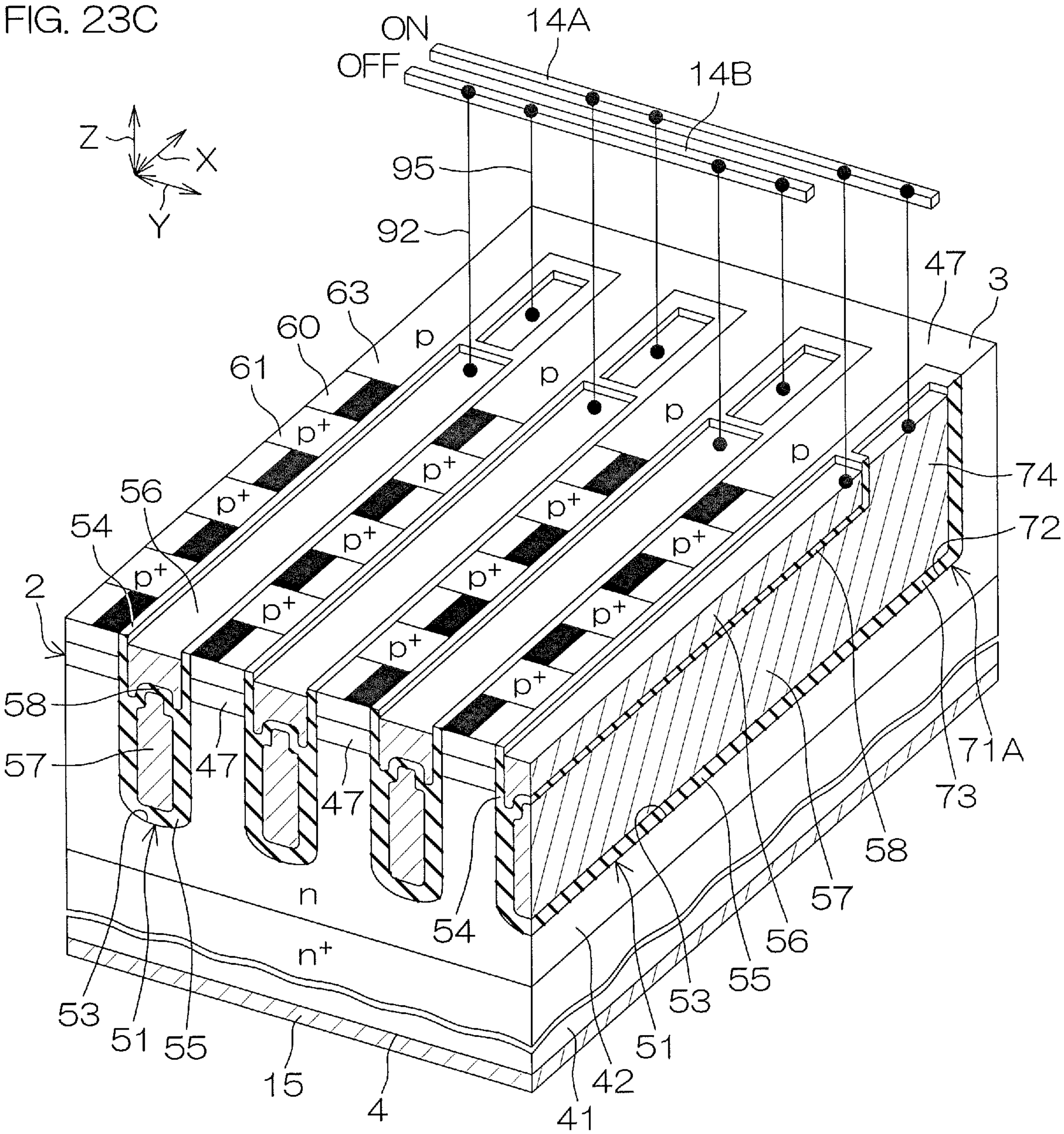

FIG. 22 is a timing chart showing a control example to the power transistor 8. FIGS. 23A to 23C are sectional perspective views showing control examples to the power transistor 8. In FIGS. 23A to 23C, the channels (the source regions 60)

in the OFF-states are shown in filled hatchings. In FIG. 22, the enable signal EN, the output voltage VOUT (solid line), the first gate signal G1 (dashed line), the second gate signals G2 (broken line), and the output current IOUT are shown in that order from a top of the page.

Hereinafter, a gate-source voltage of the first system transistor 9A is represented by "Vgs1", a gate-source voltage of the clamp MISFET 104 is represented by "Vgs2", a gate-source voltage of the drive MISFET 110 is represented by "Vgs3", a breakdown voltage of the Zener diode array 102 is represented by "mVZ", and a forward drop voltage of the diode array 103 is represented by "nVF".

With reference to FIG. 22, the enable signal EN is kept to the low level until a time t1. In the enable signal EN, the low level is a logical level when the power transistor 8 is controlled to the OFF-state, and the high level is a logical level when the power transistor 8 is controlled to the ON-state. At this time, since the first and second gate signals G1 and G2 are kept at the low level (≈VOUT), and therefore the first and second system transistors 9A and 9B are controlled to the OFF-states (see FIG. 23A). The power transistor 8 is therefore suspended. This state corresponds to the first operational mode of the power transistor 8.

At the time t1, the enable signal EN is controlled to the high level from the low level. When the enable signal EN becomes the high level, the first and second gate signals G1 and G2 rise from the low level (≈VOUT) to the high level (≈VG), and both of the first and second system transistors 9A and 9B are controlled to the ON-states at the same timing (see FIG. 23B). This makes the power transistor 8 become the normal operation state. This state corresponds to the second operational mode of the power transistor 8.

When the first and second system transistors 9A and 9B become the ON-state, the output current IOUT starts to flow. The output voltage VOUT rises to a vicinity of the power supply voltage VB. The power transistor 8 is driven with the total channel ratio RT (=50%) during the normal operation. The area resistivity Ron·A thereby approaches the area resistivity Ron·A indicated by the second plot point P2 in the graph of FIG. 21.

At a time t2, the enable signal EN is controlled to the low level from the high level. When the enable signal EN becomes the low level, the first and second gate signals G1 and G2 fall to the low level from the high level. In this time, the inductive load L causes the output current IOUT to flow until an energy stored during an ON-period of the power transistor 8 is released. As a result, the output voltage VOUT drops sharply to a negative voltage lower than the ground voltage GND. This makes the power transistor 8 shift to the active clamp operation.

At a time t3, when the output voltage VOUT drops to a channel switching voltage VB-α which is lower by a predetermined value α (=mVZ+nVF+Vgs3) than the power supply voltage VB, the interior node voltage Vx becomes higher than the gate-source voltage Vgs3. This makes the drive MISFET 110 turn to the ON-state, and the gate and the source of the second system transistor 9B are short-circuited (G2=VOUT). As a result, the second system transistor 9B is controlled to the OFF-state.

On the other hand, at a time t4, when the output voltage VOUT drops to the lower limit voltage VB-β which is lower by a predetermined value β (=mVZ+nVF+Vgs1+Vgs2) than the power supply voltage VB, the first system transistor 9A is controlled to the ON-state by the active clamp circuit 25. The lower limit voltage VB-β is less than the channel switching voltage VB-α (VB-β<VB-α).

Therefore, the second system transistor 9B is completely suspended by the drive MISFET 110 before the operation of the active clamp circuit 25. The power transistor 8 is therefore driven by the first system transistor 9A in a state in which the second system transistor 9B is suspended, during the active clamp operation (see FIG. 23C). This state corresponds to the third operational mode of the power transistor 8.

The power transistor 8 is driven with the first system channel ratio RS1 (=25%) during the active clamp operation. That is, the channel utilization during the active clamp operation becomes more than zero and less than the channel utilization during the normal operation. The active clamp withstand amount Eac therefore approaches the active clamp withstand amount Eac shown by the fourth plot point P4 in the graph of FIG. 21.

The output current IOUT due to the inductive load L is discharged via the first system transistor 9A. The output voltage VOUT is therefore limited to a value not less than the lower limit voltage VB-β. The active clamp circuit 25 limits the output voltage VOUT based on the power supply voltage VB and limits the drain-source voltage Vds (=VB-VOUT) of the power transistor 8 to a value not more than the clamp voltage Vclp (=β). The active clamp operation is continued until a time t5 when the energy stored in the inductive load L is exhausted and the output current IOUT stops flowing.

As described above, with the semiconductor device 101, during the normal operation, the first and second system transistors 9A and 9B can be used to pass the current. This can reduce the ON-resistance Ron. On the other hand, during the active clamp operation, the first system transistor 9A can be used to pass the current in a state in which the second system transistor 9B is suspended. This makes it possible to consume (absorbe) the counter electromotive force with the first system transistor 9A while suppressing the rapid temperature rise caused by the counter electromotive force of the inductive load L. As a result, the active clamp withstand amount Eac can be improved.

In other words, according to the semiconductor device 101, the channel utilization of the power transistor 8 relatively increases during the normal operation, and the channel utilization of the power transistor 8 relatively decreases during the active clamp operation. Therefore, during the normal operation, the ON-resistance Ron can be reduced since the current path relatively increases. Also, during the active clamp operation, the active clamp withstand amount Eac can be improved since the rapid temperature rise caused by the counter electromotive force of the inductive load L can be suppressed.

As described above, according to the semiconductor device 101, it is possible to achieve both of the excellent area resistivity Ron·A and the excellent active clamp withstand amount Eac by separating from the trade-off relationship shown in FIG. 21. Especially in the field of the IPD, the active clamp withstand amount Eac is one of the important characteristics for driving the larger the inductive load L.

In this embodiment, an example in which, during the active clamp operation, the first system transistor 9A was controlled to the ON-state whereas the second system transistor 9B was controlled to the OFF-state was described. However, during the active clamp operation, the second system transistor 9B may be controlled to the ON-state whereas the first system transistor 9A may be controlled to the OFF-state. In this case, the relationship between the first system transistor 9A and the second system transistor 9B should be interchanged and understood.

Figure 24:
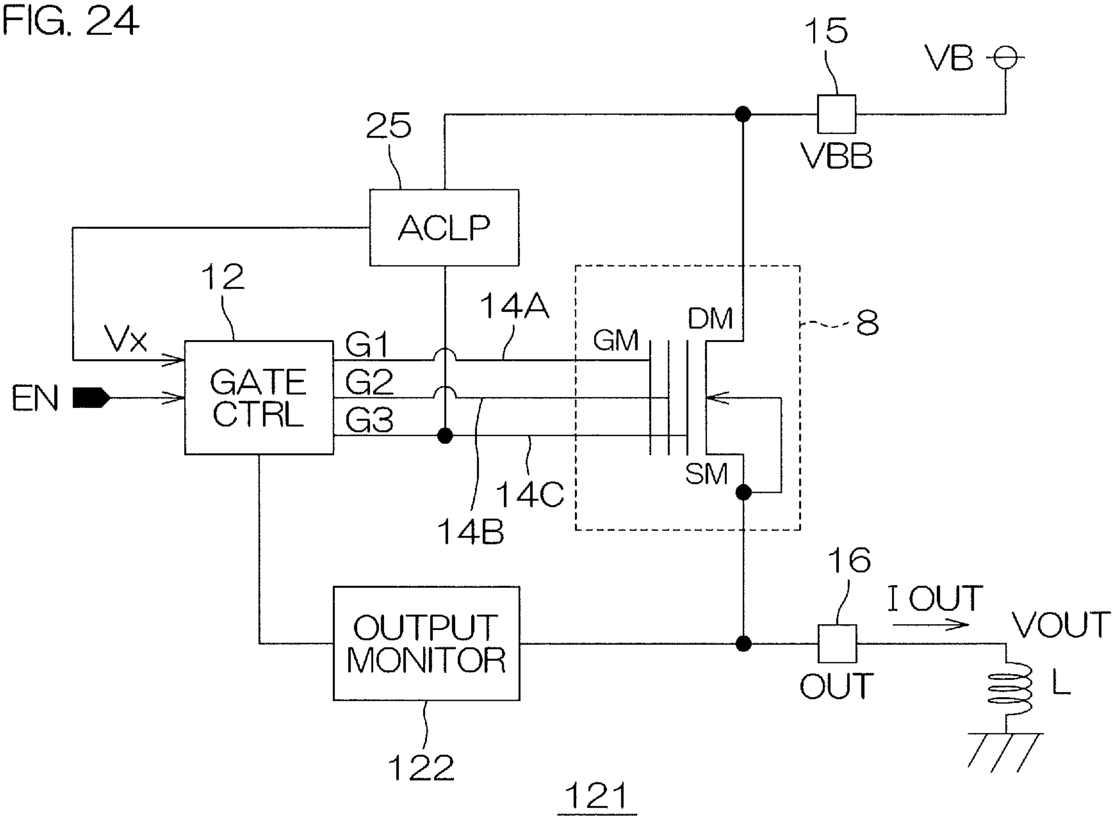
FIG. 24 is a block circuit diagram showing a semiconductor device according to a third preferred embodiment of the present invention (which is an embodiment for performing a 3-system-control in a case in which a 3-system power transistor is adopted into the semiconductor device according to the first preferred embodiment).
Figure 25:
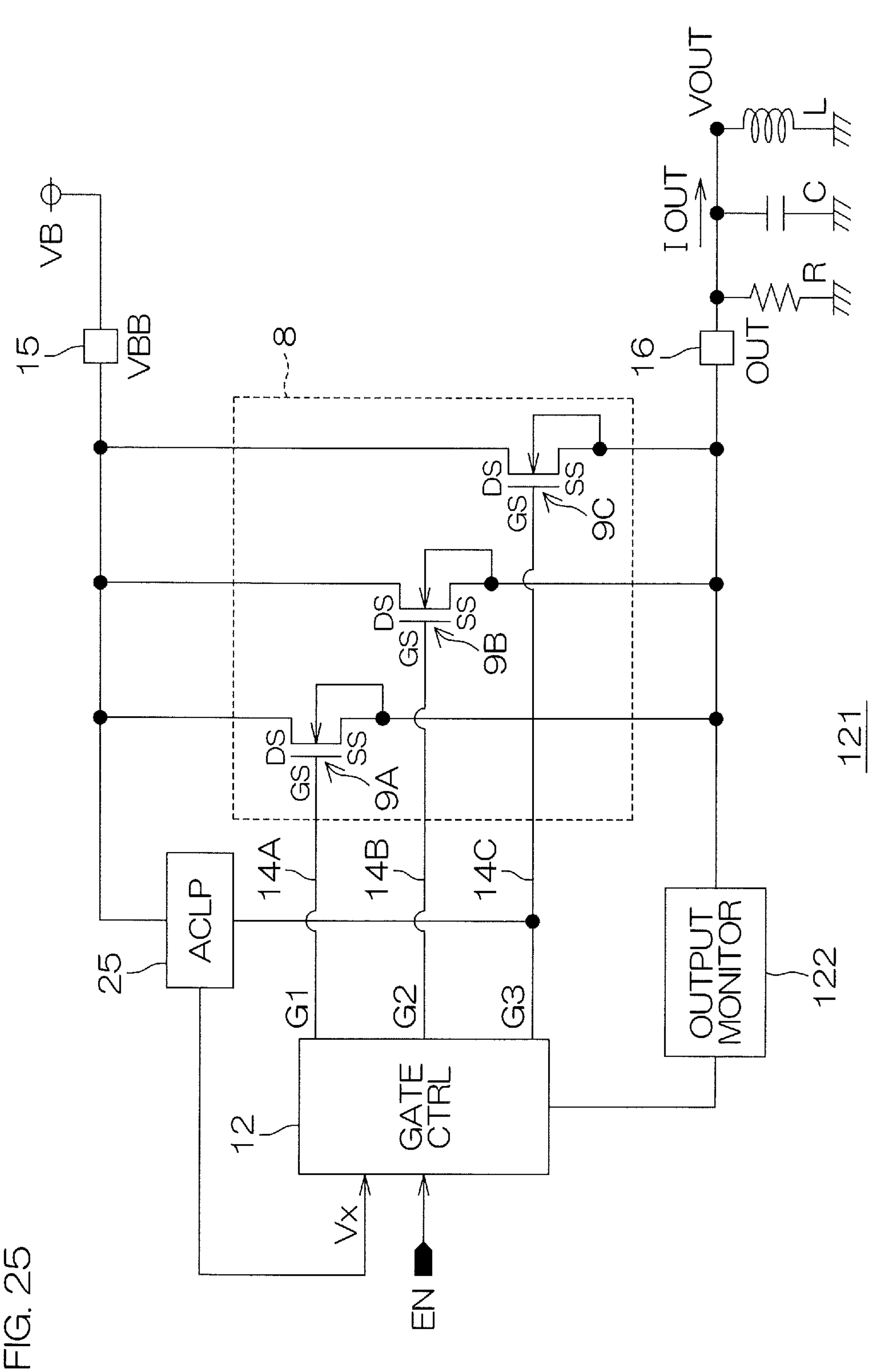
FIG. 25 is an equivalent circuit diagram of the power transistor shown in FIG. 24.
Figure 26:
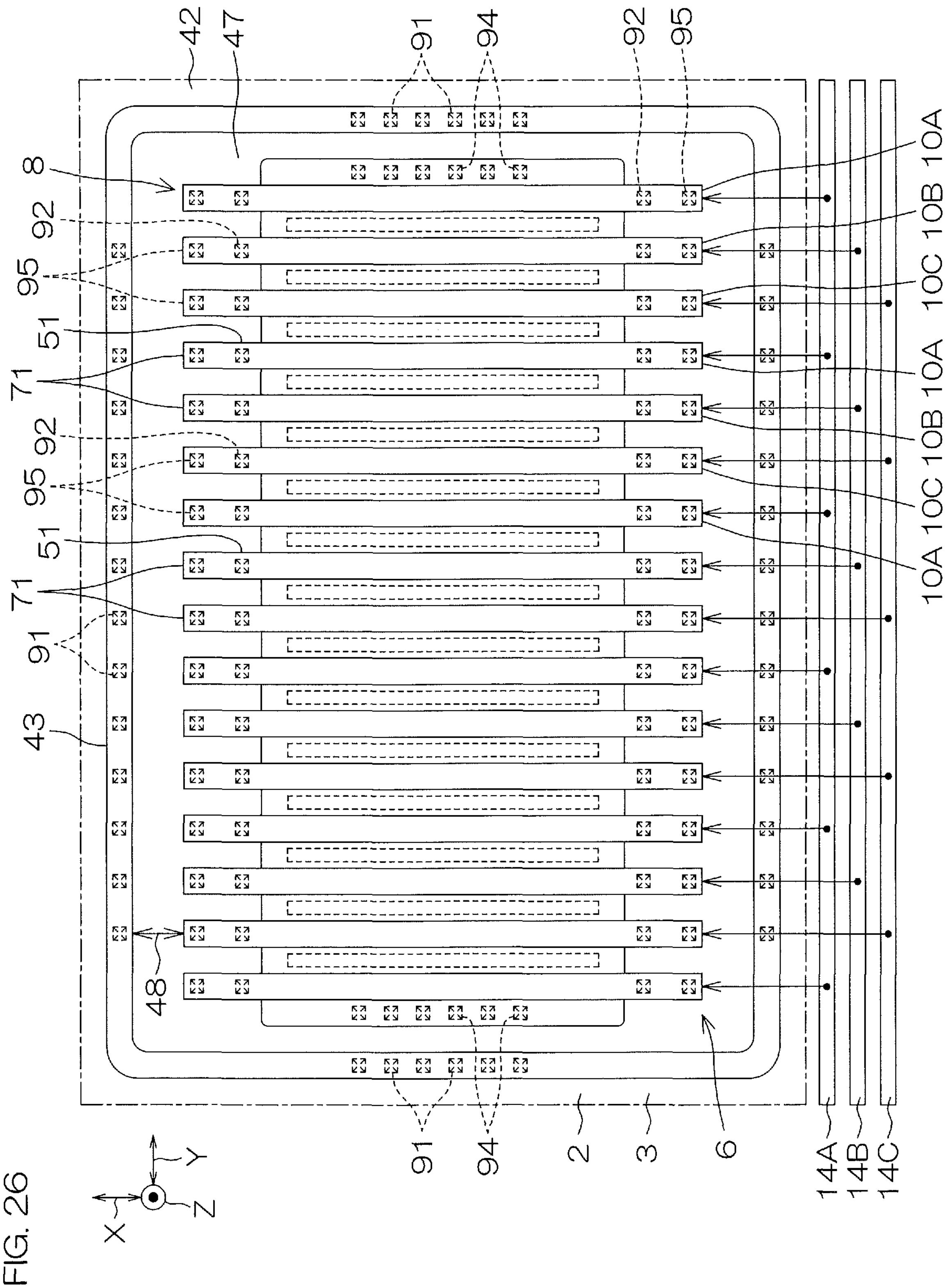
FIG. 26 is a plan view showing one configuration example of the 3-system power transistor.
Figure 27:
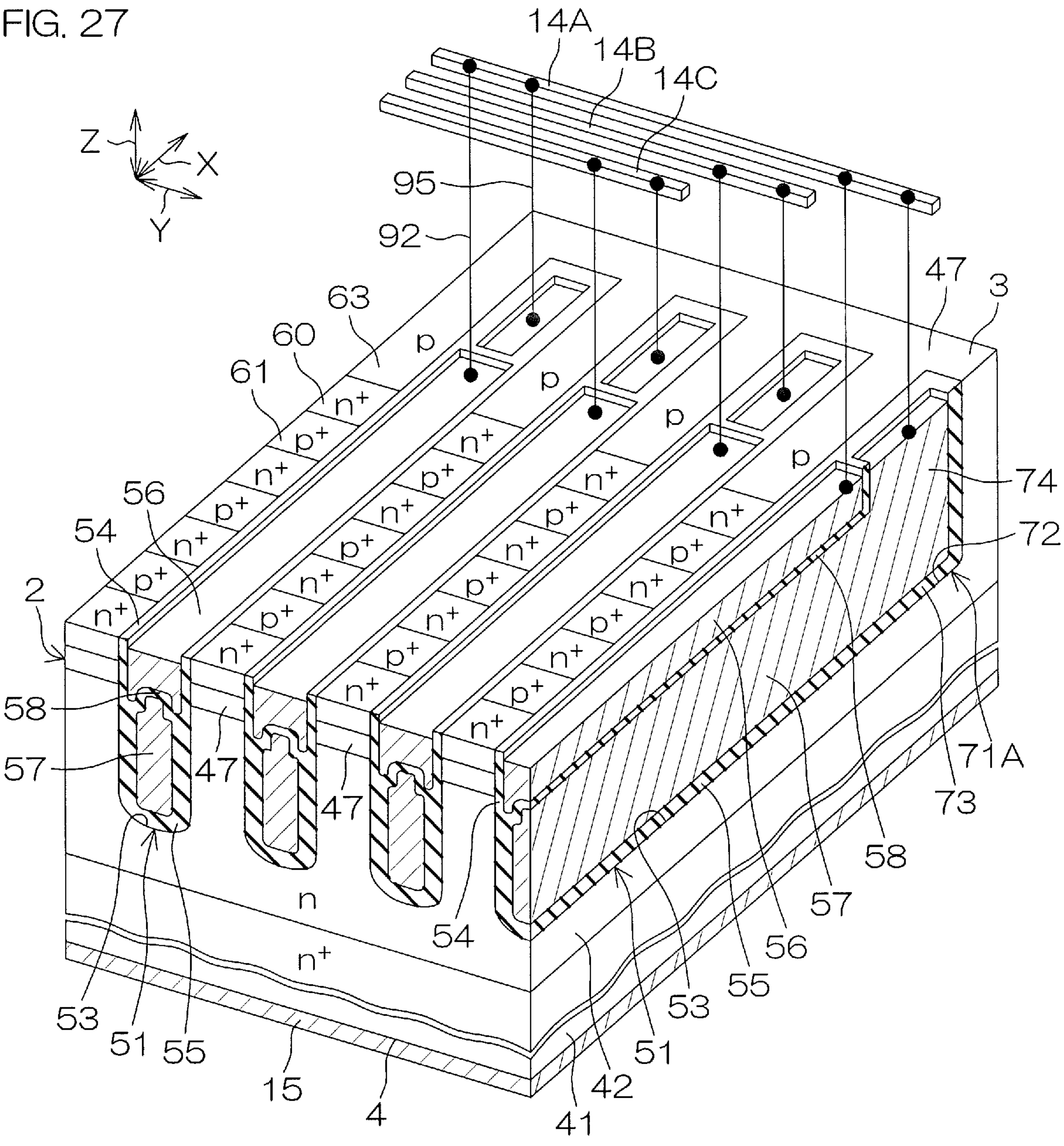
FIG. 27 is a sectional perspective view showing one configuration example of the 3-system power transistor.

FIG. 24 is a block circuit diagram showing a semiconductor device 121 according to a third preferred embodiment of the present invention (which is an embodiment for performing a 3-system-control in a case in which the 3-system power transistor 8 is adopted into the semiconductor device 1 according to the first preferred embodiment). FIG. 25 is an equivalent circuit diagram of the power transistor 8 shown in FIG. 24. FIG. 26 is a plan view showing one configuration example of the 3-system power transistor 8. FIG. 27 is a sectional perspective view showing one configuration example of the 3-system power transistor 8. Hereinafter, the structures corresponding to the structures described for the semiconductor device 1 will be described with the same reference numerals.

With reference to FIG. 24 to FIG. 27, the semiconductor device 121 includes the drain terminal 15 (the power terminal VBB), the source terminal 16 (the output terminal OUT), the 3-system power transistor 8, 3-number of the gate wirings 14, the active clamp circuit 25, an output voltage monitoring circuit 122 and the gate control circuit 12. In FIG. 24 and FIG. 25, an example in which at least one of a resistive load R, a capacitive load C and an inductive load L is connected to the source terminal 16.

The 3-system power transistor 8 includes the 3-number of system transistors 9, in this embodiment. The 3-number of system transistors 9 includes a first system transistor 9A, a second system transistor 9B and a third system transistor 9C. The 3-number of system gates GS of the first to third system transistors 9A to 9C each consists of the 3-number of the main gates GM (a first gate, a second gate and a third gate) of the power transistor 8.

The first system transistor 9A includes a single or plurality of first unit transistors 10A systematized as the individual control target from the plurality of unit transistors 10. The first system transistor 9A is composed of the plurality (6, in this embodiment) of first unit transistors 10A, in this embodiment. It is preferred that the plurality of first unit transistors 10A are systematized at intervals such as to sandwich at least one of the unit transistors 10.

The second system transistor 9B includes a single or plurality of second unit transistors 10B systematized as the individual control target from the plurality of unit transistors 10 excluding the first unit transistors 10A. The second system transistor 9B is composed of the plurality (5, in this embodiment) of second unit transistors 10B, in this embodiment. It is preferred that the plurality of second unit transistors 10B are systematized at intervals such as to sandwich at least one of the unit transistors 10.

The third system transistor 9C includes a single or plurality of third unit transistors 100 systematized as the individual control target from the plurality of unit transistors 10 excluding the first unit transistors 10A and the second unit transistors 10B. The third system transistor 9C is composed of the plurality (5, in this embodiment) of third system transistors 9C, in this embodiment. It is preferred that the plurality of third system transistors 9C are systematized at intervals such as to sandwich at least one of the unit transistors 10.

The single or plurality of second unit transistors 10B and/or the single or plurality of third system transistors 9C may be interposed in a region between the two first unit transistors 10A adjacent to each other. The single or plurality of first unit transistors 10A and/or the single or plurality of third system transistors 9C may be interposed in a region between the two second unit transistors 10B adjacent to each other. The single or plurality of first unit transistors 10A and/or the single or plurality of second unit transistors 10B may be interposed in a region between the third system transistors 9C adjacent to each other.

In this embodiment, the first unit transistor 10A, the second unit transistor 10B and the third system transistor 9C are iteratively systematized in the second direction Y in that order. According to this structure, the first to third unit transistors 10A to 100 are distributively systematized. That is, the unit transistors 10 of the same system are not continuously systematized in the second direction Y. This makes it possible to disperse temperature-rising regions in the first device region 6 when the first to third unit transistors 10A to 100 are individually controlled. A local temperature rise in the first device region 6 can thereby be suppressed.

The numbers of the first to third unit transistors 10A to 100 are arbitrary. The number of the second unit transistor 10B may be equal to the number of the first unit transistor 10A. The number of the second unit transistor 10B may be more than the number of the first unit transistor 10A, or may be less than the first unit transistor 10A.

The number of the third system transistor 9C may be equal to the number of the first unit transistor 10A. The number of the third system transistor 9C may be more than the number of the first unit transistor 10A, or may be less than the first unit transistor 10A. The number of the third system transistor 9C may be equal to the number of the second unit transistor 10B. The number of the third system transistor 9C may be more than the number of the second unit transistor 10B, or may be less than the second unit transistor 10B.

The total channel ratio RT of the 3-system power transistor 8 is divided into the three system channel ratios RS each consisting of a same or different value by the first system transistor 9A, the second system transistor 9B and the third system transistor 9C. The first system transistor 9A has a first system channel ratio RS1, the second system transistor 9B has a second system channel ratio RS2, and the third system transistor 9C has a third system channel ratio RS3. The first to third system channel ratios RS1 to RS3 each has various values as long as a relational expression (RT=RT1+RT2+RT3) in which a total sum of the first to third system channel ratios RS1 to RS3 becomes the total channel ratio RT (0%<RT≤100%) is satisfied.

The second system channel ratio RS2 may be equal to the first system channel ratio RS1 (RS1≈RS2). The second system channel ratio RS2 may be more than the first system channel ratio RS1 (RS1<RS2), or may be less than the first system channel ratio RS1 (RS2<RS1). The third system channel ratio RS3 may be equal to the first system channel ratio RS1 (RS1≈RS3). The third system channel ratio RS3 may be more than the first system channel ratio RS1 (RS1<RS3), or may be less than the first system channel ratio RS1 (RS3<RS1).

The third system channel ratio RS3 may be equal to the second system channel ratio RS2 (RS2≈RS3). The third system channel ratio RS3 may be more than the second system channel ratio RS2 (RS2<RS3), or may be less than the second system channel ratio RS2 (RS3<RS2). Hereinafter, for convenience, an example in which the total channel ratio RT is set to 75%, the first system channel ratio RS1 is set to 25%, the second system channel ratio RS2 is set to 25%, and the third system channel ratio RS3 is set to 25% will be described.

The 3-system power transistor 8 is to be controlled with a first operational mode, a second operational mode, a third operational mode, and a fourth operational mode. In the first operational mode, the first to third system transistors 9A to 9C are controlled to the OFF-states at a same timing. In the second operational mode, the first to third system transistors 9A to 9C are controlled to the ON-states at a same timing. In the third operational mode, only two of the first to third system transistors 9A to 9C are controlled to the ON-states at a same timing. In the fourth operational mode, only one of the first to third system transistors 9A to 9C is controlled to the ON-state.

In the first operational mode, the power transistor 8 is to be in a suspended state. In the second operational mode, the power transistor 8 is to be driven with the total channel ratio RT (=75%). In the third operational mode, the power transistor 8 is driven with a sum of any of two channel ratios of the first to third system channel ratios RS1 to RS3 (=50%), which is less than the total channel ratio RT. In the fourth operational mode, the power transistor 8 is driven with one of the first to third system channel ratios RS1 to RS3 (=25%), which is a channel ratio less than the total channel ratio RT.

In the third operational mode, the power transistor 8 is driven by the second and third system transistors 9B and 9C in a state in which the first system transistor 9A is suspended in this embodiment. The power transistor 8 is therefore driven with a sum of the second and third system channel ratios RS2 and RS3 (=50%) in the third operational mode. Also, in the fourth operational mode, the power transistor 8 is driven by the third system transistor 9C in a state in which the first and second system transistors 9A and 9B are suspended. The power transistor 8 is therefore driven with the third system channel ratio RS3 (=25%) in the fourth operational mode.

The 3-number of the gate wirings 14 includes a first gate wiring 14A, a second gate wiring 14B and a third gate wiring 14C. The first gate wiring 14A is electrically connected to the first system transistor 9A (the plurality of first unit transistors 10A). The second gate wiring 14B is electrically connected to the second system transistor 9B (the plurality of second unit transistors 10B) different from the first system transistor 9A. The third gate wiring 14C is electrically connected to the third system transistor 9C (the plurality of third system transistors 9C) different from the first system transistor 9A and the second system transistor 9B.

The active clamp circuit 25 is connected to the drain and the gate of the third system transistor 9C. The active clamp circuit 25 forcibly controls the third system transistor 9C to the ON-state when the source terminal 16 becomes a negative voltage. The active clamp circuit 25 thereby limits the drain-source voltage Vds (=VBB-VOUT) of the power transistor 8 to a value not more than the clamp voltage Vclp. The first system transistor 9A and the second system transistor 9B do not contribute to an active clamp operation. The active clamp circuit 25 is therefore not connected to the first system transistor 9A and the second system transistor 9B.

The output voltage monitoring circuit 122 is connected to the gate control circuit 12 and the source terminal 16. The output voltage monitoring circuit 122 is configured such as to monitor the output voltage VOUT and generate a drive signal Sc based on a monitoring result of the output voltage VOUT and output the drive signal Sc to the gate control circuit 12.

The gate control circuit 12 is electrically connected to the power transistor 8, the active clamp circuit 25 (the interior node voltage Vx) and the output voltage monitoring circuit 122. The gate control circuit 12 is electrically connected to the first to third system transistors 9A to 9C via the first to third gate wirings 14A to 14C.

The gate control circuit 12 generates the first to third gate signals G1 to G3 by which the first to third system transistors 9A to 9C are to be individually controlled in response to the enable signal EN, the interior node voltage Vx and the drive signal Sc, and output the first to third gate signals G1 to G3 to the first to third gate wirings 14A to 14C. Specifically, the gate control circuit 12 individually controls the first to third gate signals G1 to G3 such as to switch the ON-resistances Ron (the channel utilizations) of the power transistor 8 during an ON-transition operation, a normal operation, an OFF-transition operation and an active clamp operation of the power transistor 8.

The gate control circuit 12, as a basic operation, generates the first to third gate signals G1 to G3 of a high level when the enable signal EN is a high level whereas generates the first to third gate signals G1 to G3 of a low level when the enable signal EN is a low level. The first to third system transistors 9A to 9C are controlled to the OFF-states when the first to third gate signals G1 to G3 are the low level (=the first operational mode).

The gate control circuit 12 generates, during the ON-transition operation and the OFF-transition operation, the first to third gate signals G1 to G3 by which the first to third system transistors 9A to 9C are controlled to the ON-states (=the second operational mode).

Also, the gate control circuit 12 generates, during the normal operation, the first to third gate signals G1 to G3 by which the second and third system transistors 9B and 9C are controlled to the ON-states whereas the first system transistor 9A are controlled to the OFF-state (=the third operational mode).

Also, the gate control circuit 12 generates, during the active clamp operation, the first to third gate signals G1 to G3 by which the third system transistor 9C is controlled to the ON-state whereas the first and second system transistors 9A and 9B are controlled to the OFF-states (=the fourth operational mode).

Figure 28:
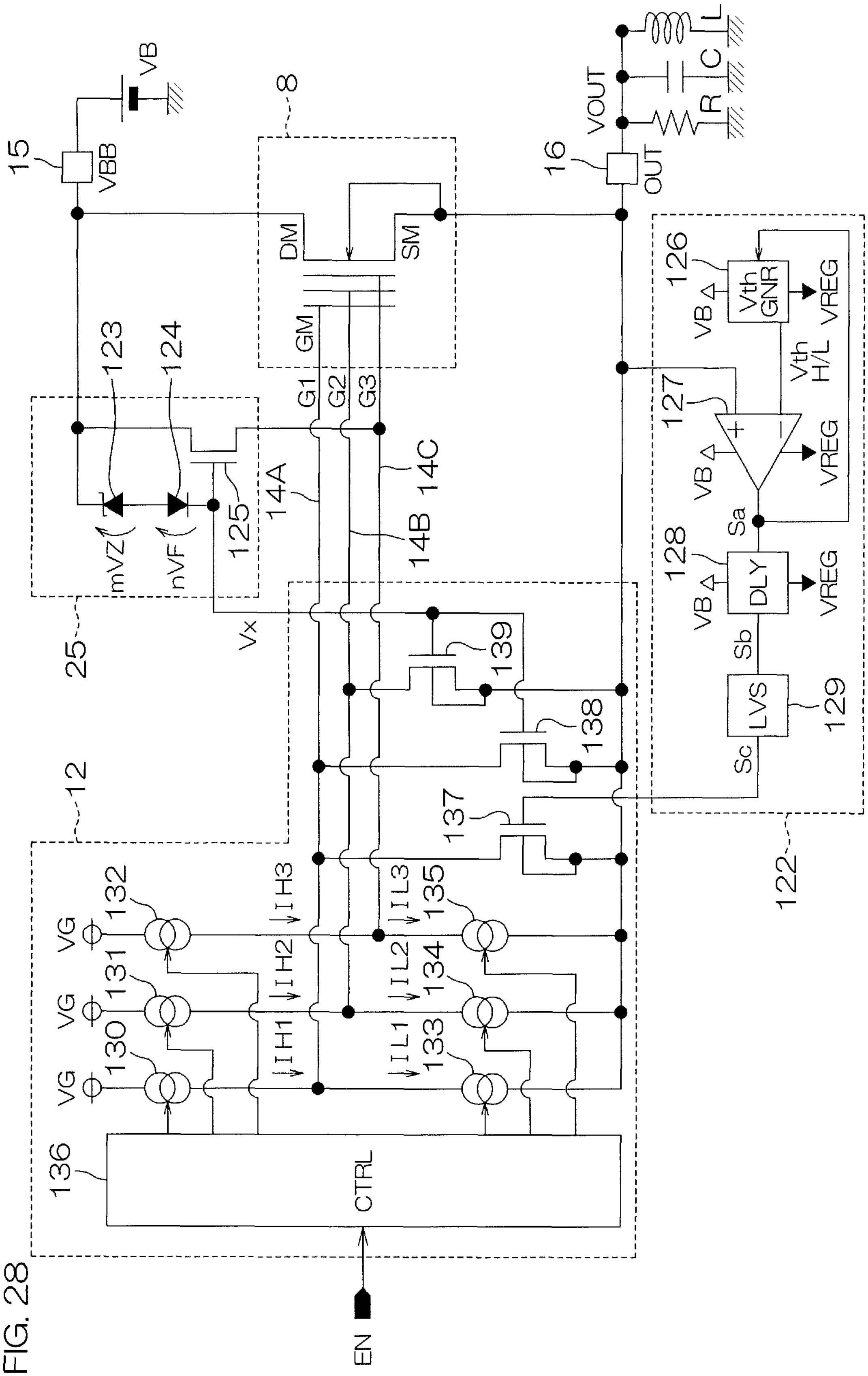
FIG. 28 is a circuit diagram showing one configuration example of a gate control circuit and an active clamp circuit shown in FIG. 24.

FIG. 28 is a circuit diagram showing one configuration example of the gate control circuit 12 and the active clamp circuit 25 shown in FIG. 24. FIG. 28 is a circuit diagram showing a principal portion of the control IC 11.

The first to third system transistors 9A to 9C each includes the system drain DS, the system source SS and the system gate GS. The system drains DS of the first to third system transistors 9A to 9C are electrically connected to the drain terminal 15, respectively. The system sources SS of the first to third system transistors 9A to 9C are electrically connected to the source terminal 16, respectively.

The first gate wiring 14A is electrically connected to the system gate GS (the first gate) of the first system transistor 9A. The second gate wiring 14B is electrically connected to the system gate GS (the second gate) of the second system transistor 9B. The third gate wiring 14C is electrically connected to the system gate GS (the third gate) of the third system transistor 9C.

In the description hereinafter, "a state of being electrically connected to the system gate GS of the first system transistor 9A" is included in "a state of being electrically connected to the first gate wiring 14A". Also, "a state of being electrically connected to the system gate GS of the second system transistor 9B" is included in "a state of being electrically connected to the second gate wiring 14B". Also, "a state of being electrically connected to the system gate GS of the third system transistor 9C" is included in "a state of being electrically connected to the third gate wiring 140".

The active clamp circuit 25 includes a Zener diode array 123, a diode array 124 and an n-channel-type clamp MISFET 125. The Zener diode array 123 consists of a series circuit including an m-stage (e.g. m=8) of Zener diodes connected in series in a forward direction. The number of the Zener diode is arbitrary, and it may be "m=1". The Zener diode array 123 includes a cathode and an anode. The cathode of the Zener diode array 102 is electrically connected to the drain terminal 15 and the system drains DS of the first to third system transistors 9A to 9C.

The diode array 124 consists of a series circuit including an n-stage (e.g. n=3) of pn-junction diodes connected in series in a forward direction. The number of the pn-junction diode is arbitrary, and it may be "n=1". The diode array 124 includes a cathode and an anode. The anode of the diode array 124 is reverse biased to the anode of the Zener diode array 123.

The clamp MISFET 125 includes a drain, a source, a gate and a back gate. The drain of the clamp MISFET 125 is electrically connected to the drain terminal 15 and the system drains DS of the first to third system transistors 9A to 9C. The source of the clamp MISFET 125 is electrically connected to the third gate wiring 14C. The gate of the clamp MISFET 125 is electrically connected to the cathode of the diode array 124.

The output voltage monitoring circuit 122 includes a threshold voltage generating unit 126 that is configured such as to generate a threshold voltage Vth, a comparator 127 that is configured such as to generate a comparison signal Sa, a delay unit 128 that is configured such as to generate a delay signal Sb, and a level shifter 129 that is configured such as to generate the drive signal Sc.

The threshold voltage generating unit 126 is configured such as to generate the threshold voltage Vth (VthH/VthL) having a hysteresis in a range between the power supply voltage VB and a constant voltage VREG (e.g. VREG=VB−5V). The threshold voltage generating unit 126 generates the threshold voltages Vth consisting of different voltage values depending on the comparison signal Sa. Specifically, the threshold voltage generating unit 126 generates a threshold voltage VthH (e.g. VthH=VB−100 mV) of a high level when the comparison signal Sa is a low level, and generates a threshold voltage VthL (e.g. VthL=VB−200 mV) when the comparison signal Sa is a high level.

The comparator 127 has a non-inverted input terminal (+) and an inverted input terminal (−). The comparator 127 is configured such as to compare the output voltage VOUT input to the non-inverted input terminal (+) and the threshold voltage Vth input to the inverted input terminal (−) and generates the comparison signal Sa. The comparison signal Sa becomes the low level (≈VREG) when the output voltage VOUT is less than the threshold voltage Vth (VOUT<Vth) and becomes the high level (≈VB) when the output voltage VOUT is more than the threshold voltage Vth (VOUT>Vth).

The delay unit 128 is configured such as to generate the delay signal Sb which gives a delay of a predetermined period to a rising edge of the comparison signal Sa. Specifically, the delay unit 128 raises the delay signal Sb to the high level (≈VB) after the comparison signal Sa rises to the high level and a predetermined delay time Td elapses. On the other hand, the delay unit 128 promptly lowers the delay signal Sb to the low level (≈VREG) when the comparison signal Sa drops to the low level. It is preferred that the delay time Td is set to a required time or more from when the output voltage VOUT exceeds the threshold voltage VthH to when the output voltage VOUT reaches the power supply voltage VB. The delay time Td may be set to a variable value that is adjusted to an arbitrary value.

The level shifter 129 is configured such as to give a level shift to the delay signal Sb to generate the drive signal Sc. The drive signal Sc becomes a high level (≥VOUT+Vgs, where Vgs is an ON-threshold voltage of a first drive MISFET 137 described later) when the delay signal Sb is the high level, and becomes a low level (≈VOUT) when the delay signal Sb is the low level.

The gate control circuit 12 includes first to sixth current sources 130 to 135, a controller 136, and an n-channel-type first to third drive MISFETs 137 to 139 (first to third switch).

The first current source 130 is configured such as to generate a first source current IH1. The first current source 130 is electrically connected to an apply end of a boosted voltage VG (=a charge pump output) and the first gate wiring 14A. The second current source 131 is configured such as to generate a second source current IH2. The second current source 131 is connected to an apply end of a boosted voltage VG and the second gate wiring 14B. The third current source 132 is configured such as to generate a third source current IH3. The third current source 132 is connected to an apply end of a boosted voltage VG and the third gate wiring 14C.

The fourth current source 133 is configured such as to generate a first sink current IL1. The fourth current source 133 is connected to the first gate wiring 14A and the source terminal 16 (the output voltage VOUT). The fifth current source 134 is configured such as to generate a second sink current IL2. The fifth current source 134 is connected to the second gate wiring 14B and the source terminal 16. The sixth current source 135 is configured such as to generate a third sink current IL3. The sixth current source 135 is connected to the third gate wiring 14C and the source terminal 16.

The controller 136 is electrically connected to the first to sixth current sources 130 to 135. The controller 136 controls the first to third current sources 130 to 132 to ON-states whereas controls the fourth to sixth current sources 133 to 135 to OFF-states when the enable signal EN is the high level (EN=H). Therefore, the first source current IH1 is output to the first gate wiring 14A, the second source current IH2 is output to the second gate wiring 14B, and the third source current IH3 is output to the third gate wiring 14C.

The controller 136 controls the first to third current sources 130 to 132 to OFF-states whereas controls the fourth to sixth current sources 133 to 135 to ON-states when the enable signal EN is the low level (EN=L). Therefore, the first sink current IL1 is pulled from the first gate wiring 14A, the second sink current IL2 is pulled from the second gate wiring 14B, and the third sink current IL3 is pulled from the third gate wiring 14C.

The first drive MISFET 137 includes a drain, a source, a gate and a back gate. The drain of the first drive MISFET 137 is electrically connected to the first gate wiring 14A. The source of the first drive MISFET 137 is electrically connected to the source terminal 16. The gate of the first drive MISFET 137 is electrically connected to the output voltage monitoring circuit 122 (specifically, the level shifter 129). The back gate of the first drive MISFET 137 is electrically connected to the source terminal 16. The first drive MISFET 137 is to be driven in response to the drive signal Sc input to the gate.

The second drive MISFET 138 includes a drain, a source, a gate and a back gate. The drain of the second drive MISFET 138 is electrically connected to the first gate wiring 14A. The source of second drive MISFET 138 is electrically connected to the source terminal 16. The gate of the second drive MISFET 138 is electrically connected to the apply end of the interior node voltage Vx. The back gate of the second drive MISFET 138 is electrically connected to the source terminal 16.

The third drive MISFET 139 includes a drain, a source, a gate and a back gate. The drain of the third drive MISFET 139 is electrically connected to the second gate wiring 14B. The source of the third drive MISFET 139 is electrically connected to the source terminal 16. The gate of the third drive MISFET 139 is electrically connected to the apply end of the interior node voltage Vx. The back gate of the third drive MISFET 139 is electrically connected to the source terminal 16.

The second and third drive MISFETs 138 and 139 are controlled to ON-states or OFF-states in response to the interior node voltage Vx input to the gates, respectively. The interior node voltage Vx may be an arbitrary voltage of the active clamp circuit 25. The interior node voltage Vx may be a gate voltage of the clamp MISFET 125, or may be an anode voltage of any one of the pn-junction diodes of the diode array 124.

Figure 29:
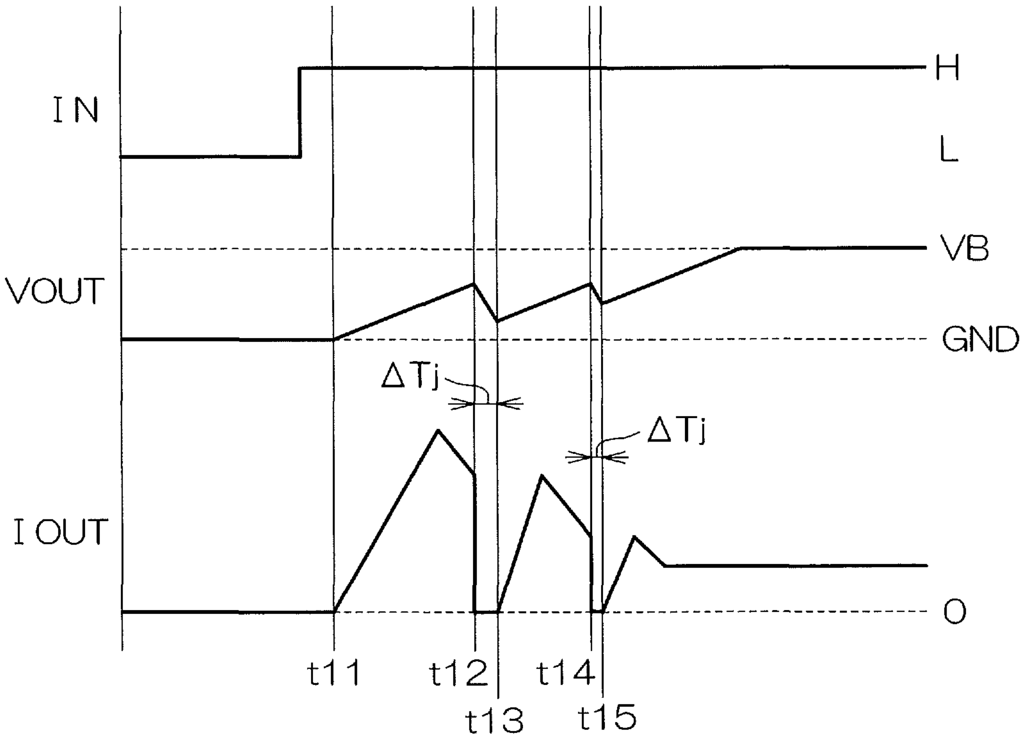
FIG. 29 is a chart which shows a starting behavior when a capacitive load is connected.

FIG. 29 is a chart which shows a starting behavior when a capacitive load is connected. In FIG. 29, an external control signal IN, the output voltage VOUT, and the output current IOUT are shown in that order from a top of the page. Hereinafter, an example of a case in which a 1-system power transistor 8 is incorporated into the semiconductor device 1 according to the first preferred embodiment and the capacitive load C is connected to the source terminal 16 (the output terminal OUT) will be described.

The semiconductor device 1 has the overheat protection circuit 35 (see also FIG. 7). The overheat protection circuit 35 forcibly controls the power transistor 8 to the OFF-state depending on a temperature conditions. The overheat protection circuit 35 may forcibly control the power transistor 8 to the OFF-state when a temperature Tj of the power transistor 8 is reached to a constant value. The overheat protection circuit 35 may forcibly control the power transistor 8 to the OFF-state when a temperature difference ΔTj between the power transistor 8 and another circuit block (such as a logic circuit which hardly generates heat) is reached to a constant value.

With reference to FIG. 29, in a case in which the capacitive load C is connected to the source terminal 16, a rush current flows during the ON-transition operation of the power transistor 8, and the power transistor 8 instantaneously generates heat (see times t11 and t12, and times t13 and t14). In a case in which the overheat protection circuit 35 is driven due to the heat generated by the power transistor 8, the power transistor 8 is forcibly controlled to the OFF-state by the overheat protection circuit 35 in a middle of the starting. A delay is therefore caused in a startup time of the power transistor 8 (see times t12 and t13, and times t14 and t15).

Figure 30:
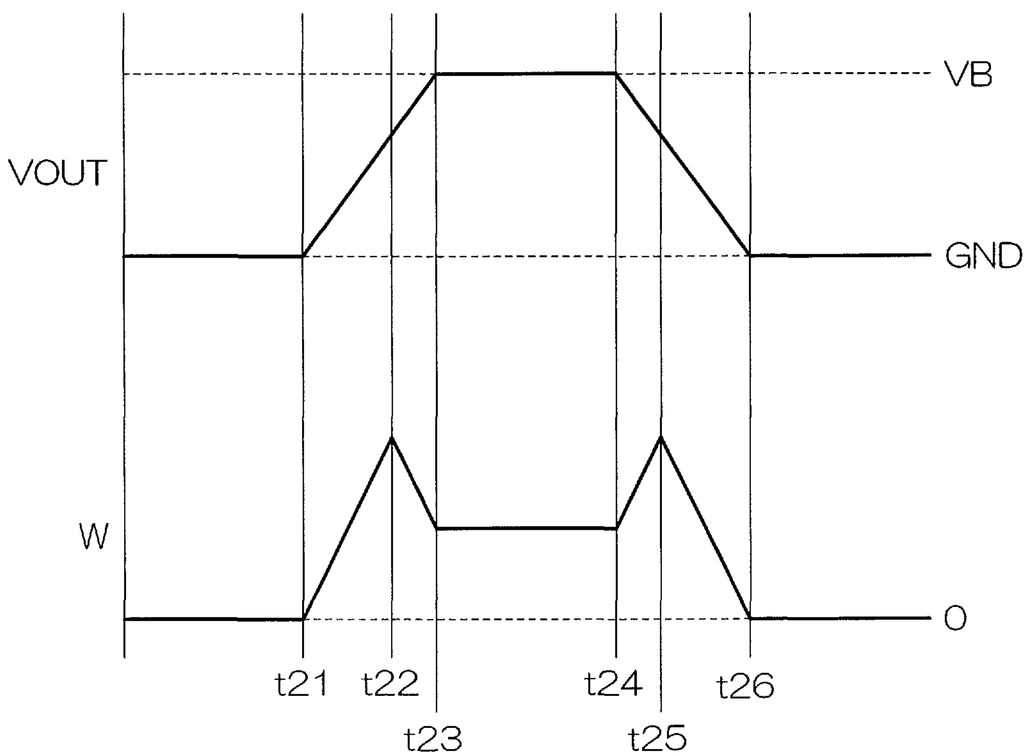
FIG. 30 is a chart which shows a power consumption when the capacitive load is connected.

FIG. 30 is a chart which shows a power consumption when the capacitive load is connected. In FIG. 30, the output voltage VOUT and a power consumption W are shown in that order from a top of the page.

With reference to FIG. 30, in the power transistor 8, the ON-resistance Ron at the ON-transition operation and the ON-resistance Ron at the OFF-transition operation each becomes higher than the ON-resistance Ron at the normal operation. A period of the ON-transition operation is a period (from a time t21 to a time t23) at which the output voltage VOUT is raised. A period of the OFF-transition operation is a period (from a time t24 to a time t26) at which the output voltage VOUT is dropped. A period of the normal operation is a period (from the time t23 to the time t24) at which the output voltage VOUT becomes a steady.

Therefore, in the power transistor 8, at the ON-transition operation and at the OFF-transition operation, the power consumption W increases and therefore rapid temperature rises are to be caused. The power consumption W is expressed by a value obtained by multiplying the output current IOUT with the square of the ON-resistance Ron ($W=IOUT\times RON^2$). In this result, it is understood that the overheat protection circuit 35 needs to be designed with a high precision such as not to malfunction due to the instantaneous heat generation from the power transistor 8 due to the rush current.

By adopting the 2-system power transistor 8 as is the semiconductor device 101 according to the second preferred embodiment, the ON-resistance Ron at the ON-transition operation, at normal operation, and at OFF-transition operation can be controlled. That is, according to the semiconductor device 101 according to the second preferred embodiment, it is possible to control the power transistor 8 such that the ON-resistance Ron at the ON-transition operation (at the OFF-transition operation) is to be less than the ON-resistance Ron at the normal operation by the individual controls of the first and second system transistors 9A and 9B.

However, in this case, the ON-resistance Ron at the active clamp operation cannot be appropriately controlled. Therefore, in the semiconductor device 121 according to the third preferred embodiment, the 3-system power transistor 8 is adopted and a control to be described with FIG. 31 and FIG. 32A to FIG. 32D is implemented.

Figure 31:
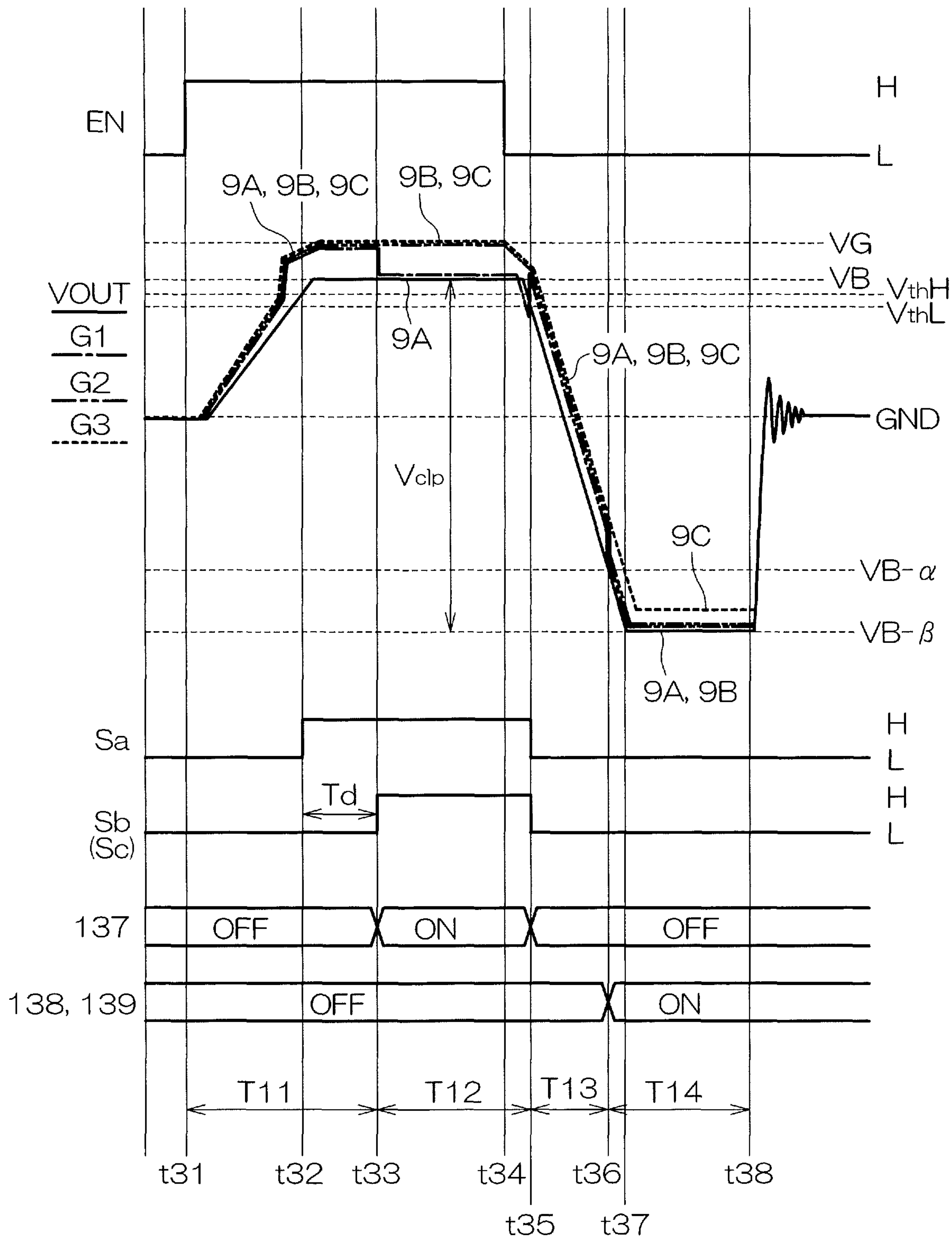
FIG. 31 is a timing chart showing a control example to the power transistor.

FIG. 31 is a timing chart showing a control example to the power transistor 8. FIGS. 32A to 32D are sectional perspective views showing control examples to the power transistor 8. In FIG. 32A to FIG. 32D, the channels (the source region 60) in the OFF-states are shown by filled hatchings. Hereinafter, it is supposed that at least the inductive load L (e.g. an inductance component of a harness) is connected to the source terminal 16 (the output terminal OUT).

In FIG. 31, the enable signal EN, the output voltage VOUT (solid line), the first gate signal G1 (dashed line), the second gate signals G2 (double-dashed line), the third gate signal G3 (broken line), the comparison signal Sa, the delay signal Sb (the drive signal Sc), the output signal of the first drive MISFET 137, the output signal of the second drive MISFET 138, and the output signal of the third drive MISFET 139 are shown in that order from a top of the page.

With reference to FIG. 31, the enable signal EN is kept to the low level until a time t31. In the enable signal EN, the low level is a logical level when the power transistor 8 is controlled to the OFF-state, and the high level is a logical level when the power transistor 8 is controlled to the ON-state. At this time, since the first to third gate signals G1 to G3 are kept to the low level (≈VOUT), the first to third system transistors 9A to 9C are controlled to the OFF-states (see FIG. 32A). This state corresponds to the first operational mode of the power transistor 8.

At the time t31, the enable signal EN is controlled to the high level from the low level. When the enable signal EN becomes the high level, the first to third gate signals G1 to G3 rise from the low level (≈VOUT) to the high level (≈VG). The power transistor 8 thereby shifts from the OFF-state to the ON-transition operation, and the output voltage VOUT raises accordingly.

The output voltage VOUT is less than the threshold voltage VthH of the high level (VOUT<VthH) at a rising starting point of the output voltage VOUT. The comparison signal Sa and the delay signal Sb (the drive signal Sc) are therefore the low levels, respectively. The first to third drive MISFETs 137 to 139 are thereby controlled to the OFF-states, respectively. That is, the gates and the sources of the first to third system transistors 9A to 9C are each controlled to open states.

Figure 32A:
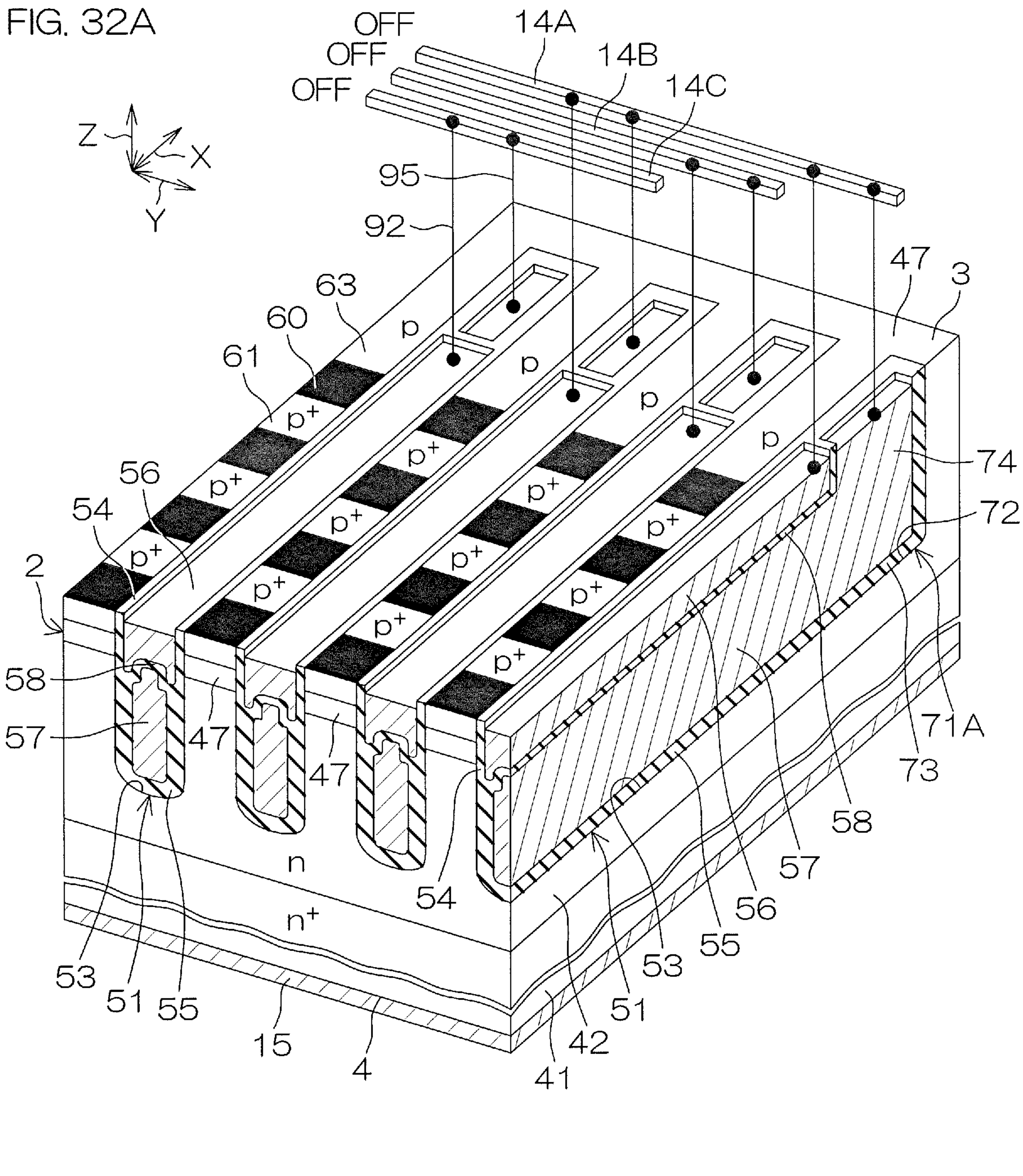
FIGS. 32A to 32D are sectional perspective views showing control examples to the power transistor.
Figure 32B:
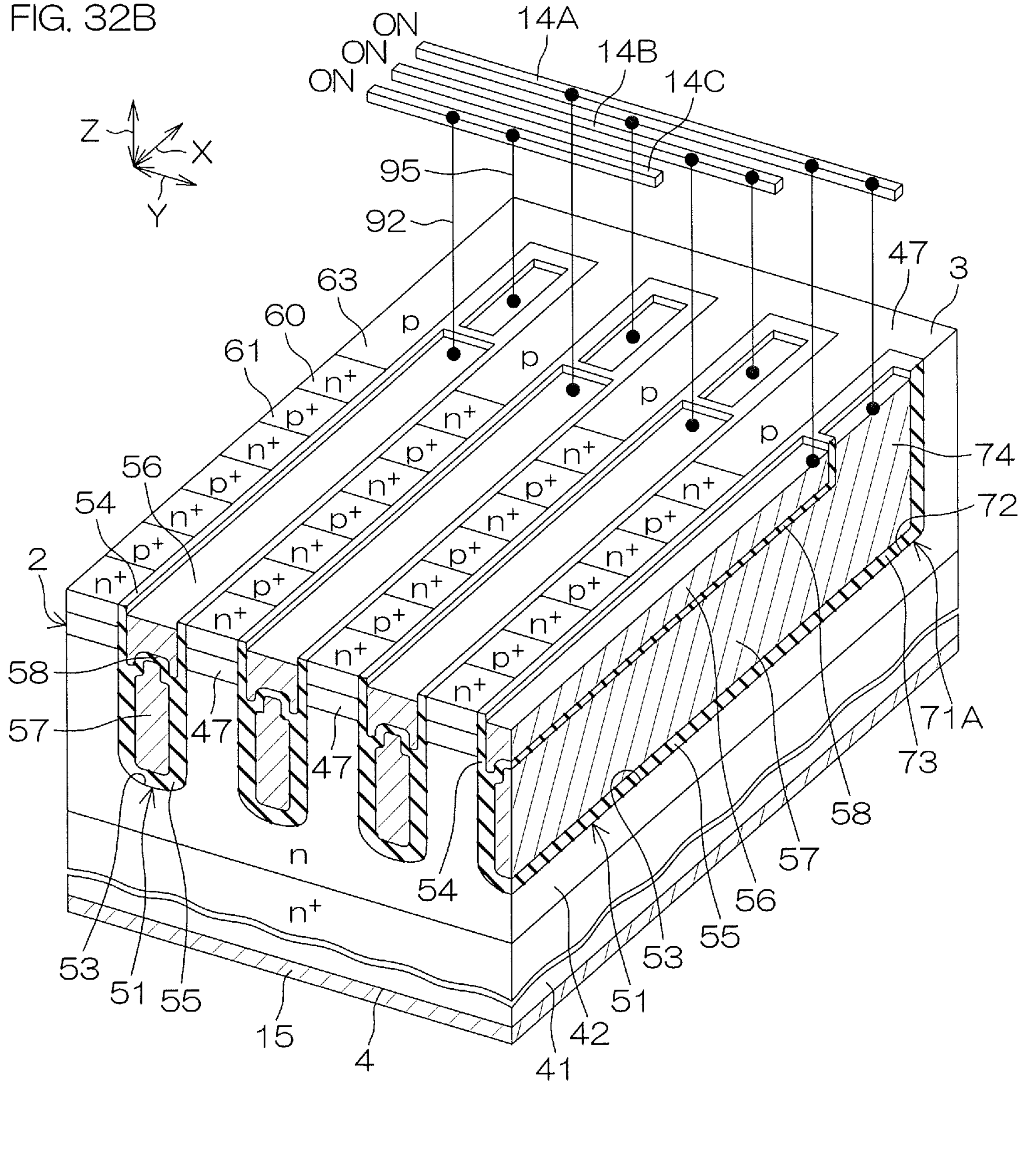
Figure 32C:
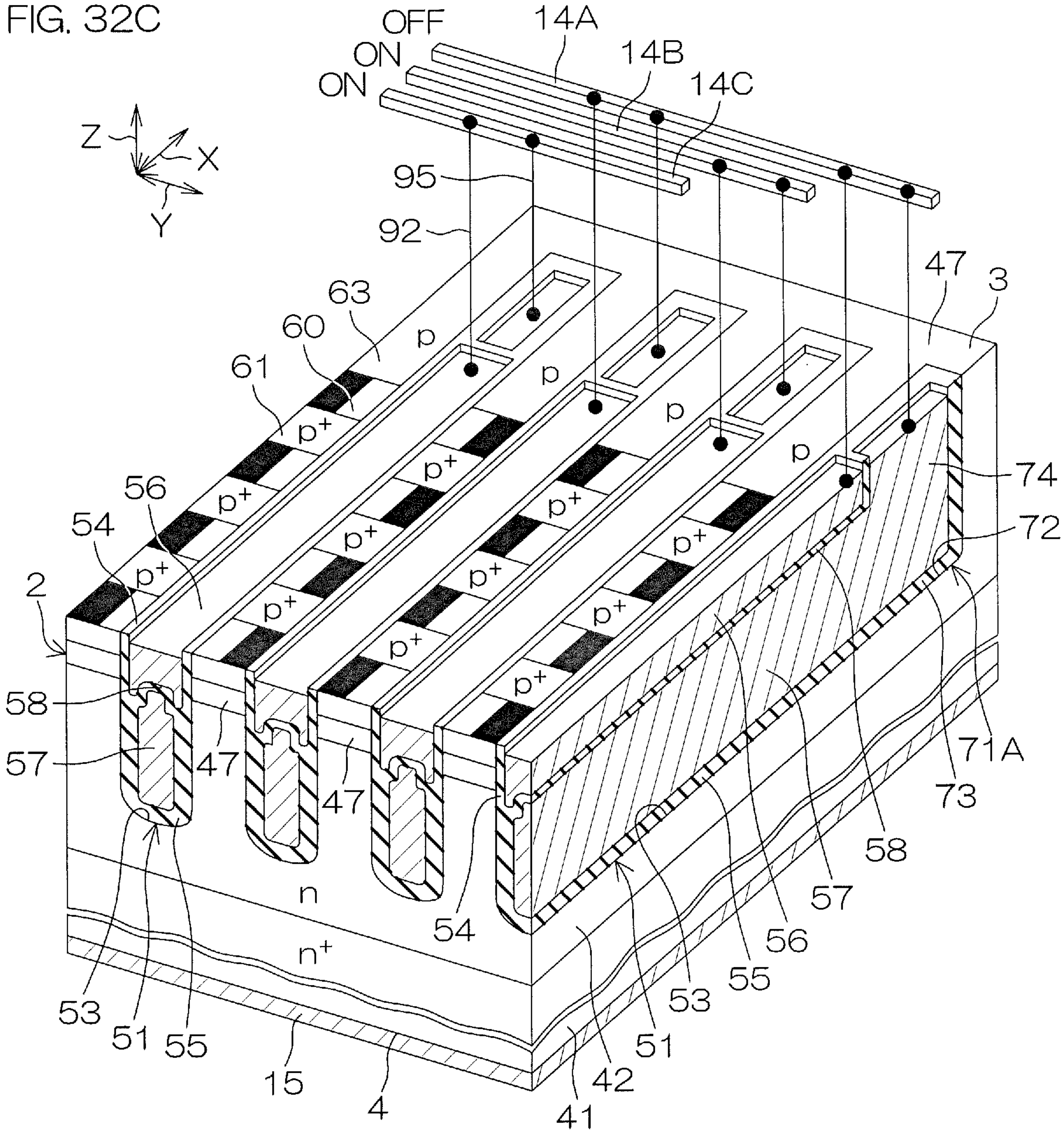
Figure 32D:
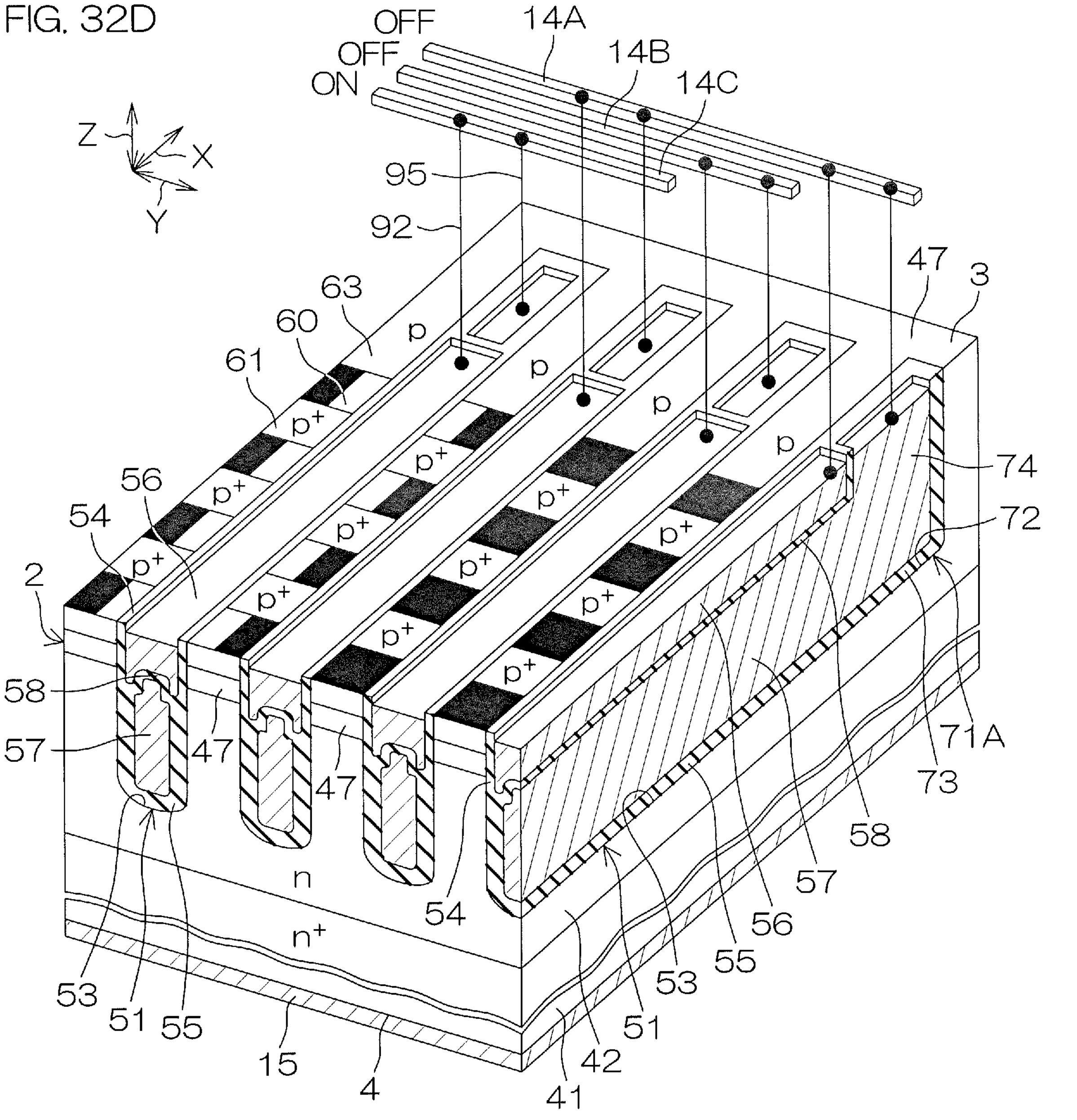

The power transistor 8 is therefore driven by the first to third system transistors 9A to 9C during the ON-transition operation (see FIG. 32B). This state corresponds to the second operational mode of the power transistor 8. That is, the power transistor 8 is driven with the total channel ratio RT (=75%) during the ON-transition operation. Therefore, the channel utilization of the power transistor 8 relatively increases, and the ON-resistance Ron relatively decreases.

At a time t32, when the output voltage VOUT exceeds the high level of the threshold voltage VthH (VthH<VOUT), the power transistor 8 transitions to the normal operation from the ON-transition operation, and the comparison signal Sa rises from the low level to the high level. The delay signal Sb (the drive signal Sc) is kept to the low level until the delay time Td elapses, and therefore the first to third drive MISFETs 137 to 139 are kept to the OFF-state, respectively.

Therefore, the power transistor 8 is driven by the first to third system transistors 9A to 9C in a period until the delay time Td elapses after the transition to the normal operation. That is, the power transistor 8 is driven with the total channel ratio RT (=75%) in the period until the delay time Td elapses after the transition to the normal operation.

At a time t33, when the delay time Td elapses after the comparison signal Sa rises to the high level, the delay signal Sb (the drive signal Sc) rises to the high level. The first drive MISFET 137 thereby becomes the ON-state, and the gate and the source of the first system transistor 9A become short-circuited (G1=VOUT). That is, the first system transistor 9A is forcibly controlled to the OFF-state whereas the second and third system transistors 9B and 9C are kept in the ON-states.

Therefore, during the normal operation after the delay time Td has elapsed, the power transistor 8 is driven by the second and third system transistors 9B and 9C in a state in which the first system transistor 9A is suspended (see FIG. 32). This state corresponds to the third operational mode of the power transistor 8. That is, during the normal operation after the delay time Td has elapsed, the power transistor 8 is driven with the sum of the second and third system channel ratios RS2 and RS3 (=50%) which is less than the total channel ratio RT (=75%). Therefore, the channel utilization of the power transistor 8 relatively decreases, and the ON-resistance Ron relatively increases. That is, the channel utilization at the normal operation is more than zero and less than the channel utilization at the ON-transition operation.

At a time t34, the enable signal EN is controlled to the low level from the high level. When the enable signal EN becomes the low level, the first to third gate signals G1 to G3 drops from the high level to the low level. The power transistor 8 thereby transitions to the OFF-transition operation from the normal operation, and the output voltage VOUT begins to drop from the power supply voltage VB.

At a time t35, when the output voltage VOUT becomes a threshold voltage VthL of the low level, the comparison signal Sa and the delay signal Sb (the drive signal Sc) each drops to the low level. The first drive MISFET 137 is thereby turned to the OFF-state, and accordingly the gate and the source of the first system transistor 9A are opened again. That is, the first system transistor 9A is controlled to the ON-state from the OFF-state.

The power transistor 8 is therefore driven by the first to third system transistors 9A to 9C at the OFF-transition operation (see FIG. 32A). This state corresponds to the second operational mode of the power transistor 8. That is, during the OFF-transition operation, the power transistor 8 is driven with the total channel ratio RT (=75%) that exceeds the channel ratio (=50%) at the normal operation. Therefore, the channel utilization of the power transistor 8 relatively increases, and the ON-resistance Ron relatively decreases.

The inductive load L continues to flow the output current IOUT during the OFF-transition operation of the power transistor 8 until an energy stored during the ON period of the power transistor 8 is released. This causes the output voltage VOUT to plummet to a negative voltage lower than the ground voltage GND. The power transistor 8 therefore transitions to the active clamp operation from the OFF-transition operation.

At a time t36, when the output voltage VOUT drops to the channel switching voltage VB-α that is lower by a predetermined value α than the power supply voltage VB, the interior node voltage Vx becomes higher than the ON-threshold voltages of the first and second drive MISFETs 136 and 137. As a result, the first drive MISFET 137 is controlled to the ON-state, and therefore the gate and the source of the first system transistor 9A become a short-circuited state (G1=VOUT). Also, the second drive MISFET 138 is controlled to the ON-state, and therefore the gate and the source of the second system transistor 9B become a short-circuited state (G2=VOUT). That is, the first and second system transistors 9A and 9B are controlled to the OFF-states at the time t36.

On the other hand, at a time t37, when the output voltage VOUT drops to the lower limit voltage VB-β (e.g. VB-50V) that is lower by a predetermined value β (α<β) than the power supply voltage VB, the third system transistor 9C is controlled to the ON-state by the active clamp circuit 25. The lower limit voltage VB-β is less than the channel switching voltage VB-α (VB-β<VB-α).

That is, the third system transistor 9C is to be driven after the first and second system transistors 9A and 9B are suspended by the active clamp circuit 25. The power transistor 8 is therefore driven by the third system transistor 9C at the active clamp operation in a state in which the first and second system transistors 9A and 9B are suspended (see FIG. 32D). This state corresponds to the fourth operational mode of the power transistor 8. Therefore, during the active clamp operation, the power transistor 8 is driven with the third system channel ratio RS3 (=25%) that is less than the channel ratio at the normal operation.

The output current IOUT due to the inductive load L is discharged via the third system transistor 9C. The output voltage VOUT is therefore limited to a value not less than the lower limit voltage VB-β. The active clamp circuit 25 controls the output voltage VOUT based on the power supply voltage VB and limits the drain-source voltage Vds (=VB−VOUT) of the power transistor 8 to a value not more than the clamp voltage Vclp (=β). The active clamp operation is continued until a time t38 when the energy stored in the inductive load L is exhausted and the output current IOUT stops flowing.

Series of the operations of the power transistor 8 can be summarized as follows. Hereinafter, a period during the times t31 to t33 is referred to as an ON-transition period T11, a period during the times t33 to t35 is referred to as a normal operation period T12, a period during the times t35 to t36 is referred to as an OFF-transition period T13, and a period during the times t36 to t38 is referred to as an active clamp operation period T14.

The power transistor 8 is controlled to the OFF-state until the ON-transition period T11 (=the first operational mode). At the ON-transition period T11, the first to third drive MISFETs 137 to 139 are controlled to the ON-states. The power transistor 8 is thereby driven by the first to third system transistors 9A to 9C at the ON-transition period T11 (=the second operational mode). The power transistor 8 is driven with the total channel ratio RT (=75%) during the ON-transition period T11.

At the normal operation period T12, the first drive MISFET 137 is controlled to the ON-state whereas the second and third drive MISFETs 137 and 138 are controlled to the OFF-states. At the normal operation period T12, the power transistor 8 is thereby driven by the second and third system transistors 9B and 9C in the state in which the first system transistor 9A is suspended (=the third operational mode). The power transistor 8 is driven with the channel ratio (=50%) less than the channel ratio (=75%) during the ON-transition operation.

At the OFF-transition period T13, the first drive MISFET 137 is controlled to the OFF-state again. That is, at the OFF-transition period T13, the first to third drive MISFETs 137 to 139 are all controlled to the OFF-states. At the OFF-transition period T13, the power transistor 8 is driven by the first to third system transistors 9A to 9C (=the first operational mode). The power transistor 8 is driven with the total channel ratio RT (=75%) that exceeds the channel ratio (=50%) during the normal operation.

At the active clamp operation period T14, the third drive MISFET 139 is controlled to the OFF-state whereas the first and second drive MISFETs 136 and 137 are controlled to the ON-states. At the active clamp operation period T14, the power transistor 8 is thereby driven by the third system transistor 9C in the state in which the first and second system transistors 9A and 9B are suspended (=the fourth operational mode). During the active clamp operation, the power transistor 8 is driven with the channel ratio (=25%) less than the channel ratio (=50%) at the normal operation.

As described above, in the power transistor 8, the ON-resistance Ron at the ON-transition operation becomes lower than the ON-resistance Ron at the normal operation, which is a steady state value. Therefore, the power consumption W of the power transistor 8 can be suppressed even in a situation where an excessive amount of the rush current can flow at the startup (when the capacitive load C is connected) so that the overheating protection (particularly ΔTj protection) is difficult to apply. This makes it possible to reduce the startup time of the power transistor 8.

On the other hand, in the power transistor 8, the ON-resistance Ron at the normal operation becomes larger than the ON-resistance Ron at the ON-transition operation. In other words, the ON-resistance Ron of the power transistor 8 is returned to the steady value after the startup of the power transistor 8 is completed. If a difference between the rush current immediately after the startup (e.g. dozens of amps) and the steady current (e.g. a few amps) after the startup is completed is large, it is preferred that an overcurrent protection is prioritized over a reduction of the power consumption W and that the ON-resistance Ron of the power transistor 8 is returned to the steady state without being kept down.

At the OFF-transition operation of the power transistor 8, the ON-resistance Ron of the power transistor 8 is lowered from the steady value (the ON-resistance Ron at the normal operation) as well as the ON-transition operation of the power transistor 8. This makes it possible to suppress the rush current and the power consumption W.

At the active clamp operation of the power transistor 8, the ON-resistance Ron of the power transistor 8 is raised than the steady state. This makes it possible to improve the active clamp withstand amount Eac since the rapid temperature rise to be caused by the counter electromotive force of the inductive load L can be suppressed.

In this embodiment, the example in which, at the normal operation, the second system transistor 9B and the third system transistor 9C are controlled to the ON-states whereas the first system transistor 9A is controlled to the OFF-state is described. However, at the normal operation, any one or two of the first to third system transistors 9A to 9C may be controlled to the ON-states whereas the remaining one or two are controlled to the OFF-states.

In this embodiment, the example in which, at the active clamp operation, the third system transistor 9C is controlled to the ON-state whereas the first system transistor 9A and the second system transistor 9B are controlled to the OFF-states is described. However, at active clamp operation, any one or two of the first to third system transistors 9A to 9C may be controlled to the ON-states whereas the remaining one or two are controlled to the OFF-states.

Figure 33:
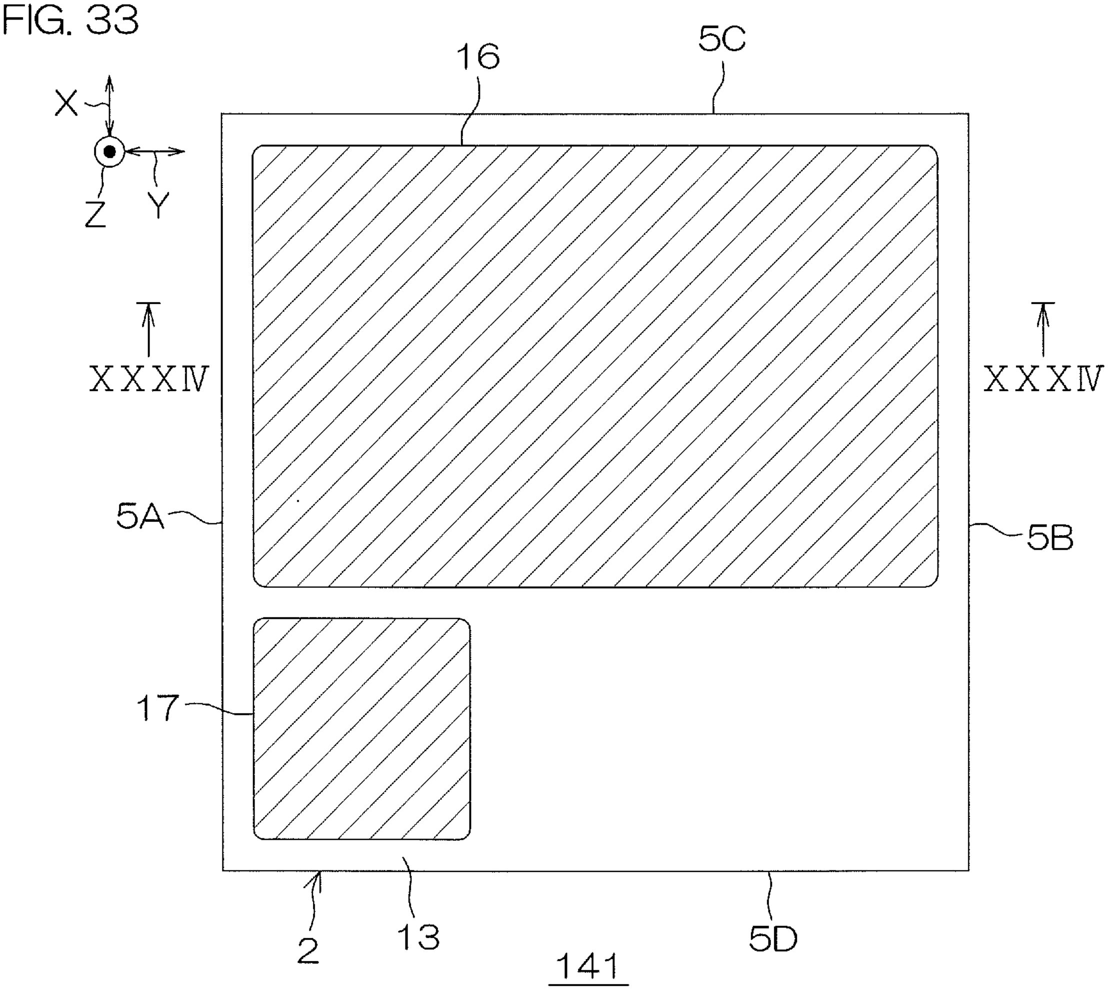
FIG. 33 is a plan view showing a semiconductor device according to a fourth preferred embodiment of the present invention (which is an embodiment in which the semiconductor device according to the first preferred embodiment consists of a low side switching device).
Figure 34:
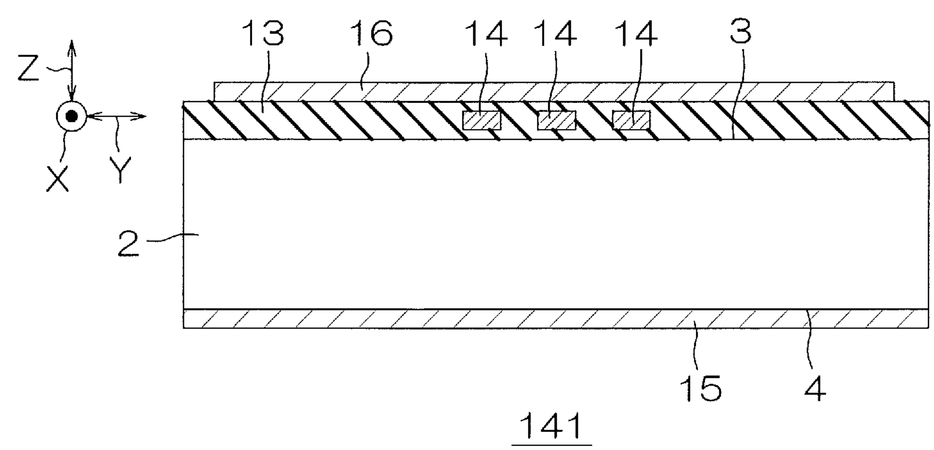
FIG. 34 is a sectional view taken along line XXXIV-XXXIV shown in FIG. 33.
Figure 35:
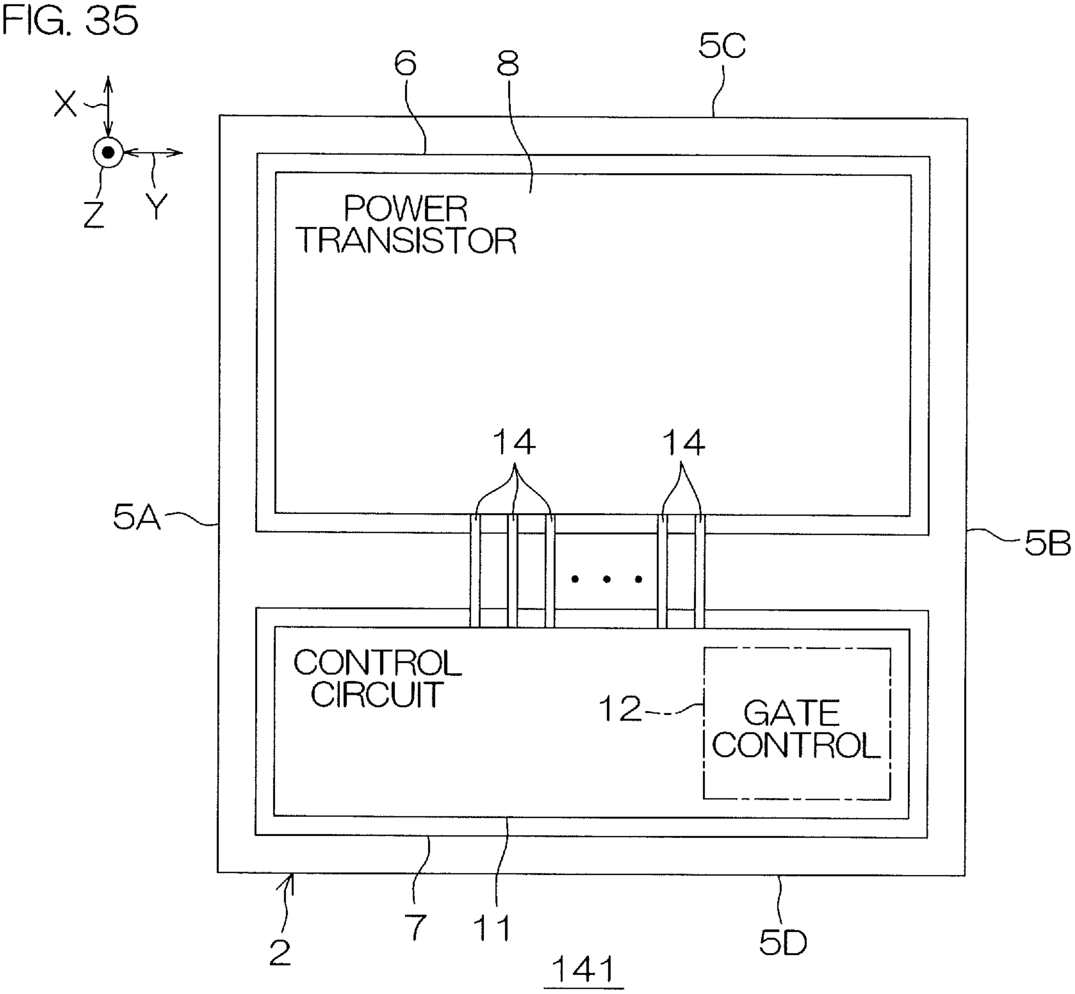
FIG. 35 is a plan view showing a structure of a semiconductor chip shown in FIG. 33.

FIG. 33 is a plan view showing a semiconductor device 141 according to a fourth preferred embodiment of the present invention (which is an embodiment in which the semiconductor device 1 according to the first preferred embodiment consists of a low side switching device). FIG. 34 is a sectional view taken along line XXXIV-XXXIV shown in FIG. 33. FIG. 35 is a plan view showing a structure of a semiconductor chip 2 shown in FIG. 33. Hereinafter, the same reference numerals will be given to the structures corresponding to the structures described for the semiconductor device 1, and the descriptions thereof will be omitted.

In the first preferred embodiment aforementioned, the configuration example in which the semiconductor device 1 is the high side switching device is described. However, the semiconductor device 1 can be provided as a low side switching device. Here, one configuration example of the semiconductor device 1 manufactured as the low side switching device is described as the semiconductor device 141 according to the fourth preferred embodiment.

With reference to FIG. 33 to FIG. 35, the semiconductor device 141 includes the semiconductor chip 2, the first device region 6, the second device region 7, the n-system power transistor 8, the control IC 11, the interlayer insulation layer 13, the n-number of gate wirings 14, and the plurality of terminal electrodes 15 to 17 as well as the semiconductor device 1 according to the first preferred embodiment. The configurations of semiconductor chip 2, the first device region 6, the second device region 7, the n-system power transistor 8, the interlayer insulation layer 13 and the n-number of gate wirings 14 are the same as the cases of the first preferred embodiment, and therefore the descriptions thereof will be omitted.

The plurality of terminal electrodes 15 to 17 includes the drain terminal 15 (the output terminal), the source terminal 16 (the reference voltage terminal) and the input terminal 17, in this embodiment. The drain terminal 15 directly covers the second main surface 4 of the semiconductor chip 2 and is electrically connected to the second main surface 4 as well as the case of the first preferred embodiment. The drain terminal 15 transmits the electrical signal generated by the power transistor 8 to the outside.

The source terminal 16 is formed above the first device region 6 at the first main surface 3 as well as the case of the first preferred embodiment. The source terminal 16 transmits the reference voltage (e.g. the ground voltage GND) to the power transistor 8 and the various functional circuits of the control IC 11. The input terminal 17 is formed above the second device region 7 at the first main surface 3 as well as the case of the first preferred embodiment. The input terminal 17 transmits the input voltage by which the control IC 11 is to be driven.

Figure 36:
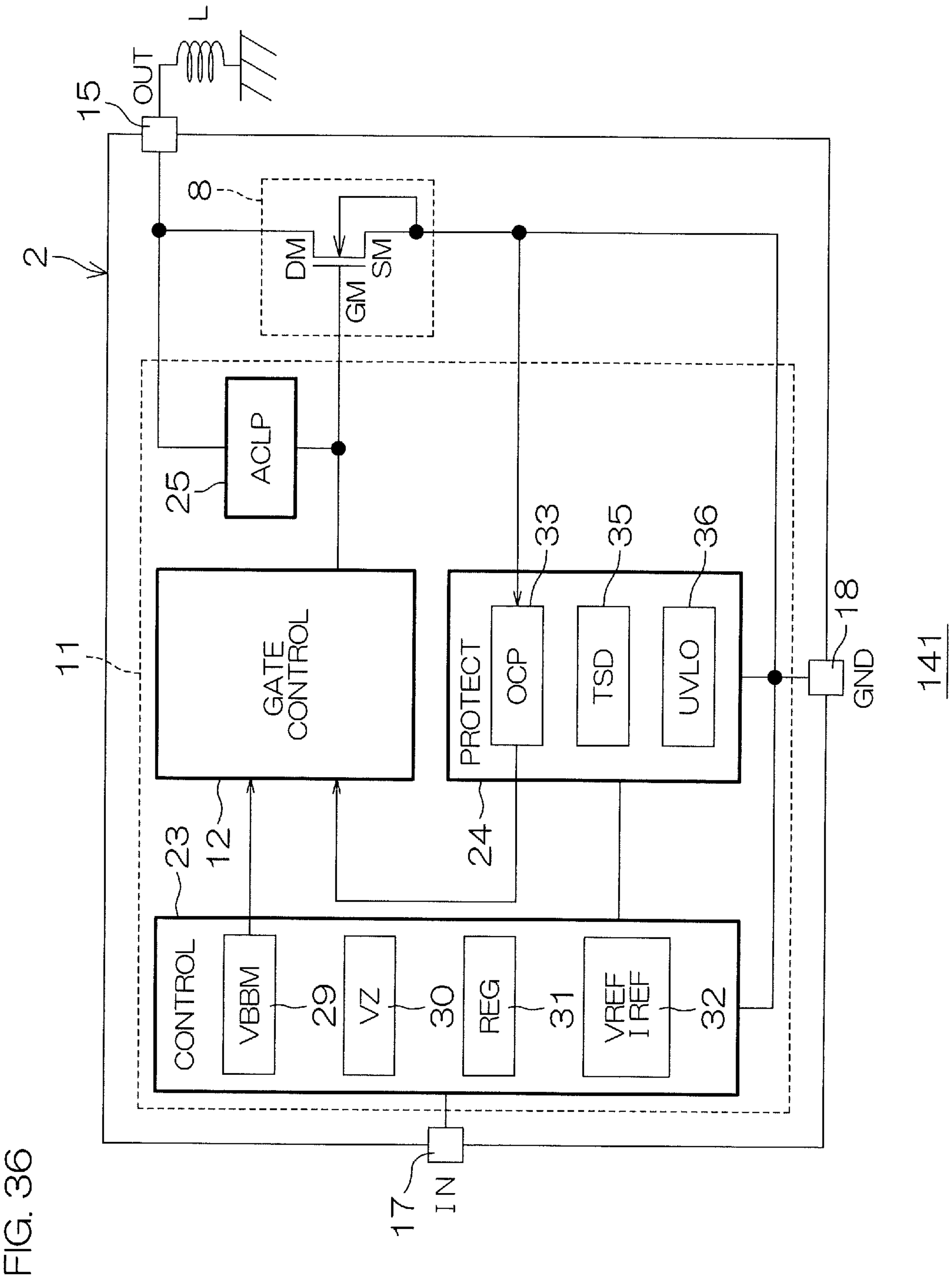
FIG. 36 is a block circuit diagram showing one configuration example of the semiconductor device shown in FIG. 34.

FIG. 36 is a block circuit diagram showing one configuration example of the semiconductor device 141 shown in FIG. 34. With reference to FIG. 36, the semiconductor device 141 includes the power transistor 8, the control IC 11, the n-number of gate wirings 14, the drain terminal 15 (the output terminal), the source terminal 16 (the reference voltage terminal) and the input terminal 17. The drain terminal 15 is to be connected to the inductive load L. The reference terminal 18 is to be grounded. The input terminal 17 is to be connected to the MCU, the DC/DC converter, the LDO or the like.

The power transistor 8 includes the main drain DM, the main source SM and the n-number of main gates GM. The main drain DM of the power transistor 8 is electrically connected to the drain terminal 15. The main source SM of the power transistor 8 is electrically connected to the source terminal 16. The n-number of main gates GM of the power transistor 8 are connected to the control IC 11 (specifically, the gate control circuit 12) via the n-number of gate wirings 14. In FIG. 36, the n-number of gate wirings 14 are shown simplified by one line.

The control IC 11 includes the current-voltage control circuit 23, the protection circuit 24, the gate control circuit 12 and the active clamp circuit 25, in this embodiment. The current-voltage control circuit 23 is electrically connected to the source terminal 16, the input terminal 17, the protection circuit 24 and the gate control circuit 12. The current-voltage control circuit 23 is configured such as to generate various voltages in response to the electrical signal from the input terminal 17 and the electrical signal from the protection circuit 24. The current-voltage control circuit 23 includes the driving voltage generation circuit 29, the first constant voltage generation circuit 30, the second constant voltage generation circuit 31 and the reference voltage-reference current generation circuit 32, in this embodiment.

The driving voltage generation circuit 29 is configured such as to generate the drive voltage by which the gate control circuit 12 is to be driven. The drive voltage generated by the driving voltage generation circuit 29 is input to the gate control circuit 12. The first constant voltage generation circuit 30 is configured such as to generate the first constant voltage by which the protection circuit 24 is to be driven. The first constant voltage generation circuit 30 may include the Zener diode, the regulator circuit or the like. The first constant voltage is input to the protection circuit 24 (e.g. the overcurrent protection circuit 33).

The second constant voltage generation circuit 31 is configured such as to generate the second constant voltage by which the protection circuit 24 is to be driven. The second constant voltage generation circuit 31 may include the Zener diode, the regulator circuit or the like. The second constant voltage is input to the protection circuit 24 (e.g. the overheat protection circuit 35). The reference voltage-reference current generation circuit 32 is configured such as to generate the reference voltages and the reference currents for various circuits. The reference voltages and the reference currents are input to the various circuits. If the various circuits include the comparator, the reference voltage or the reference current may be input to the comparator.

The protection circuit 24 is electrically connected to the current-voltage control circuit 23, the gate control circuit 12 and the source of the power transistor 8. The protection circuit 24 includes the overcurrent protection circuit 33, the overheat protection circuit 35 and the low-voltage malfunction suppression circuit 36.

The overcurrent protection circuit 33 is configured such as to protect the power transistor 8 from the overcurrent by detecting the output current flowing through power transistor 8 and limiting the output current to the value not more than the constant value. The overcurrent protection circuit 33 may include the current monitor circuit. The signal generated by the overcurrent protection circuit 33 is input to the gate control circuit 12.

The overheat protection circuit 35 is electrically connected to the current-voltage control circuit 23. The overheat protection circuit 35 is configured such as to monitor the temperature of the power transistor 8 and protect the power transistor 8 from an excessive temperature rise. The overheat protection circuit 35 is configured such as to forcibly control the power transistor 8 to the OFF-state when the temperature of the power transistor 8 reaches the predetermined threshold value, or when the temperature difference between the power transistor 8 and the another circuit reaches the predetermined threshold value. The overheat protection circuit 35 may include the temperature sensitive device such as the temperature sensitive diode and the thermistor. The signal generated by the overheat protection circuit 35 is input to the current-voltage control circuit 23.

The low-voltage malfunction suppression circuit 36 is electrically connected to the current-voltage control circuit 23. The low-voltage malfunction suppression circuit 36 is configured such as to suppress the malfunction of the power transistor 8 in the case in which the power supply voltage VB is less than the predetermined value. The signal generated by the low-voltage malfunction suppression circuit 36 is input to the current-voltage control circuit 23.

The gate control circuit 12 is electrically connected to the current-voltage control circuit 23, the protection circuit 24 and the n-number of gate wirings 14. The gate control circuit 12 may include the oscillation circuit, the charge pump circuit, etc. The gate control circuit 12 is configured such as to control the ON-state and the OFF-state of the power transistor 8. The gate control circuit 12 is configured such as to generate the n-number of gate signals G to be input to the n-number of gate wirings 14, in response to the electrical signal from the current-voltage control circuit 23 and the electrical signal from the protection circuit 24. The power transistor 8 is thereby driven and controlled.

The active clamp circuit 25 is electrically connected to the drain terminal 15 and the main gates GM of the power transistor 8. The active clamp circuit 25 is configured such as to protect the power transistor 8 from the counter electromotive force. The active clamp circuit 25 may include a series circuit including the plurality of diodes connected in a series in a forward direction. The active clamp circuit 25 may include the diode pair including the first diode array and the second diode array that are connected in a reverse biased manner.

The first diode array includes the single or the plurality of diodes that are connected in the series in the forward direction. The second diode array includes the single or the plurality of diodes that are connected in the series in the forward direction and is connected to the first diode array in the reverse biased manner. The single or plurality of diodes that compose of the first diode array may include at least one of the pn-junction diode and the Zener diode. The single or plurality of diodes that compose of the second diode array may include at least one of the pn-junction diode and the Zener diode.

As described above, the semiconductor device 141 includes the semiconductor chip 2 and the n-system (n≥2) power transistor 8. The n-system power transistor 8 includes the n-number (n≥2) of system transistors 9 formed in the semiconductor chip 2 such as to be individually controlled, and generates the single output current IOUT (the output signal) by selective controls of the n-number of system transistors 9.

Specifically, the n-system power transistor 8 is configured with the parallel circuit in which the n-number of system transistors 9 are parallelly connected such that the n-number of gate signals G are individually input. The n-number of system transistors 9 generate the electrical signals for the respective systems in response to the gate signals G. The n-system power transistor 8 generates the single output current IOUT consisting of the addition value of the n-number of electrical signals generated by the n-number of system transistors 9.

Figure 37:
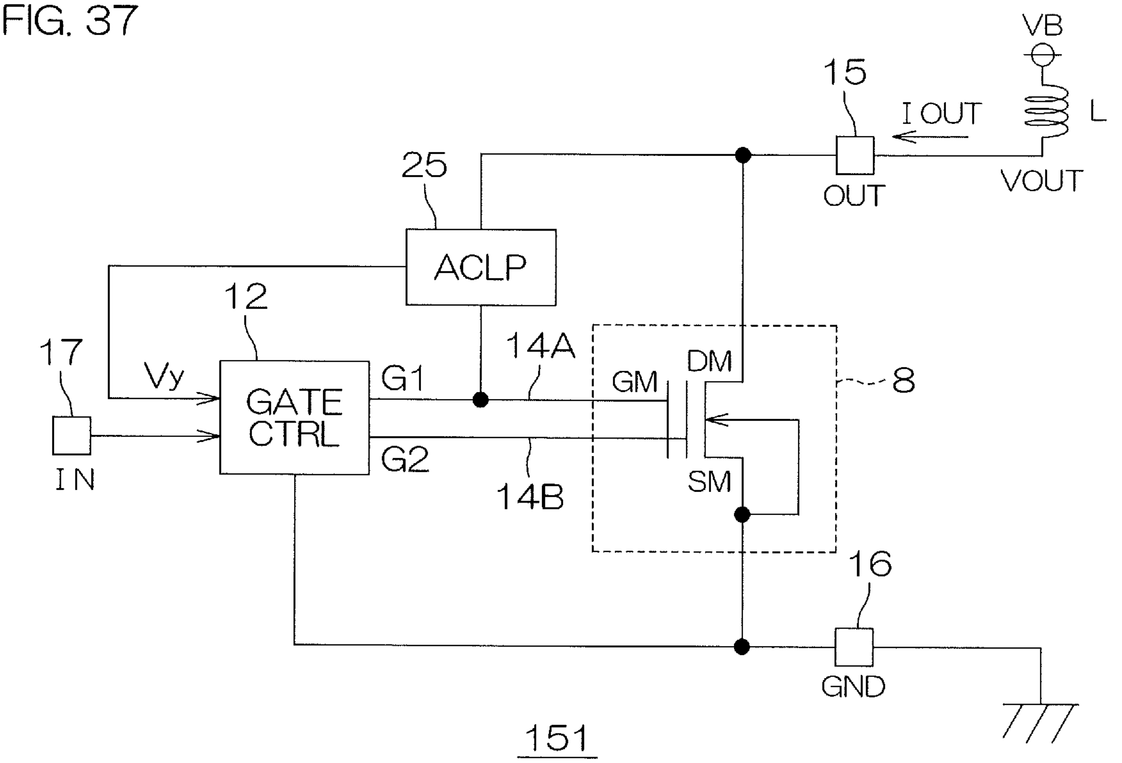
FIG. 37 is a block circuit diagram of a semiconductor device according to a fifth preferred embodiment of the present invention (which is an embodiment for performing the 2-system-control in a case in which the 2-system power transistor is adopted into the semiconductor device according to the fourth preferred embodiment).
Figure 38:
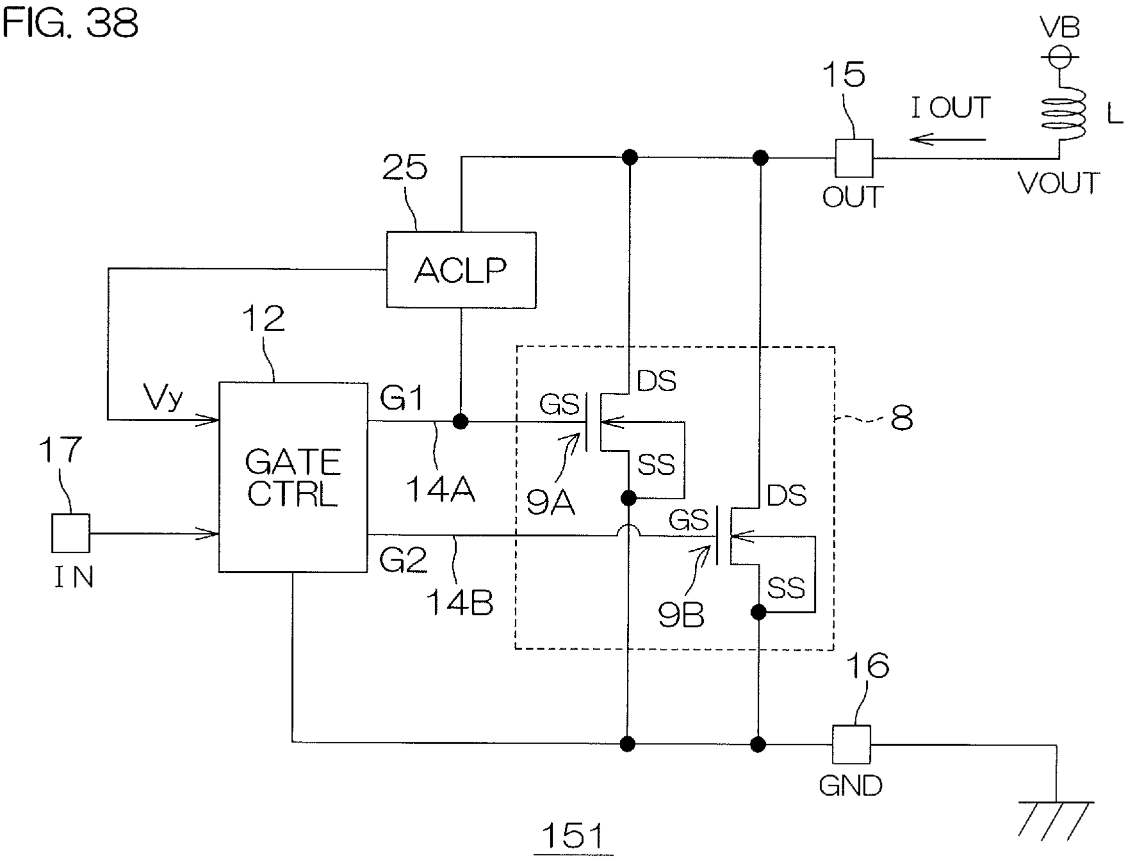
FIG. 38 is an equivalent circuit diagram of the power transistor shown in FIG. 37.

The n-system power transistor 8 is configured such that the channel utilization and the ON-resistance Ron are to be changed by the selective controls of the n-number of system transistors 9. The power transistor 8 is therefore can be controlled with the plural operational modes each consisting of the different ON-resistance Ron. As described above, with the semiconductor device 141 consisting of the low side switching device, it is possible to achieve the same effect as the effect described to the semiconductor device 1 consisting of the high side switching device FIG. 37 is a block circuit diagram of a semiconductor device 151 according to a fifth preferred embodiment of the present invention (which is an embodiment for performing the 2-system-control in a case in which the 2-system power transistor 8 is adopted into the semiconductor device 141 according to the fourth preferred embodiment). FIG. 38 is an equivalent circuit diagram of the power transistor 8 shown in FIG. 37. In FIG. 37 and FIG. 38, an example in which the inductive load L is connected to the drain terminal 15. The inductive load L may be an inductance component of a coil, a solenoid, a harness, etc.

With reference to FIG. 37 and FIG. 38, the semiconductor device 151 includes the drain terminal 15 (the output terminal OUT), the source terminal 16 (the reference voltage terminal), the 2-system power transistor 8, the 2-number of gate wirings 14, the active clamp circuit 25 and the gate control circuit 12.

The power transistor 8 according to the semiconductor device 151 includes the first system transistor 9A and the second system transistor 9B that are systematized as the individual control target as well as the second preferred embodiment (see also FIG. 16 and FIG. 19). That is, the power transistor 8 according to the semiconductor device 151 is to be driven and controlled with the first operational mode, the second operational mode and the third operational mode as well as the second preferred embodiment. Other than that, the configurations of the first system transistor 9A and the second system transistor 9B are the same as those of the second preferred embodiment, so that specific descriptions thereof will be omitted.

The 2-number of gate wirings 14 includes the first gate wiring 14A and the second gate wiring 14B. The first gate wiring 14A is electrically connected to the first system transistor 9A (the plurality of first unit transistors 10A). The second gate wiring 14B is electrically connected to the second system transistor 9B (the plurality of second unit transistors 10B) different from the first system transistor 9A.

The active clamp circuit 25 is connected to the drain and the gate of the first system transistor 9A. The active clamp circuit 25 forcibly controls the first system transistor 9A to the ON-state when the output voltage VOUT of the drain terminal 15 becomes an overvoltage. The active clamp circuit 25 thereby limits a drain-source voltage Vds (=VBB−VOUT) of the power transistor 8 to the value not more than the clamp voltage Vclp. The second system transistor 9B does not contribute to the active clamp operation. The active clamp circuit 25 is therefore not connected to the second system transistor 9B.

The gate control circuit 12 is electrically connected to the first and second system transistors 9A and 9B via the first and second gate wirings 14A and 14B. The gate control circuit 12 is also electrically connected to the apply end of an interior node voltage Vy of the active clamp circuit 25. The gate control circuit 12 generate, in response to the external control signal IN input to the input terminal 17, the first and second gate signals G1 and G2 by which the first and second system transistors 9A and 9B are to be controlled, and individually input the first and second gate signals G1 and G2 to the first and second gate wirings 14A and 14B. The external control signal IN functions a power supply voltage to the semiconductor device 151 in addition to functioning as an ON/OFF control signal to the power transistor 8.

Specifically, in an enable state in which the external control signal IN is to be a high level, the gate control circuit 12 generates the first and second gate signals G1 and G2 by which both of the first and second system transistors 9A and 9B are controlled to the ON-state. On the other hand, in an disable state in which the external control signal IN is to be a low level, the gate control circuit 12 generates the first and second gate signals G1 and G2 by which both of the first and second system transistors 9A and 9B are controlled to the OFF-state.

Also, in response to the interior node voltage Vy, the gate control circuit 12 controls the first system transistor 9A to the ON-state whereas controls the second system transistor 9B to the OFF-state. Specifically, the gate control circuit 12 controls the second system transistor 9B to the OFF-state in response to the interior node voltage Vy after a transition from the enable state (EN=H) to the disable state (EN=L) and before the operation of the active clamp circuit 25.

Figure 39:
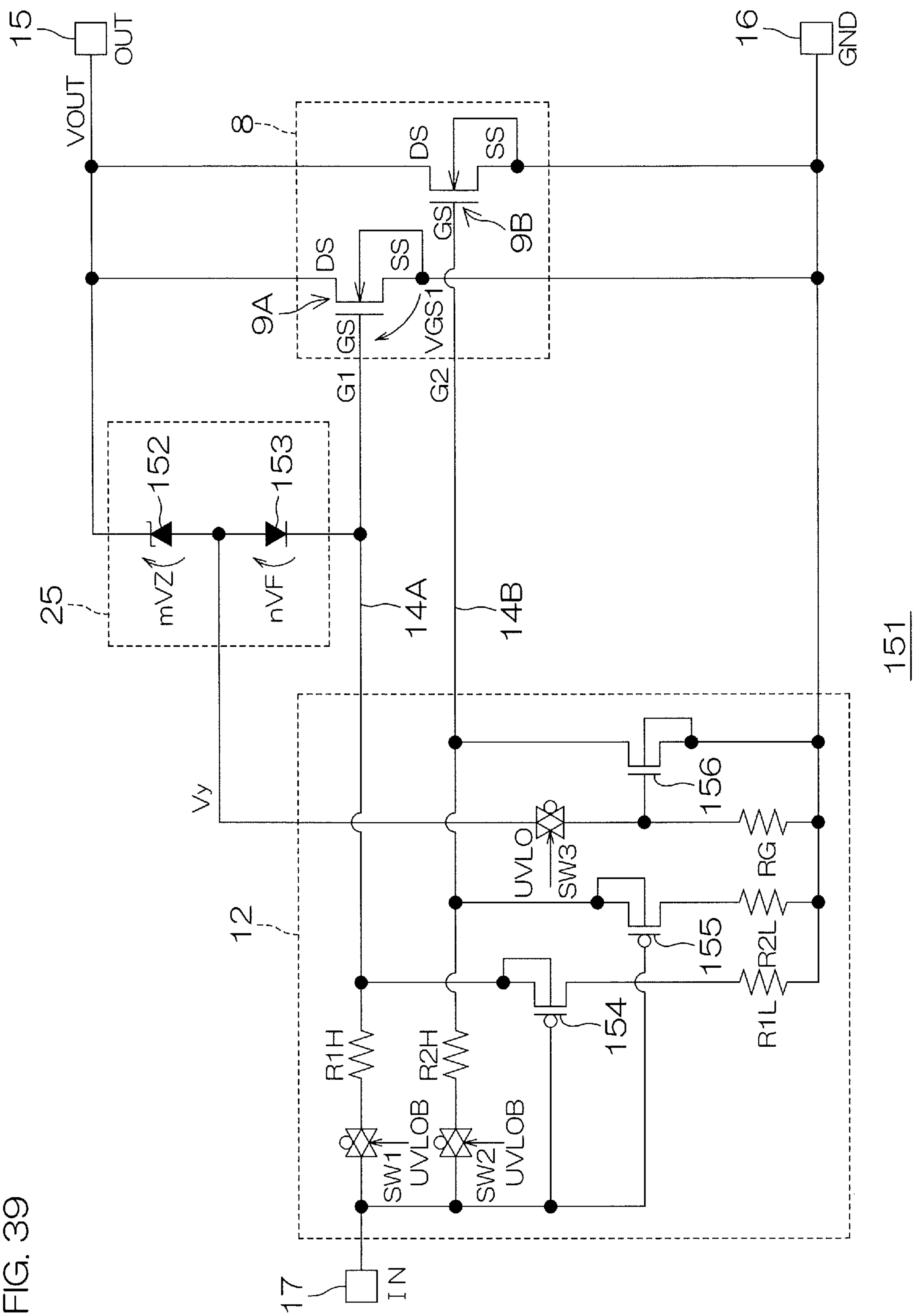
FIG. 39 is a circuit diagram showing one configuration example of a gate control circuit and an active clamp circuit shown in FIG. 37.

FIG. 39 is a circuit diagram showing one configuration example of the gate control circuit 12 and the active clamp circuit 25 shown in FIG. 37. FIG. 39 is a circuit diagram showing a principal portion of the control IC 11.

The first and second system transistors 9A and 9B include the system drain DS, the system source SS and the system gate GS, respectively. The system drains DS of the first and second system transistors 9A and 9B are electrically connected to the drain terminal 15, respectively. The system sources SS of the first and second system transistors 9A and 9B are electrically connected to the source terminal 16, respectively.

The first gate wiring 14A is electrically connected to the system gate GS of the first system transistor 9A. The second gate wiring 14B is electrically connected to the system gate GS of the second system transistor 9B. In the description hereinafter, "a state of being electrically connected to the system gate GS of the first system transistor 9A" is included in "a state of being electrically connected to the first gate wiring 14A". Also, "a state of being electrically connected to the system gate GS of the second system transistor 9B" is included in "a state of being electrically connected to the second gate wiring 14B".

The active clamp circuit 25 includes a Zener diode array 152 and a diode array 153. The Zener diode array 152 consists of a series circuit including an m-stage (e.g. m=8) of Zener diodes connected in series in the forward direction. The number of the Zener diode is arbitrary, and it may be "m=1". The Zener diode array 152 includes a cathode and an anode. The cathode of the Zener diode array 152 is electrically connected to the drain terminal 15 and the system drains DS of the first and second system transistors 9A and 9B.

The diode array 153 consists of a series circuit including an n-stage (e.g. n=3) of pn-junction diodes connected in series in a forward direction. The number of the pn-junction diode is arbitrary, and it may be "n=1". The diode array 153 includes a cathode and an anode. The cathode of the diode array 153 is electrically connected to the first gate wiring 14A. The anode of the diode array 153 is reverse biased to the anode of the Zener diode array 152.

The gate control circuit 12 includes a first switch SW1, a second switch SW2, a third switch SW3, a p-channel-type first drive MISFET 154, a p-channel-type second drive MISFET 155, an n-channel-type third drive MISFET 156, a first high side resistance R1H (a first upper side resistance), a first low side resistance R1L (a first lower side resistance), a second high side resistance R2H (a second upper side resistance), a second low side resistance R2L (a second lower side resistance), and a gate resistance RG.

A first end of the first high side resistance R1H is electrically connected to the first gate wiring 14A. The first switch SW1 is electrically connected to the input terminal 17 and a second end of the first high side resistance R1H. An ON/OFF of the first switch SW1 is to be controlled in response to an inverted low-voltage detection signal UVLOB. The inverted low-voltage detection signal UVLOB consists of a signal that a logical level of a low-voltage detection signal UVLO is inverted. Specifically, the first switch SW1 is to be in an ON-state when the inverted low-voltage detection signal UVLOB is a high level (UVLOB=H, UVLO=L), and is to be in an OFF-state when the inverted low-voltage detection signal UVLOB is a low level (UVLOB=L, UVLO=H).

A first end of the second high side resistance R2H is electrically connected to the second gate wiring 14B. The second switch SW2 is electrically connected to the input terminal 17 and a second end of the second high side resistance R2H. An ON/OFF of the second switch SW2 is controlled in response to the inverted low-voltage detection signal UVLOB. Specifically, the second switch SW2 is to be in an ON-state when the inverted low-voltage detection signal UVLOB is the high level (UVLOB=H, UVLO=L), and is to be in an OFF-state when the inverted low-voltage detection signal UVLOB is the low level (UVLOB=L, UVLO=H).

A first end of the gate resistance RG is electrically connected to the source terminal 16. The third switch SW3 is electrically connected to an apply end of the interior node voltage Vy and a second end of the gate resistance RG. An ON/OFF of the third switch SW3 is controlled in response to the low-voltage detection signal UVLO. Specifically, the third switch SW3 is to be in an ON-state when the low-voltage detection signal UVLO is the high level (UVLOB=L, UVLO=H), and is to be in an OFF-state when the low-voltage detection signal UVLO is the low level (UVLOB=H, UVLO=L).

The apply end of the interior node voltage Vy may be an arbitrary node in the active clamp circuit 25. The apply end of the interior node voltage Vy may be a connecting node between the Zener diode array 152 and the diode array 153, or may be a connecting node (an anode voltage) of any one of the pn-junction diodes of the diode array 153.

The logical levels of each of the low-voltage detection signal UVLO and the inverted low-voltage detection signal UVLOB are switched according to a comparison result of the external control signal IN (power supply voltage of the semiconductor device 151) and a low-voltage detection threshold Vuvlo. When the external control signal IN is less than the low-voltage detection threshold Vuvlo (IN<Vuvlo), the low-voltage detection signal UVLO is to be in the high level (UVLO=H) and the inverted low-voltage detection signal UVLOB is to be in the low level (UVLOB=L) (a logical level when UVLO is detected). Therefore, the third switch SW3 is to be in the ON-state whereas the first and second switches SW1 and SW2 are to be in the OFF-states.

When the external control signal IN exceeds the low-voltage detection threshold Vuvlo (Vuvlo<IN), the low-voltage detection signal UVLO is to be the low level (UVLO=L) and the inverted low-voltage detection signal UVLOB is to be the high level (UVLOB=H) (a logical level when UVLO is released). Therefore, the third switch SW3 is to be in the OFF-state whereas the first and second switches SW1 and SW2 are to be in the ON-state. Thus, the first and second switches SW1 and SW2 are complementarily controlled with respect to the third switch SW3.

A first end of the first low side resistance R1L is electrically connected to the source terminal 16. The first drive MISFET 154 includes a drain, a source, a gate and a back gate. The drain of the first drive MISFET 154 is electrically connected to a second end of the first low side resistance R1L. The source of the first drive MISFET 154 is electrically connected to the first gate wiring 14A. The gate of the first drive MISFET 154 is electrically connected to the input terminal 17. The back gate of first drive MISFET 154 is electrically connected to the first gate wiring 14A.

A first end of the second low side resistance R2L is electrically connected to the source terminal 16. The second drive MISFET 155 includes a drain, a source, a gate and a back gate. The drain of the second drive MISFET 155 is electrically connected to a second end of the second low side resistance R2L. The source of second drive MISFET 155 is electrically connected to the second gate wiring 14B. The gate of the second drive MISFET 155 is electrically connected to the input terminal 17. The back gate of the second drive MISFET 155 is electrically connected to the second gate wiring 14B.

The third drive MISFET 156 includes a drain, a source, a gate and a back gate. The drain of the third drive MISFET 156 is electrically connected to the second gate wiring 14B. The source of the third drive MISFET 156 is electrically connected to the source terminal 16. The gate of third drive MISFET 156 is electrically connected to a second end of the gate resistance RG (that is a connecting node between the gate resistance RG and the third switch SW3). The back gate of the third drive MISFET 156 is electrically connected to the source terminal 16.

Figure 40:
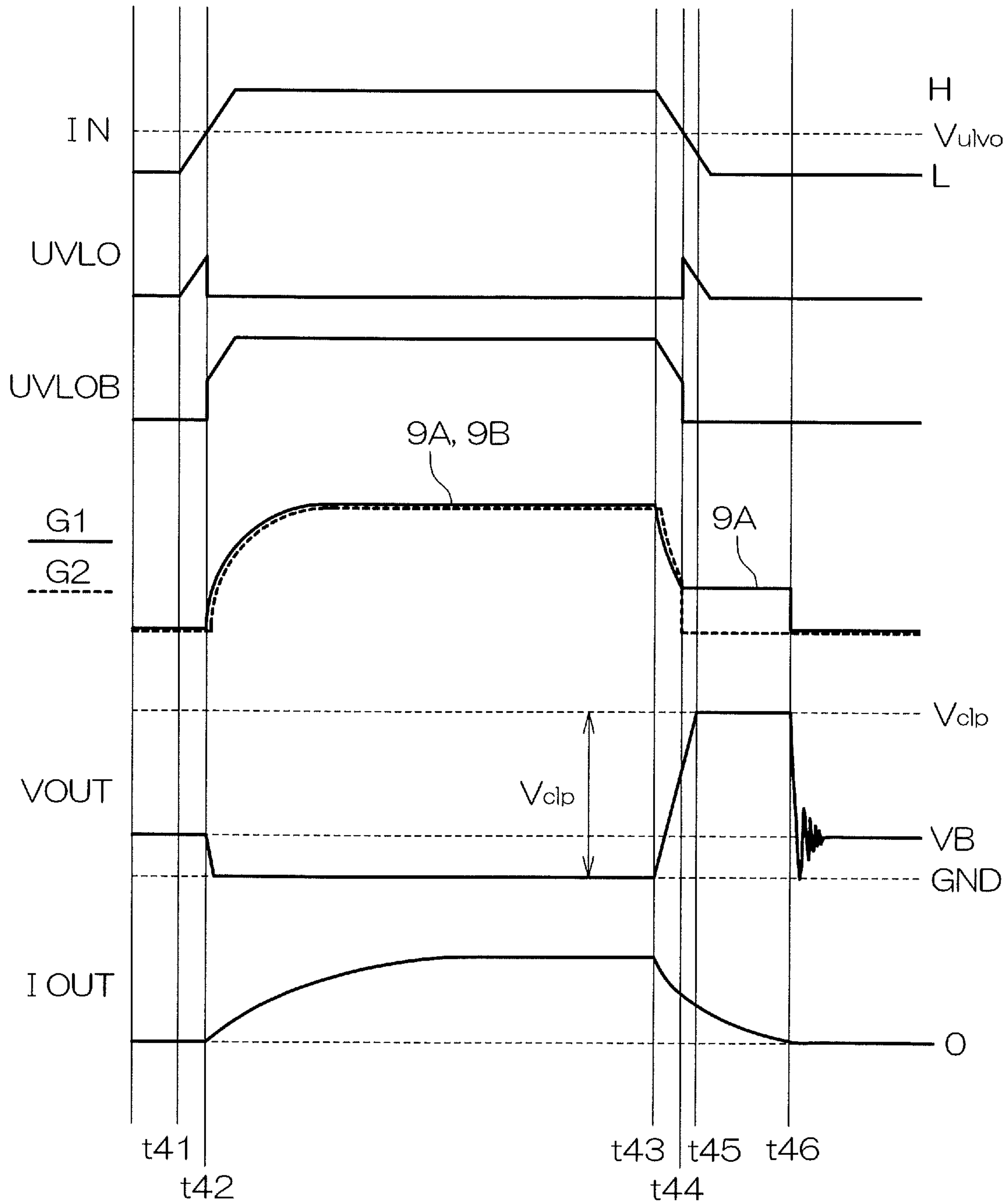
FIG. 40 is a timing chart showing a control example to the power transistor.

FIG. 40 is a timing chart showing a control example to the power transistor 8. In FIG. 40, the external control signal IN, the low-voltage detection signal UVLO and the inverted low-voltage detection signal UVLOB, the first gate signal G1 (solid line), the second gate signals G2 (broken line), the output voltage VOUT, and the output current IOUT are shown in that order from a top of the page. Hereinafter, the gate-source voltage of the first system transistor 9A is represented by "Vgs1", the ON-threshold voltage of the third drive MISFET 156 is represented by "Vth", a breakdown voltage of the Zener diode array 152 is represented by "mVZ", and a forward drop voltage of the diode array 153 is represented by "nVF".

With reference to FIG. 40, the external control signal IN is kept to the low level until a time t41. In the external control signal IN, the low level is a logical level when the power transistor 8 is controlled to the OFF-state, and the high level is a logical level when the power transistor 8 is controlled to the ON-state. At this time, since the first and second gate signals G1 and G2 are kept to the low level, and therefore the first and second system transistors 9A and 9B are controlled to the OFF-states (see also FIG. 23A). This state corresponds to the first operational mode of the power transistor 8.

At the time t41, the external control signal IN is controlled to the high level from the low level. Since the external control signal IN is less than the low-voltage detection threshold Vuvlo (IN<Vuvlo), the low-voltage detection signal UVLO becomes the high level (UVLO=H), and the inverted low-voltage detection signal UVLOB becomes the low level (UVLOB=L). At this time, in the gate control circuit 12, the third switch SW3 becomes the ON-state whereas the first and second switches SW1 and SW2 become the OFF-states.

The first and second gate signals G1 and G2 are therefore kept to the low level, and the first and second system transistors 9A and 9B are kept to the OFF-states, respectively. Thus, the output current IOUT does not flow, and the output voltage VOUT is substantially equal to the power supply voltage VB (VOUTVB).

At a time t42, when the external control signal IN exceeds the low-voltage detection threshold Vuvlo (Vuvlo<IN), the low-voltage detection signal UVLO becomes the low level (UVLO=L), and the inverted low-voltage detection signal UVLOB becomes the high level (UVLOB=H). At this time, in the gate control circuit 12, the third switch SW3 becomes the OFF-state whereas the first and second switches SW1 and SW2 become the ON-states.

The first and second gate wirings 14A and 14B are therefore conducted, and the first and second gate signals G1 and G2 rise from the low level to the high level. The rising speed (=a slew rate when the switch is turned on) of the first gate signal G1 is adjusted by a resistance value of the first high side resistance R1H. The rising speed (=a slew rate when the switch is turned on) of the second gate signals G2 is adjusted by a resistance value of the second high side resistance R2H.

When the first and second gate signals G1 and G2 are raised, the first and second system transistors 9A and 9B become the ON-state (see also FIG. 23B). The power transistor 8 therefore becomes the normal operation. This state corresponds to the second operational mode of the power transistor 8. In this time, the power transistor 8 is driven with the total channel ratio RT of 50%. The area resistivity Ron·A thereby approaches the area resistivity Ron·A indicated by the second plot point P2 in the graph of FIG. 21.

At the normal operation of the power transistor 8, the output current IOUT starts to flow, and the output voltage VOUT drops to a vicinity of the ground voltage GND. In this time, the third switch SW3 is the OFF-state, and thereby the interior node voltage Vy is not applied to the gate of the third drive MISFET 156. The third drive MISFET 156 is therefore kept in the OFF-state.

At a time t43, the external control signal IN is controlled to the low level from the high level. Therefore, the first and second drive MISFETs 154 and 155 become the ON-states, and the first and second gate signals G1 and G2 drop to the low level from the high level. The dropping speed (=a slew rate when the switch is turned on) of the first gate signal G1 is adjusted by a resistance value of the first low side resistance R1L. The dropping speed (=a slew rate when the switch is turned on) of the second gate signals G2 is adjusted by a resistance value of the second low side resistance R2L.

When the first drive MISFET 154 becomes the ON-state, the gate and the source of the first system transistor 9A are short-circuited, and thereby the first system transistor 9A becomes the OFF-state. Also, when the second drive MISFET 155 becomes the ON-state, the gate and the source of the second system transistor 9B are short-circuited, and thereby the second system transistor 9B becomes the OFF-state.

In this time, the inductive load L keeps flowing the output current IOUT until an energy stored during an ON-period of the power transistor 8 is released. As a result, the output voltage VOUT rises sharply to a positive voltage higher than the power supply voltage VB. This makes the power transistor 8 shift to the active clamp operation.

At a time t44, when the external control signal IN becomes less than the low-voltage detection threshold Vuvlo (IN<Vuvlo) and the low-voltage detection signal UVLO rises to the high level from the low level, the third switch SW3 becomes the ON-state. When the third switch SW3 becomes ON-state, the interior node voltage Vy (>Vth) is applied to the gate of the third drive MISFET 156. The third drive MISFET 156 is thereby controlled to the ON-state, and the gate and the source of the second system transistor 9B are short-circuited (G2=VOUT). As a result, the second system transistor 9B is controlled to the OFF-state.

On the other hand, at a time t45, when the output voltage VOUT rises up to the clamp voltage Vclp (=Vgs1+nVF+mVZ), the first system transistor 9A is controlled to the ON-state by the active clamp circuit 25. Specifically, the first system transistor 9A is controlled to the ON-state after the second system transistor 9B is suspended.

Therefore, at the active clamp operation of the power transistor 8, the second system transistor 9B is controlled to the OFF-state whereas the first system transistor 9A is controlled to ON-state (see also FIG. 23C). This state corresponds to the third operational mode of the power transistor 8. At the active clamp operation, the power transistor 8 is driven with the first system channel ratio RS1 (=25%). That is, the channel utilization during the active clamp operation becomes more than zero and less than the channel utilization during the normal operation. The active clamp withstand amount Eac therefore approaches the active clamp withstand amount Eac shown by the fourth plot point P4 in the graph of FIG. 21.

The output current IOUT due to the inductive load L is discharged via the first system transistor 9A. The output voltage VOUT is therefore limited to a value not more than the clamp voltage Vclp. The active clamp operation is continued until a time t46 when the energy stored in the inductive load L is exhausted and the output current IOUT stops flowing.

As described above, with the semiconductor device 151, during the normal operation, the first and second system transistors 9A and 9B can be used to pass the current. This can reduce the ON-resistance Ron. On the other hand, during the active clamp operation, the first system transistor 9A can be used to pass the current in a state in which the second system transistor 9B is suspended. This makes it possible to consume (absorbe) the counter electromotive force with the first system transistor 9A while suppressing the rapid temperature rise caused by the counter electromotive force of the inductive load L. As a result, the active clamp withstand amount Eac can be improved.

In other words, according to the semiconductor device 151, the channel utilization of the power transistor 8 relatively increases during the normal operation, and the channel utilization of the power transistor 8 relatively decreases during the active clamp operation. Therefore, during the normal operation, the ON-resistance Ron can be reduced since the current path relatively increases. Also, during the active clamp operation, the active clamp withstand amount Eac can be improved since the rapid temperature rise caused by the counter electromotive force of the inductive load L can be suppressed.

As described above, according to the semiconductor device 151, it is possible to achieve both of the excellent area resistivity Ron·A and the excellent active clamp withstand amount Eac by separating from the trade-off relationship shown in FIG. 21. Especially in the field of the IPD, the active clamp withstand amount Eac is one of the important characteristics for driving the larger the inductive load L.

In this embodiment, an example in which, during the active clamp operation, the first system transistor 9A was controlled to the ON-state whereas the second system transistor 9B was controlled to the OFF-state was described. However, during the active clamp operation, the second system transistor 9B may be controlled to the ON-state whereas the first system transistor 9A may be controlled to the OFF-state. In this case, the relationship between the first system transistor 9A and the second system transistor 9B should be interchanged and understood.

Figure 41:
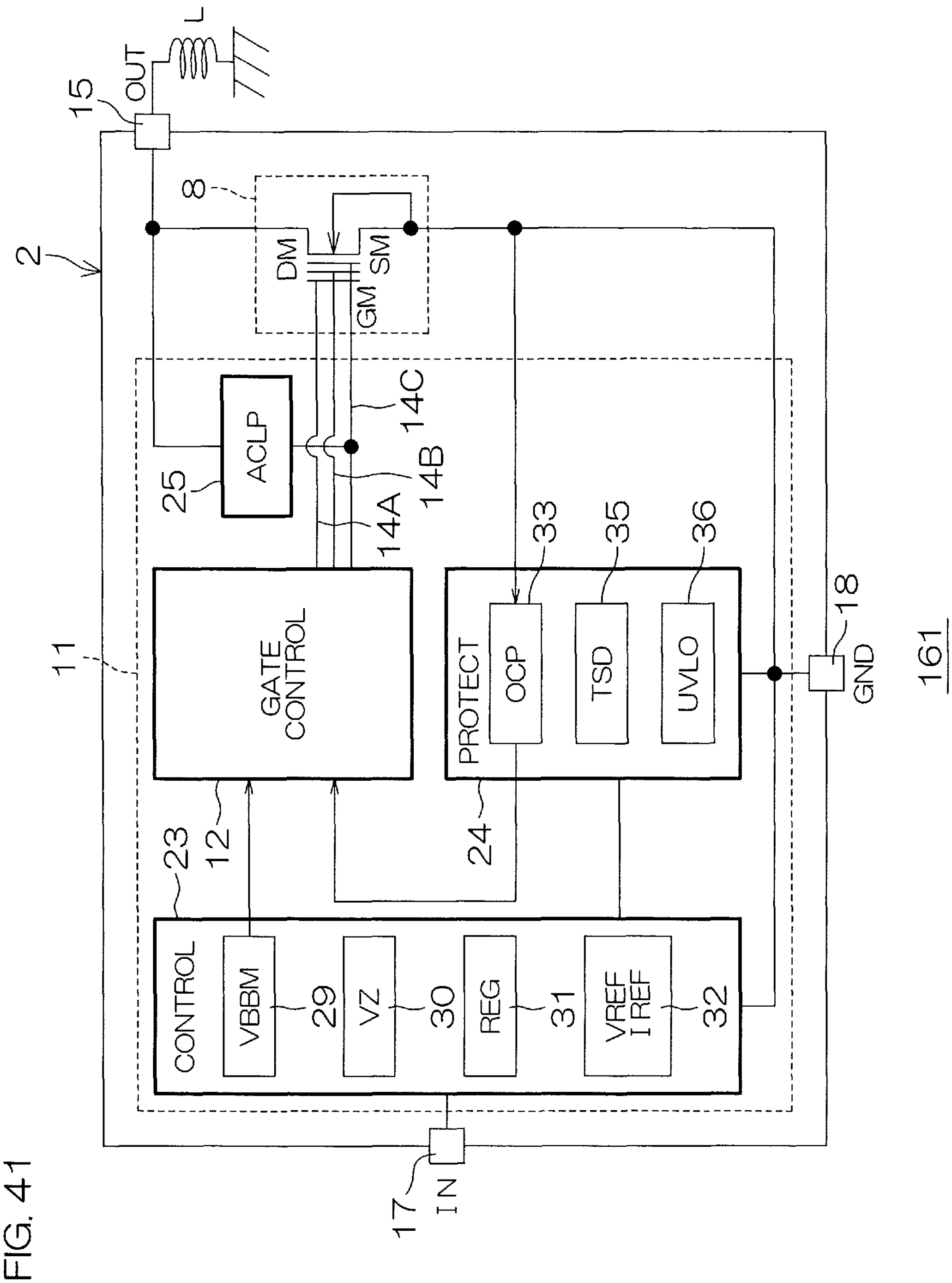
FIG. 41 is a block circuit diagram of a semiconductor device according to a sixth preferred embodiment of the present invention (which is an embodiment in which the 3-system power transistor is adopted into the semiconductor device according to the fourth preferred embodiment).

FIG. 41 is a block circuit diagram of a semiconductor device 161 according to a sixth preferred embodiment of the present invention (which is an embodiment in which the 3-system power transistor 8 is adopted into the semiconductor device 1 according to the fourth preferred embodiment). In the fifth preferred embodiment, an example in which the 2-system power transistor 8 is applied was described. However, as shown in FIG. 41, the 3-system power transistor 8 is applied thereto.

In this case, with respect to the 3-system power transistor 8 according to the semiconductor device 161, the same control as that performed in the 3-system power transistor 8 according to the third preferred embodiment. Therefore, with the semiconductor device 161, it is possible to achieve the same effects as the effects described to the semiconductor device 1 according to the first preferred embodiment and the semiconductor device 121 according to the third preferred embodiment.

Figure 42:
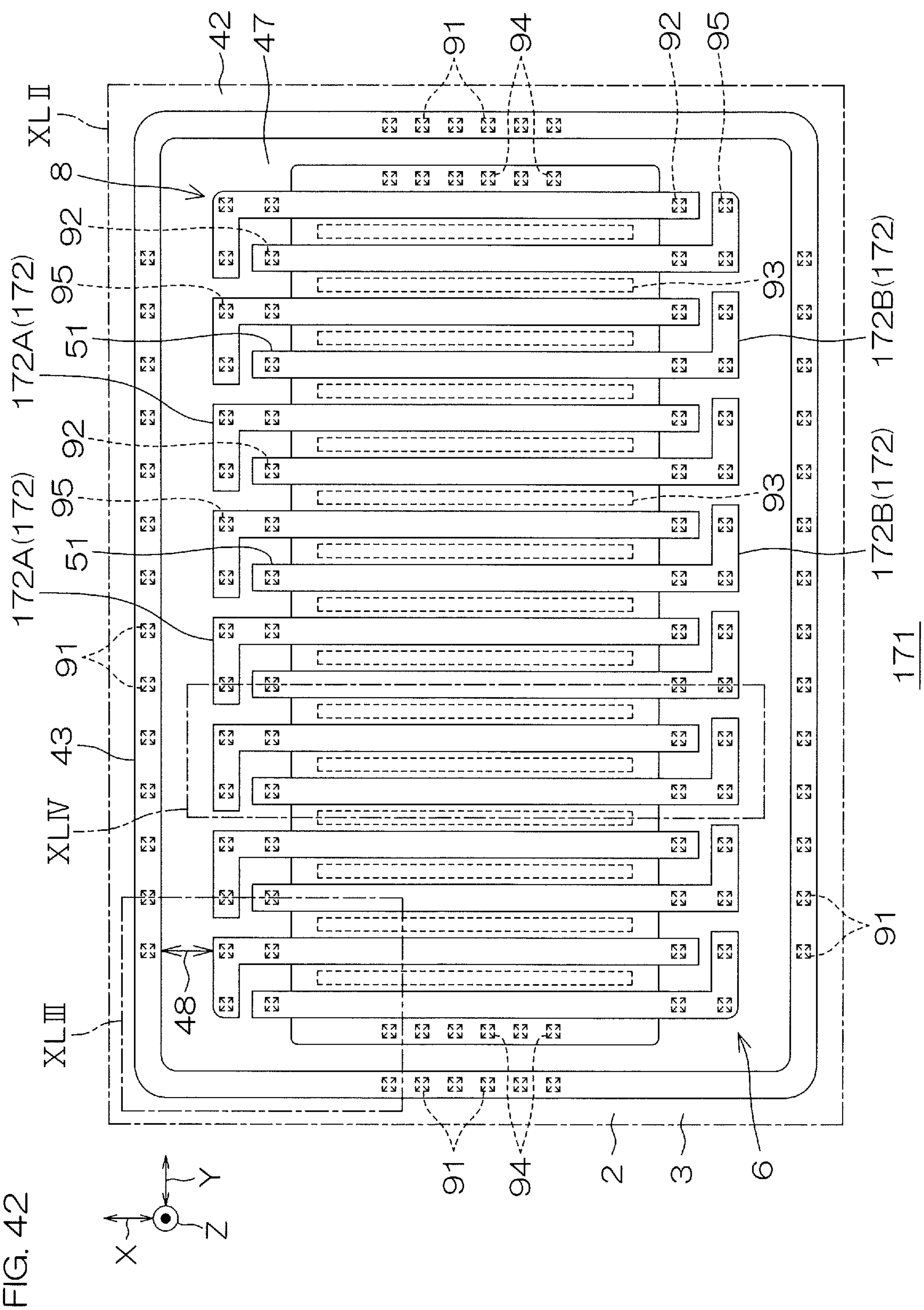
FIG. 42 corresponds to FIG. 9 and is a plan view showing a semiconductor device according to a seventh preferred embodiment of the present invention (which is an embodiment in which a trench contact structure is modified in the semiconductor device according to the first preferred embodiment).
Figure 43:
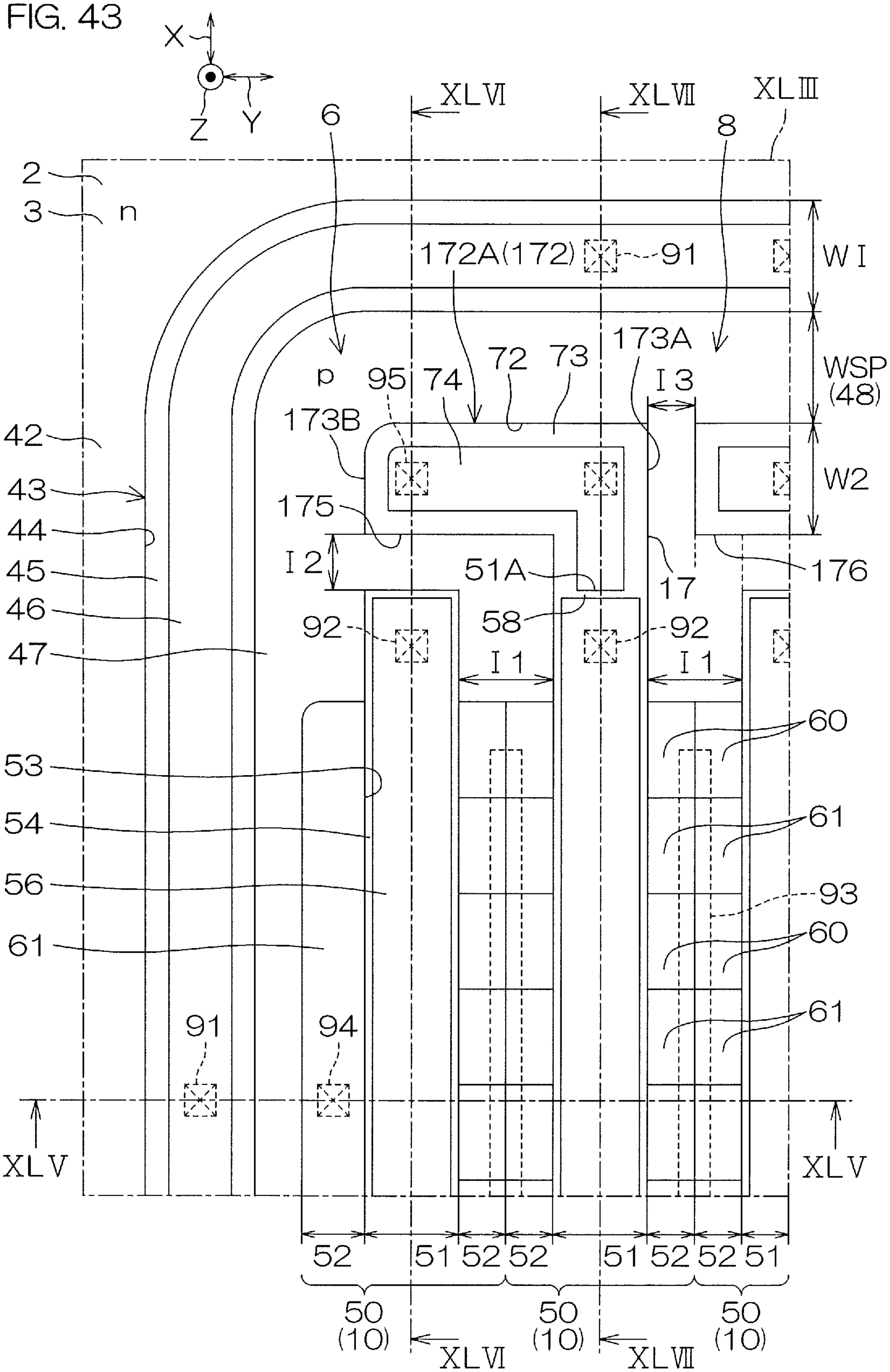
FIG. 43 is an enlarged view of a region XLIII shown in FIG. 42.
Figure 44:
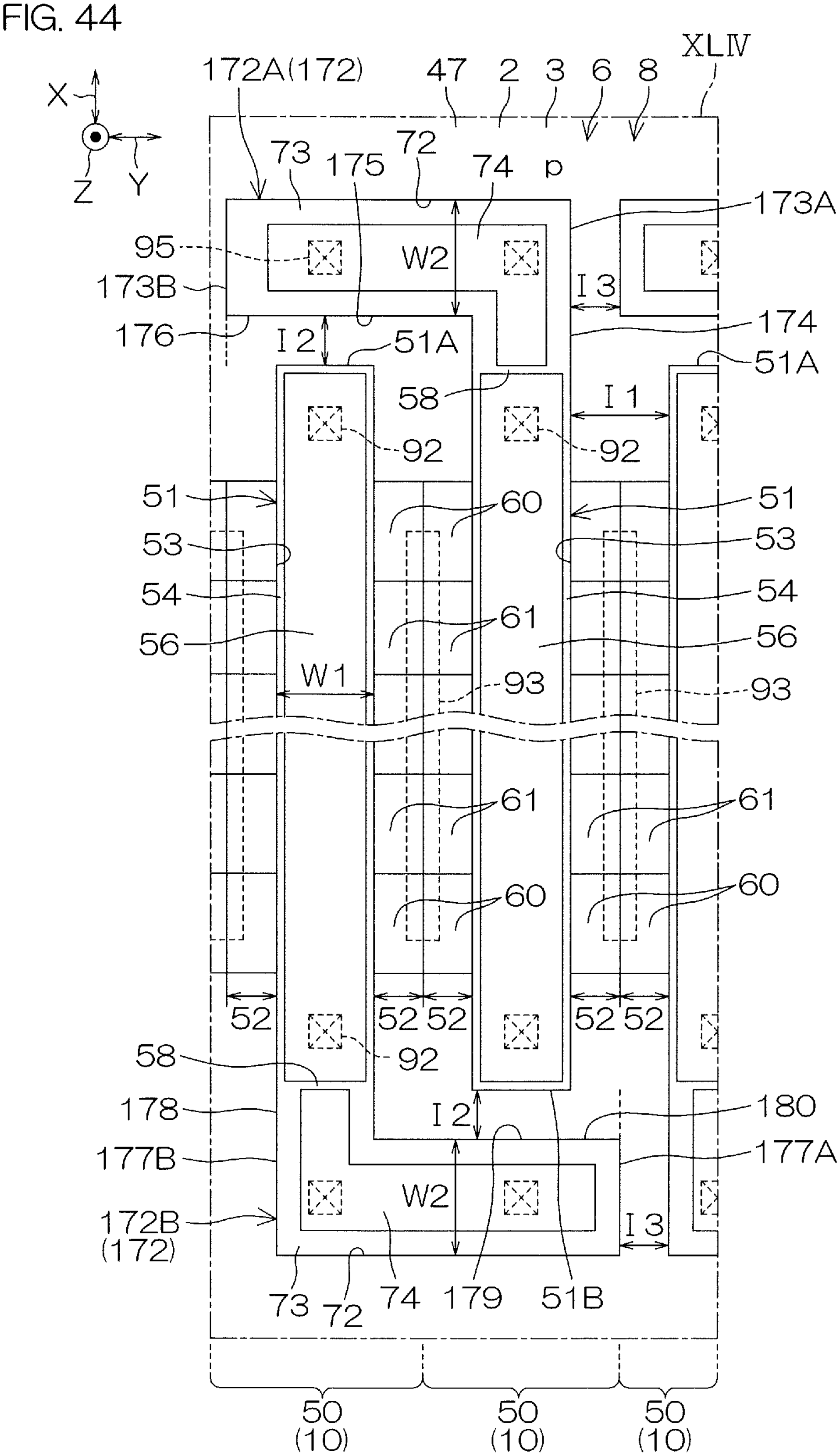
FIG. 44 is an enlarged view of a region XLIV shown in FIG. 42 with some parts omitted.
Figure 45:
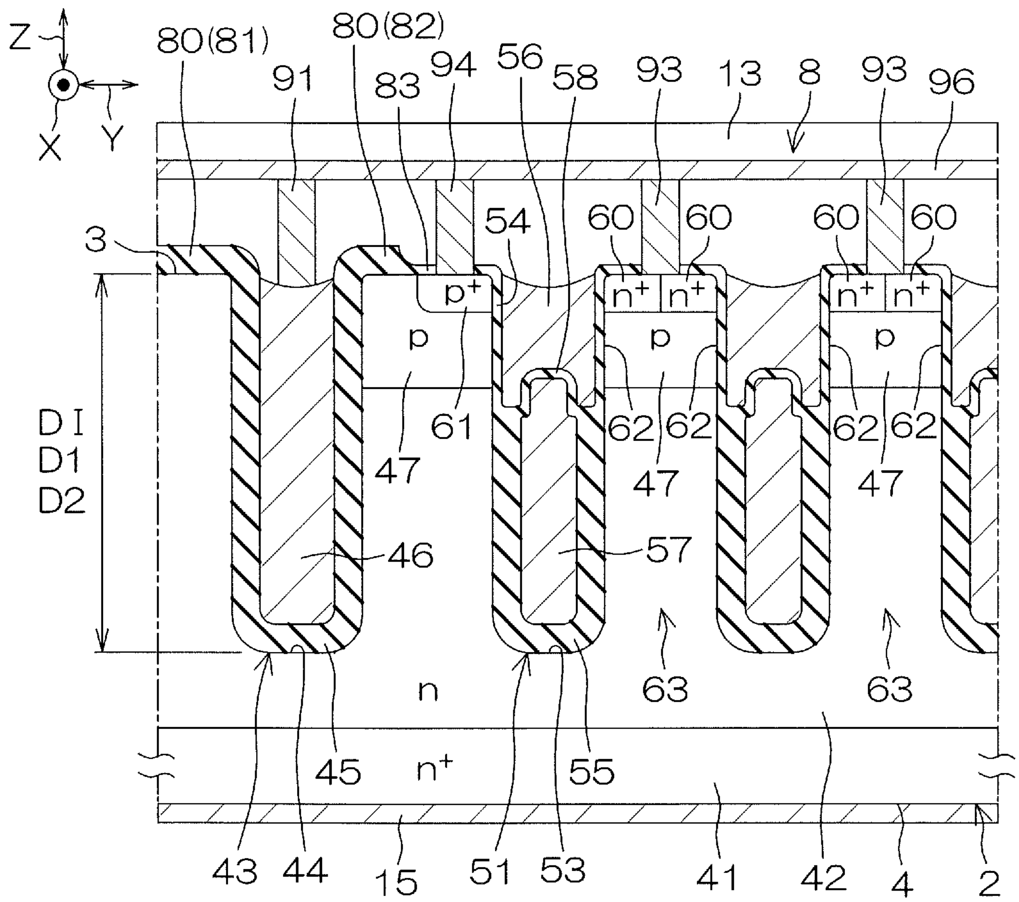
FIG. 45 is a sectional view taken along line XLV-XLV shown in FIG. 43.
Figure 46:
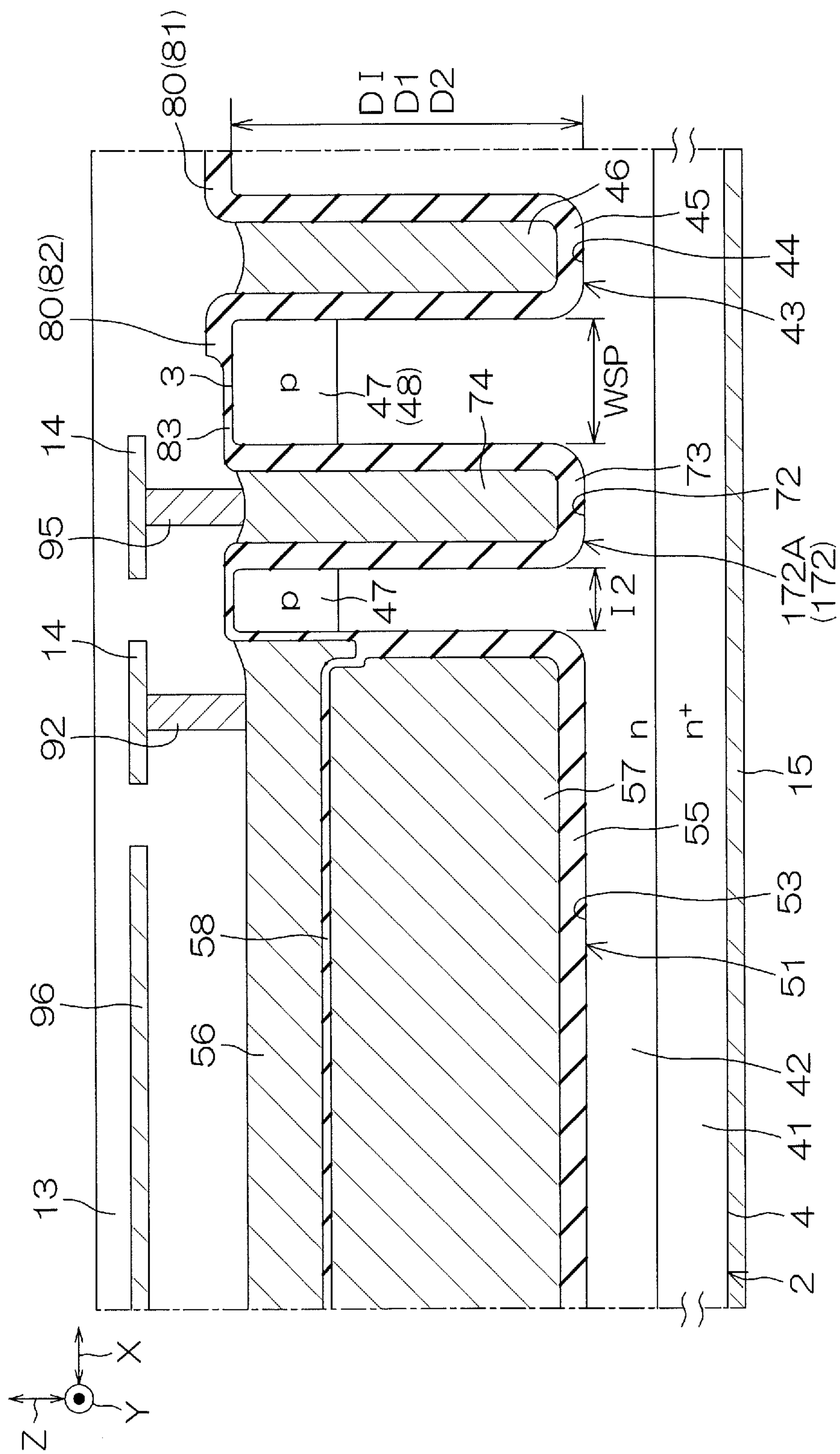
FIG. 46 is a sectional view taken along line XLVI-XLVI shown in FIG. 43.
Figure 47:
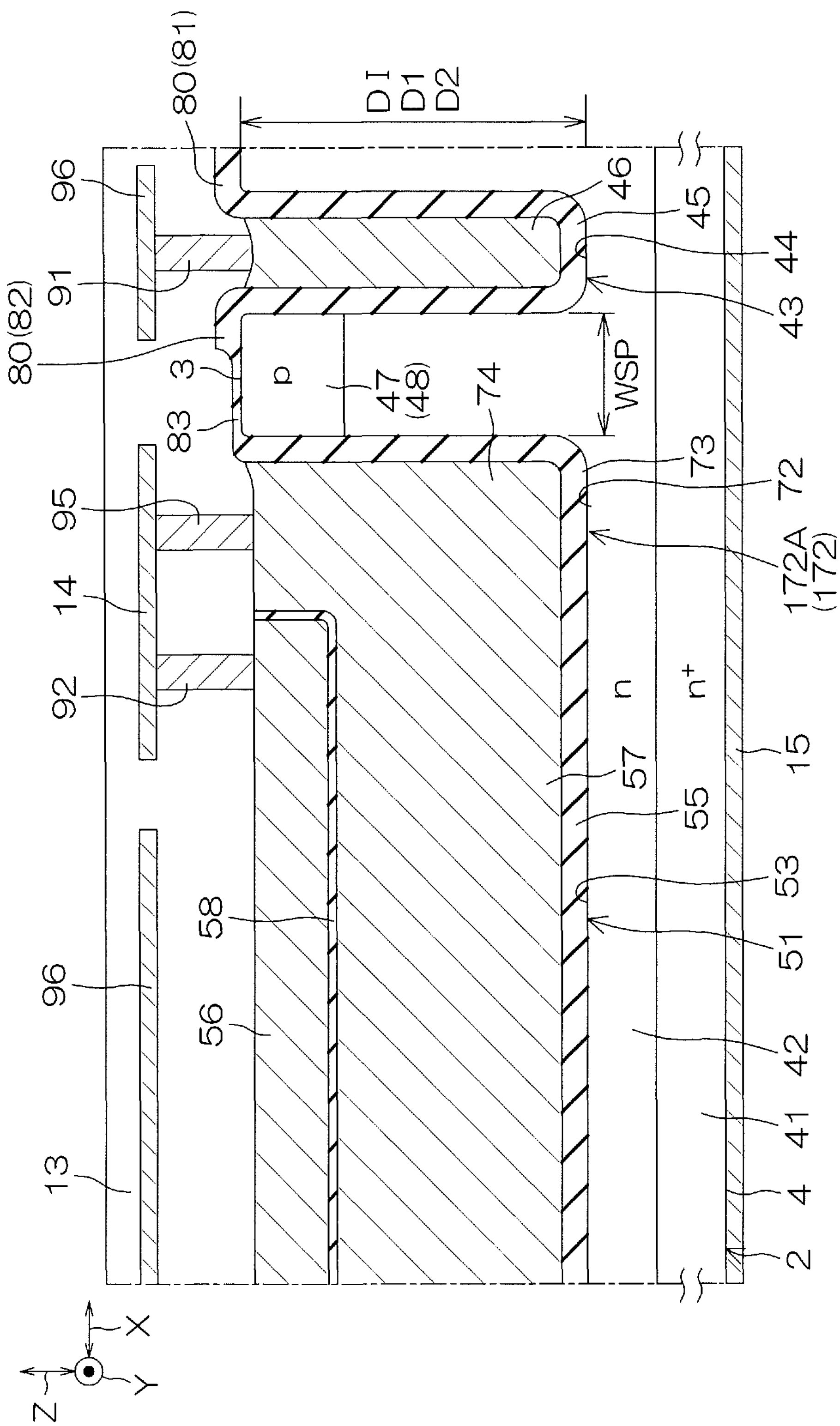
FIG. 47 is a sectional view taken along line XLVII-XLVII shown in FIG. 43.
Figure 48:
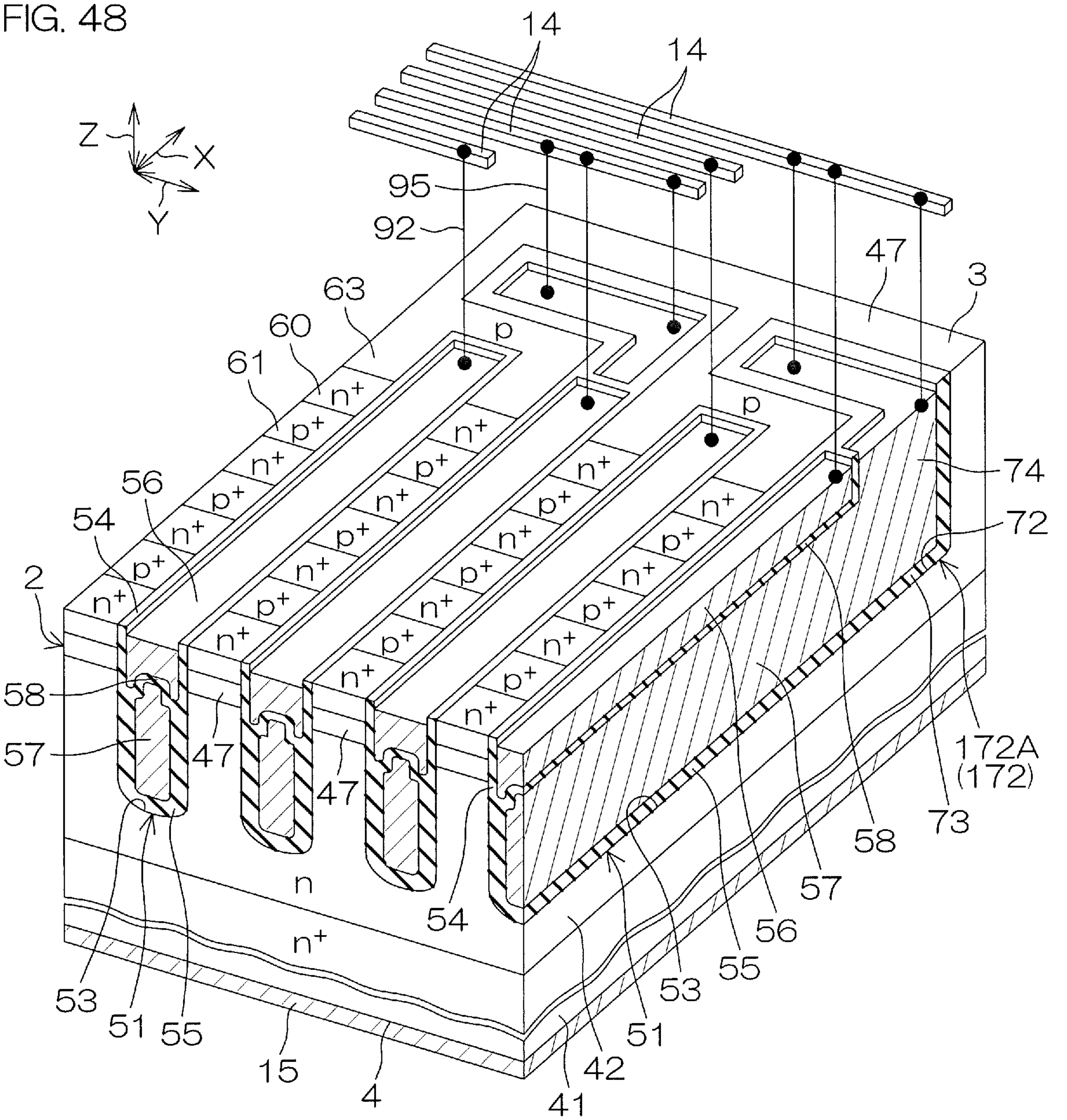
FIG. 48 is a sectional perspective view showing a principal portion of the first device region shown in FIG. 42.

FIG. 42 corresponds to FIG. 9 and is a plan view showing a semiconductor device 171 according to a seventh preferred embodiment of the present invention (which is an embodiment in which the plurality of trench contact structures 71 is modified in the semiconductor device 1 according to the first preferred embodiment). FIG. 43 is an enlarged view of a region XLIII shown in FIG. 42. FIG. 44 is an enlarged view of a region XLIV shown in FIG. 42 with some parts omitted. FIG. 45 is a sectional view taken along line XLV-XLV shown in FIG. 43. FIG. 46 is a sectional view taken along line XLVI-XLVI shown in FIG. 43. FIG. 47 is a sectional view taken along line XLVII-XLVII shown in FIG. 43. FIG. 48 is a sectional perspective view showing a principal portion of the first device region 6 shown in FIG. 42. Hereinafter, the same reference numerals will be given to the structures corresponding to the structures described for the semiconductor device 1, and the descriptions thereof will be omitted.

The semiconductor device 171 has a configuration designed as a purpose to suppress an electric field concentration at an end portion of the trench gate structure 51 (the first end portion 51A and the second end portion 51B). With reference to FIG. 42 to FIG. 48, the semiconductor device 171 (the power transistor 8) includes a plurality of trench contact structures 172 instead of the plurality of trench contact structures 71. The plurality of trench contact structures 172 each has a single electrode structure including the contact trench 72, the contact insulating film 73 (the second insulator) and the contact electrode 74 as well as the case of the first preferred embodiment.

Specifically, the plurality of trench contact structures 172 includes a single or plurality (8, in this embodiment) of first trench contact structures 172A, and a single or plurality (8, in this embodiment) of second trench contact structures 172B.

The plurality of first trench contact structures 172A are formed in regions at sides of the first end portions 51A of the plurality of trench gate structures 51. Specifically, the plurality of first trench contact structures 172A are formed in regions between the trench separation structure 43 and the first end portions 51A of the plurality of trench gate structures 51. The plurality of first trench contact structures 172A are arranged at intervals in a row in the second direction Y and are respectively formed in a band shape (a rectangular shape) passing beside at least two of the trench gate structures 51 in the second direction Y in plan view.

The plurality of first trench contact structures 172A each passes beside the two trench gate structures 51 in the second direction Y in plan view, in this embodiment. The plurality of first trench contact structures 172A each has, regarding the second direction Y, a first end portion 173A at one side (the second side surface 5B side) and a second end portion 173B at the other side (the first side surface 5A side).

The plurality of first trench contact structures 172A each has the second width W2. The second width W2 is a width in a direction (the second direction Y) orthogonal to a direction (the first direction X) in which the first trench contact structures 172A extends. It is preferred that the second width W2 exceeds the first width W1 of the trench gate structure 51 (W1<W2). Connection areas for the fifth plug electrodes 95 (the gate plug electrodes for the contact electrodes 74) can be increased by expanding the second width W2.

The second width W2 may be substantially equal to the separation width WI of the trench separation structure 43 in this embodiment (W2≈WI). The second width W2 may be less than the separation width WI (W2<WI), or may be exceed the separation width WI (WI<W2). The second width W2 may be substantially equal to the space width WSP (W2≈WSP). The second width W2 may be less than the space width WSP (W2<WSP), or may be exceed the space width WSP (WSP<W2).

The second width W2 may be not less than 0.1 μm and not more than 2.5 μm. The second width W2 may be not less than 0.1 μm and not more than 0.5 μm, not less than 0.5 μm and not more than 1 μm, not less than 1 μm and not more than 1.5 μm, not less than 1.5 μm and not more than 2 μm, or, not less than 2 μm and not more than 2.5 μm. It is preferred that the second width W2 is not less than 0.5 μm and not more than 1.5 μm.

The plurality of first trench contact structures 172A each has the second depth D2. It is preferred that the second depth D2 is substantially equal to the first depth D1 of the trench gate structure 51 (D1≈D2). The second depth D2 may be substantially equal to the separation depth DI of the trench separation structure 43 (D2≈DI). It is preferred that the second depth D2 is less than the separation depth DI of the trench separation structure 43 (D2<DI). Bottom walls of the plurality of first trench contact structures 172A are smoothly connected to the bottoms wall of the gate trenches 53 as well as the plurality of trench contact structures 71 according to the first preferred embodiment.

The second depth D2 may be not less than 1 μm and not more than 10 μm. The second depth D2 may be not less than 1 μm and not more than 2.5 μm, not less than 2.5 μm and not more than 5 μm, not less than 5 μm and not more than 7.5 μm, or, not less than 7.5 μm and not more than 10 μm. It is preferred that the second depth D2 may be not less than 2 μm and not more than 6 μm.

It is preferred that aspect ratios D2/W2 of the plurality of first trench contact structures 172A may exceed 1 and not more than 5, respectively. The aspect ratio D2/W2 is a ratio of the second depth D2 with respect to the second width W12. It is particularly preferred that the aspect ratio D2/W2 is not less than 2. It is preferred that the bottom walls of the plurality of first trench contact structures 172A are formed at intervals of not less than 1 μm and not more than 10 μm from the bottom portion of the drift region 42. It is particularly preferred that the bottom walls of the plurality of first trench contact structures 172A are formed at intervals of not less than 1 μm and not more than 5 μm from the bottom portion of the drift region 42.

The plurality of first trench contact structures 172A are formed at intervals of the space widths WSP from the trench separation structure 43, and formed at intervals of second intervals 12 from the first end portions 51A of the plurality of trench gate structures 51 in plan view, respectively. Furthermore, the plurality of first trench contact structures 172A are arranged at intervals of third intervals 13 in a row along the second direction Y in plan view.

It is preferred that the second interval I2 is less than the space width WSP (I2<WSP). It is preferred that the second interval 12 is not more than the first interval I1 of the plurality of trench gate structures 51 (I2≤I1). That is, it is preferred that the second interval I2 is not more than the width of the mesa portion 63. It is particularly preferred that the second interval I2 is less than the first interval I1 (I2<I1). In this case, the second interval I2 may be not more than ½ of the first interval I1. The second interval 12 may be not more than ¼ of the first interval I1. The second interval I2 may be not more than the second width W2 of the first trench contact structure 172A (I2≤W2). It is preferred that the second interval I2 is not more than the first width W1 of the trench gate structure 51 (I2≤W1).

It is preferred that the second interval I2 is set to a value such that a depletion layer extending form the first end portion 51A of the trench gate structure 51 cover the bottom wall of the adjacent first trench contact structure 172A. It is preferred that the second interval I2 is, specifically, set to a value such that the depletion layer extending from the first end portion 51A of the trench gate structure 51 and the depletion layer extending from the first trench contact structure 172A are to be integrated at a region below the bottom walls of the plurality of first trench contact structures 172A.

The second interval I2 may be not less than 0.1 μm and not more than 2 μm. The second interval I2 may be not less than 0.1 μm and not more than 0.25 μm, not less than 0.25 μm and not more than 0.5 μm, not less than 0.5 μm and not more than 0.75 μm, not less than 0.75 μm and not more than 1 μm, not less than 1 μm and not more than 1.25 μm, not less than 1.25 μm and not more than 1.5 μm, not less than 1.5 μm and not more than 1.75 μm, or, not less than 1.75 μm and not more than 2 μm. It is preferred that the second interval I2 is not less than 0.1 μm and not more than 1 μm.

It is preferred that the third interval I3 is less than the space width WSP (I3<WSP). It is preferred that the third interval 13 is not more than the first interval I1 of the plurality of trench gate structures 51 (I3≤I1). That is, it is preferred that the third interval I3 is not more than the width of the mesa portion 63. It is particularly preferred that the third interval I3 is less than the first interval I1 (I3<I1). In this case, the third interval I3 may be not more than ½ of the first interval I1. The third interval 13 may be not more than ¼ of the first interval I1.

The third interval I3 may be not more than the second width W2 of the first trench contact structure 172A (I3≤W2). It is preferred that the third interval I3 is not more than the first width W1 of the trench gate structure 51 (I3≤W1). The third interval I3 may be substantially equal to the second interval I2 (I3≈I2). The third interval I3 may be less than the second interval I2 (I3<I2), or, may be exceed the second interval I2 (I2<I3).

It is preferred that the third interval I3 are set to a value such that the depletion layer extending form the first end portion 51A of the trench gate structure 51 cover the bottom wall of the adjacent first trench contact structure 172A. It is preferred that the third interval I3 is, specifically, set to a value such that the depletion layer extending from the first end portion 51A of the trench gate structure 51 and the depletion layer extending from the first trench contact structure 172A are to be integrated at a region below the bottom walls of the plurality of first trench contact structures 172A.

The third interval I3 may be not less than 0.1 μm and not more than 2 μm. The third interval I3 may be not less than 0.1 μm and not more than 0.25 μm, not less than 0.25 μm and not more than 0.5 μm, not less than 0.5 μm and not more than 0.75 μm, not less than 0.75 μm and not more than 1 μm, not less than 1 μm and not more than 1.25 μm, not less than 1.25 μm and not more than 1.5 μm, not less than 1.5 μm and not more than 1.75 μm, or, not less than 1.75 μm and not more than 2 μm. It is preferred that the second interval I2 is not less than 0.1 μm and not more than 1 μm.

The two first trench contact structures 172A located at both ends in the second direction Y each has a corner extending in an arc shape along the corner of the trench separation structure 43 in plan view. In a case in which the single first trench contact structure 172A is formed, the single first trench contact structure 172A may have one or two corners each extending in an arc shape along the corners of the trench separation structure 43 in plan view.

The plurality of first trench contact structures 172A are respectively formed such as to be connected to the trench gate structure 51 (the trench gate structure 51 of a first side) located at the one side (the second side surface 5B side) and to be opposed to the trench gate structure 51 (the trench gate structure 51 of a second side) located at the other side (the first side surface 5A side) regarding the two trench gate structures 51 adjacent to each other. That is, the plurality of first trench contact structures 172A are configured such as to be controlled at the same timing with the trench gate structure 51 located at the one side and electrically independently controlled form the trench gate structure 51 located at the other side.

Specifically, the plurality of first trench contact structures 172A each has at least one of first connection portion 174 (connection portion) and at least one of first opposing portion 175 (opposing portion), regarding the second direction Y. In this embodiment, the plurality of first trench contact structures 172A each has the single first connection portion 174 and the single first opposing portion 175.

The first connection portion 174 is a portion of the first trench contact structure 172A that is connected to the first end portion 51A of the trench gate structure 51. The first connection portion 174 is formed at a side of the first end portion 173A of the first trench contact structure 172A and connected to the first end portion 51A of the trench gate structure 51 located at the one side (the second side surface 5B side), in this embodiment.

The first trench contact structure 172A (the contact trench 72) is thereby connected to the trench gate structure 51 (the gate trench 53) in an L-shape in plan view. The first trench contact structure 172A may be connected to the trench gate structure 51 in a T-shape in plan view. The first trench contact structure 172A (the contact trench 72) forms a single trench structure with the trench gate structure 51 (the gate trench 53) therebetween.

The first opposing portion 175 is a portion of the first trench contact structure 172A that opposes the first end portion 51A of the trench gate structure 51 with the second interval I2. The first opposing portion 175 is formed at a side of the second end portion 173B of the first trench contact structure 172A and opposes the first end portion 51A of the trench gate structure 51 located at the other side (the first side surface 5A side), in this embodiment. It is preferred that the first opposing portion 175 opposes a whole region of the first end portion 51A of the trench gate structure 51.

In this case, it is preferred that the second end portion 173B of the first trench contact structure 172A has a first extension portion 176 extended from the first opposing portion 175 toward the adjacent trench gate structure 51. The first extension portion 176 is formed at an interval of the third interval I3 from the first end portion 173A of the adjacent first trench contact structure 172A and opposes the mesa portion 63 in the first direction X. The first extension portion 176 may pass beside an intermediate portion of the mesa portion 63. With the first extension portion 176, the first opposing portion 175 can be reliably opposed to the whole region of the first end portion 51A of the trench gate structure 51. Also, with the first extension portion 176, the third interval I3 can be reliably narrowed.

The contact electrode 74 of the first trench contact structure 172A has a portion that extends in the first direction X and a portion that extends in the second direction Y in plan view. A width of the first direction X of the portion extending in the second direction Y exceeds a width of the second direction Y of the portion extending in the first direction X. A connecting are of the fifth plug electrode 95 (the gate plug electrode for the contact electrode 74) with respect to the contact electrode 74 is increased by the portion extending in the second direction Y.

The contact electrode 74 is led out into the gate trench 53 with the contact insulating film 73 therebetween at the first connection portion 174. The contact electrode 74 is connected to the lower electrode 57 in the gate trench 53, and insulated and separated from the upper electrode 56 with the middle insulating film 58 therebetween. The contact electrode 74 of the first trench contact structures 172A is thereby fixed to the same potential as the potential of the lower electrode 57 of the trench gate structure 51 located at the one side.

That is, the contact electrode 74 consists of a lead-out portion of the lower electrode 57 that is led out into the contact trench 72 from the gate trench 53 with the contact insulating film 73 and the middle insulating film 58 therebetween. The lower electrode 57 of the trench gate structure 51 located at the one side is fixed to the same potential as the potential of the upper electrode 56 of the trench gate structure 51 located at the one side. The first trench contact structure 172A is thereby controlled at the same timing with the trench gate structure 51.

The plurality of second trench contact structures 172B are formed in regions at sides of the second end portions 51B of the trench gate structures 51 with the same configurations as the first trench contact structures 172A. Specifically, the plurality of second trench contact structures 172B are formed in regions between the trench separation structure 43 and the second end portions 51B of the plurality of trench gate structures 51. The plurality of second trench contact structures 172B sandwich the plurality of trench gate structures 51 with the first trench contact structures 172A therebetween, respectively, in plan view.

The plurality of second trench contact structures 172B are arranged at intervals in a row in the second direction Y and are respectively formed in a band shape (a rectangular shape) passing beside at least two of the trench gate structures 51 in the second direction Y in plan view. The plurality of second trench contact structures 172B each passes beside the two trench gate structures 51 in the second direction Y in plan view, in this embodiment. The plurality of second trench contact structures 172B each has, regarding the second direction Y, a first end portion 177A at the one side (the second side surface 5B side) and a second end portion 177B at the other side (the first side surface 5A side).

The plurality of second trench contact structures 172B each has the second width W2 and the second depth D2 (the aspect ratio D2/W2) as well as the first trench contact structures 172A. Also, the plurality of second trench contact structures 172B are formed at intervals of the space width WSP from the trench separation structure 43, and formed at intervals of the second intervals 12 from the second end portions 51B of the plurality of trench gate structures 51 in plan view, respectively. Furthermore, the plurality of second trench contact structures 172B are arranged at intervals of the third intervals 13 in a row along the second direction Y in plan view.

The two second trench contact structures 172B located at both ends in the second direction Y each has a corner extending in an arc shape along the corner of the trench separation structure 43 in plan view. In a case in which the single second trench contact structure 172B is formed, the single second trench contact structure 172B may have one or two corners each extending in an arc shape along the corners of the trench separation structure 43 in plan view.

The plurality of second trench contact structures 172B are respectively formed such as to be connected to the trench gate structure 51 (the trench gate structure 51 of the second side) located at the other side (the first side surface 5A side) and opposed to the trench gate structure 51 (the trench gate structure 51 of the first side) located at the one side (the second side surface 5B side) regarding the two trench gate structures 51 adjacent to each other. That is, the plurality of second trench contact structures 172B are respectively connected to the other trench gate structures 51 different from the trench gate structures 51 to which the first trench contact structures 172A are connected, and respectively oppose the other trench gate structures 51 different from the trench gate structures 51 to which the first trench contact structures 172A oppose.

The plurality of second trench contact structures 172B are therefore configured such as to be electrically independently controlled from the plurality of first trench contact structures 172A. Also, the plurality of second trench contact structures 172B are configured such as to be controlled at the same timing with the trench gate structures 51 located at the other side and electrically independently controlled form the trench gate structure 51 located at the one side.

Specifically, the plurality of second trench contact structures 172B each has at least one of second connection portion 178 (connection portion) and at least one of second opposing portion 179 (opposing portion), regarding the second direction Y. In this embodiment, the plurality of second trench contact structures 172B each has the single second connection portion 178 and the single second opposing portion 179.

The second connection portion 178 is a portion of the second trench contact structure 172B that is connected to the second end portion 51B of the trench gate structure 51. The second connection portion 178 is formed at a side of the second end portion 177B of the second trench contact structure 172B and connected to the trench gate structure 51 located at the other side, in this embodiment. In other words, the second connection portion 178 is connected to the trench gate structure 51 different from the trench gate structure 51 located at the one side to which the first trench contact structure 172A is connected.

That is, the second connection portion 178 is connected to the trench gate structure 51 located at the other side to which the first trench contact structure 172A oppose. The second trench contact structure 172B (the contact trench 72) is thereby connected to the trench gate structure 51 (the gate trench 53) in an L-shape in plan view. The second trench contact structure 172B may be connected to the trench gate structure 51 in a T-shape in plan view. The second trench contact structure 172B (the contact trench 72) forms a single trench structure with the trench gate structure 51 (the gate trench 53) therebetween.

The second opposing portion 179 is a portion of the second trench contact structure 172B that opposes the second end portion 51B of the trench gate structure 51 with the second interval I2. The second opposing portion 179 is formed at a side of the first end portion 177A of the second trench contact structure 172B and opposes the trench gate structure 51 located at the one side, in this embodiment. In other words, the second opposing portion 179 opposes the trench gate structure 51 different from the trench gate structure 51 located at the other side to which the first trench contact structure 172A oppose.

That is, the second opposing portion 179 opposes the trench gate structure 51 located at the one side to which the first trench contact structure 172A is connected. It is preferred that the second opposing portion 179 opposes a whole region of the second end portion 51B of the trench gate structure 51. In this case, it is preferred that the first end portion 177A of the second trench contact structure 172B has a second extension portion 180 extended from the second opposing portion 179 toward the adjacent trench gate structure 51.

The second extension portion 180 is formed at an interval of the third interval I3 from the second end portion 177B of the adjacent second trench contact structure 172B and opposes the mesa portion 63 in the first direction X. The second extension portion 180 may pass beside an intermediate portion of the mesa portion 63. With the second extension portion 180, the second opposing portion 179 can be reliably opposed to the whole region of the second end portion 51B of the trench gate structure 51. Also, with the second extension portion 180, the third interval I3 can be reliably narrowed.

The contact electrode 74 of second trench contact structure 172B has a portion that extends in the first direction X and a portion that extends in the second direction Y in plan view. A width of the first direction X of the portion extending in the second direction Y exceeds a width of the second direction Y of the portion extending in the first direction X. A connecting are of the fifth plug electrode 95 (the gate plug electrode for the contact electrode 74) with respect to the contact electrode 74 is increased by the portion extending in the second direction Y.

The contact electrode 74 is led out into the gate trench 53 with the contact insulating film 73 therebetween at the second connection portion 178. The contact electrode 74 is connected to the lower electrode 57 in the gate trench 53, and insulated and separated from the upper electrode 56 with the middle insulating film 58 therebetween. The contact electrode 74 of the second trench contact structure 172B is thereby fixed to the same potential as the potential of the lower electrode 57 of the trench gate structure 51 located at the other side.

That is, the contact electrode 74 consists of a lead-out portion of the lower electrode 57 that is led out into the contact trench 72 from the gate trench 53 with the contact insulating film and the middle insulating film 58 therebetween. The lower electrode 57 of the trench gate structure 51 located at the other side is fixed to the same potential as the potential of the upper electrode 56 of the trench gate structure 51 located at the other side. The second trench contact structure 172B is thereby controlled at the same timing with the trench gate structure 51 located at the other side.

The trench contact structure 172 is to be controlled at the same timing with the connected trench gate structure 51 because of structurally including the contact electrode 74 which is fixed to the same potential as the potential of the lower electrode 57. Therefore, the total number of the unit transistor 10 which can be systematized as the system transistor 9 (that is, the maximum system number of the power transistor 8) is determined by the plurality of trench contact structures 172.

In this embodiment, the plurality of first trench contact structures 172A are connected to every other ones of the first end portions 51A of the plurality of trench gate structures 51. Also, the plurality of second trench contact structures 172B are connected to every other ones of the second end portions 51B of the plurality of trench gate structures 51. The plurality of second trench contact structures 172B are connected to the second end portions 51B of the trench gate structures 51 different from the trench gate structures 51 to which the first trench contact structures 172A are connected. Therefore, the total number of the system transistor 9 which can be systematized as the individual control target is "16", and the maximum system number of the power transistor 8 is "16".

The n-number of gate wirings 14 are electrically connected to the single or plurality of trench gate structures 51 (the trench contact structures 172) to be systematized as the individual control target, respectively, as well as the case of the first preferred embodiment. That is, the n-number of gate wirings 14 are respectively electrically connected to the single or plurality of trench gate structures 51 and the single or plurality of trench contact structures 172 that is connected to the single or plurality of trench gate structures 51.

The n-number of gate wirings 14 may include the single or plurality of gate wirings 14 electrically connected to the single trench gate structure 51 (the trench contact structure 172) to be systematized as the individual control target as well as the case of the first preferred embodiment. Also, the n-number of gate wirings 14 may include the single or plurality of gate wirings 14 parallelly connecting the plurality of trench gate structures 51 (the trench contact structures 172) as the individual control target.

The common gate wiring 14 may be electrically connected to the first trench contact structures 172A (the trench gate structure 51 at the one side) and the second trench contact structure 172B (the trench gate structure 51 at the other). However, in this case, the plurality of trench gate structures 51 adjacent to each other are controlled to the ON-states at the same timing, and therefore temperature is likely to rise. Therefore, it is preferred that the second trench contact structure 172B (the trench gate structure 51 at the other side) belongs to a system different from a system the first trench contact structure 172A (the trench gate structure 51 at the one side) belongs.

In this case, it is preferred that the n-number of gate wirings 14 include a first side gate wiring 14 that is connected to the trench gate structure 51 located at the one side and the first trench contact structures 172A, and a second side gate wiring 14 that is connected to the trench gate structure 51 located at the other side and the second trench contact structure 172B.

According to this structure, a first side gate signals G is to be individually input to the first side gate wiring 14, and a second side gate signals G is to be individually input to the second side gate wiring 14. Thus, the first trench contact structure 172A (the trench gate structure 51 at the one side) and the second trench contact structure 172B (the trench gate structure 51 at the other side) are controlled to the ON-state and the OFF-state with different timings, and it makes it possible to suppress the temperature rise caused around the adjacent plurality of trench gate structures 51.

The total number of the system transistor 9 which can be systematized as the individual control target can also be adjusted by patterns of the plurality of trench contact structures 172. In this case, the n-number of trench contact structures 172 may systematize (groups) the single or plurality of trench gate structures 51 as the individual control target. That is, the n-number of system transistors 9 may include the n-number of trench contact structures 172 which systematize (groups) the single or plurality of trench gate structures 51 (the unit transistors 10) as the individual control targets.

For example, the plurality of trench contact structures 172 can be formed in various patterns with combinations of the number of the first trench contact structure 172A, the number of the first opposing portion 175, the number of the first connection portion 174, the number of the second trench contact structure 172B, the number of the second opposing portion 179, the number of the second connection portion 178, etc.

Hereinafter, other pattern examples of the plurality of trench contact structures 172 are shown in FIG. 49A to FIG. 49F. FIGS. 49A to 49F are plan views showing first to sixth examples of the trench contact structures 172. In FIGS. 49A to 49F, the same reference numerals are given to the foregoing structure.

Figure 49A:
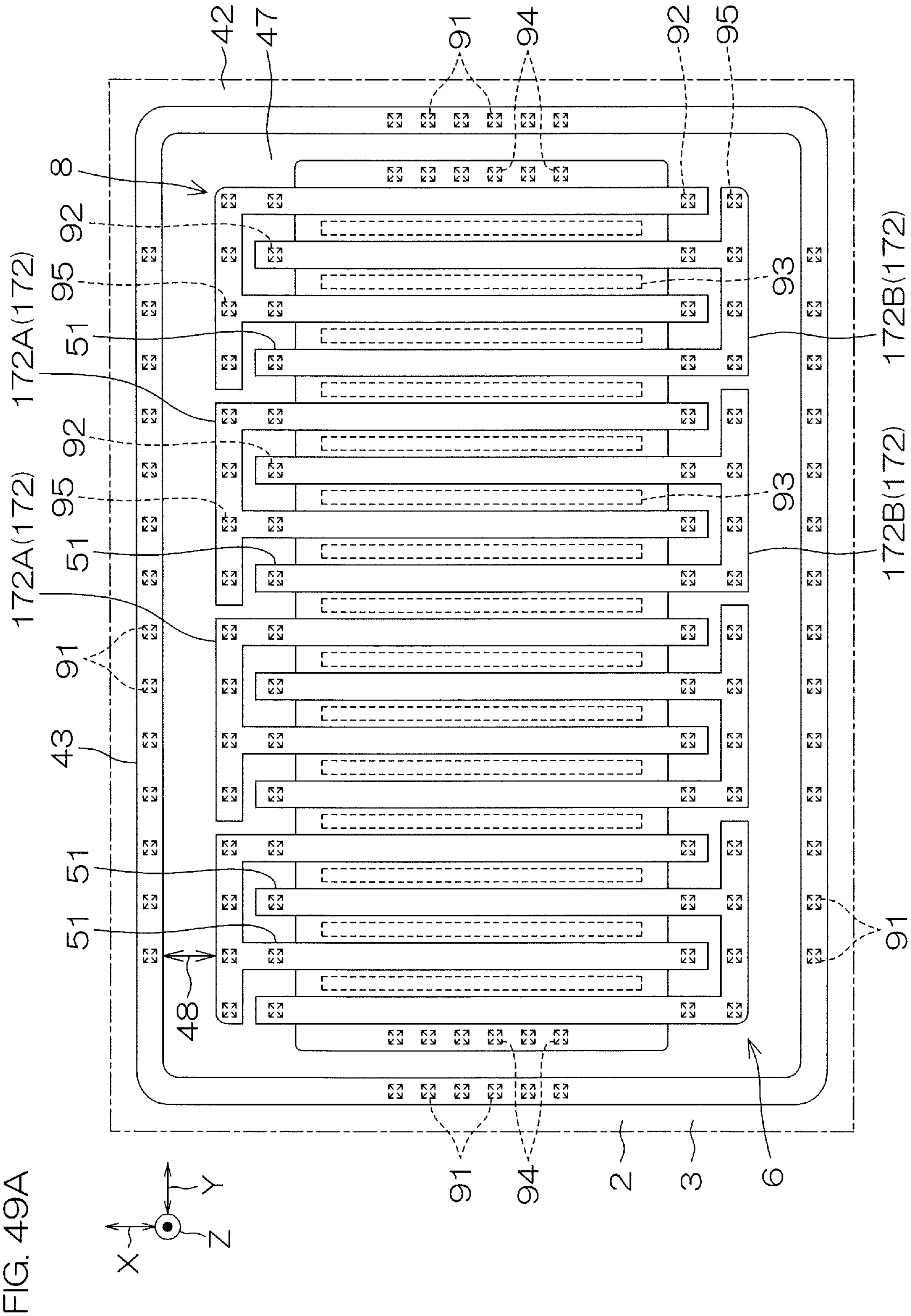
FIGS. 49A to 49F are plan views showing first to sixth examples of the trench contact structure.
Figure 49B:
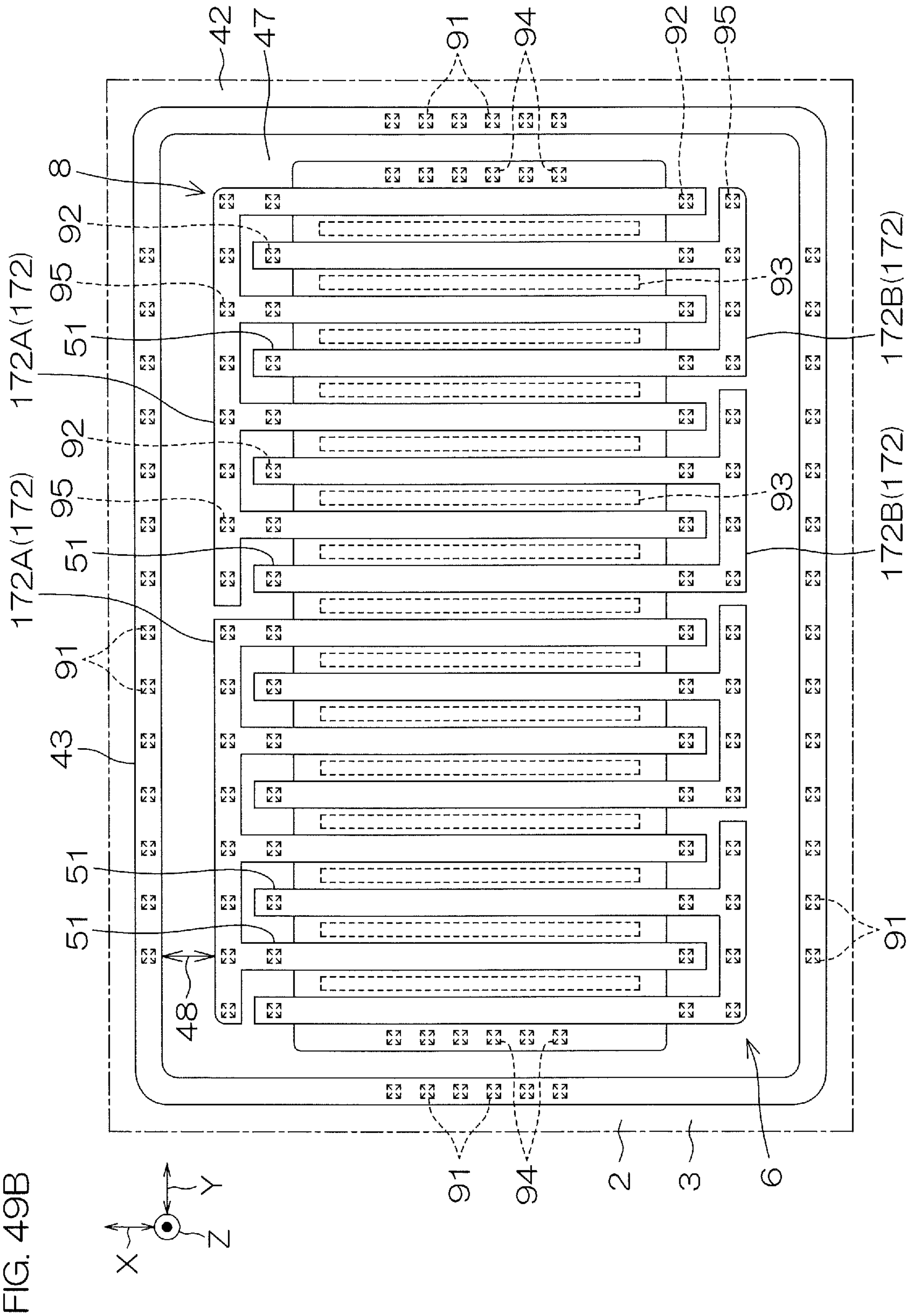
Figure 49C:
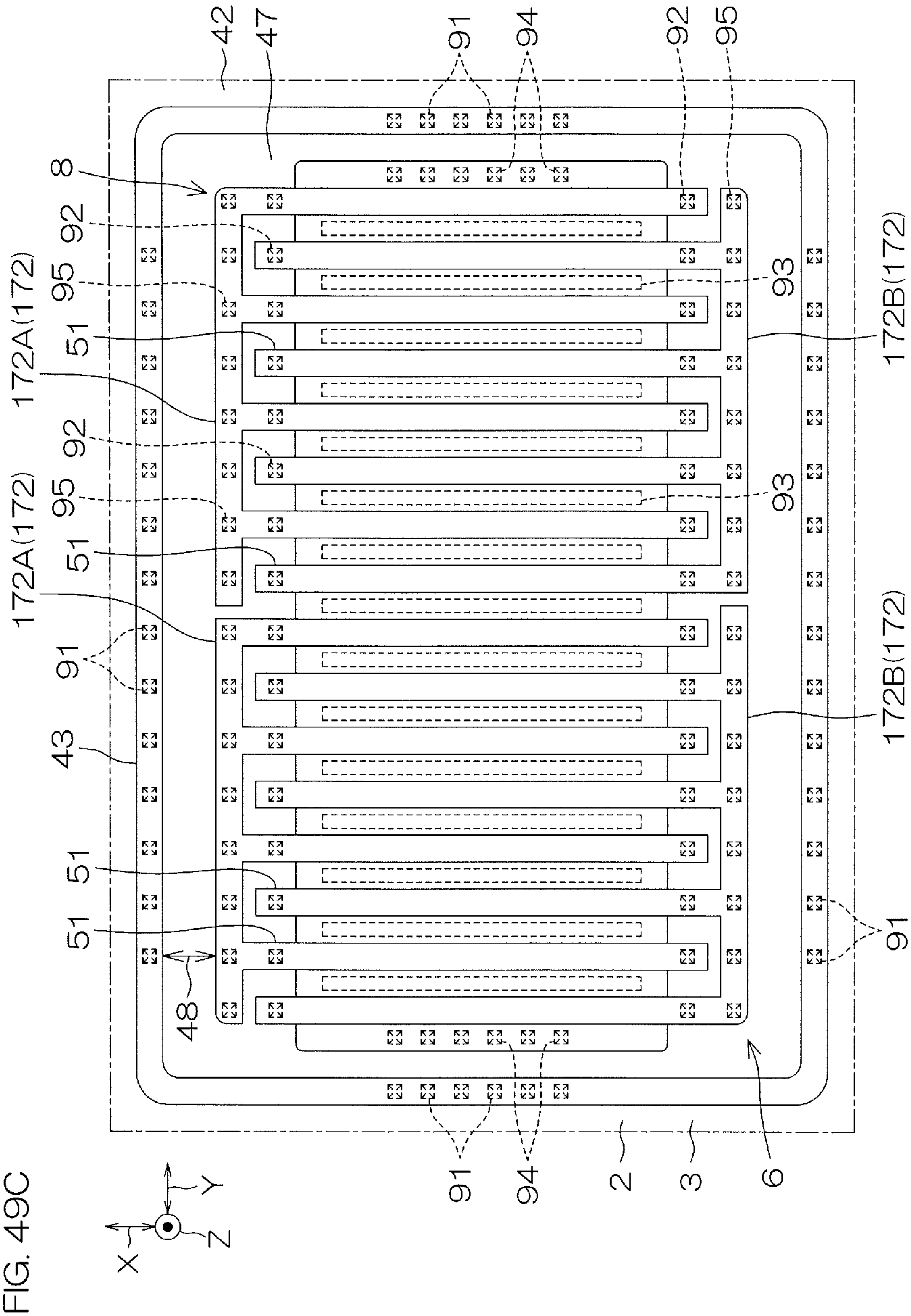
Figure 49D:
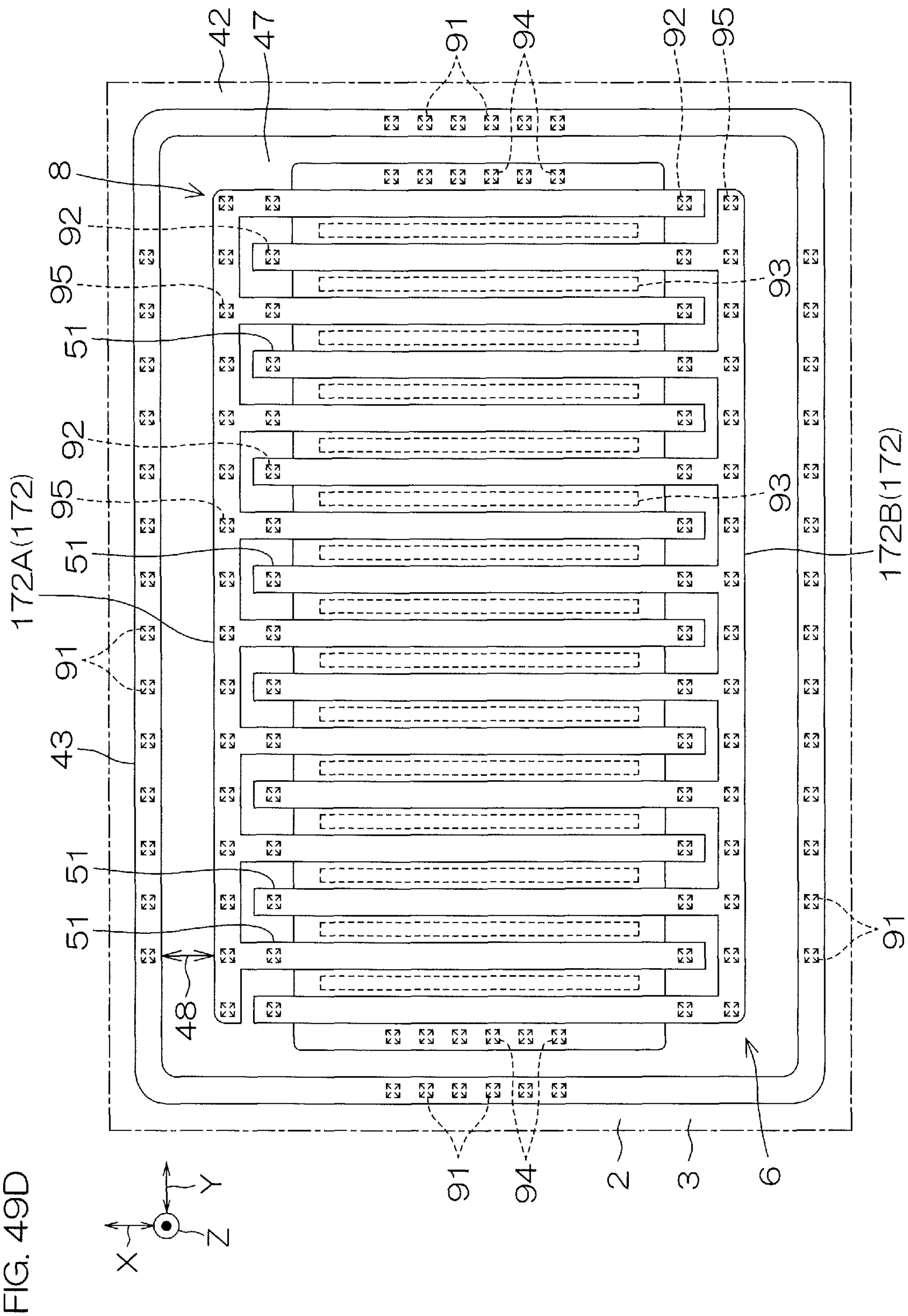
Figure 49E:
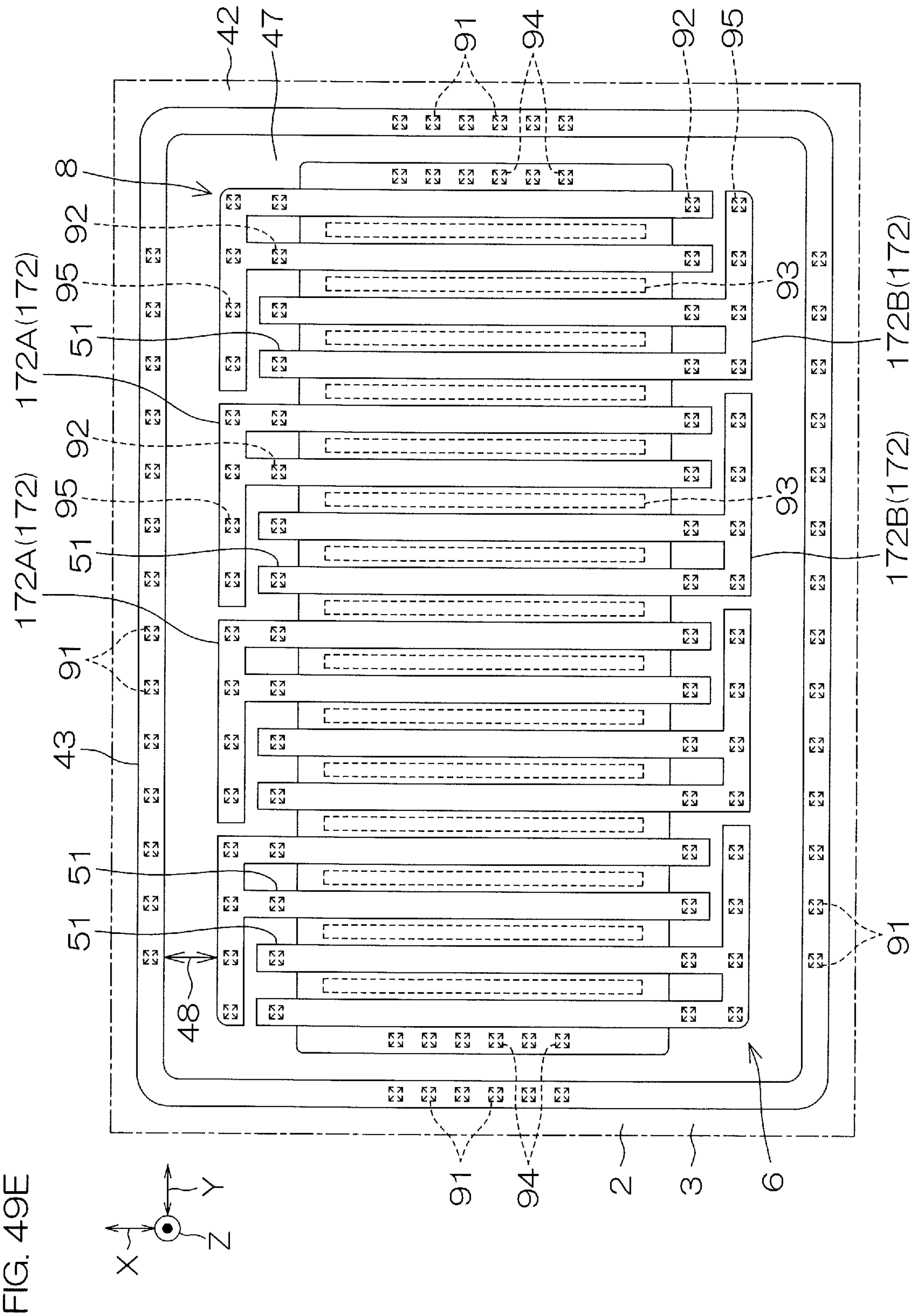
Figure 49F:
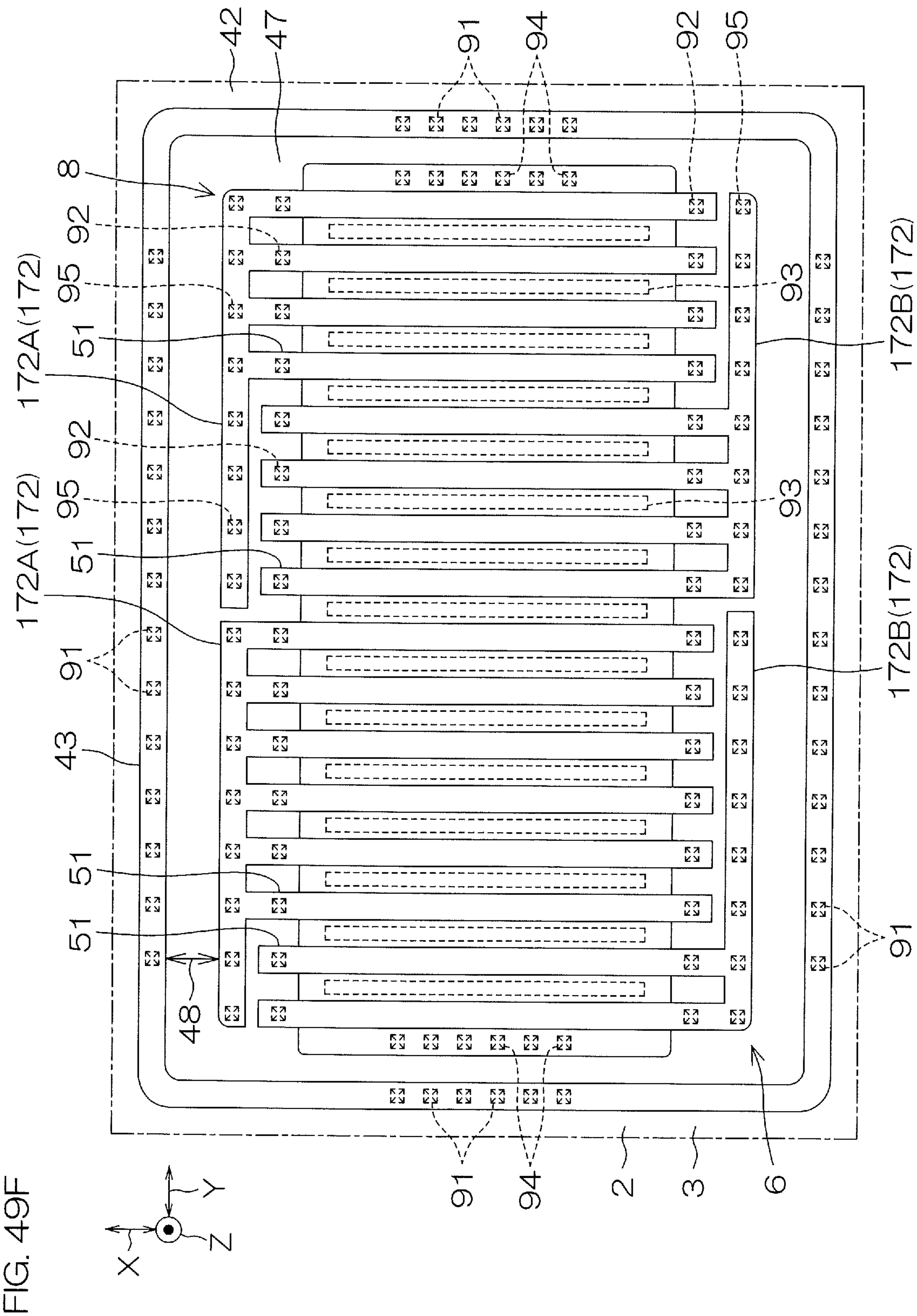

In FIG. 49A, a pattern in which the maximum system number is adjusted to "8" is shown. In FIG. 49B, a pattern in which the maximum system number is adjusted to "6" is shown. In FIG. 49C, a pattern in which the maximum system number is adjusted to "4" is shown. In FIG. 49D, a pattern in which the maximum system number is adjusted to "2" is shown. In FIG. 49E, a pattern in which the maximum system number is adjusted to "8" with different pattern form FIG. 49A is shown. In FIG. 49F, a pattern in which the maximum system number is adjusted to "4" with different pattern form FIG. 49C is shown.

As shown in FIG. 49A to FIG. 49F, the number of the first trench contact structure 172A, the number of the first opposing portion 175 and the number of the first connection portion 174 are arbitrary. The first trench contact structure 172A may have the single or plurality of first opposing portion 175, and may have the single or plurality of first connection portion 174.

Also, as long as the plurality of first trench contact structures 172A each has at least one of the first opposing portion 175, the plurality of first trench contact structure 172A does not necessarily have to be connected to every other ones of the first end portions 51A of the plurality of trench gate structures 51, respectively. As shown in FIG. 49E and FIG. 49F, the plurality of first trench contact structures 172A may be successively connected to two or more of the first end portions 51A of the adjacent trench gate structures 51. However, in this case, note the temperature rise around two or more of the adjacent trench gate structures 51.

Similarly, the number of the second trench contact structure 172B, the number of the second opposing portion 179 and the number of the second connection portion 178 are arbitrary. The second trench contact structure 172B may have the single or plurality of second opposing portion 179, and may have the single or plurality of second connection portion 178.

Also, as long as the plurality of second trench contact structure 172B each has at least one of the second opposing portion 179, the plurality of second trench contact structure 172B does not necessarily have to be connected to every other ones of the second end portions 51B of the plurality of trench gate structures 51, respectively. As shown in FIG. 49E and FIG. 49F, the plurality of second trench contact structures 172B may be successively connected to two or more of the second end portions 51B of the adjacent trench gate structures 51. However, in this case, note the temperature rise around two or more of the adjacent trench gate structures 51.

The patterns shown in FIG. 49A to FIG. 49F are just examples. The plurality of trench contact structures 172 can be formed in patterns other than the patterns shown in FIG. 49A to FIG. 49F, depending on the number of the trench gate structure 51, etc.

Figure 50:
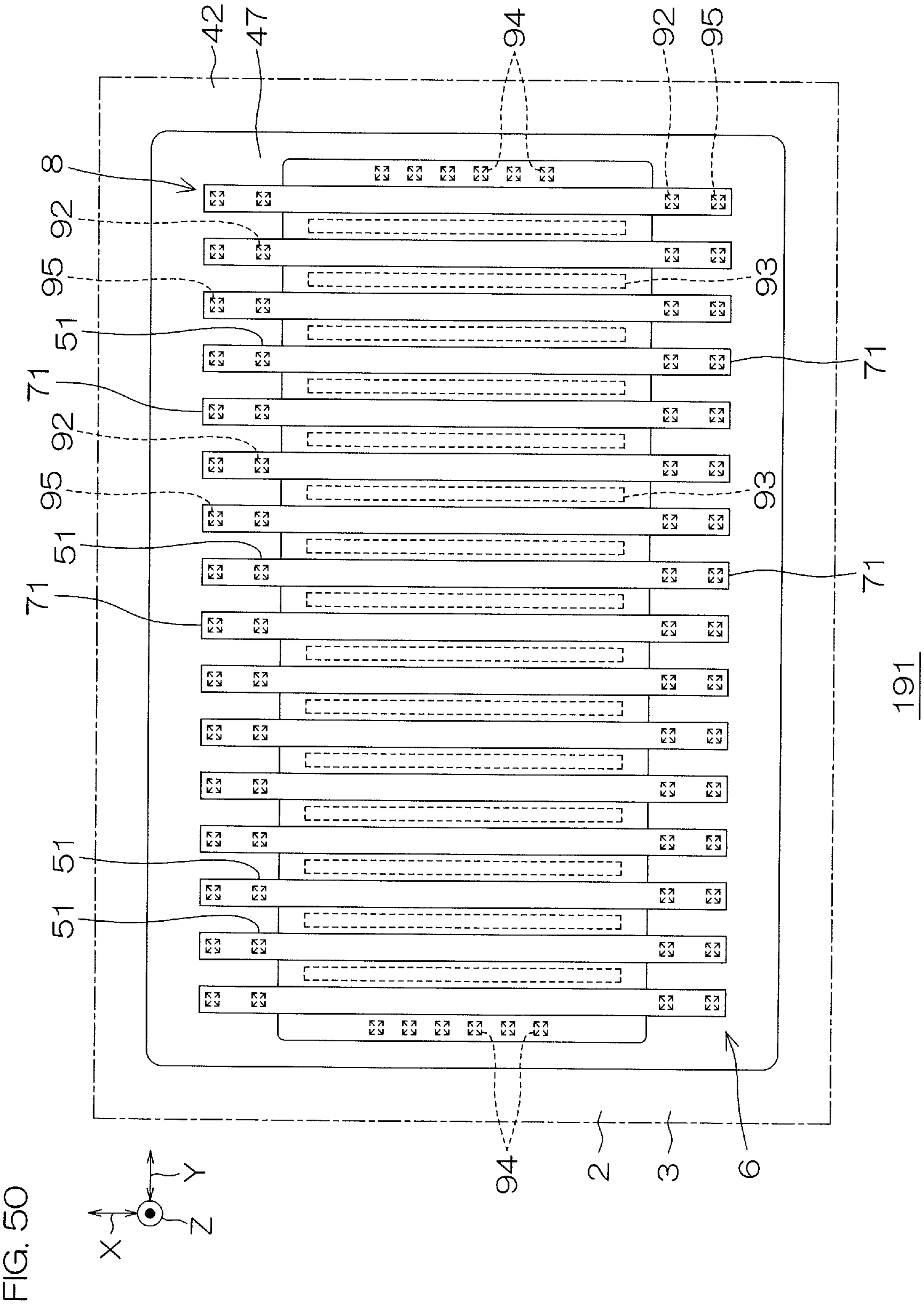
FIG. 50 is an enlarged view showing a principal portion of a semiconductor device according to a reference embodiment.

FIG. 50 is an enlarged view showing a principal portion of a semiconductor device 191 according to a reference embodiment. The semiconductor device 191 corresponds to an embodiment from which the trench separation structure 43 is omitted from the semiconductor device 1 according to the first preferred embodiment. The other structures of the semiconductor device 191 are the substantially same as those of the semiconductor device 1 according to the first preferred embodiment.

Figure 51:
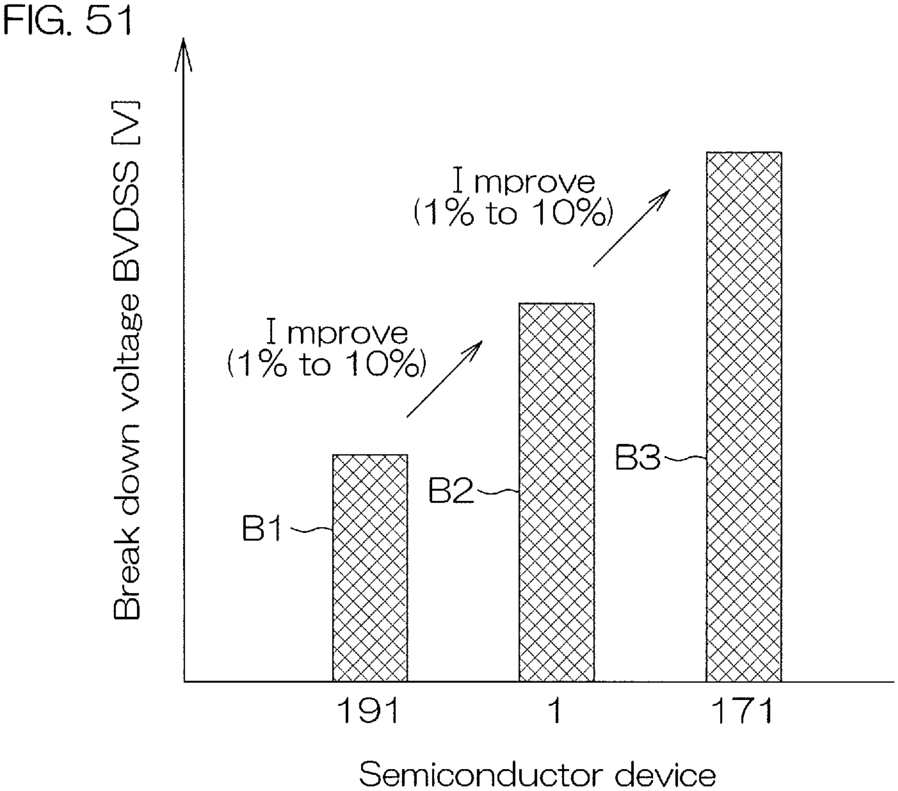
FIG. 51 is a graph showing a breakdown voltage.

FIG. 51 is a graph showing a breakdown voltage BVDSS. An ordinate axis in FIG. 51 shows the breakdown voltage BVDSS [V]. An abscissa axis in FIG. 51 shows items. In FIG. 51, a first bar graph B1, a second bar graph B2 and a third bar graph B3 are shown.

The first bar graph B1 shows the breakdown voltage BVDSS of the semiconductor device 191 according to a reference embodiment (see FIG. 50). The second bar graph B2 shows the breakdown voltage BVDSS of the semiconductor device 1 according to the first preferred embodiment (see FIG. 1 to FIG. 16). The third bar graph B3 shows the breakdown voltage BVDSS of the semiconductor device 171 according to the present preferred embodiment (see FIG. 42 to FIG. 49). The breakdown voltages BVDSS increased in the order of the semiconductor device 191 according to a reference embodiment, the semiconductor device 1 according to the first preferred embodiment, and the semiconductor device 171 according to the present preferred embodiment.

It was found that the breakdown voltage BVDSS could be improved by introducing the trench separation structure 43 from a comparison of the first bar graph B1 and the second bar graph B2. It was also found that the breakdown voltage BVDSS could be further improved by introducing the plurality of trench contact structures 172 instead of the trench separation structure 43 from a comparison of the first bar graph B2 and the second bar graph B3. It was also found that the structure in which both of the trench separation structure 43 and the plurality of trench contact structures 172 were introduced was most preferable from a comparison of the first bar graph B1 and the second bar graph B3.

As described above, the semiconductor device 171 includes the semiconductor chip 2, the plurality of trench gate structures 51 and the trench contact structure 172. The plurality of trench gate structures 51 each has the multiple electrode structure including the upper electrode 56 and the lower electrode 57 each embedded in the gate trench 53 such as to be vertically insulated and separated by the first insulator (the upper insulating film 54, the lower insulating film 55 and the middle insulating film 58). The plurality of trench gate structures 51 extends in the first direction X respectively, and are formed in the first main surface 3 at the interval of the first interval T1 in the second direction Y orthogonal to the first direction X, in plan view.

The trench contact structure 172 has the single electrode structure including the contact electrode 74 embedded in the contact trench 72 with the second insulator (the contact insulating film 73). The trench contact structure 172 extends in the second direction Y, and is formed in the first main surface 3 at the interval of the second interval I2 less than the first interval T1 in the first direction X from the end portion (the first end portion 51A or the second end portion 51B) of at least one of the trench gate structures 51.

According to this structure, it is possible to connect the depletion layer extending from the trench gate structure 51 and the depletion layer extending from the trench contact structure 172 below the bottom wall of the trench contact structure 172. This makes it possible to suppress the electric field concentration at the end portion of the trench gate structure 51. As a result, the breakdown voltage BVDSS can be improved.

In the semiconductor device 171, it is preferred that the plurality of trench gate structures 51 are configured such as to be electrically independently controlled. That is, it is preferred that the plurality of trench gate structures 51 are configured such as to be individually controlled by the plurality of gate signals G.

The semiconductor device 171 further includes the n-number of gate wirings 14 configured such as to individually transmit the gate signals G to the plurality of trench gate structures 51. According to this structure, it is possible to provide the semiconductor device 171 including the n-system power transistor 8. It is preferred that the n-number of gate wirings 14 has the single or plurality of gate wirings 14 that parallelly connects the plurality of trench gate structures 51 to be systematized as the individual control target.

In the semiconductor device 171, it is further preferred that the lower electrode 57 is fixed to the same potential as the potential of the upper electrode 56. According to this structure, it is possible to suppress the voltage drop between the upper electrode 56 and the lower electrode 57. Therefore, the electric field concentration between the upper electrode 56 and the lower electrode 57 can be suppressed.

In the semiconductor device 171, the gate signal G is input to the trench contact structure 172. In this case, it is preferred that the other gate signal G different from the gate signal G, which input to the trench gate structure 51 to which the trench contact structure 172 is opposed, is input to the trench contact structure 172.

In the semiconductor device 171, it is preferred that the trench contact structure 172 passes beside at least two of the trench gate structures 51 in the second direction Y. In this case, it is preferred that the trench contact structure 172 has at least one of connection portion (the first connection portion 174 or the second connection portion 178) that is connected to the end portion of at least one of the trench gate structure 51.

It is also preferred that the trench contact structure 172 has at least one of the opposing portion (the first opposing portion 175 or the second opposing portion 179) that opposes the end portion (the first end portion 51A or the second end portion 51B) of at least one of the trench gate structure 51 at a region different from the connection portion. According to this structure, it is possible to suppress the electric field concentration with respect to the end portion of the trench gate structure 51 while keeping the trench gate structure 51 individually controllable. It is preferred that the contact electrode 74 is connected to the lower electrode 57 at the connection portion (the first connection portion 174 or the second connection portion 178).

In the semiconductor device 171, it is preferred that the plurality of trench contact structures 172 are formed at the interval of the third interval I3 less than the first interval T1 (I3≤I1) in the second direction Y. According to this structure, even in a case in which the plurality of trench contact structures 172 are formed, it is possible to appropriately suppress the electric field concentration at the end portion of the trench contact structure 172 and the end portion of the trench gate structure 51.

In the semiconductor device 171, it is preferred that the plurality of trench gate structure 51 has the first depth D1, and the trench contact structure 172 has the second depth D2 substantially equal to the first depth D1 (D1≈D2). That is, it is preferred that the trench contact structure 172 is smoothly connected to the plurality of trench gate structures 51. According to this structure, it is possible to suppress a bias of an electric field distribution due to a depth variation between the trench gate structure 51 and the trench contact structure 172.

In the semiconductor device 171, the trench gate structure 51 may have the first width W1 regarding the second direction Y. The trench contact structure 172 may have the second width W2 not less than the first width W1 (W2≤W1) regarding the first direction X.

It is preferred that the semiconductor device 171 includes the trench separation structure 43 that demarcates the first device region 6 in the first main surface 3. The trench separation structure 43 has the single electrode structure including the separation electrode 46 embedded in the separation trench 44 across the separation insulating film 45. In this structure, it is preferred that the plurality of trench gate structures 51 and the plurality of trench contact structures 172 are each formed in the first device region 6 at the interval from the trench separation structure 43. According to this structure, it is possible to suppress the electric field concentration with respect to the trench gate structures 51 and the trench contact structures 172 by the trench separation structure 43. As a result, the breakdown voltage BVDSS can be appropriately suppress.

In the semiconductor device 171, it is preferred that the trench separation structure 43 is formed deeper than the trench gate structure 51 and the trench contact structure 172. According to this structure, the first device region 6 can be appropriately demarcated. It is preferred that the semiconductor device 171 further includes the control IC 11 configured such as to generate the plurality of gate signals G by which the plurality of trench gate structures 51 are individually controlled.

The structure of the semiconductor device 171 can be adopted to the aforementioned first to sixth preferred embodiment, respectively. That is, the power transistor 8 of the semiconductor device 171 may be controlled with at least two operational modes each consisting of the different ON-resistance Ron during at least two operations of the ON-transition operation, the normal operation, the OFF-transition operation, and the active clamp operation, as described in the second to sixth preferred embodiment.

Figure 52:
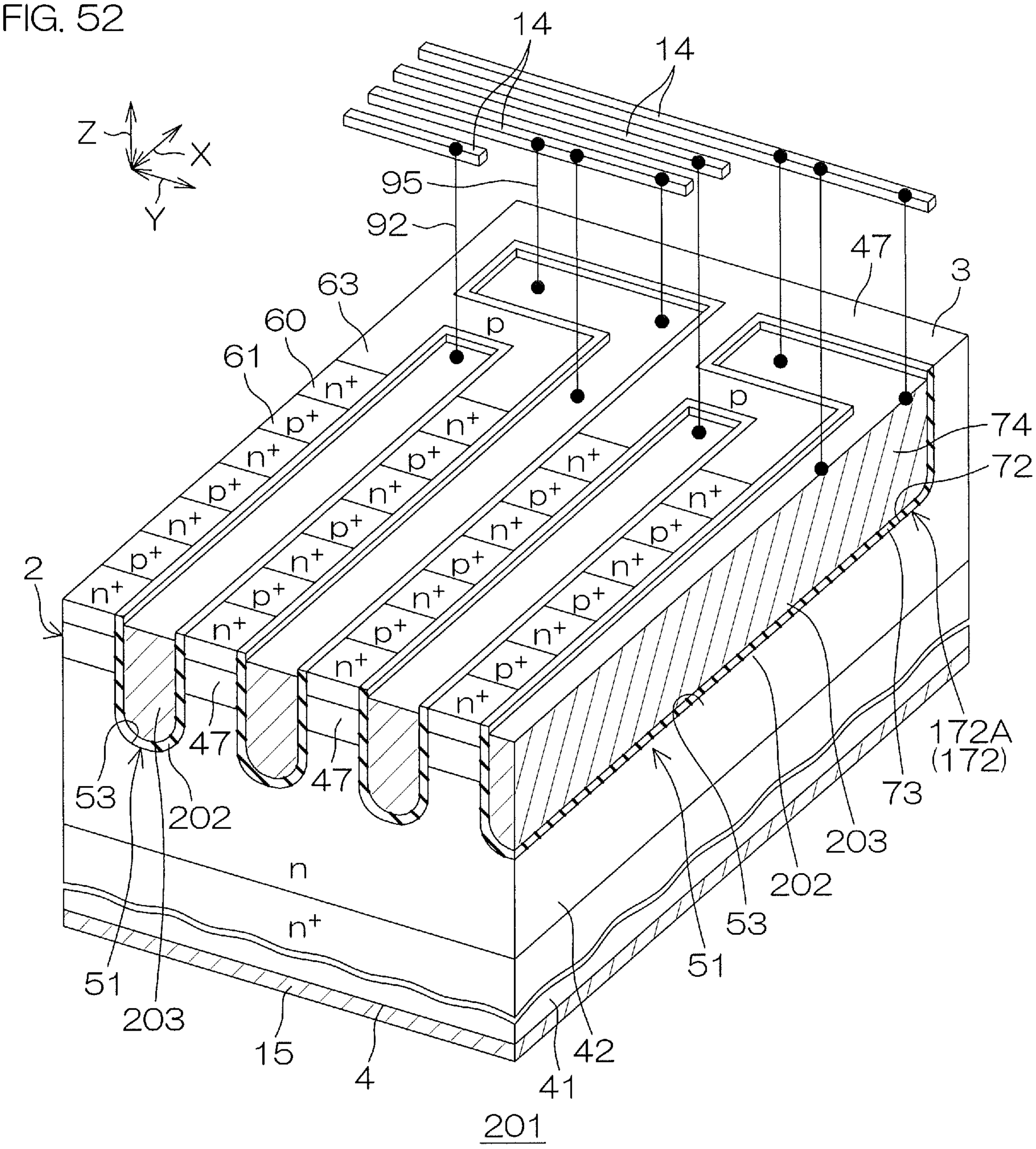
FIG. 52 is a sectional perspective view showing a principal portion of a semiconductor device according to an eighth preferred embodiment of the present invention.

FIG. 52 is a sectional perspective view showing a principal portion of a semiconductor device 201 according to an eighth preferred embodiment of the present invention. Hereinafter, the same reference numerals will be given to the structures corresponding to the structures described for the semiconductor device 1, and the descriptions thereof will be omitted.

The trench gate structure 51 according to the aforementioned semiconductor device 1 has a multiple electrode structure including the gate trench 53, the upper insulating film 54, the lower insulating film 55, the upper electrode 56, the lower electrode 57, and the middle insulating film 58. On the other hand, the trench gate structure 51 according to the semiconductor device 201 has a single electrode structure including the gate trench 53, a gate insulating film 202 and a gate electrode 203.

The gate trench 53 is formed in the first main surface 3 with the same manner as the case of the first preferred embodiment. The gate insulating film 202 is formed in a film shape in a whole region of the wall surface of the gate trench 53. The gate electrode 203 is embedded in the gate trench 53 as an integrated member across the gate insulating film 202.

The semiconductor device 201 may include the plurality of trench contact structures 71 according to the first preferred embodiment, or, the trench contact structures 172 according to the seventh preferred embodiment. In FIG. 52, an example in which the trench contact structures 172 according to the seventh preferred embodiment are formed. The contact insulating film 73 of the trench contact structure 172 has a thickness substantially equal to a thickness of the gate insulating film 202, in this embodiment.

The contact insulating film 73 is connected to the gate insulating film 202 at the connection portion (the first connection portion 174 and the second connection portion 178). The contact electrode 74 of the trench contact structure 172 is connected to the gate electrode 203 at the connection portion (the first connection portion 174 and the second connection portion 178).

As described above, with the semiconductor device 201, the n-system power transistor 8 can also be configured. Therefore, the same effects as those described in the first to seventh preferred embodiments can be achieved.

Figure 53:
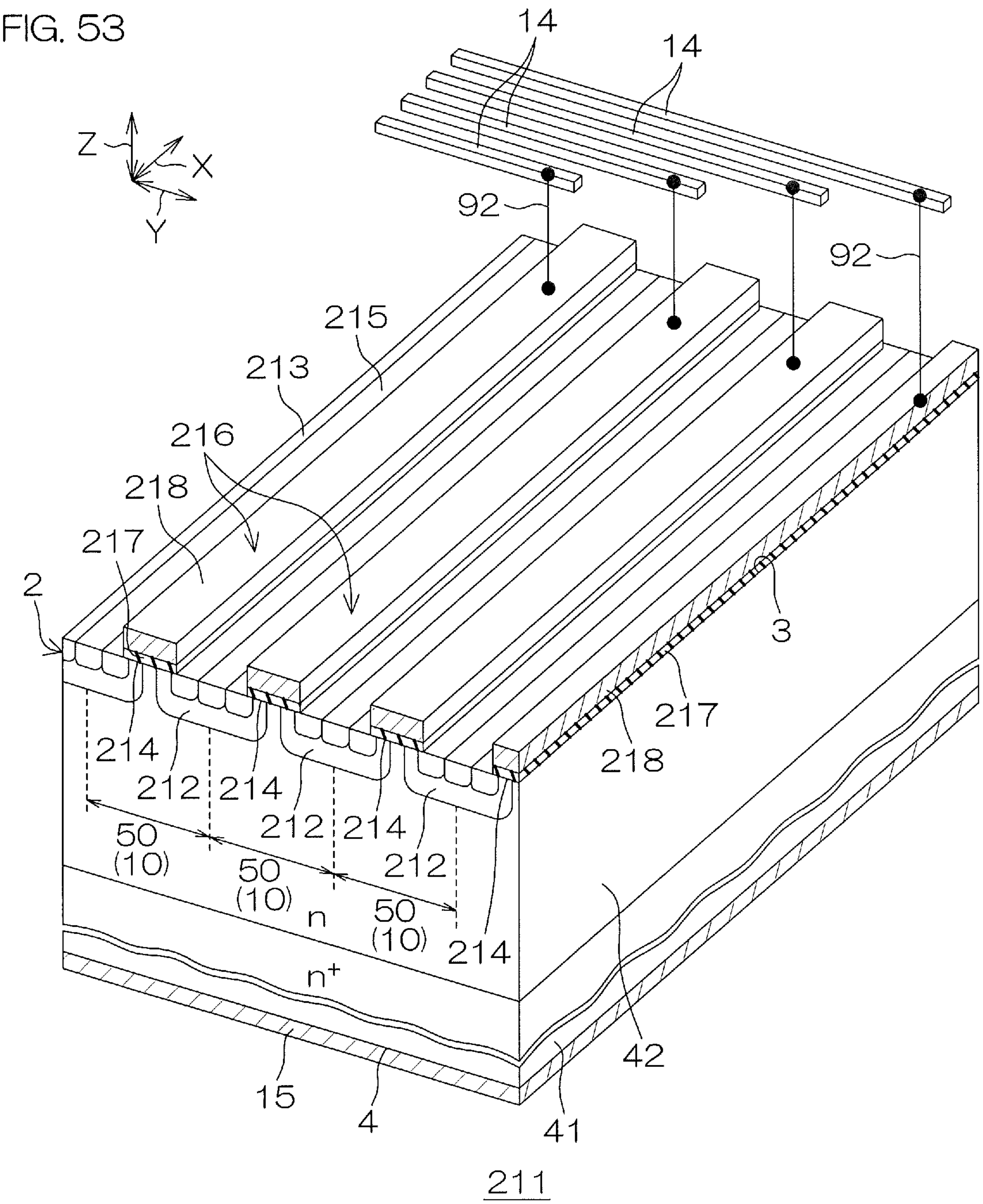
FIG. 53 is a sectional perspective view showing a principal portion of a semiconductor device according to a ninth preferred embodiment of the present invention.

FIG. 53 is a sectional perspective view showing a principal portion of a semiconductor device 211 according to a ninth preferred embodiment of the present invention. Hereinafter, the same reference numerals will be given to the structures corresponding to the structures described for the semiconductor device 1, and the descriptions thereof will be omitted.

The semiconductor device 211 has the n-system power transistor 8 of a planer-gate-type instead of the trench-gate-type. The semiconductor device 211 includes a plurality of p-type body regions 212 formed in the surface layer portion of the first main surface 3 at the first device region 6. The plurality of body regions 212 are each formed in a band shape extending along the first direction X, and formed at intervals in the second direction Y in plan view. The plurality of body regions 212 are thereby formed in a stripe shape extending along the first direction X in plan view.

The semiconductor device 211 includes a plurality of n-type source regions 213 formed in a surface layer portion of each of the body regions 212. The plurality of source regions 213 each has an n-type impurity concentration exceeding the n-type impurity concentration of the drift region 42. The plurality of source regions 213 are each formed in a band shape extending in the first direction X, and formed at an interval in the second direction Y. The plurality of source regions 213 are formed at intervals toward the first main surface 3 from each of the body regions 212. The plurality of source regions 213 each defines a p-type channel region 214 with the drift region 42 therebetween at the surface layer portion of each of the body regions 212.

The semiconductor device 211 includes a plurality of p-type contact regions 215 each formed in the surface layer portion of each of the body regions 212. The plurality of contact regions 215 each has a p-type impurity concentration exceeding the p-type impurity concentration of the body region 212. The contact region 61 is formed in a region between the plurality of source regions 213 adjacent to each other at the surface layer portion of each of the body regions 212.

The semiconductor device 211 includes a plurality of planer gate structures 216 that are formed on the first main surface 3. The plurality of planer gate structures 216 are each formed in a band shape extending in the first direction X such as to extend over the adjacent pairs of the body regions 212, and are formed at intervals in the second direction Y in plan view.

The plurality of planer gate structures 216 each has a laminated structure in which a gate insulating film 217 and a gate electrode 218 are laminated on the first main surface 3 in that order. The gate insulating film 217 is formed to extend over the adjacent pairs of the body regions 212 such as to cover the drift region 42 and a pair of the channel regions 214 connected to the drift region 42. The gate electrode 218 opposes the drift region 42 and the channel regions 214 across the gate insulating film 217.

The unit cell 50 (the unit transistor 10) according to the semiconductor device 211 includes the pair of the channel regions 214 to be controlled by the planer gate structure 216, in this embodiment. That is, the plurality of unit cells 50 (the unit transistors 10) are each formed in a region between central portions of the plurality of body regions 212 (specifically, the contact regions 215), in this embodiment.

As described above, with the semiconductor device 211, the n-system power transistor 8 of the planer-gate-type can be configured. Therefore, the same effects as those described in the first to seventh preferred embodiments can be achieved.

Figure 54:
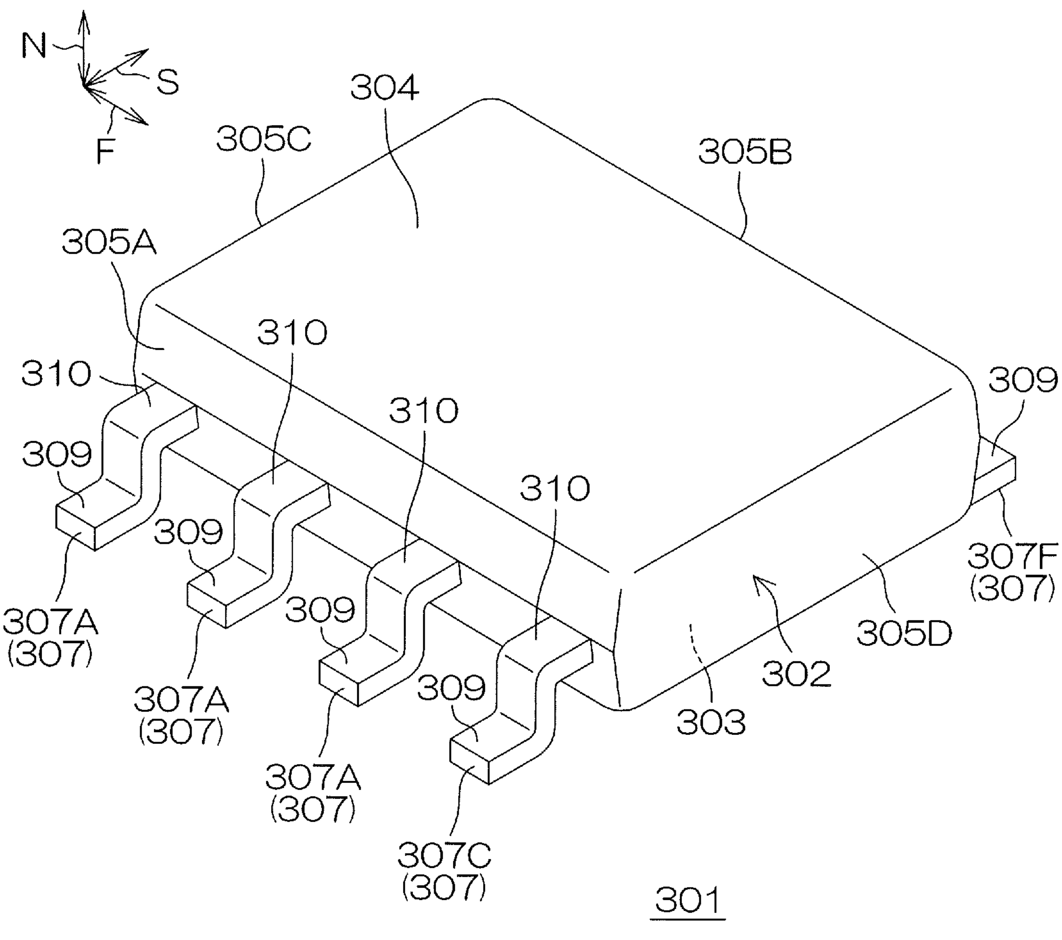
FIG. 54 is a perspective view showing a semiconductor package in which any one of the semiconductor devices according to the first to ninth embodiments is incorporated.
Figure 55:
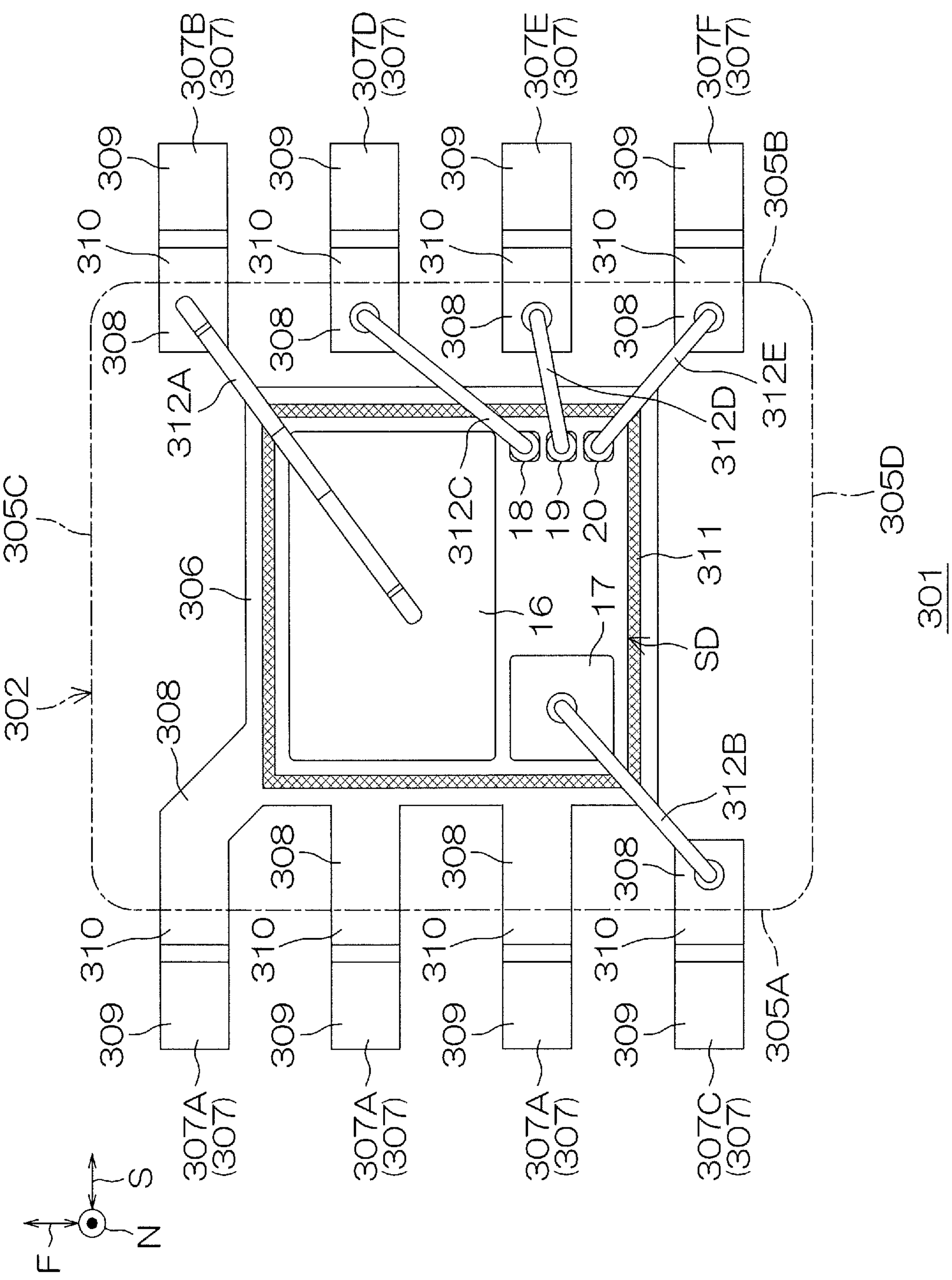
FIG. 55 is a plan view showing an internal structure of the semiconductor package shown in FIG. 54.

FIG. 54 is a perspective view showing a semiconductor package 301 in which any one of the semiconductor devices 1, 121, 141, 151, 161, 171, 201 and 211 according to the first to ninth embodiments is incorporated (hereinafter, simply referred to as "the semiconductor device SD"). FIG. 55 is a plan view showing an internal structure of the semiconductor package 301 shown in FIG. 54.

With reference to FIG. 54 and FIG. 55, the semiconductor package 301 consists of an 8-terminal type of SOP (Small Outline Package), in this embodiment. The semiconductor package 301 includes a package body 302. The package body 302 consists of a mold resin (e.g. an epoxy resin) and formed in a rectangular parallelepiped shape.

The package body 302 has a mounting surface 303 on one side, a non-mounting surface 304 on the other side, and first to fourth side walls 305A to 305D connecting the mounting surface 303 and the non-mounting surface 304. The mounting surface 303 and the non-mounting surface 304 are each formed in a quadrilateral shape (specifically, a rectangular shape) in plan view when viewed from a normal direction N thereof. The mounting surface 303 is a surface that opposes a connecting target in a state in which the semiconductor package 301 is mounted to the connecting target. A PCB (Printed Circuit Board), a circuit board, etc. are exemplified as the connecting target.

The first to fourth side walls 305A to 305D includes the first side wall 305A, the second side wall 305B, the third side wall 305C and the fourth side wall 305D. The first side wall 305A and the second side wall 305B extend along a first direction F, and oppose a second direction F orthogonal to the first direction F. The first side wall 305A and the second side wall 305B form long sides of the package body 302. The third side wall 305C and the fourth side wall 305D extend along the second direction S, and oppose the first direction F. The third side wall 305C and the fourth side wall 305D form short sides of the package body 302. Lengths of the long sides of the package body 302 may be not less than 2 mm and not more than 5 mm. Lengths of the short sides of the package body 302 may be not less than 1 mm and not more than 4 mm.

The semiconductor package 301 includes a die pad 306 of a plate shape arranged in the package body 302. The die pad 306 is arranged at a side of the mounting surface 303 in the package body 302. The die pad 306 includes at least one of copper, copper-alloy, iron and iron-alloy. The die pad 306 is formed in a quadrilateral shape in plan view.

The semiconductor package 301 includes a plurality (8, in this embodiment) of lead terminals 307 led out from inside to outside of the package body 302. The plurality of lead terminals 307 are bent toward the mounting surface 303 side outside the package body 302. The plurality of lead terminals 307 each includes at least one of copper, copper-alloy, iron and iron-alloy.

The plurality of lead terminals 307 include drain lead terminals 307A, a source lead terminal 307B, a input lead terminal 307C, a reference lead terminal 307D, an enable lead terminal 307E and the sense lead terminal 307F, in this embodiment.

The three drain lead terminals 307A and the input lead terminal 307C are arranged at intervals from the third side wall 305C side to the fourth side wall 305D side in that order at the first side wall 305A side. The source lead terminal 307B, the reference lead terminal 307D, the enable lead terminal 307E and the sense lead terminal 307F are arranged at intervals from the third side wall 305C side to the fourth side wall 305D side in that order at second side wall 305B side.

The plurality of lead terminals 307 each has an inner end portion 308, an outer end portion 309 and a lead portion 310. The inner end portion 308 is arranged inside the package body 302 and has a plate surface parallel to the mounting surface 303 (the non-mounting surface 304). The inner end portions 308 of the three drain lead terminal 307A are integrally formed with the die pad 306, and fixed to a same potential as a potential of the die pad 306, in this embodiment.

The outer end portion 309 is arranged outside the package body 302 and has a plate surface parallel to the mounting surface 303 (the non-mounting surface 304). The lead portion 310 is led out from the inner end portion 308 to the outside the package body 302 and connected to the outer end portion 309. The lead portion 310 is bent toward the mounting surface 303 side outside the package body 302 and is connected to the outer end portion 309 at a height position passing beside the mounting surface 303 in the normal direction N.

A number and functions of the plurality of lead terminals 307 are adjusted depending on the terminal electrodes 15 to 20 of the semiconductor device SD. Also, shapes of the plurality of lead terminals 307 are arbitrary and are adjusted depending on the package type. Also, arrangements of the drain lead terminals 307A, the source lead terminal 307B, the reference lead terminal 307D, the enable lead terminal 307E and the sense lead terminal 307F are arbitrary, and are not restricted to the arrangements shown in FIG. 54 and FIG. 55.

The semiconductor package 301 includes the semiconductor device SD arranged on the die pad 306 inside the package body 302. The semiconductor device SD is arranged on the die pad 306 in a posture in which the drain terminal 15 is opposed to the mounting surface 303 of the package body 302. The drain terminal 15 is thereby electrically connected to the die pad 306.

The semiconductor package 301 includes a conductive bonding material 311 (see hatching portion in FIG. 55) that is interposed between the die pad 306 and the semiconductor device SD inside the package body 302 and by which the die pad 306 and the semiconductor device SD (specifically, the drain terminal 15) are joined. The conductive bonding material 311 includes a metal paste or a solder.

The semiconductor package 301 includes a plurality (5, in this embodiment) of lead wires 312 each connecting the corresponding terminal electrodes 16 to 20 (the source terminal 16, the input terminal 17, the reference terminal 18, the enable terminal 19 and the sense terminal 20) of the semiconductor device SD to the corresponding lead terminals 307 inside the package body 302. The plurality of lead wires 312 each consists of a bonding wire.

Specifically, the plurality of lead wires 312 include a source lead wire 312A, an input lead wire 312B, a reference lead wire 312C, an enable lead wire 312D and a sense lead wire 312E. The source lead wire 312A is connected to the source terminal 16 and the source lead terminal 307B. The input lead wire 312B is connected to the input terminal 17 and the input lead terminal 307C. The reference lead wire 312C is connected to the reference terminal 18 and the reference lead terminal 307D. The enable lead wire 312D is connected to the enable terminal 19 and the enable lead terminal 307E. The sense lead wire 312E is connected to the sense terminal 20 and the sense lead terminal 307F.

The plurality of lead wires 312 each includes at least one of a copper wire, a gold wire and an aluminum wire. It is preferred that the source lead wire 312A among the plurality of lead wires 312 consists of the aluminum wire. It is preferred that the input lead wire 312B, the reference lead wire 312C, the enable lead wire 312D and the sense lead wire 312E among the plurality of lead wires 312 consist of the copper wire.

In this embodiment, an example in which the three drain lead terminals 307A are formed. However, the number of the drain lead terminal 307A are arbitrary and one or more of the drain lead terminal 307A may be formed. Also, in this embodiment, an example in which the drain lead terminals 307A are integrally formed with the die pad 306 is described. However, the drain lead terminals 307A may be formed at intervals from the die pad 306. In this case, the single or plurality of lead wires 312 may be connected to the die pad 306 and the drain lead terminals 307A.

The semiconductor package 301 is not restricted to SOP and may consist of QFN (Quad Flat Non Lead Package), DFP (Dual Flat Package), DIP (Dual Inline Package), QFP (Quad Flat Package), SIP (Single Inline Package), or, SOJ (Small Outline J-leaded Package), or any various packages similar to those packages.

Hereinafter, modification examples of the semiconductor device 1 will be described. As a matter of course, the modification examples described hereinafter can be adopted not only to the semiconductor device 1 but also to the semiconductor devices 121, 141, 151, 161, 171, 201 and 211 according to the second to ninth preferred embodiments.

Figure 56:
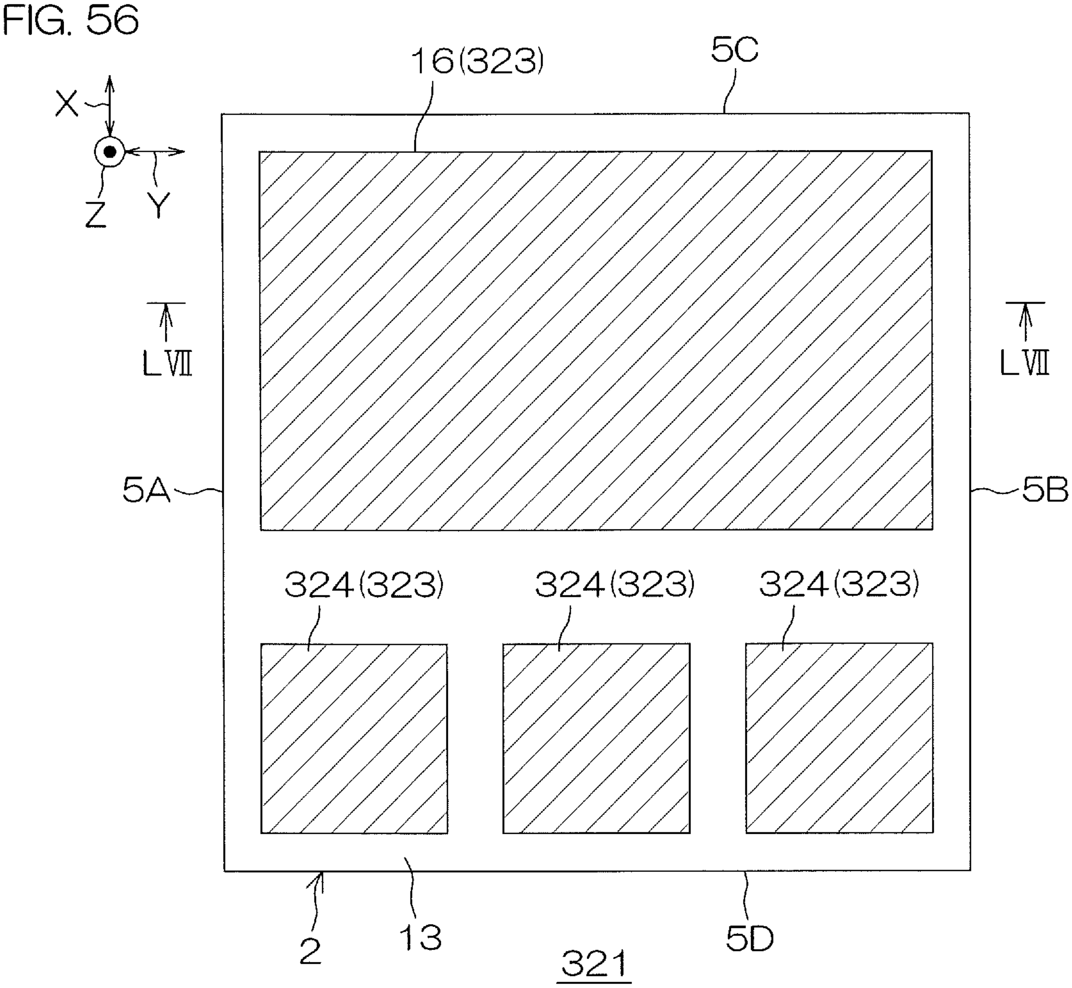
FIG. 56 is a plan view showing a semiconductor device according to a first modification example.
Figure 57:
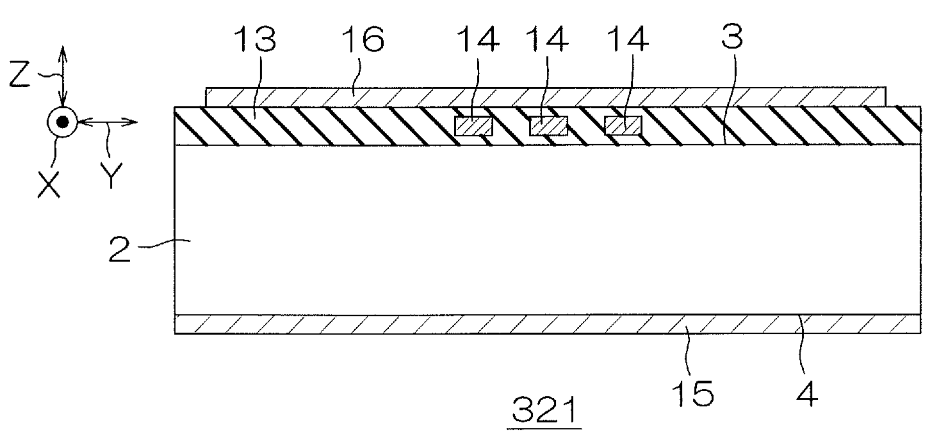
FIG. 57 is a sectional view taken along LVII-LVII shown in FIG. 56.
Figure 58:
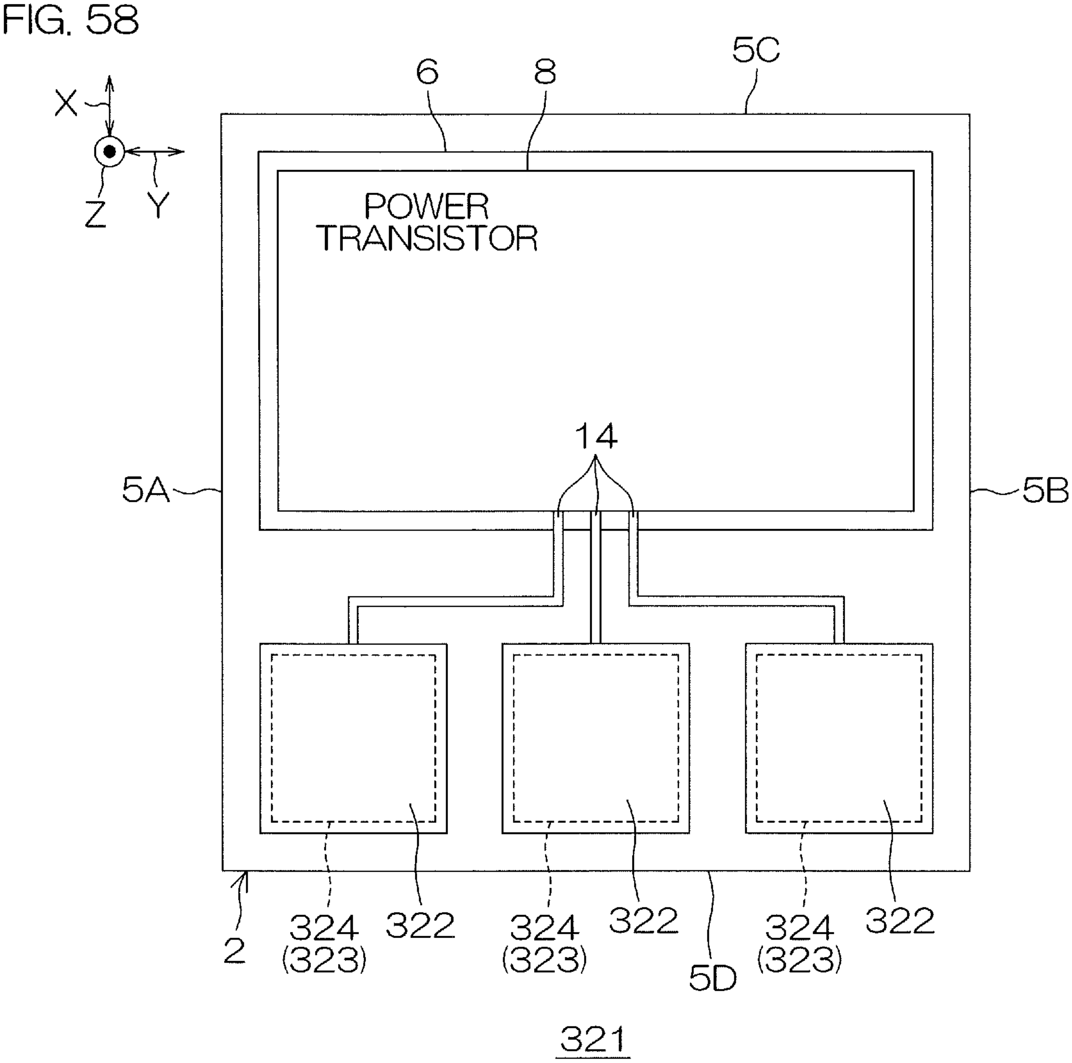
FIG. 58 is a plan view showing a semiconductor chip shown in FIG. 56.

FIG. 56 is a plan view showing a semiconductor device 321 according to a first modification example. FIG. 57 is a sectional view taken along LVII-LVII shown in FIG. 56. FIG. 58 is a plan view showing a semiconductor chip 2 shown in FIG. 56. Hereinafter, the same reference numerals will be given to the structures corresponding to the structures described for the semiconductor device 1, and the descriptions thereof will be omitted.

With reference to FIG. 56 to FIG. 58, the semiconductor device 321 does not have the second device region 7 (the control IC 11) in the semiconductor chip 2. That is, the semiconductor device 321 includes only the first device region 6 (the n-system power transistor 8). The first device region 6 is formed in a region at the side of the third side surface 5C in the first main surface 3 in this embodiment. An arrangement and a planar shape is the first device region 6 are arbitrary, and are not restricted to specific form. Any one of the n-system power transistors 8 according to the first to ninth preferred embodiments is formed in the first device region 6.

The semiconductor device 321 includes n-number of gate pads 322 arranged inside the interlayer insulation layer 13 such as to be electrically connected to the n-number of gate wirings 14 in this embodiment. In FIG. 56 to FIG. 58, for convenience, an example in which the three gate pads 322 are shown. The n-number of gate pads 322 are arranged at a region outside the first device region 6 in plan view, in this embodiment. The n-number of gate pads 322 are electrically connected to the n-number of gate wirings 14 with a one-to-one correspondence in stats of being electrically independent of each other. The n-number of gate pads 322 are thereby electrically connected to the n-number of system transistors 9 via the n-number of gate wirings 14, respectively.

The semiconductor device 321 includes a plurality of terminal electrodes 323. In FIG. 56, the plurality of terminal electrodes 323 are shown by a hatching. The plurality of terminal electrodes 323 includes the single drain terminal 15, the single source terminal 16 and the n-number of gate terminals 324, in this embodiment. A number, an arrangements and planar shapes of the plurality of terminal electrodes 323 can be adjusted to arbitrary configurations depending on the power transistor 8, and are not restricted to the configurations shown in FIG. 56 to FIG. 58. However, the number of the n-number of gate terminal 324 is adjusted depending on the system number of the power transistor 8.

The drain terminal 15 directly covers the second main surface 4 of the semiconductor chip 2 and is electrically connected to the second main surface 4. The drain terminal 15 may include at least one of a Ti layer, an Ni layer, an Au layer, an Ag layer and an Al layer. The drain terminal 15 may include a laminated structure in which at least two of the Ti layer, the Ni layer, the Au layer, the Ag layer and the Al layer are laminated in an arbitrary manner.

The source terminal 16 and the n-number of gate terminals 324 are formed on the interlayer insulation layer 13. The source terminal 16 is formed above the first device region 6 at the first main surface 3. The source terminal 16 is electrically connected to the main source SM of the power transistor 8.

The n-number of gate terminals 324 are each formed above a region outside the first device region 6. The n-number of gate terminals 324 are electrically connected to the n-number of main gates GM of the power transistor 8. Specifically, the n-number of gate terminals 324 penetrate the interlayer insulation layer 13, and are connected to the n-number of gate pads 322, respectively. The n-number of gate terminals 324 individually transmit the n-number of gate signals G input from the outside to the n-number of gate wirings 14.

The source terminal 16 and the n-number of gate terminals 324 may each include at least one of a pure-Al layer, a pure-Cu layer, an AlCu-alloy layer, an AlSiCu-alloy layer and an AlSi-alloy layer. Plating layers may be formed on outer surfaces of the source terminal 16 and outer surfaces of the n-number of gate terminals 324, respectively. The plating layers may each include at least one of an Ni layer, a Pd layer and an Au layer.

As described above, the configuration that is free from the control IC 11 as the semiconductor device 321 may be adopted. According to this structure, with externally connecting the control IC 11 to the n-number of gate terminals 324, it is possible to achieve the same effects as the effects described in the first to ninth embodiments.

Also, with the semiconductor device 321, the control IC 11 does not need to be formed in the semiconductor chip 2, and it is therefore possible to effectively reduce manufacturing man-hours. On the other hand, the control IC 11 (including an electrical circuit with a similar function to the control IC 11) also does not need to have the n-system power transistor 8 and therefore it is also possible to effectively reduce manufacturing man-hours of the control IC 11. That is, the IPD (IPM) can be configured with an assembly including the semiconductor device 321 and the control IC 11 (including an electrical circuit with the similar function to the control IC 11) that are manufacture separately.

Figure 59:
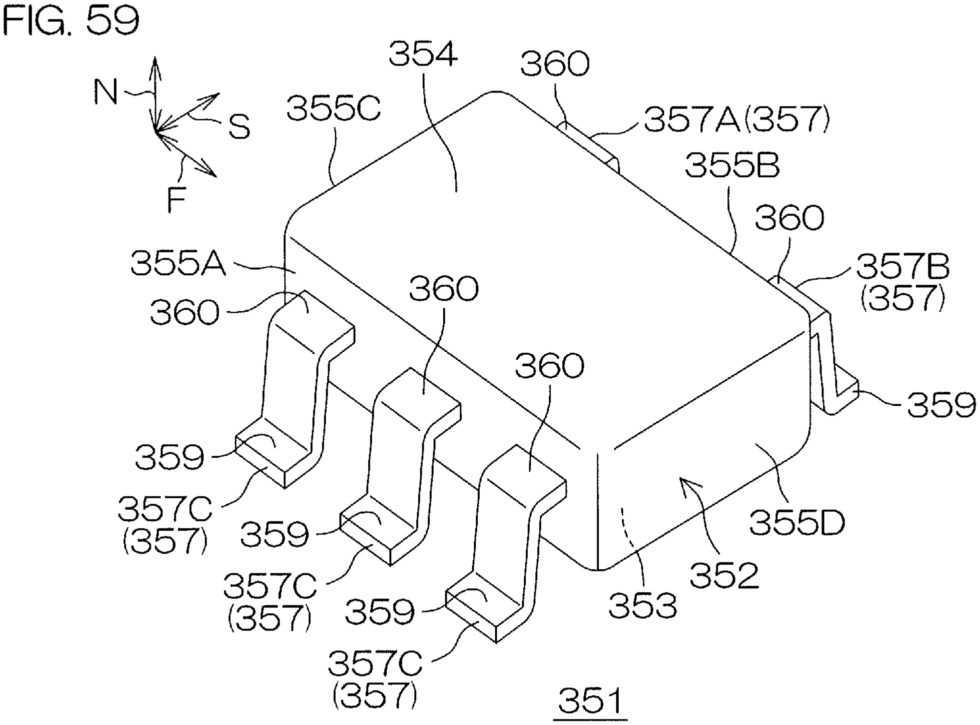
FIG. 59 is a perspective view showing a semiconductor package in which the semiconductor device according to the first modification example is incorporated.
Figure 60:
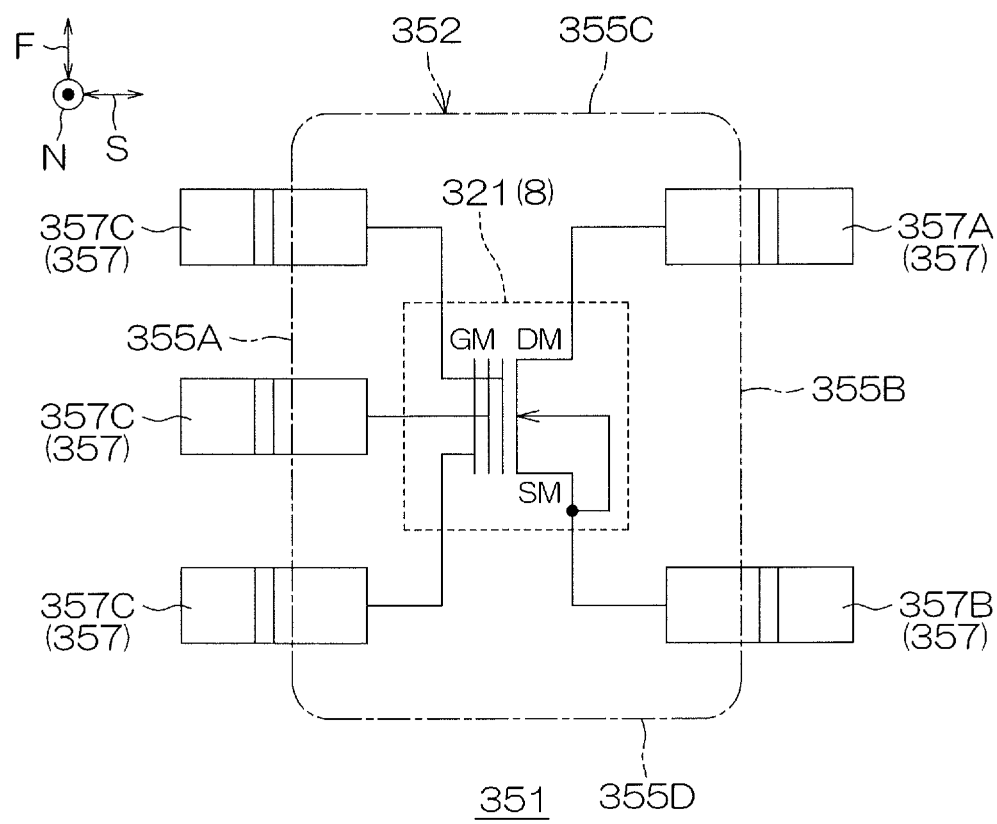
FIG. 60 is a diagram in which an electrical structure of the semiconductor package shown in FIG. 59 is shown by circuit symbols.
Figure 61:
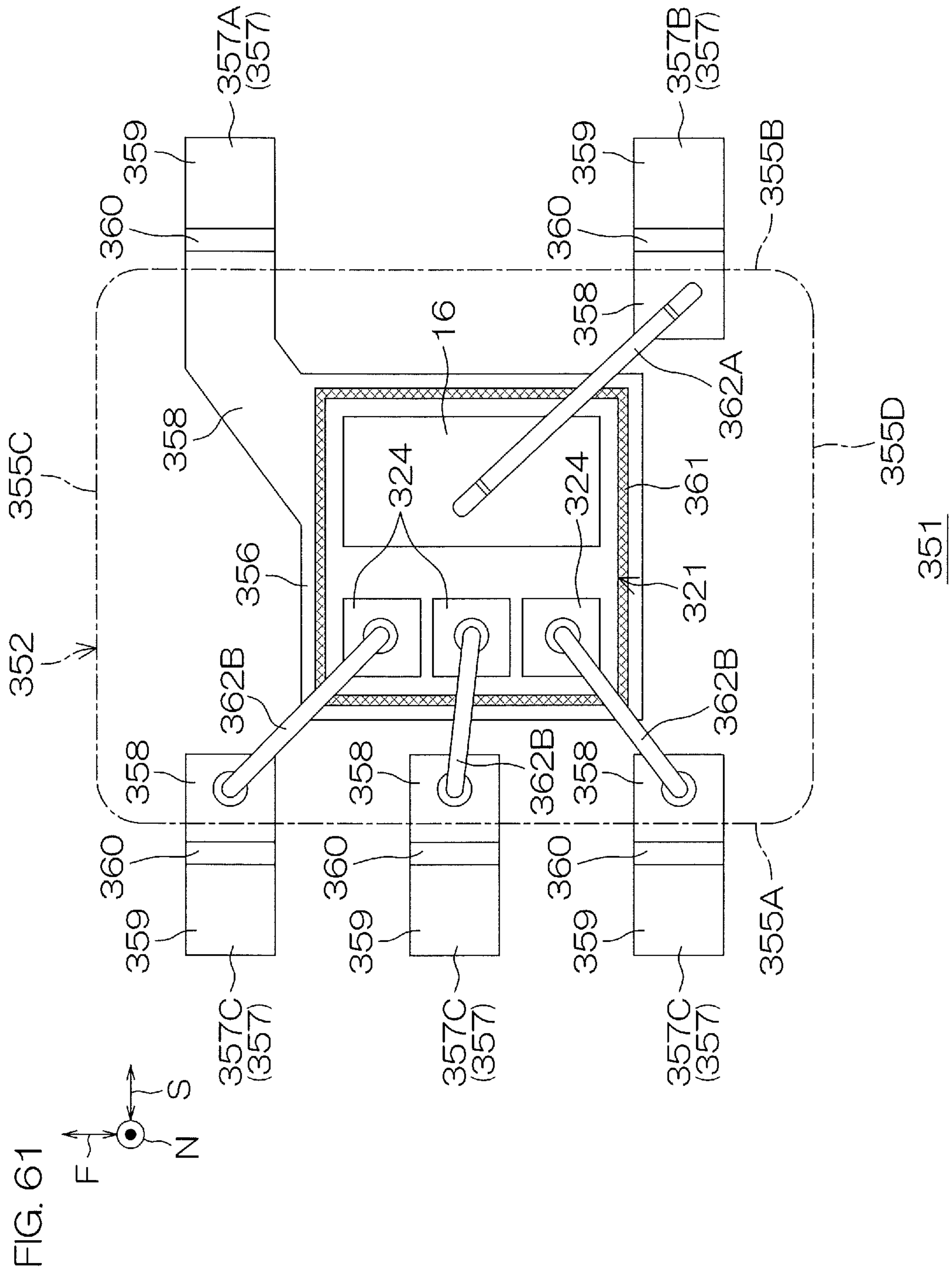
FIG. 61 is a plan view showing an internal structure of the semiconductor package shown in FIG. 59.

FIG. 59 is a perspective view showing a semiconductor package 351 in which the semiconductor device 321 according to the first modification example is incorporated. FIG. 60 is a diagram in which an electrical structure of the semiconductor package 351 shown in FIG. 59 is shown by circuit symbols. FIG. 61 is a plan view showing an internal structure of the semiconductor package 351 shown in FIG.

With reference to FIG. 59 to FIG. 61, the semiconductor package 351 consists of an SOP (Small Outline Package) of n-terminal-type (5-terminal-type, in this embodiment). The semiconductor package 351 includes a package body 352. The package body 352 consists of a mold resin (e.g. an epoxy resin) and formed in a rectangular parallelepiped shape.

The package body 352 has a mounting surface 353 on one side, a non-mounting surface 354 on the other side, and first to fourth side walls 355A to 355D connecting the mounting surface 353 and the non-mounting surface 354. The mounting surface 353 and the non-mounting surface 354 are each formed in a quadrilateral shape (specifically, a rectangular shape) in plan view when viewed from a normal direction N thereof. The mounting surface 353 is a surface that opposes a connecting target in a state in which the semiconductor package 351 is mounted to the connecting target. A PCB (Printed Circuit Board), a circuit board, etc. are exemplified as the connecting target.

The first to fourth side walls 355A to 355D includes the first side wall 355A, the second side wall 355B, the third side wall 355C and the fourth side wall 355D. The first side wall 355A and the second side wall 355B extend along a first direction F, and oppose a second direction F orthogonal to the first direction F. The first side wall 355A and the second side wall 355B form long sides of the package body 352. The third side wall 355C and the fourth side wall 355D extend along the second direction S, and oppose the first direction F. The third side wall 355C and the fourth side wall 355D form short sides of the package body 352. Lengths of the long sides of the package body 352 may be not less than 2 mm and not more than 5 mm. Lengths of the short sides of the package body 352 may be not less than 1 mm and not more than 4 mm.

The semiconductor package 351 includes a die pad 356 of a plate shape arranged inside the package body 352. The die pad 356 is arranged at a side of the mounting surface 353 in the package body 352. The die pad 356 includes at least one of copper, copper-alloy, iron and iron-alloy. The die pad 356 is formed in a quadrilateral shape in plan view.

The semiconductor package 351 includes a plurality (5, in this embodiment) of lead terminals 357 led out from inside to outside of the package body 352. The plurality of lead terminals 357 are bent toward the mounting surface 353 side outside the package body 352. The plurality of lead terminals 357 each includes at least one of copper, copper-alloy, iron and iron-alloy. Specifically, the plurality of lead terminals 357 includes a drain lead terminal 357A, a source lead terminal 357B and n-number (3, in this embodiment) of gate lead terminals 357C.

The three gate lead terminals 357C are arranged at intervals from the third side wall 355C side to the fourth side wall 355D side in that order at the first side wall 355A side. The drain lead terminal 357A and the source lead terminal 357B are arranged at intervals from the third side wall 355C side to the fourth side wall 355D side in that order at second side wall 355B side.

The plurality of lead terminals 357 each has an inner end portion 358, an outer end portion 359 and a lead portion 360. The inner end portion 358 is arranged inside the package body 352 and has a plate surface parallel to the mounting surface 353 (the non-mounting surface 354). The inner end portions 358 of the drain lead terminal 357A is integrally formed with the die pad 356, and fixed to a same potential as a potential of the die pad 356, in this embodiment.

The outer end portion 359 is arranged outside the package body 352 and has a plate surface parallel to the mounting surface 353 (the non-mounting surface 354). The lead portion 360 is led out from the inner end portion 358 to the outside the package body 352 and connected to the outer end portion 359. The lead portion 360 is bent toward the mounting surface 353 side outside the package body 352 and is connected to the outer end portion 359 at a height position passing beside the mounting surface 353 in the normal direction N.

A number and functions of the plurality of lead terminals 357 are adjusted depending on the terminal electrodes 323 of the semiconductor device 321. Shapes of the plurality of lead terminals 357 are arbitrary. Also, arrangements of the drain lead terminal 357A, the source lead terminal 357B, and the n-number of gate lead terminals 357C are arbitrary, and are not restricted to the arrangements shown in FIG. 59 to FIG. 61. However, the number of the n-number of gate lead terminals 357C is adjusted depending on the system number (the number of the gate terminals 324 of the semiconductor device 321) of the power transistor 8.

The semiconductor package 351 includes the semiconductor device 321 arranged on the die pad 356 inside the package body 352. The semiconductor device 321 is arranged on the die pad 356 in a posture in which the drain terminal 15 is opposed to the mounting surface 353 of the package body 352. The drain terminal 15 is thereby electrically connected to the die pad 356.

The semiconductor package 351 includes a conductive bonding material 361 (see hatching portion in FIG. 61) that is interposed between the die pad 356 and the semiconductor device 321 inside the package body 352 and by which the die pad 356 and the semiconductor device 321 (specifically, the drain terminal 15) are joined. The conductive bonding material 361 includes a metal paste or a solder.

The semiconductor package 351 includes a plurality (4, in this embodiment) of lead wires 362 each connecting the plurality of terminal electrodes 323 (the source terminal 16 and the n-number of gate terminals 324) of the semiconductor device 321 to the corresponding plurality of lead terminals 357 inside the package body 352. The plurality of lead wires 362 each consists of a bonding wire.

Specifically, the plurality of lead wires 362 include a source lead wire 362A and n-number of gate lead wires 362B. The source lead wire 362A is connected to the source terminal 16 and the source lead terminal 357B. The n-number of gate lead wires 362B are each connected to the n-number of gate terminals 324 and the n-number of gate lead terminals 357C.

The plurality of lead wires 362 each includes at least one of a copper wire, a gold wire and an aluminum wire. It is preferred that the source lead wire 362A among the plurality of lead wires 362 consists of the aluminum wire. It is preferred that the n-number of gate lead wires 362B among the plurality of lead wires 362 consist of the copper wires.

In this embodiment, an example in which the drain lead terminal 357A is integrally formed with the die pad 356 is described. However, the drain lead terminal 357A may be formed at an interval from the die pad 356. In this case, the single or plurality of lead wires 362 may be connected to the die pad 356 and the drain lead terminal 357A.

The semiconductor package 351 is not restricted to SOP and may consist of QFN (Quad Flat Non Lead Package), DFP (Dual Flat Package), DIP (Dual Inline Package), QFP (Quad Flat Package), SIP (Single Inline Package), or, SOJ (Small Outline J-leaded Package), or any various packages similar to those packages.

Figure 62:
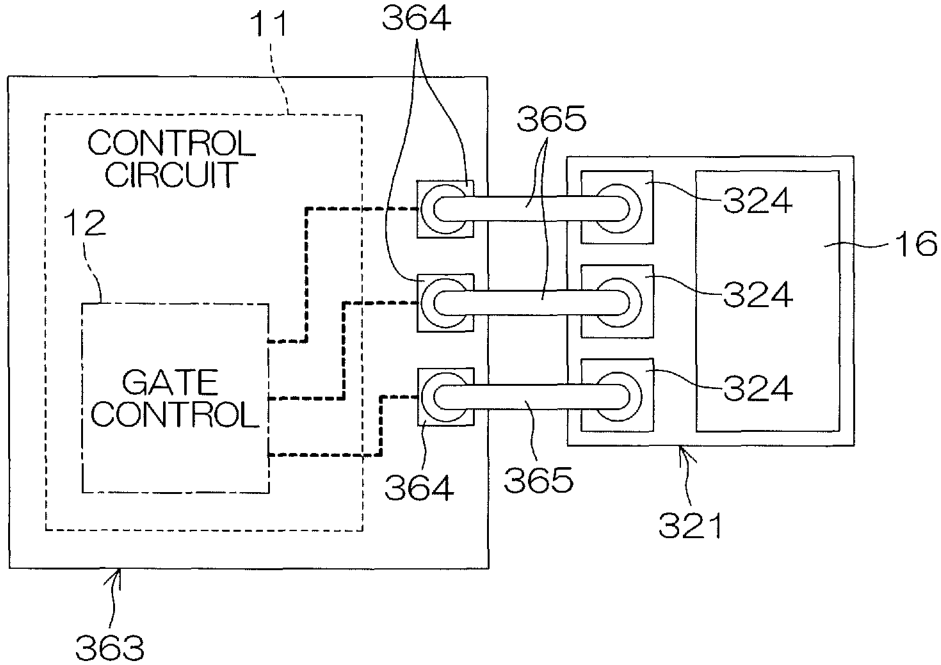
FIG. 62 is a schematic plan view showing a first connection example between the semiconductor device according to the first modification example and a control chip.

FIG. 62 is a schematic plan view showing a first connection example between the semiconductor device 321 according to the first modification example and a control chip 363. With reference to FIG. 62, the semiconductor device 321 according to the first modification example can be connected to the control chip 363 that has at least the gate control circuit 12 inside a semiconductor package (not shown), or, outside the semiconductor package (not shown). A circuit board such as a PCB is exemplified as outside the semiconductor package (not shown).

The control chip 363 includes the control IC 11 (the gate control circuit 12) and n-number of gate output terminals 364, in this embodiment. The n-number of gate output terminals 364 are connected to the n-number of gate terminals 324 of the semiconductor device 321 via n-number of lead wires 365 (bonding wires) with a one-to-one correspondence, respectively. As a matter of course, a plurality of lead wires 365 may be connected between one gate terminal 324 and one gate output terminal 364.

The control IC 11 (the gate control circuit 12) is configured such as to generate the n-number of gate signals G by which the n-number of system transistors 9 of the semiconductor device 321 are individually controlled and output the n-number of gate signals G to the n-number of gate output terminals 364. The n-number of gate signals G input to the n-number of gate output terminals 364 are input to the n-number of gate terminals 324 of the semiconductor device 321 via the n-number of lead wires 365. The n-number of system transistors 9 are thereby individually controlled in the semiconductor device 321.

Figure 63:
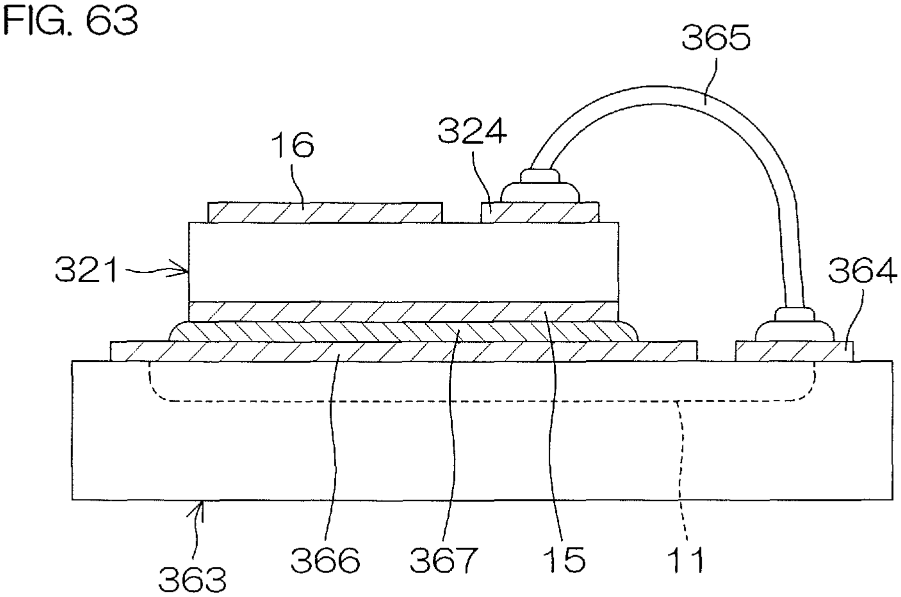
FIG. 63 is a schematic sectional view showing a second connection example between the semiconductor device according to the first modification example and the control chip.

FIG. 63 is a schematic sectional view showing a second connection example between the semiconductor device 321 according to the first modification example and the control chip 363. As shown in FIG. 63, in a case in which the control chip 363 has an electrode pad 366 on which a device is mounted, the semiconductor device 321 may be bounded on the electrode pad 366 of the control chip 363 via a conductive bonding material 367. In this case, the n-number of gate output terminals 364 of the semiconductor device 321 is electrically connected the n-number of gate output terminals 364 of the control chip 363 via the n-number of lead wires 365 on the control chip 363.

The semiconductor device 321 and the control chip 363 are configured as an integrated component and may be incorporated into a semiconductor package (not shown) or may be mounted on a circuit board.

Figure 64:
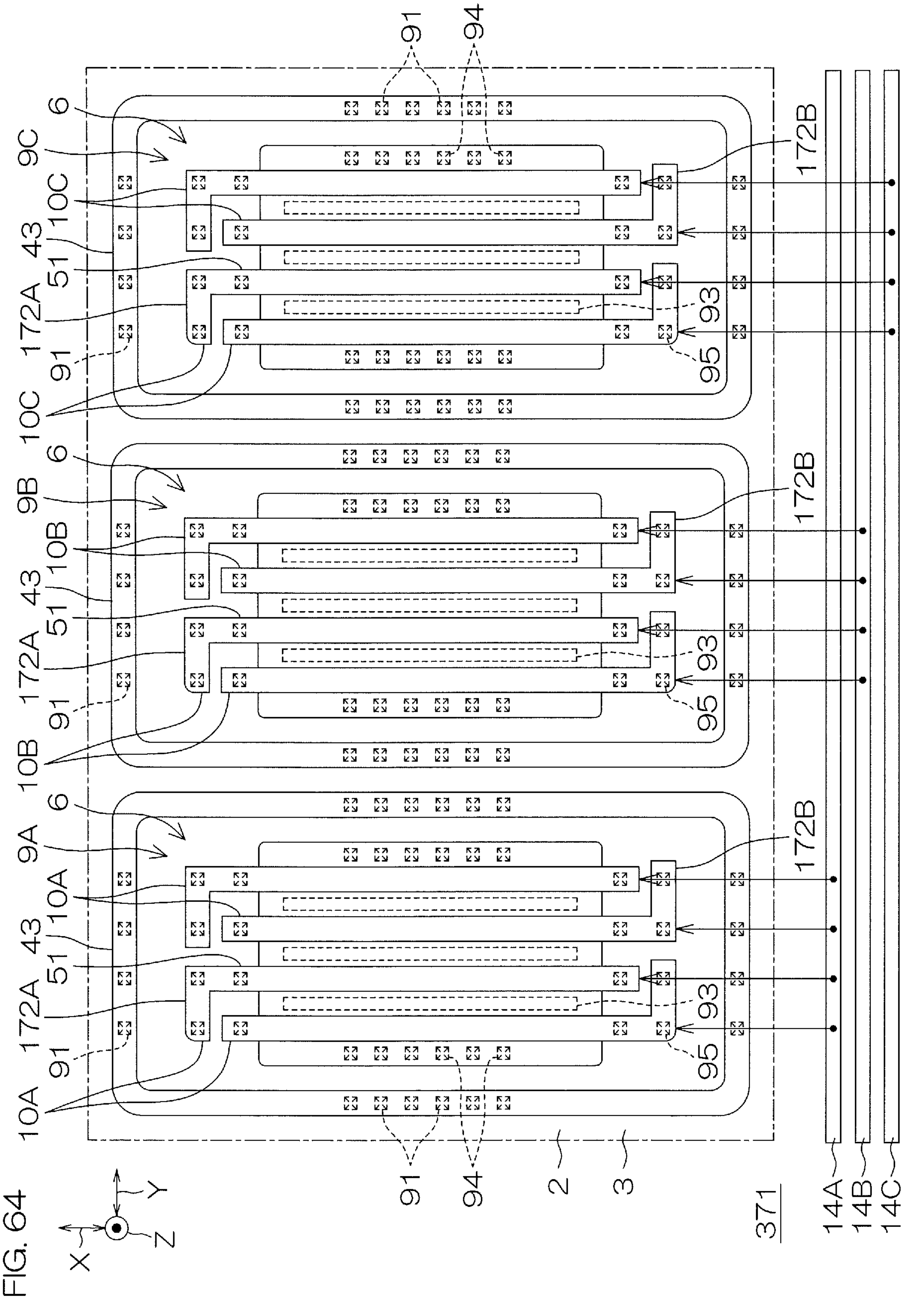
FIG. 64 corresponds to FIG. 9 and is a plan view showing a principal portion of a semiconductor device according to a second modification example.

FIG. 64 corresponds to FIG. 9 and is a plan view showing a principal portion of a semiconductor device 371 according to a second modification example. Hereinafter, the same reference numerals will be given to the structures corresponding to the structures described for the semiconductor device 1, and the descriptions thereof will be omitted.

In the semiconductor device 1 according to the first preferred embodiment, the single first device region 6 is demarcated at the first main surface 3 by the trench separation structure 43, and the n-number of system transistors 9 are collectively formed in the single first device region 6. Meanwhile, in the semiconductor device 371, n-number of first device regions 6 are demarcated in the first main surface 3 by n-number of trench separation structures 43. The system transistors 9 of a single system are separately arranged in the n-number of first device regions 6 for the respective systems.

In FIG. 64, an example in which three first device regions 6 are demarcated by the three trench separation structures 43, respectively, and the system transistor 9 of the single system is formed in each of the first device region 6. In FIG. 64, as an example, the first to third system transistors 9A to 9C are shown. In this embodiment, the n-number of trench separation structures 43 are formed at intervals, but the n-number of trench separation structures 43 may be integrally formed.

In each of the first device regions 6, each of the system transistors 9 may include the single or plurality of unit transistors 10. In each of the first device regions 6, the plurality of unit transistors 10 are parallelly connected. The number and the channel area of the unit transistor 10 (the unit cell 50) that is to be formed in each of the first device regions are arbitrary, and those are adjusted for each specification of the system transistor 9.

As described above, in the semiconductor device 371, the single power transistor 8 is formed by the n-number of system transistors 9 that are separately arranged in the n-number of first device regions 6 for the respective systems. Therefore, with the semiconductor device 371, the same effects as those described in the first to ninth preferred embodiments can be achieved. However, in a case in which two or more of the unit transistors 10 (the trench gate structures 51) are formed in each of the first device regions 6, it is necessary to take the temperature rise in each of the first device regions 6 into consideration, since two or more of the unit transistors 10 are to be controlled at the same timing.

Figure 65:
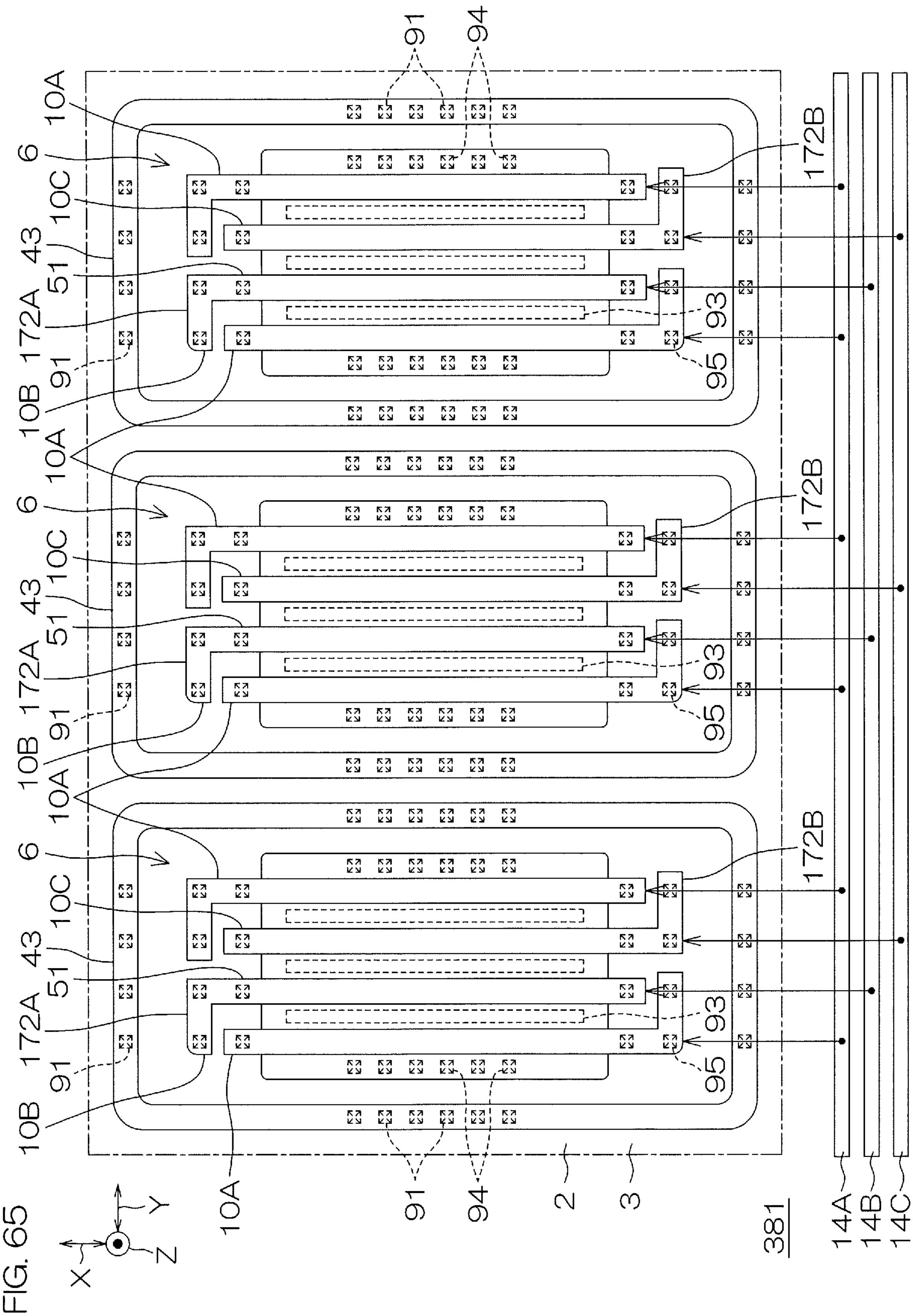
FIG. 65 corresponds to FIG. 9 and is a plan view showing a principal portion of a semiconductor device according to a third modification example.

FIG. 65 corresponds to FIG. 9 and is a plan view showing a principal portion of a semiconductor device 381 according to a third modification example. Hereinafter, the same reference numerals will be given to the structures corresponding to the structures described for the semiconductor device 1, and the descriptions thereof will be omitted.

In the semiconductor device 1 according to the first preferred embodiment, the single first device region 6 is demarcated in the first main surface 3 by the trench separation structure 43, and the n-number of system transistors 9 are collectively formed in the single first device region 6. Meanwhile, in the semiconductor device 371, the n-number of first device regions 6 are demarcated in the first main surface 3 by the n-number of trench separation structures 43. The n-number of system transistors 9 are collectively formed in the n-number of first device regions 6, respectively.

In FIG. 65, an example in which the three first device regions 6 are demarcated by the three trench separation structures 43, respectively and the n-number of system transistors 9 are formed in each of the first device regions 6, respectively. In FIG. 65, as an example, the first to third system transistors 9A to 9C are shown. In this embodiment, the n-number of trench separation structures 43 are formed at intervals, but the n-number of trench separation structures 43 are integrally formed.

In each of the first device regions 6, the n-number of system transistors 9 may include the single or plurality of unit transistors 10, respectively. The system number of the system transistor 9 arranged in each of the first device regions 6 is arbitrary. Also, the number and channel area of the unit transistor 10 (the unit cell 50) formed in each of the first device regions 6 are arbitrary and those are adjusted for each specifications of the system transistors 9.

As described above, in the semiconductor device 381, the single power transistor 8 is formed by the n-number of system transistors 9 that are each collectively arranged in the n-number of first device region 6. Therefore, with the semiconductor device 381, the same effects as those described in the first to ninth preferred embodiments can be achieved.

Figure 66:
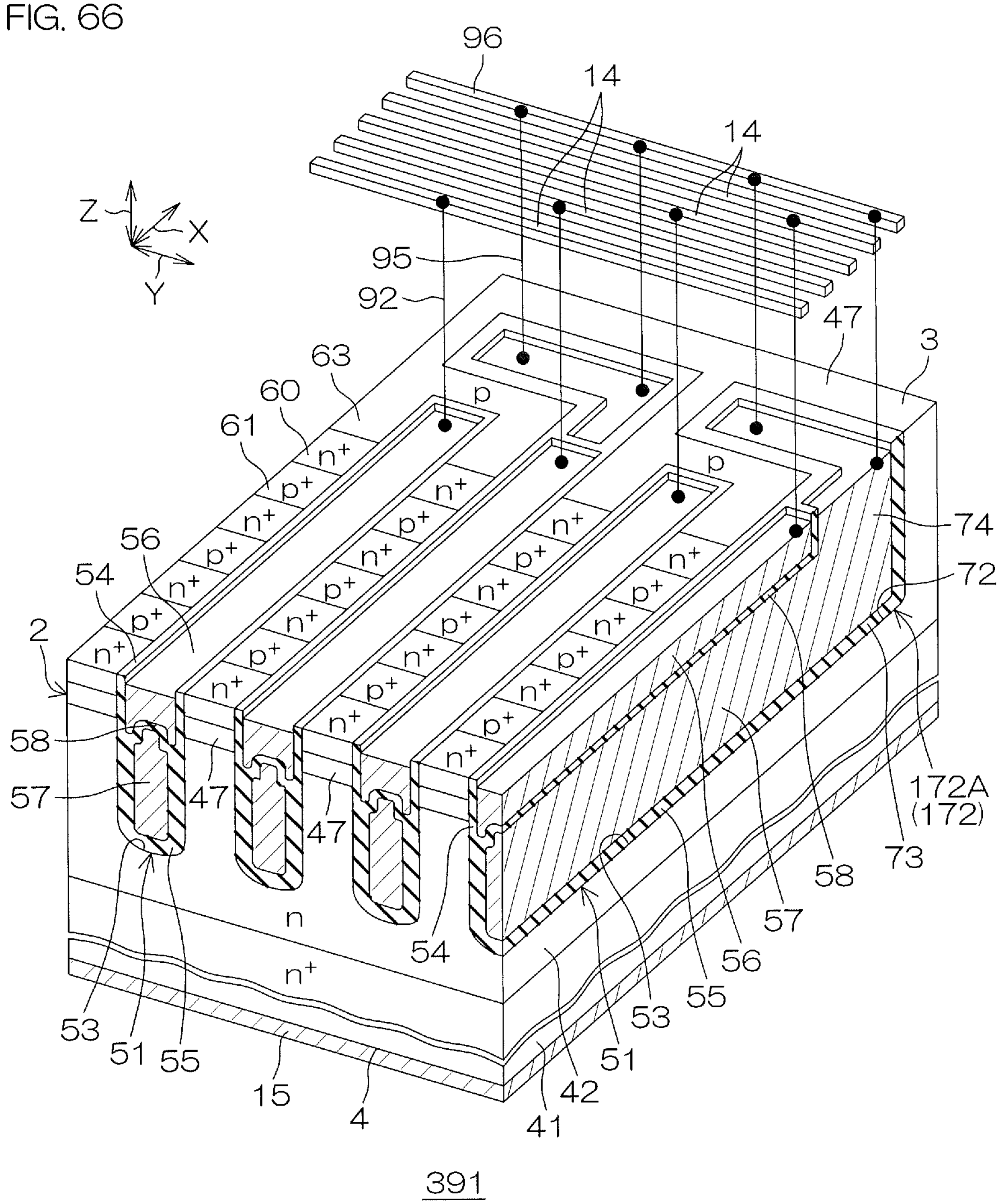
FIG. 66 corresponds to FIG. 14 and is a plan view showing a principal portion of a semiconductor device according to a fourth modification example.

FIG. 66 corresponds to FIG. 14 and is a plan view showing a principal portion of a semiconductor device 391 according to a fourth modification example. Hereinafter, the same reference numerals will be given to the structures corresponding to the structures described for the semiconductor device 1, and the descriptions thereof will be omitted.

In the semiconductor device 1 according to the first preferred embodiment, the lower electrode 57 of the trench gate structure 51 and the contact electrodes 74 of the plurality of trench contact structures 71 are each formed as a gate electrode. Meanwhile, in the semiconductor device 391, the lower electrode 57 of the trench gate structure 51 and the contact electrodes 74 of the plurality of trench contact structures 71 are each formed as a field electrode. In this embodiment, the source wiring 96 is electrically connected to the contact electrode 74 instead of the gate wiring 14. On the other hand, the gate wiring 14 is connected to the upper electrode 56.

As described above, with the semiconductor device 391, the gate signal G is applied to the upper electrode 56 via the gate wiring 14, whereas the source voltage as the reference voltage (e.g. the ground voltage GND) is applied to the lower electrode 57 and the contact electrode 74 via the source wiring 96. It is therefore possible to reduce a parasitic capacitance between the trench gate structure 51 and the semiconductor chip 2 (specifically, the drift region 42), and thereby it is possible to improve a switching speed. With the semiconductor device 391, the same effects as those described in the first to ninth preferred embodiments can be achieved.

The present invention can be implemented in still other embodiments.

In each of the preferred embodiments, the example in which the control IC 11 includes the sense transistor 21 is described. It is preferred that the sense transistor 21 has the substantially same structures as the structures of the power transistor 8 in terms of the function that monitors the current flowing through the power transistor 8. That is, it is preferred that the sense transistor 21 includes the single or plurality of unit transistors 10 (the unit cells 50).

The sense transistor 21 may be formed in the second device region 7 and/or the first device region 6. In a case in which the sense transistor 21 is formed in the first device region 6, the single or plurality of unit transistors 10 (the unit cells 50) among the plurality of unit transistors 10 can be utilized as the sense transistor 21. In this case, the power transistor 8 is configured with the unit transistors 10 (the unit cells 50) excluding the unit transistors 10 (the unit cells 50) functioning as the sense transistor 21.

In each of the preferred embodiments, the example, in which the first conductivity type is the n-type and the second conductivity type is the p-type, is described, but the first conductivity type may be the p-type and the second conductivity type may be the n-type. The specific configurations in this case can be obtained with replacing the n-type region to the p-type region and replacing the p-type region to the n-type region in the aforementioned descriptions and the attached figures.

Hereinafter, examples of features to be extracted from this specification and drawings. [A1] to [A16], [B1] to [B16], and [C1] to [C19] provide a semiconductor device in which an electric field concentration at an end portion of a trench gate structure can be suppressed.

[A1] A semiconductor device comprising: a semiconductor chip (2) having a main surface (3); a plurality of trench gate structures (51) each extending in a first direction (X) and formed in the main surface (3) at a first interval (I1) in a second direction (Y) orthogonal to the first direction (X) in plan view, the plurality of trench gate structures (51) each having a multiple electrode structure that includes an upper electrode (56) and a lower electrode (57) each embedded in a gate trench (53) such as to be vertically insulated and separated by a first insulator (54, 55, 58); and a trench contact structure (172, 172A, 172B) extending in the second direction (Y) and formed in the main surface (3) at a second interval (I2) not more than the first interval (I1) from an end portion (51A, 51B) of at least one of the trench gate structures (51) in plan view, the trench contact structure (172, 172A, 172B) having a single electrode structure that includes a contact electrode (74) embedded in a contact trench (72) with a second insulator (73).

According to this structure, a depletion layer extending from the end portion of the trench gate structure (51) and a depletion layer extending from the trench contact structure (172) can be connected at a lower side to a bottom wall of the trench gate structure (51). It is therefore possible to suppress the electric field concentration at the end portion of the trench gate structure (51).

[A2] The semiconductor device according to A1, wherein the plurality of trench gate structures (51) are to be electrically independently controlled.

[A3] The semiconductor device according to A1 or A2, wherein the plurality of trench gate structures (51) are individually controlled by a plurality of gate signals (G).

[A4] The semiconductor device according to any one of A1 to A3, further comprising: a plurality of gate wirings (14) that individually transmit gate signals (G) to the plurality of trench gate structures (51).

[A5] The semiconductor device according to A4, wherein the plurality of gate wirings (14) include a single or plurality of gate wirings (14) that parallelly connect the plurality of trench gate structures (51) to be systematized as an individual control target.

[A6] The semiconductor device according to any one of A1 to A5, wherein the lower electrode (57) is fixed to a same potential as a potential of the upper electrode (56).

[A7] The semiconductor device according to any one of A1 to A6, wherein a gate signal (G) is to be input to the trench contact structure (172, 172A, 172B).

[A8] The semiconductor device according to any one of A1 to A7, wherein the trench contact structure (172, 172A, 172B) passes beside at least two of the trench gate structures (51) in the second direction (Y).

[A9] The semiconductor device according to any one of A1 to A8, wherein the trench contact structure (172, 172A, 172B) has at least one connection portion (174, 178) that is connected to the end portion (51A, 51B) of at least one of the trench gate structures (51), and at least one opposing portion (175, 179) that opposes the end portion (51A, 51B) of at least one of the trench gate structures (51) in a region different from the connection portion (174, 178).

[A10] The semiconductor device according to A9, wherein the contact electrode (74) is connected to the lower electrode (57) at the connection portion (174, 178).

[A11] The semiconductor device according to any one of A1 to A10, wherein a plurality of the trench contact structures (172, 172A, 172B) are formed at a third interval (13) not more than the first interval (I1) in the second direction (Y).

[A12] The semiconductor device according to any one of A1 to A11, wherein the plurality of trench gate structures (51) each has a first depth (D1), and the trench contact structure (172, 172A, 172B) has a second depth (D2) substantially equal to the first depth (D1).

[A13] The semiconductor device according to any one of A1 to A12, wherein the trench gate structures (51) each has a first width (W1) regarding the second direction (Y), and the trench contact structure (172, 172A, 172B) has a second width (W2) not less than the first width (W1) regarding the first direction (X).

[A14] The semiconductor device according to any one of A1 to A13, further comprising: a trench separation structure (43) that demarcates a device region (6) at the main surface (3), the trench separation structure (43) having a separation electrode (45) embedded in a separation trench (44) with a separation insulator (45); and wherein the plurality of trench gate structures (51) and the trench contact structure (172, 172A, 172B) are formed in the device region (6) at intervals (WSP) from the trench separation structure (43).

[A15] The semiconductor device according to A14, wherein the trench separation structure (43) is formed deeper than the plurality of trench gate structures (51) and the trench contact structure (172, 172A, 172B).

[A16] The semiconductor device according to any one of A1 to A15, further comprising: a control circuit (11) configured such as to generate a plurality of gate signals (G) that individually control the plurality of trench gate structures (51).

[B1] A semiconductor device comprising: a semiconductor chip (2) having a main surface (3); a trench gate structure (51) formed in the main surface (3) in a band shape extending in a first direction (X) and having a trench width (W1) in a second direction (Y) orthogonal to the first direction (X) in plan view, the trench gate structure (51) having a multiple electrode structure that includes an upper electrode (56) and a lower electrode (57) each embedded in a gate trench (53) such as to be vertically insulated and separated by a first insulator (54, 55, 58); and a trench contact structure (172, 172A, 172B) formed in the main surface (3) at an interval (I2) not more than the trench width (W1) in the first direction (X) from an end portion of the trench gate structure (51) in plan view, the trench contact structure (172, 172A, 172B) having a single electrode structure that includes a contact electrode (74) embedded in a contact trench (72) with a second insulator (73).

According to this structures a depletion layer extending from the end portion of the trench gate structure (51) and a depletion layer extending from the trench contact structure (172) can be connected at a lower side to a bottom wall of the trench gate structure (51). It is therefore possible to suppress the electric field concentration at the end portion of the trench gate structure (51).

[B2] The semiconductor device according to B1, wherein the trench contact structure (172, 172A, 172B) is formed in a band shape extending in the second direction (Y).

[B3] The semiconductor device according to B1 or B2, wherein the trench contact structure (172, 172A, 172B) has a second trench width (W2) in the first direction (X) and is formed at an interval (12) not more than the second trench width (W2) from the end portion of the trench gate structure (51).

[B4] The semiconductor device according to any one of B1 to B3, wherein the trench contact structure (172, 172A, 172B) passes beside the trench gate structure (51) in the second direction (Y).

[B5] The semiconductor device according to any one of B1 to B4, wherein the contact electrode (74) of the trench contact structure (172, 172A, 172B) is fixed to a different potential from a potential of the lower electrode (57) of the trench gate structure (51).

[B6] The semiconductor device according to any one of B1 to B5, wherein the trench contact structure (172, 172A, 172B) is to be electrically independently controlled from the trench gate structure (51).

[B7] The semiconductor device according to any one of B1 to B6, wherein the trench gate structure (51) is to be controlled by a first gate signal (G), and the trench contact structure (172, 172A, 172B) is to be controlled by a second gate signal (G) different from the first gate signal (G).

[B8] The semiconductor device according to any one of B1 to B7, further comprising: a first gate wiring (14) electrically connected to the trench gate structure (51); and a second gate wiring (14) electrically connected to the trench contact structure (172, 172A, 172B).

[B9] The semiconductor device according to any one of B1 to B8, wherein the trench gate structure (51) has a first depth (D1), and the trench contact structure (172, 172A, 172B) has a second depth (D2) substantially equal to the first depth (D1).

[B10] The semiconductor device according to any one of B1 to B9, wherein a plurality of the trench gate structures (51) are formed in the main surface (3) at an interval in the second direction (Y), and the trench contact structure (172, 172A, 172B) is formed in the main surface (3) at an interval from the end portion of at least one of the trench gate structures (51).

[B11] The semiconductor device according to B10, wherein the trench contact structure (172, 172A, 172B) has at least one connection portion (174, 178) that is connected to the end portion (51A, 51B) of at least one of the trench gate structures (51), and at least one opposing portion (175, 179) that opposes the end portion (51A, 51B) of at least one of the trench gate structures (51) in a region different from the connection portion (174, 178).

[B12] The semiconductor device according to B10 or B11, wherein the trench contact structure (172, 172A, 172B) is formed at an interval (12) not more than an interval (I1) between the adjacent two trench gate structures (51) in the first direction (X) from the trench gate structures (51).

[B13] The semiconductor device according to B11 or B12, wherein a plurality of the trench contact structures (172, 172A, 172B) are formed at an interval (13) not more than the trench width (W1) in the second direction (Y).

[B14] The semiconductor device according to any one of B1 to B13, further comprising: a trench separation structure (43) that demarcates a device region (6) at the main surface (3), the trench separation structure (43) having a separation electrode (45) embedded in a separation trench (44) with a separation insulator (45); and wherein the trench gate structure (51) and the trench contact structure (172, 172A, 172B) are formed in the device region (6) at intervals (WSP) from the trench separation structure (43).

[B15] The semiconductor device according to B14, wherein the trench separation structure (43) is formed deeper than the trench gate structure (51) and the trench contact structure (172, 172A, 172B).

[B16] The semiconductor device according to any one of B1 to B15, further comprising: a control circuit (11) configured such as to generate a plurality of gate signals (G) that individually control the plurality of trench gate structures (51).

[C1] A semiconductor device comprising: a semiconductor chip (2) having a main surface (3); a pair of trench gate structures (51) each extending in a first direction (X) and formed in the main surface (3) at a first interval (I1) in a second direction (Y) orthogonal to the first direction (X) in plan view, the pair of trench gate structures (51) each having a multiple electrode structure that includes an upper electrode (56) and a lower electrode (57) each embedded in a gate trench (53) such as to be vertically insulated and separated by a first insulator (54, 55, 58); and a pair of trench contact structures (172, 172A, 172B) each formed in a region of one end portions (51A) side and a region of another end portions (51B) side of the pair of trench gate structures (51) at second intervals (I2) not more than the first interval (I1) in the first direction (X) from the pair of trench gate structures (51) in plan view, the pair of trench contact structures (172, 172A, 172B) each having a single electrode structure that includes a contact electrode (74) embedded in a contact trench (72) with a second insulator (73).

According to this structures a depletion layer extending from the end portion of the trench gate structure (51) and a depletion layer extending from the trench contact structure (172) can be connected at a lower side to a bottom wall of the trench gate structure (51). It is therefore possible to suppress the electric field concentration at the end portion of the trench gate structure (51).

[C2] The semiconductor device according to C1, wherein the pair of trench gate structures (51) are to be electrically independently controlled.

[C3] The semiconductor device according to C1 or C2, wherein the pair of trench contact structures (172, 172A, 172B) are to be electrically independently controlled.

[C4] The semiconductor device according to any one of C1 to C3, wherein one trench contact structure (172A) is to be simultaneously controlled with one trench gate structure (51), and the other trench contact structure (172B) is to be simultaneously controlled with the other trench gate structure (51).

[C5] The semiconductor device according to any one of C1 to C4, wherein one trench contact structure (172A) is to be electrically independently controlled from the other trench gate structure (51), and the other trench contact structure (172B) is to be electrically independently controlled from one trench gate structure (51).

[C6] The semiconductor device according to any one of C1 to C5, wherein the pair of trench gate structures (51) are to be individually controlled by a plurality of gate signals (G).

[C7] The semiconductor device according to any one of C1 to C6, wherein the pair of trench contact structures (172, 172A, 172B) are to be individually controlled by a plurality of gate signals (G).

[C8] The semiconductor device according to any one of C1 to C7, further comprising: a first gate wiring (14) that is electrically connected to one trench gate structure (51) and one trench contact structure (172A); and a second gate wiring (14) that is electrically connected to the other trench gate structure (51) and the other trench contact structure (172B).

[C9] The semiconductor device according to any one of C1 to C8, wherein the lower electrode (57) of one trench gate structure (51) is fixed to a same potential as a potential of the upper electrode (56) of one trench gate structure (51), and the lower electrode (57) of the other trench gate structure (51) is fixed to a same potential as a potential of the upper electrode (56) of the other trench gate structure (51).

The semiconductor device according to any one of C1 to C9, wherein the contact electrode (74) of one trench contact structure (172A) is fixed to a same potential as a potential of the lower electrode (57) of one trench gate structure (51), and the contact electrode (74) of the other trench contact structure (172B) is fixed to a same potential as a potential of the lower electrode (57) of the other trench gate structure (51).

[C11] The semiconductor device according to any one of C1 to 010, wherein the pair of trench contact structures (172, 172A, 172B) each passes beside the pair of trench gate structures (51) in the second direction (Y).

[C12] The semiconductor device according to any one of C1 to C11, wherein one trench contact structure (172A) has a first connection portion (174) that is connected to the one end portion (51A) of one trench gate structure (51) and a first opposing portion (175) that opposes to the one end portion (51A) of the other trench gate structure (51) with the second interval (12).

[C13] The semiconductor device according to C12, wherein the contact electrode (74) of one trench contact structure (172A) is connected to the lower electrode (57) of one trench gate structure (51) at the first connection portion (174).

[C14] The semiconductor device according to any one of C1 to C13, wherein the other trench contact structure (172B) has a second connection portion (178) that is connected to the other end portion (51B) of the other trench gate structure (51) and a second opposing portion (179) that opposes to the other end portion (51B) of one trench gate structure (51) with the second interval (12).

[C15] The semiconductor device according to C14, wherein the contact electrode (74) of the other trench contact structure (172B) is connected to the lower electrode (57) of the other trench gate structure (51) at the second connection portion (178).

[C16] The semiconductor device according to any one of C1 to C15, wherein the pair of trench gate structures (51) each has a first depth (D1), and the pair of trench contact structures (172, 172A, 172B) each has a second depth (D2) substantially equal to the first depth (D1).

[C17] The semiconductor device according to any one of C1 to C16, wherein the pair of trench gate structures (51) each has a first width (W1) regarding the second direction (Y), and the pair of trench contact structures (172, 172A, 172B) each has a second width (W2) not less than the first width (W1) regarding the first direction (X).

[C18] The semiconductor device according to any one of C1 to C17, further comprising: a trench separation structure (43) that demarcates a device region (6) at the main surface (3), the trench separation structure (43) having a separation electrode (45) embedded in a separation trench (44) with a separation insulator (45); and wherein the pair of trench gate structures (51) and the pair of trench contact structures (172, 172A, 172B) are formed in the device region (6) at intervals (WSP) from the trench separation structure (43).

[C19] The semiconductor device according to any one of C1 to C18, further comprising: a control circuit (11) configured such as to generate a plurality of gate signals (G) that individually control the pair of trench gate structures (51).

[D1] to [D10] and [E1] to [E12] provide a semiconductor device that has a transistor with a variable ON-resistance.

[D1] A semiconductor device comprising: a semiconductor chip (2); and a plural-system gate divided transistor (8) that includes a first system transistor (9A) and a second system transistor (9B) each formed at the semiconductor chip (2), and that generates a single output signal (IOUT) by selective controls of the first system transistor (9A) and the second system transistor (9B). According to this structure, it is possible to provide a semiconductor device that has a transistor with a variable ON-resistance.

[D2] The semiconductor device according to D1, wherein the gate divided transistor (8) is to be controlled with plural operational modes in which switching patterns of the first system transistor (9A) and the second system transistor (9B) are different during a normal operation and during an active clamp operation.

[D3] The semiconductor device according to D2, wherein the gate divided transistor (8) is to be controlled to an ON-state by both of the first system transistor (9A) and the second system transistor (9B) at the normal operation.

[D4] The semiconductor device according to D2 or D3, wherein the gate divided transistor (8) is to be controlled to an ON-state by any one of the first system transistor (9A) and the second system transistor (9B) at the active clamp operation.

[D5] The semiconductor device according to any one of D2 to D4, wherein the gate divided transistor (8) is to be operated with a first ON-resistance during the normal operation and is to be operated with a second ON-resistance more than the first ON-resistance during the active clamp operation.

[D6] The semiconductor device according to any one of D1 to D5, wherein a first gate signal (G1) is individually input to the first system transistor (9A), and a second gate signal (G2) is individually input to the second system transistor (9B).

[D7] The semiconductor device according to any one of D1 to D6, further comprising: a first gate wiring (14A) that is connected to the first system transistor (9A) anywhere above the semiconductor chip (2); and a second gate wiring (14B) that is connected to the second system transistor (9B) anywhere above the semiconductor chip (2).

[D8] The semiconductor device according to any one of D1 to D7, further comprising: a device region (6) that is demarcated at the semiconductor chip (2); and wherein the first system transistor (9A) and the second system transistor (9B) are collectively formed at the device region (6).

[D9] The semiconductor device according to any one of D1 to D8, further comprising: a plurality of unit transistors (10) that are formed at the semiconductor chip (2); and wherein the first system transistor (9A) includes a single or plurality of first unit transistors (10A) systematized as an individual control target from the plurality of unit transistors (10), and the second system transistor (9B) includes a single or plurality of second unit transistors (10B) systematized as an individual control target from the plurality of unit transistors (10) excluding the first unit transistor (10A).

[D10] The semiconductor device according to any one of D1 to D9, further comprising: a control circuit (11) that is formed in a region different from the gate divided transistor (8) at the semiconductor chip (2) and that controls the gate divided transistor (8).

[E1] A semiconductor device comprising: a semiconductor chip (2); and a plural-system gate divided transistor (8) that includes a first system transistor (9A), a second system transistor (9B) and a third system transistor (9C) each formed at the semiconductor chip (2) and that generates a single output signal (IOUT) by selective controls of the first system transistor (9A), the second system transistor (9B) and the third system transistor (9C). According to this structure, it is possible to provide a semiconductor device that has a transistor with a variable ON-resistance.

[E2] The semiconductor device according to E1, wherein the gate divided transistor (8) is to be controlled with plural operational modes in which switching patterns of the first system transistor (9A), the second system transistor (9B) and the third system transistor (9C) are different during at least two of an ON-transition operation, a normal operation, an OFF-transition operation and an active clamp operation.

[E3] The semiconductor device according to E2, wherein the gate divided transistor (8) is to be controlled to an ON-state by all of the first system transistor (9A), the second system transistor (9B) and the third system transistor (9C) at the ON-transition operation.

[E4] The semiconductor device according to E2 or E3, wherein the gate divided transistor (8) is to be controlled to an ON-state by any two of the first system transistor (9A), the second system transistor (9B) and the third system transistor (9C) at the normal operation.

[E5] The semiconductor device according to any one of E2 to E4, wherein the gate divided transistor (8) is to be controlled to an ON-state by all of the first system transistor (9A), the second system transistor (9B) and the third system transistor (9C) at the OFF-transition operation.

[E6] The semiconductor device according to any one of E2 to E5, wherein the gate divided transistor (8) is to be controlled to an ON-state by any one of the first system transistor (9A), the second system transistor (9B) and the third system transistor (9C) at the active clamp operation.

[E7] The semiconductor device according to any one of E2 to E6, wherein the gate divided transistor (8) is to be operated with a first ON-resistance at the ON-transition operation, is to be operated with a second ON-resistance more than the first ON-resistance at the normal operation, is to be operated with a third ON-resistance less than the second ON-resistance at the OFF-transition operation, and is to be operated with a fourth ON-resistance more than the second ON-resistance at the active clamp operation.

[E8] The semiconductor device according to any one of E1 to E7, wherein a first gate signal (G1) is to be input to the first system transistor (9A), a second gate signal (G2) is to be input to the second system transistor (9B), and a third gate signal (G3) is to be input to the third system transistor (9C).

[E9] The semiconductor device according to any one of E1 to E8, further comprising: a first gate wiring (14A) that is connected to the first system transistor (9A) anywhere above the semiconductor chip (2); a second gate wiring (14B) that is connected to the second system transistor (9B) anywhere above the semiconductor chip (2); and a third gate wiring (14C) that is connected to the third system transistor (9C) anywhere above the semiconductor chip (2).

[E10] The semiconductor device according to any one of E1 to E9, further comprising: a device region (6) that is demarcated at the semiconductor chip (2); and wherein the first system transistor (9A), the second system transistor (9B) and the third system transistor (9C) are collectively formed at the device region (6).

[E11] The semiconductor device according to any one of E1 to E10, further comprising: a plurality of unit transistors (10) that are formed at the semiconductor chip (2); and wherein the first system transistor (9A) includes a single or plurality of first unit transistors (10A) systematized as an individual control target from the plurality of unit transistors (10), the second system transistor (9B) includes a single or plurality of second unit transistors (10B) systematized as an individual control target from the plurality of unit transistors (10) excluding the first unit transistor (10A), and the third system transistor (9C) includes a single or plurality of third unit transistors (100) systematized as an individual control target from the plurality of unit transistors (10) excluding the first unit transistor (10A) and the second unit transistor (10B).

[E12] The semiconductor device according to any one of E1 to E11, further comprising: a control circuit (11) that is formed in a region different from the gate divided transistor (8) at the semiconductor chip (2) and that controls the gate divided transistor (8).

[F1] to [F11] provide a semiconductor circuit that has a transistor with a variable ON-resistance.

[F1] A semiconductor circuit comprising: a gate divided transistor (8) an ON-resistance of which changes by individual control of a plurality of gate signals (G); and a gate control circuit (12) which individually controls the plurality of gate signals (G) such as to reduce the ON-resistance to be lower than a steady-state value when an ON-transition operation of the gate divided transistor (8). According to this structure, it is possible to provide a semiconductor circuit that has a transistor with a variable ON-resistance.

[F2] The semiconductor circuit according to F1, further comprising: an active clamp circuit (25) which limits a terminal-to-terminal voltage (Vds) of the gate divided transistor (8) to a value not more than a clamp voltage (Vclp); and wherein the gate control circuit (12) raises the ON-resistance more than the steady-state value before an operation of the active clamp circuit (25).

[F3] The semiconductor circuit according to F2, wherein the gate divided transistor (8) has a drain (DM), a source (SM), a first gate (GM, GS), a second gate (GM, GS) and a third gate (GM, Gs), the active clamp circuit (25) is connected between the drain (DM) and the third gate (GM, GS) of the gate divided transistor (8), and the gate control circuit (12) includes: a first switch (137) that is connected between the source (SM) and the first gate (GM, GS) of the gate divided transistor (8), and that is to be OFF when the ON-resistance is to be reduced from the steady-state value; a second switch (138) that is connected between the source (SM) and the first gate (GM, GS) of the gate divided transistor (8), and that is to be ON when the ON-resistance is to be raised from the steady-state value; and a third switch (139) that is connected to the source (SM) and the second gate (GM, GS) of the gate divided transistor (8), and that is to be ON when the ON-resistance is to be raised from the steady-state value.

[F4] The semiconductor circuit according to F3, further comprising: an output voltage monitoring circuit (122) which monitors an output voltage (VOUT) of the gate divided transistor (8) and generates a drive signal (Sc) of the first switch (137).

[F5] The semiconductor circuit according to F4, wherein the output voltage monitoring circuit (122) includes: a threshold voltage generating unit (126) which generates a threshold voltage (Vth); a comparator (127) which compares the output voltage (VOUT) and the threshold voltage (Vth) to generate a comparison signal (Sa); a delay unit (128) which gives a predetermined delay to the comparison signal (Sa) to generate a delay signal (Sb); and a level shifter (129) which gives a level-shift to the delay signal (Sb) to generate the drive signal (Sc).

[F6] The semiconductor circuit according to any one of F3 to F5, wherein the second switch (138) and the third switch (139) are each controlled in response to an internal node voltage (Vx) of the active clamp circuit (25).

[F7] The semiconductor circuit according to any one of F3 to F6, wherein the active clamp circuit includes: a diode pair that includes a Zener diode and a diode, an anode of the Zener diode and an anode of the diode connecting each other; a clamp transistor that has a drain connected to the drain (DM) of the gate divided transistor (8), a source connected to the third gate (GM, GS) of the gate divided transistor (8), and a gate connected to a cathode of the diode.

[F8] The semiconductor circuit according to any one of F1 to F7, further comprising: an overcurrent protection circuit (33) which limits an output current (IOUT) that flows to the gate divided transistor (8).

[F9] The semiconductor circuit according to any one of F1 to F8, further comprising: an overheat protection circuit (35) which protects the gate divided transistor (8) from a rise of temperature.

[F10] The semiconductor circuit according to F9, wherein the overheat protection circuit (35) forcibly controls the gate divided transistor (8) to an off-state when the gate divided transistor (8) reaches a constant value, or when a temperature difference between the gate divided transistor (8) and another circuit block reaches a constant value.

[F11] A semiconductor device comprising: a semiconductor chip (2) in which a semiconductor circuit according to any one of F1 to F10 are formed.

[G1] to [G20] provide a semiconductor device that has a transistor with a variable ON-resistance.

[G1] A semiconductor device comprising: a semiconductor chip (2); and an n-system gate divided transistor (8), where the "n" is not less than 2, that includes n-number of system transistors (9, 9A, 9B, 9C) formed in the semiconductor chip (2) such as to be individually controlled and that generates a single output signal (IOUT) by selective controls of the n-number of system transistors (9, 9A, 9B, 9C).

[G2] The semiconductor device according to G1, wherein the gate divided transistor (8) is configured such that an ON-resistance is to be changed by individual controls of the n-number of system transistors (9, 9A, 9B, 9C).

[G3] The semiconductor device according to G1 or G2, wherein the gate divided transistor (8) is configured such that a channel utilization is to be changed by individual controls of the n-number of system transistors (9, 9A, 9B, 9C).

[G4] The semiconductor device according to any one of G1 to G3, wherein the gate divided transistor (8) includes a parallel circuit including the n-number of system transistors (9, 9A, 9B, 9C).

[G5] The semiconductor device according to any one of G1 to G4, wherein the n-number of system transistors (9, 9A, 9B, 9C) are individually controlled by n-number of gate signals (G, G1, G2, G3).

[G6] The semiconductor device according to any one of G1 to G5, wherein the gate divided transistor (8) generates the output signal (IOUT) that consists of an addition value of n-number of electrical signals generated by the n-number of system transistors (9, 9A, 9B, 9C).

[G7] The semiconductor device according to any one of G1 to G6, further comprising: n-number of gate wirings (14, 14A, 14B, 14C) configured such as to individually transmit gate signals (G, G1, G2, G3) to the n-number of system transistors (9, 9A, 9B, 9C).

[G8] The semiconductor device according to any one of G1 to G7, further comprising: a device region (6) that is demarcated in the semiconductor chip (2); wherein the n-number of system transistors (9, 9A, 9B, 9C) are collectively formed in the device region (6).

[G9] The semiconductor device according to any one of G1 to G8, further comprising: a control circuit (11) that is formed in a region different from the gate divided transistor (8) in the semiconductor chip (2), and that is configured such as to generate n-number of gate signals (G, G1, G2, G3) by which the n-number of system transistors (9, 9A, 9B, 9C) are to be individually controlled.

[G10] The semiconductor device according to any one of G1 to G9, wherein the n-number of system transistors (9, 9A, 9B, 9C) are each configured with a single or plurality of unit transistors (10, 10A, 10B, 100) that are systematized as an individual control target.

[G11] The semiconductor device according to G10, wherein the n-number of system transistors (9, 9A, 9B, 9C) are each configured with a parallel circuit that includes the single or plurality of unit transistors (10, 10A, 10B, 100).

[G12] The semiconductor device according to G10 or G11, wherein the unit transistor (10, 10A, 10B, 100) has a trench gate structure (51).

[G13] The semiconductor device according to G12, wherein the trench gate structure (51) has a multiple electrode structure including an upper electrode (56) and a lower electrode (57) each embedded in a gate trench (53) such as to be vertically insulated and separated by an insulator (54, 55, 58).

[G14] The semiconductor device according to G13, wherein the lower electrode (57) is fixed to a same potential as a potential of the upper electrode (56).

[G15] The semiconductor device according to any one of G1 to G14, wherein the gate divided transistor (8) is configured such as to be controlled with multiple operational modes each consisting of a different ON-resistance.

[G16] The semiconductor device according to any one of G1 to G15, wherein the gate divided transistor (8) is configured such as to be controlled with at least two operational modes by selective controls of at least two of the system transistors (9, 9A, 9B, 9C).

[G17] The semiconductor device according to any one of G1 to G16, wherein the gate divided transistor (8) is configured such as to be controlled with at least three operational modes by selective controls of at least three of the system transistors (9, 9A, 9B, 9C).

[G18] The semiconductor device according to any one of G1 to G17, wherein the gate divided transistor (8) is configured such as to be controlled with at least two operational modes each consisting of a different ON-resistance in at least two operations of an on-transition operation, a normal operation, an off-transition operation, and an active clamp operation.

[G19] The semiconductor device according to G18, wherein the gate divided transistor (8) is to be controlled such that the ON-resistance at the active clamp operation exceeds the ON-resistance at the normal operation.

[G20] The semiconductor device according to G18, wherein the gate divided transistor (8) is to be controlled such that the ON-resistance at the on-transition operation is to be less than the ON-resistance at the normal operation.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A semiconductor device comprising:

a semiconductor chip; and an n-system gate divided transistor, where the “n” is not less than 2, that includes n-number of system transistors formed in the semiconductor chip so as to be individually controlled and that is configured so as to generate a single output current including system currents generated by selective controls of the n-number of system transistors, the n-system gate divided transistor including a parallel circuit including the n-number of system transistors such that the n-number of system transistors are configured so as to be electrically controlled to an ON-state and OFF-state independently of each other; and a control circuit that is formed in a region different from the gate divided transistor in the semiconductor chip, and that is configured so as to generate n-number of gate signals by which the n-number of system transistors are to be individually controlled, wherein two or more of the system transistors are individually controlled by the gate signals input from the control circuit, respectively, to be in ON states during a normal operation, and at least one of the system transistors is controlled by the gate signal input from the control circuit to be in an ON state while at least one of the system transistors is controlled by the gate signal input from the control circuit to be in an OFF state during an active clamp operation.

2. The semiconductor device according to claim 1, wherein the n-system gate divided transistor is configured such that an ON-resistance is to be changed by individual controls of the n-number of system transistors.

3. The semiconductor device according to claim 1, wherein the n-system gate divided transistor is configured such that a channel utilization is to be changed by individual controls of the n-number of system transistors.

4. The semiconductor device according to claim 1, further comprising:

n-number of gate wirings configured so as to individually transmit gate signals to the n-number of system transistors.

5. The semiconductor device according to claim 1, further comprising:

a device region that is demarcated in the semiconductor chip;

wherein the n-number of system transistors are collectively formed in the device region and configure the n-system gate divided transistor.

6. The semiconductor device according to claim 1, wherein the n-number of system transistors are each configured with a single unit transistor or a plurality of unit transistors that are systematized as an individual control target.

7. The semiconductor device according to claim 6, wherein the n-number of system transistors are each configured with a parallel circuit that includes the single unit transistor or the plurality of unit transistors.

8. The semiconductor device according to claim 6, wherein the unit transistor has a trench gate structure.

9. The semiconductor device according to claim 8, wherein the trench gate structure has a multiple electrode structure including an upper electrode and a lower electrode each embedded in a gate trench so as to be vertically insulated and separated by an insulator.

10. The semiconductor device according to claim 9, wherein the lower electrode is fixed to a same potential as a potential of the upper electrode.

11. The semiconductor device according to claim 1, wherein the n-system gate divided transistor is configured so as to be controlled with multiple operational modes each consisting of a different ON-resistance.

12. The semiconductor device according to claim 1, wherein the n-system gate divided transistor is configured so as to be controlled with at least three operational modes by selective controls of at least three of the system transistors.

13. The semiconductor device according to claim 1, wherein the n-system gate divided transistor is configured so as to be controlled with at least two operational modes each consisting of a different ON-resistance in at least two operations of an on-transition operation, a normal operation, an off-transition operation, and an active clamp operation.

14. The semiconductor device according to claim 13, wherein the n-system gate divided transistor is to be controlled such that an ON-resistance at the active clamp operation exceeds an ON-resistance at the normal operation.

15. The semiconductor device according to claim 13, wherein the n-system gate divided transistor is to be controlled such that an ON-resistance at the on-transition operation is to be less than an ON-resistance at the normal operation.

16. The semiconductor device according to claim 1, wherein the n-system gate divided transistor includes:

a single main drain that is configured by n-number of electrically connected system drains of the system transistors, a single main source that is configured by n-number of electrically connected system sources of the system transistors, and n-number of main gates that are respectively configured by n-number of electrically separated system gates of the system transistors.

17. The semiconductor device according to claim 16, wherein n-number of gate signals from the control circuit that are electrically independent from each other are individually input into the n-number of system gates of the system transistors, respectively.

* * * * *